United States Patent
Yoshidome et al.

(10) Patent No.: US 8,802,349 B2
(45) Date of Patent: Aug. 12, 2014

(54) ACTINIC RAY-SENSITIVE OR RADIATION-SENSITIVE RESIN COMPOSITION AND RESIST FILM AND PATTERN FORMING METHOD USING THE COMPOSITION

(75) Inventors: Masahiro Yoshidome, Shizuoka (JP); Shuji Hirano, Shizuoka (JP); Hiroshi Saegusa, Shizuoka (JP); Kaoru Iwato, Shizuoka (JP); Yusuke Iizuka, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/258,898

(22) PCT Filed: Mar. 31, 2010

(86) PCT No.: PCT/JP2010/056290
§ 371 (c)(1),
(2), (4) Date: Sep. 22, 2011

(87) PCT Pub. No.: WO2010/114176
PCT Pub. Date: Oct. 7, 2010

(65) Prior Publication Data
US 2012/0015301 A1  Jan. 19, 2012

(30) Foreign Application Priority Data

Mar. 31, 2009 (JP) .................. 2009-088568
Nov. 9, 2009 (JP) .................. 2009-256265

(51) Int. Cl.
G03F 7/004 (2006.01)
G03F 7/38 (2006.01)
G03F 7/039 (2006.01)

(52) U.S. Cl.
CPC .......... *G03F 7/0397* (2013.01); *G03F 7/38* (2013.01); *Y10S 430/108* (2013.01); *Y10S 430/111* (2013.01)
USPC ......... 430/270.1; 430/326; 430/907; 430/910

(58) Field of Classification Search
CPC .................................................. G03F 7/0397
USPC ................................. 430/270.1, 326, 910, 907
See application file for complete search history.

(56) References Cited

U.S. PATENT DOCUMENTS 7,309,750 B2 * 12/2007 Bae et al. ...................... 526/282
7,998,654 B2 * 8/2011 Nishiyama et al. ......... 430/270.1
2007/0178405 A1 * 8/2007 Kanda et al. ............... 430/270.1
2008/0248425 A1 * 10/2008 Nishiyama et al. ........ 430/285.1
2008/0305433 A1   12/2008 Kanda et al.

FOREIGN PATENT DOCUMENTS

| JP | 2005-48126 A | 2/2005 |
| JP | 2005-258438 A | 9/2005 |
| JP | 2007-304537 A | 11/2007 |
| JP | 2008-111103 A | 5/2008 |
| JP | 2008-268915 A | 11/2008 |
| JP | 2008-268931 A | 11/2008 |
| WO | 2008/123560 A1 | 10/2008 |

OTHER PUBLICATIONS

Written Opinion of the International Search Authority [PCT/ISA/237] issued in corresponding International application No. PCT/JP2010/056290 on May 11, 2010.
International Search Report [PCT/ISA/210] issued by the International Search Authority in corresponding International application No. PCT/JP2010/056290 on May 11, 2010.
Office Action dated Nov. 26, 2013, issued by the Japanese Patent Office in corresponding Japanese Application No. 2010-076454.
Office Action dated May 7, 2014, issued by the Japanese Patent Office in counterpart Japanese Patent Application No. 2010-076454.

* cited by examiner

*Primary Examiner* — John Chu
(74) *Attorney, Agent, or Firm* — Sughrue Mion, PLLC

(57) ABSTRACT

Provided is an actinic ray-sensitive or radiation-sensitive resin composition including: (A) a resin capable of increasing the solubility in an alkali developer by the action of an acid, the resin containing (a) a repeating unit represented by the following formula (AN-01), (B) a compound capable of generating an acid upon irradiation with an actinic ray or radiation, and (C) a resin that contains at least either a fluorine atom or a silicon atom and contains a repeating unit having a group capable of decomposing by the action of an alkali developer to increase the solubility in an alkali developer:

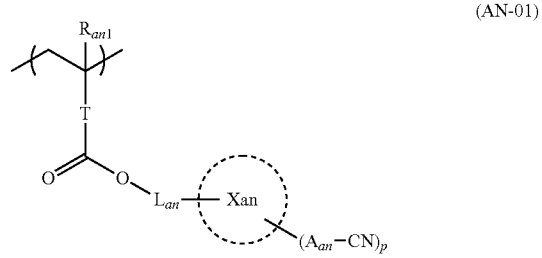

wherein the variables in formula (AN-01) are defined in the description.

14 Claims, No Drawings

ACTINIC RAY-SENSITIVE OR RADIATION-SENSITIVE RESIN COMPOSITION AND RESIST FILM AND PATTERN FORMING METHOD USING THE COMPOSITION

TECHNICAL FIELD

The present invention relates to an actinic ray-sensitive or radiation-sensitive resin composition for use in lithography for the production of a semiconductor device such as IC, a liquid crystal device or a circuit board such as thermal head and further for other photofabrication processes, and a pattern forming method using the composition. More specifically, the present invention relates to a positive resist composition suitable for exposure by an immersion projection exposure apparatus using a light source that emits far ultraviolet light at a wavelength of 300 nm or less, a resist film and a pattern forming method using the composition.

BACKGROUND ART

Along with miniaturization of a semiconductor device, the trend is moving into a shorter wavelength of the exposure light source and a higher numerical aperture (higher NA) of the projection lens, and a so-called immersion method of filling a high refractive-index liquid (hereinafter sometimes referred to as an "immersion liquid") between the projection lens and the sample with an attempt to raise the resolution by more shortening the wavelength is known. The immersion method is effective for all pattern profiles and furthermore, can be combined with the super-resolution technology under study at present, such as phase-shift method and modified illumination method.

Since the advent of a resist for KrF excimer laser (248 nm), an image forming method called chemical amplification is used as an image forming method for a resist so as to compensate for sensitivity reduction caused by light absorption. For example, the image forming method by positive chemical amplification is an image forming method of decomposing an acid generator in the exposed area upon exposure to produce an acid, converting an alkali-insoluble group into an alkali-soluble group by using the generated acid as a reaction catalyst in the baking after exposure (PEB: Post Exposure Bake), and removing the exposed area by alkali development.

In recent years, the resist pattern is becoming finer and finer and demands for high resolution are more increasing. In turn, enhancement of various lithography characteristics are required also of the resist composition. Furthermore, for forming various device circuits, a resist capable of forming a resist pattern more faithful to a mask under various conditions is demanded. Such characteristics include pitch dependency and coverage dependency.

In this respect, the resin described in JP-A-2008-111103 (the term "JP-A" as used herein means an "unexamined published Japanese patent application") exhibits high transparency to ArF excimer laser but is insufficient in view of pitch dependency and coverage dependency (the "pitch dependency" indicates the CD (critical dimension, limiting (minimum) dimension) fluctuation of line width of a line-and-space pattern of a resist when the pitch is varied, and the "coverage dependency" indicates the CD fluctuation of line width of a line-and-space pattern of a resist when the reticle mask coverage within an exposure chip is varied).

Also, it is pointed out that when a chemical amplification resist is applied to immersion exposure, the resist layer comes into contact with the immersion liquid at the exposure, as a result, the resist layer deteriorates or a component adversely affecting the immersion liquid bleeds out from the resist layer.

Furthermore, in the immersion exposure process, when the exposure is performed using a scanning-type immersion exposure machine, unless the immersion liquid moves following the movement of lens, the exposure speed decreases and this may affect the productivity. In the case where the immersion liquid is water, the resist film is preferably hydrophobic because of good followability of water.

To solve the problem above, in JP-A-2007-304537 and JP-A-2005-258438, there is described an example of preventing the bleed-out by adding a resin containing a silicon atom or a fluorine atom.

However, combinations of the resin and the fluorine-containing protective film material described in JP-A-2007-304537 and JP-A-2005-258438 are insufficient in terms of pitch dependency and coverage dependency.

SUMMARY OF INVENTION

The resist pattern is recently becoming finer and finer and demands for high resolution are more increasing. In turn, enhancement of various lithography characteristics are required also of the resist composition. Furthermore, for forming various device circuits, a resist capable of forming a resist pattern more faithful to a mask under various conditions is demanded. Such characteristics include pitch dependency and coverage dependency. The "pitch dependency" indicates the CD (critical dimension, limiting (minimum) dimension) fluctuation of line width of a line-and-space pattern of a resist when the pitch is varied.

The "coverage dependency" indicates the CD fluctuation of line width of a line-and-space pattern of a resist when the reticle mask coverage within an exposure chip is varied.

An object of the present invention is to solve the technical task of enhancing the performance in micro-photofabrication using far ultraviolet light, particularly ArF excimer laser at a wavelength of 193 nm, and more specifically, provide an actinic ray-sensitive or radiation-sensitive resin composition having good performance in terms of pitch dependency and coverage dependency, a resist film and a resist pattern forming method using the composition.

As a result of intensive studies to attain the above-described object, the present inventors have accomplished the present invention described below.

The present invention has the following constructions.

1. An actinic ray-sensitive or radiation-sensitive resin composition comprising:

(A) a resin capable of increasing the solubility in an alkali developer by the action of an acid, the resin containing (a) a repeating unit represented by the following formula (AN-01), (B) a compound capable of generating an acid upon irradiation with an actinic ray or radiation, and (C) a resin that contains at least either a fluorine atom or a silicon atom and contains a group capable of decomposing by the action of an alkali developer to increase the solubility in an alkali developer:

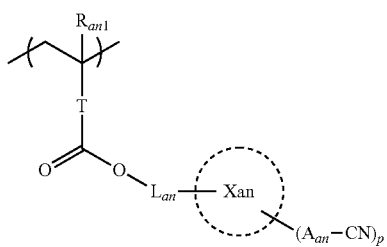

(AN-01)

wherein

T represents a single bond or a divalent linking group;

$R_{an1}$ represents a hydrogen atom, a methyl group or a group represented by —$CH_2$—$R_9$, wherein $R_9$ represents a hydroxyl group or a monovalent organic group;

$L_{an}$ represents a single bond or a divalent linking group;

$X_{an}$ represents (1+p)-valent alicyclic structure;

p is an integer of 1 to 3; and $A_{an}$ represents a single bond, an alkylene group, a cycloalkylene group, an oxy group, a carbonyl group, an amide group, or a group formed by combining two or more of these groups.

2. The actinic ray-sensitive or radiation-sensitive resin composition as described in 1 above, wherein the repeating unit (a) is a repeating unit represented by formula (ANa) or (ANb):

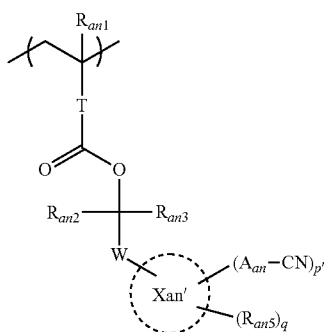

(ANa)

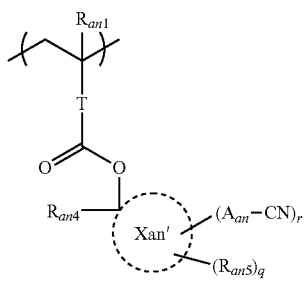

(ANb)

wherein $A_{an}$ has the same meanings as that in formula (AN-01);

$X_{an'}$ represents an alicyclic structure;

W represents a single bond, an alkylene group or a cycloalkylene group;

T represents a single bond or a divalent linking group;

$R_{an1}$ represents a hydrogen atom, a methyl group or a group represented by —$CH_2$—$R_9$, wherein $R_9$ represents a hydroxyl group or a monovalent organic group:

each of $R_{an2}$ and $R_{an3}$ independently represents an alkyl group or a cycloalkyl group;

$R_{an4}$ represents an alkyl group, a cycloalkyl group or a structure represented by -$A_{an}$-CN;

$R_{an5}$ represents a halogen atom, a hydroxyl group or a monovalent organic group;

p' is an integer of 1 to 3;

q is an integer of 0 to 3; and r is an integer of 0 to 3, provided that when r is 0, $R_{an4}$ is a structure represented by -$A_{an}$-CN.

3. The actinic ray-sensitive or radiation-sensitive resin composition as described in 1 or 2 above, wherein the alicyclic structure represented by $X_{an}$ and $X_{an'}$ is an adamantane residue.

4. The actinic ray-sensitive or radiation-sensitive resin composition as described in 1 or 2 above, wherein the repeating unit (a) is a repeating unit represented by the following formula (Nb-01):

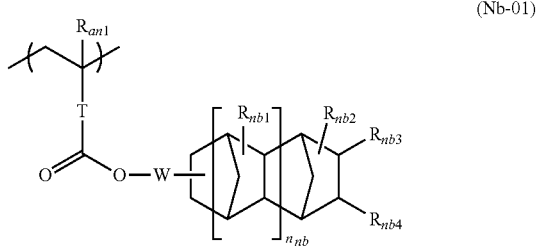

(Nb-01)

wherein $R_{an1}$ represents a hydrogen atom, a methyl group or a group represented by —$CH_2$—$R_9$, wherein $R_9$ represents a hydroxyl group or a monovalent organic group;

W represents a single bond, an alkylene group or a cycloalkylene group;

T represents a single bond or a divalent linking group;

each of $R_{nb1}$ and $R_{nb2}$ independently represents a hydrogen atom, a hydroxyl group, an alkyl group or a cycloalkyl group;

each of $R_{nb3}$ and $R_{nb4}$ independently represents a hydrogen atom, an alkyl group, a cycloalkyl group or a structure represented by -$A_{an}$-CN, wherein $A_{an}$ has the same meaning as that in formula (AN-01), provided that at least one of $R_{nb3}$ and $R_{nb4}$ is a structure represented by -$A_{an}$-CN; and $n_{nb}$ is an integer of 0 to 2, provided that when $n_{nb}$ is 2, two of $R_{nb1}$ may be same or different, respectively.

5. The actinic ray-sensitive or radiation-sensitive resin composition as described in any one of 1 to 4, wherein the resin (C) contains a repeating unit represented by the following formula (K0)

(K0)

wherein $R_{k1}$ represents a hydrogen atom, a halogen atom, a hydroxyl group, an alkyl group, a cycloalkyl group, an aryl group or a group containing a group capable of decomposing by the action of an alkali developer to increase the solubility in an alkali developer, and $R_{k2}$ represents an alkyl group, a cycloalkyl group, an aryl group or a group containing a group capable of decomposing by the action of an alkali developer to increase the solubility in an alkali developer, provided that at least either one of $R_{k1}$ and $R_{k2}$ contains a group capable of decomposing by the action of an alkali developer to increase the solubility in an alkali developer.

6. The actinic ray-sensitive or radiation-sensitive resin composition as described in any one of 1 to 5 above, wherein the resin (C) contains a repeating unit having two or more groups capable of decomposing by the action of an alkali developer to increase the solubility in an alkali developer.

7. The actinic ray-sensitive or radiation-sensitive resin composition as described in any one of 1 to 6 above, wherein the resin (C) contains a repeating unit having at least either a fluorine atom or a silicon atom and having a group capable of decomposing by the action of an alkali developer to increase the solubility in an alkali developer.

8. The actinic ray-sensitive or radiation-sensitive resin composition as described in any one of 1 to 7 above, wherein the resin (A) further contains a lactone structure-containing repeating unit.

9. A resist film formed of the actinic ray-sensitive or radiation-sensitive resin composition described in any one of 1 to 8.

10. A pattern forming method comprising steps of subjecting the resist film described in 9 to immersion exposure and developing the immersion-exposed resist film.

Furthermore, the present invention preferably includes the following constructions.

11. The actinic ray-sensitive or radiation-sensitive resin composition as described in 6 above, wherein the repeating unit having two or more groups capable of decomposing by the action of an alkali developer to increase the solubility in an alkali developer contains a group having a partial structure represented by the following formula (KY-2):

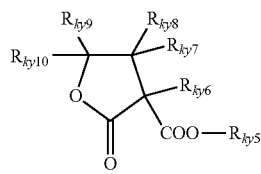

wherein each of $R_{ky6}$ to $R_{ky10}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amide group or an aryl group, two or more members of $R_{ky6}$ to $R_{ky10}$ may combine with each other to form a monocyclic or polycyclic structure, $R_{ky5}$ represents an electron-withdrawing group, and each of $R_{ky5}$ to $R_{ky10}$ represents an alkyl group, a cycloalkyl group, an ether group, a hydroxyl group, an amide group, an aryl group, a lactone ring group or an electron-withdrawing group and each of $R_{ky5}$ to $R_{ky10}$ may be same or different, provided that the structure represented by formula (KY-2) is a group having a monovalent or higher valent group formed by removing at least one arbitrary hydrogen atom in the structure.

12. The actinic ray-sensitive or radiation-sensitive resin composition as described in 11 above, wherein the partial structure represented by formula (KY-2) is a partial structure represented by the following formula (KY-3):

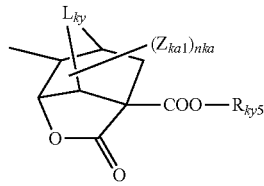

wherein $Z_{ka1}$ represents, when a plurality of $Z_{ka1}$'s are present, each independently represents, an alkyl group, a cycloalkyl group, an ether group, a hydroxyl group, an amide group, an aryl group, a lactone ring group or an electron-withdrawing group, nka represents an integer of 0 to 10, $R_{ky5}$ has the same meaning as in formula (KY-2), and $L_{ky}$ represents an alkylene group, an oxygen atom or a sulfur atom.

13. The actinic ray-sensitive or radiation-sensitive resin composition as described in any one of 1 to 8 and 11 above, wherein the resin (C) contains a repeating unit having a partial structure represented by the following formula (cc):

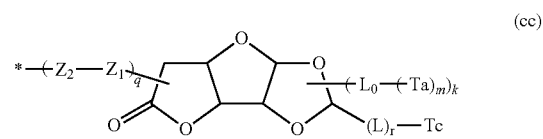

wherein each $Z_1$ independently represents a single bond, an ether bond, an ester bond, an amide bond, a urethane bond or a urea bond and is preferably an ester bond;

each $Z_2$ independently represents a chain or cyclic alkylene group;

each Ta independently represents an alkyl group, a cycloalkyl group, an alkoxy group, a nitrile group, a hydroxyl group, an amide group, an aryl group or an electron-withdrawing group, and when a plurality of Ta's are present, Ta's may combine with each other to form a ring;

$L_0$ represents a single bond or an (m+1)-valent hydrocarbon group, and when k is 2, two $L_0$'s may combine with each other to form a ring;

each L independently represents a carbonyl group, a carbonyloxy group or an ether group;

Tc represents a hydrogen atom, an alkyl group, a cycloalkyl group, a nitrile group, a hydroxyl group, an amide group, an aryl group or an electron-withdrawing group;

* represents a bond to the main or side chain of the resin;

m represents an integer of 0 to 28;

k represents an integer of 0 to 2;

q represents an integer of 0 to 5; and r represents an integer of 0 to 5;

provided that the formula (cc) may have -$L_0$-(Ta)$_m$ as a substituent in place of -(L)$_r$-Tc.

DESCRIPTION OF EMBODIMENTS

The present invention is described in detail below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of a mercury lamp, a far ultraviolet ray typified by excimer laser, an extreme-ultraviolet ray (EUV light), an X-ray or an electron beam. Also, in the present invention, the "light" means an actinic ray or radiation.

Furthermore, in the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

The actinic ray-sensitive or radiation-sensitive resin composition of the present invention is preferably a chemical amplification positive resist composition.

The actinic ray-sensitive or radiation-sensitive resin composition of the present invention comprises (A) a resin capable of increasing the solubility in an alkali developer by the action of an acid, the resin containing (a) a repeating unit represented by the following formula (AN-01), (B) a compound capable of generating an acid upon irradiation with an actinic ray or radiation, and (C) a resin having at least either a fluorine atom or a silicon atom and containing a group capable of decomposing by the action of an alkali developer to increase the solubility in an alkali developer.

Respective components in the composition of the present invention are described in detail below.

[1] (A) Resin Capable of Increasing the Solubility in an Alkali Developer by the Action of an Acid The actinic ray-sensitive or radiation-sensitive resin composition of the present invention contains (A) a resin capable of increasing the solubility in an alkali developer by the action of an acid (acid-decomposable resin).

The resin (A) is preferably insoluble or sparingly soluble in an alkali developer.

The resin (A) contains (a) a repeating unit represented by formula (AN-01):

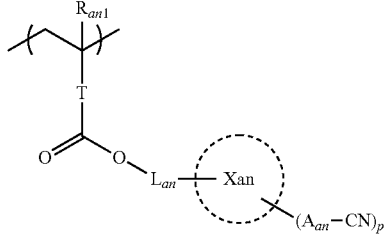

(AN-01)

In formula (AN-01), T represents a single bond or a divalent linking group.

$R_{an1}$ represents a hydrogen atom, a methyl group or a group represented by —$CH_2$—$R_9$, wherein $R_9$ represents a hydroxyl group or a monovalent organic group.

$L_{an}$ represents a single bond or a divalent linking group.

$X_{an}$ represents (1+p)-valent alicyclic structure.

$A_{an}$ represents a single bond, an alkylene group, a cycloalkylene group, an oxy group, a carbonyl group, an amide group, or a group formed by combining two or more of these groups.

When a plurality of $A_{an}$'s are present, each of $A_{an}$'s may be same or different.

p is an integer of 1 to 3.

At least either one of $L_{an}$ and $X_{an}$ preferably contains a quaternary carbon atom bonded directly to a carboxyloxy group or an oxycarbonyl group.

The repeating unit (a) preferably contains a group capable of decomposing by the action of an acid to produce an alkali-soluble group (hereinafter sometimes referred to as an "acid-decomposable group").

The acid-decomposable group preferably has a structure where an alkali-soluble group is protected by a group capable of decomposing and leaving by the action of an acid.

The alkali-soluble group is not particularly limited as long as it dissociates in an alkali developer and becomes an ion, but examples thereof include a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred alkali-soluble groups include a carboxyl group, a fluorinated alcohol group (preferably hexafluoroisopropanol) and a sulfonic acid group.

The group preferred as the acid-decomposable group is a group where a hydrogen atom of the above alkali-soluble group is replaced by a group capable of leaving by the action of an acid.

Examples of the group capable of leaving by the action of an acid include —$C(R_{36})(R_{37})(R_{38})$, —$C(R_{36})(R_{37})(OR_{39})$ and —$C(R_{01})(R_{02})(OR_{39})$.

In the formulae, each of $R_{36}$ to $R_{39}$ independently represents an alkyl group, a cycloalkyl group, an aryl group, an aralkyl group or an alkenyl group, and $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be either monocyclic or polycyclic. The monocyclic cycloalkyl group is preferably a cycloalkyl group having a carbon number of 3 to 8, and examples thereof include a cyclopropyl group, a cyclobutyl group, a cyclopentyl group, a cyclohexyl group and a cyclooctyl group. The polycyclic cycloalkyl group is preferably a cycloalkyl group having a carbon number of 6 to 20, and examples thereof include an adamantyl, a norbornyl group, an isoboronyl group, a camphanyl group, a dicyclopentyl group, an α-pinel group, a tricyclodecanyl group, a tetracyclododecyl group and an androstanyl group. Incidentally, a part of carbon atoms in the cycloalkyl group may be substituted by a heteroatom such as oxygen atom.

The aryl group of $R_{36}$ to $R_{39}$, $R_{01}$ and $R_{02}$ is preferably an aryl group having a carbon number of 6 to 10, and examples thereof include a phenyl group, a naphthyl group and an anthryl group.

The aralkyl group of $R_{36}$ to $R_{39}$, $R_{01}$ and $R_{02}$ is preferably an aralkyl group having a carbon number of 7 to 12, and examples thereof include a benzyl group, a phenethyl group and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group and a cyclohexenyl group.

The acid-decomposable group is preferably a cumyl ester group, an enol ester group, an acetal ester group, a tertiary alkyl ester group or the like, more preferably a tertiary alkyl ester group.

The methyl group of $R_{an1}$ may have a substituent, and examples thereof include a trifluoromethyl group and a hydroxymethyl group.

Examples of the monovalent organic group of $R_9$ include an alkyl group having a carbon number of 5 or less and an acyl group having a carbon number of 5 or less, and the monovalent organic group is preferably alkyl group having a carbon number of 3 or less, more preferably a methyl group.

$R_{an1}$ is preferably a hydrogen atom, a methyl group, a trifluoromethyl group or a hydroxymethyl group.

Examples of the divalent linking group of T include an alkylene group, a —COO-Rt- group and a —O-Rt- group, wherein Rt represents an alkylene group or a cycloalkylene group.

The alkylene group of T and Rt may be linear or branched, and examples thereof include a linear alkylene group such as a methylene group, an ethylene group, n-propylene group, n-butylene group, n-pentylene group and n-hexene group, and a branched alkylene group such as isopropylene group, isobutylene group, tert-butylene group and neopentylene group. Of these, an alkylene group having a carbon number of 1 to 6 is preferred, and an alkylene group having a carbon number of 1 to 3 is more preferred. The cycloalkylene group of Rt includes a monocyclic or polycyclic cycloalkylene group, and examples thereof include a cyclohexylene group, an adamantylene group and a norbornylene group.

T is preferably a single bond or a —COO-Rt- group. Rt is preferably an alkylene group having a carbon number of 1 to 5, more preferably a —CH$_2$— group, a —(CH$_2$)$_2$— group or a —(CH$_2$)$_3$— group.

Examples of the divalent linking group of $L_{an}$ are the same as those for T, and the divalent linking group is preferably a single bond or and a branched alkylene group, more preferably a single bond or —C(CH$_3$)$_2$—.

The (1+p)-valent alicyclic structure of $X_{an}$ is an aliphatic hydrocarbon ring structure not containing a heterocycle such as lactone ring. The alicyclic structure may be monocyclic or polycyclic and may also be a spiro ring. Examples thereof include the structures shown below. Incidentally, the following structures are illustrated as a divalent group, but the structure is not limited to a divalent group and may have a linking group to the main chain of p structures represented by -A$_{an}$-CN or may further have a substituent.

The alicyclic structure represented by $X_{an}$ is more preferably an adamantane residue.

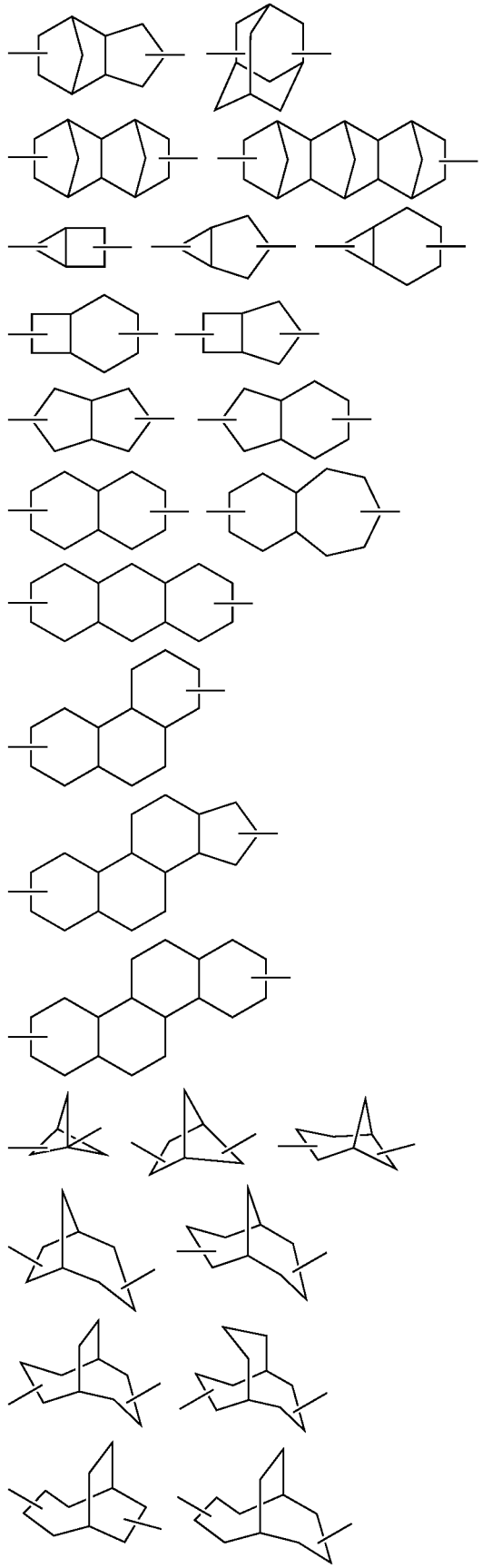

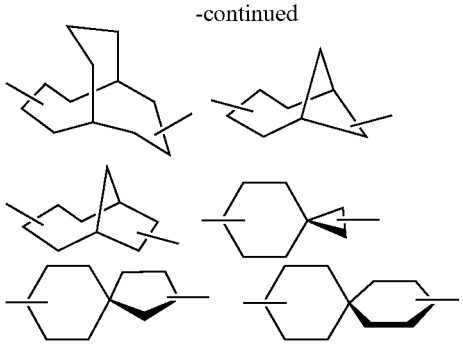

$A_{an}$ preferably represents a single bond, an alkylene group or a cycloalkylene group.

The total carbon umber of $A_{an}$ is preferably from 1 to 10, more preferably from 1 to 6.

In $A_{an}$, the alkylene group may be linear or branched, and examples thereof include a linear alkylene group such as methylene group, ethylene group, n-propylene group, n-butylene group, n-pentylene group and n-hexene group, and a branched alkylene group such as isopropylene group, isobutylene group, tert-butylene group and neopentylene group. Among these, those having a carbon number of 1 to 6 are preferred, and those having a carbon number of 1 to 3 are more preferred.

The cycloalkylene group of $A_{an}$ includes a monocyclic or polycyclic cycloalkylene group, and examples thereof include a cyclohexylene group, an adamantylene group and a norbornylene group.

$A_{an}$ is more preferably a single bond, a methylene group, an ethylene group or an isopropylene group.

The alicyclic structure of $X_{an}$ and the alkylene or cycloalkylene group of $A_{an}$ may further have a substituent.

Examples of the substituent which they may further have include a halogen atom, a hydroxyl group and a monovalent organic group. The monovalent organic group includes an alkyl group, a cycloalkyl group, a hydroxyl group protected by a protective group, and an amino group protected by a protective group. The substituent which they may further have may be further substituted by a cyano group or the like.

Examples of the alkyl group which the alicyclic structure of $X_{an}$ and the cycloalkylene group of $A_{an}$ may further have include a methyl group, an ethyl group, an n-propyl group, an isopropyl group, an n-butyl group, an isobutyl group and a tert-butyl group.

Examples of the cycloalkyl group which the alicyclic structure of $X_{an}$ and the alkylene group of $A_{an}$ may further have include a monocyclic cycloalkyl group such as cyclopentyl group and cyclohexyl group, and a polycyclic cycloalkyl group such as norbornyl group, tetracyclodecanyl group, tetracyclododecanyl group and adamantyl group.

Examples of the protective group in the hydroxyl group protected by a protective group and the amino group protected by a protective group include an alkyl group, a cycloalkyl group, an aralkyl group, a substituted methyl group, a substituted ethyl group, an alkoxycarbonyl group and an alkylcarbonyloxy group. The alkyl group is preferably an alkyl group having a carbon number of 1 to 4 as described above; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the alkoxycarbonyl group is preferably an alkoxycarbonyl group having a carbon number of 2 to 4; and the acyl group in the alkylcarbonyloxy group is preferably an aliphatic acyl group having a carbon number of 1 to 6, such as acetyl group, propionyl group, butyryl group, isobutyryl group, valeryl group and pivaloyl group.

The repeating unit (a) is preferably an acid decomposable group-containing repeating unit represented by formula (ANa) or (ANb):

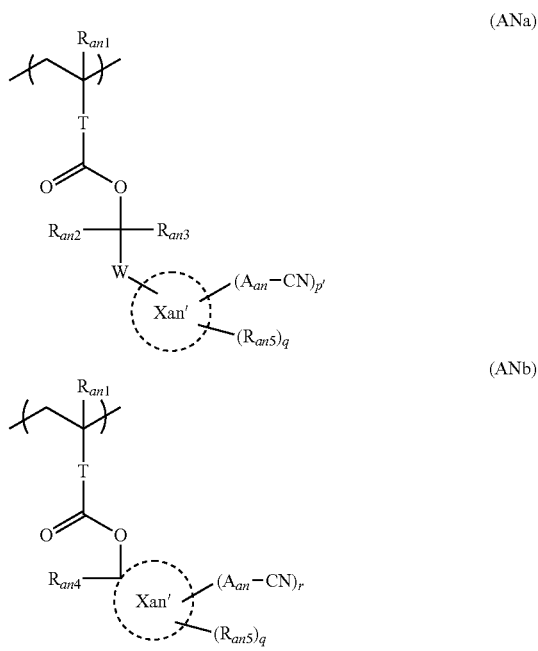

In formulae (ANa) and (ANb), $A_{an}$ has the same meanings as those in formula (AN-01).

$X_{an'}$ represents an alicyclic structure.

W represents a single bond, an alkylene group or a cycloalkylene group.

T represents a single bond or a divalent linking group.

$R_{an1}$ represents a hydrogen atom, a methyl group which may have a substituent, or a group represented by —$CH_2$—$R_9$, wherein $R_9$ represents a hydroxyl group or a monovalent organic group.

Each of $R_{an2}$ and $R_{an3}$ independently represents an alkyl group or a cycloalkyl group. Each of $R_{an2}$ and $R_{an3}$ is preferably an alkyl group having a carbon number of 1 to 3, and it is more preferred that both of $R_{an2}$ and $R_{an3}$ are a methyl group.

$R_{an4}$ represents an alkyl group, a cycloalkyl group or a structure represented by -$A_{an}$-CN.

$R_{an5}$ represents a halogen atom, a hydroxyl group or a monovalent organic group.

p' is an integer of 1 to 3.

q is an integer of 0 to 3.

r is an integer of 0 to 3, provided that when r is 0, $R_{an4}$ is a structure represented by -$A_{an}$-CN.

Incidentally, in formula (ANb), the "oxygen atom bonded to the alicyclic structure $X_{an'}$ (oxygen atom adjacent to the carbonyl group) in the ester bond" and $R_{an4}$ are bonded to the same carbon atom constituting the alicyclic structure $X_{an'}$.

$R_9$ represents a hydroxyl group or a monovalent organic group, and examples thereof include an alkyl group having a carbon number of 5 or less and an acyl group. The monovalent organic group is preferably an alkyl group having a carbon number of 3 or less, more preferably a methyl group. $R_{an1}$ preferably represents a hydrogen atom, a methyl group, a trifluoromethyl group or a hydroxymethyl group.

Xan' has the same meaning as Xan in formula (AN-01), and specific examples and preferred examples thereof are also the same as those described above for Xan. In formula (ANa), Xan' is (1+p'+q)-valent, and in formula (ANb), Xan' is (2+r+q)-valent.

Examples of the alkylene group and cycloalkylene group of W are the same as those for $A_{an}$ in formula (AN-01).

Examples of the divalent linking group of T are the same as those for T in formula (AN-01).

The alkyl group of $R_{an2}$ to $R_{an4}$ is preferably an alkyl group having a carbon number of 1 to 4, such as methyl group, ethyl group, n-propyl group, isopropyl group, n-butyl group, isobutyl group and tert-butyl group.

The cycloalkyl group of $R_{an2}$ to $R_{an4}$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The alkyl group and cycloalkyl group of $R_{an2}$ to $R_{an4}$ may further have a substituent, and examples of the substituent which these groups may have are the same as those of the substituent which the alkylene group and cycloalkylene group of $A_{an}$ may further have.

Specific examples of the monovalent organic group of $R_{an5}$ are the same as specific examples of the monovalent organic group which the alicyclic structure $X_{an}$ in formula (AN-01) may further have.

The repeating unit (a) is more preferably a structure shown below. In formulae, the symbols have the same meanings as above.

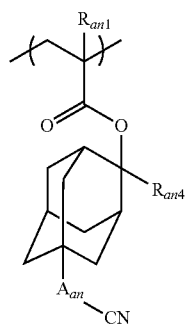

(Ad-01a)

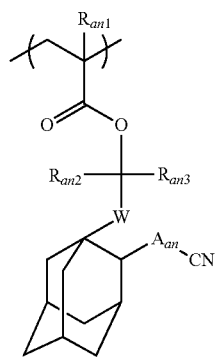

(Ad-02a)

Examples of the repeating unit (a) include the repeating units derived from the monomers shown below, but the present invention is not limited thereto.

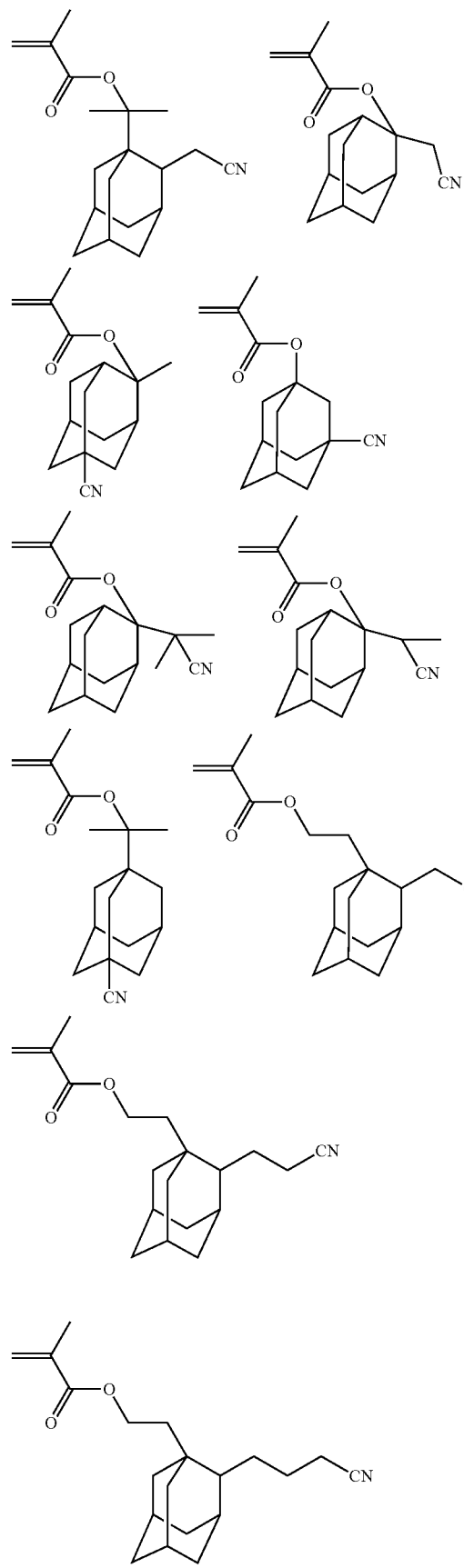

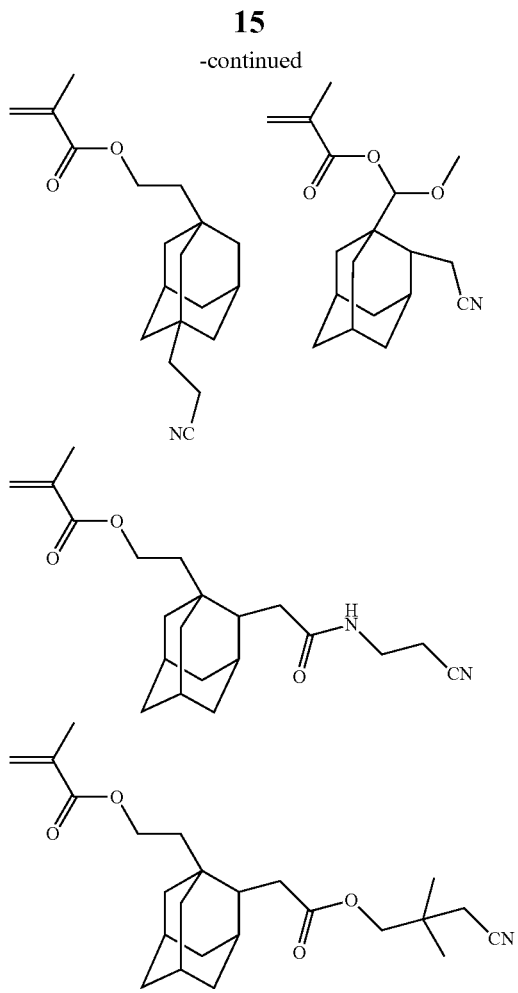

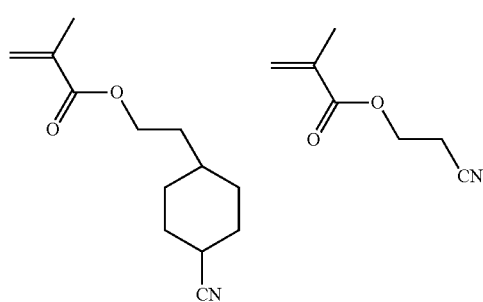

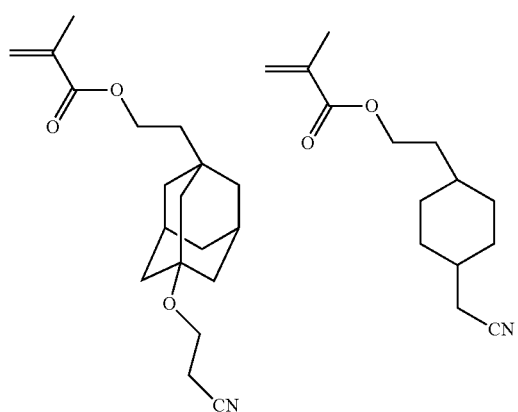

It is also preferred that the repeating unit (a) is a repeating unit represented by the following formula (Nb-01). The repeating unit represented by formula (Nb-01) preferably has no acid-decomposable group.

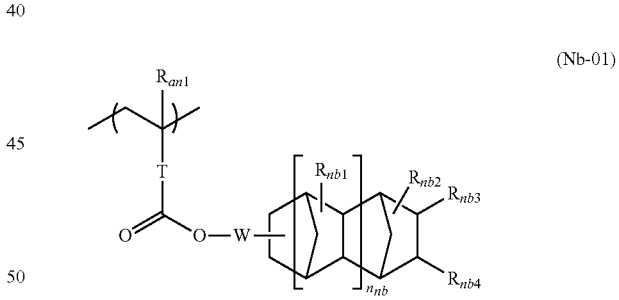

(Nb-01)

In formula (Nb-01), $R_{an1}$ represents a hydrogen atom, a methyl group which may have a substituent, or a group represented by $-CH_2-R_9$, wherein $R_9$ represents a hydroxyl group or a monovalent organic group.

W represents a single bond, an alkylene group or a cycloalkylene group.

T represents a single bond or a divalent linking group.

Each of $R_{nb1}$ and $R_{nb2}$ independently represents a hydrogen atom, a hydroxyl group, an alkyl group or a cycloalkyl group.

Each of $R_{nb3}$ and $R_{nb4}$ independently represents a hydrogen atom, an alkyl group, a cycloalkyl group or a structure represented by $-A_{an}$-CN, wherein $A_{an}$ has the same meaning as that in that formula (AN-01), provided that at least one of $R_{nb3}$ and $R_{nb4}$ is a structure represented by $-A_{an}$-CN.

$n_{nb}$ is an integer of 0 to 2. When $n_{nb}$ is 2, two of $R_{nb1}$ may be same or different, respectively.

Each of $R_{nb1}$ and $R_{nb2}$ independently represents preferably a hydrogen atom, an alkyl group or a cycloalkyl group.

Specific examples of the alkyl group and cycloalkyl group of $R_{nb1}$ to $R_{nb4}$ are the same as those for $R_{an2}$ and $R_{an3}$. Each of $R_{an1}$, W and T specifically represents the same as in formula (ANa), but preferably, both W and T represent a single bond.

$n_{nb}$ is preferably 0 or 1, more preferably 0.

Examples of the repeating unit represented by formula (Nb-01) include the repeating units derived from the monomers shown below, but the present invention is not limited thereto.

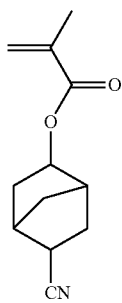
(Nb-01-01)

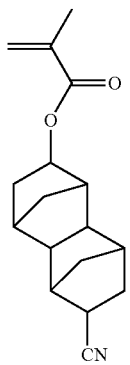
(Nb-01-02)

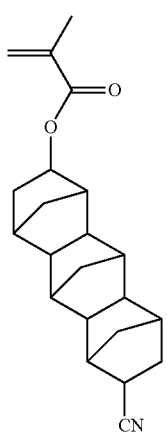
(Nb-01-03)

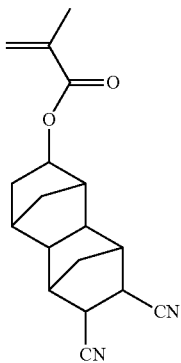
(Nb-01-04)

(Nb-01-05)

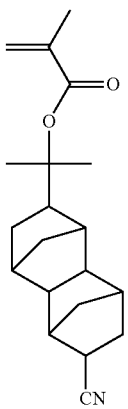
(Nb-01-06)

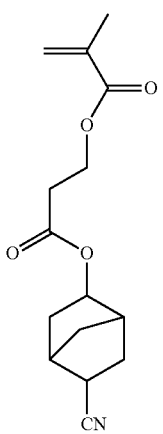
(Nb-01-07)

(Nb-01-08)

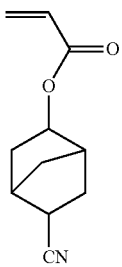

(Nb-01-09)

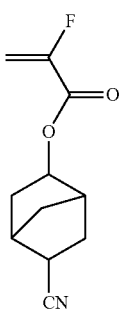

(Nb-01-10)

(Nb-01-11)

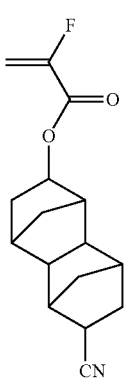

(Nb-01-12)

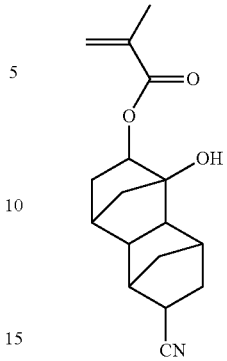

As for the repeating unit represented by formula (Nb-01), one kind of a repeating unit may be used, or a plurality of kinds of repeating units may be used in combination.

The content of the repeating unit represented by formula (Nb-01) in the resin (A) is preferably from 1 to 50 mol %, more preferably from 10 to 30 mol %, still more preferably from 10 to 20 mol %, based on all repeating units in the resin.

The monomers corresponding to the repeating unit (a) can be synthesized by the method described, for example, in JP-A-2005-258438 or JP-A-2005-281307.

As for the repeating unit (a), one kind of a repeating unit may be used, or a plurality of kinds of repeating units may be used in combination, and examples thereof include an embodiment where the resin (A) contains, as the repeating unit (a), an acid-decomposable group-containing repeating unit represented by formula (ANa) or (ANb) and a repeating unit represented by formula (Nb-01).

The content of the repeating unit (a) in the resin (A) is preferably from 5 to 70 mol %, more preferably from 10 to 50 mol %, based on all repeating units in the resin.

The resin (A) may further contain an acid-decomposable group-containing repeating unit different from the repeating unit (a) above. Such a repeating unit is preferably a repeating unit represented by the following formula (AI):

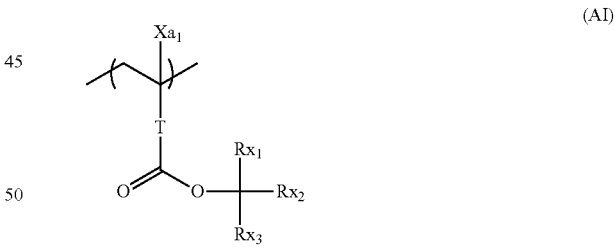

(AI)

In formula (AI), $Xa_1$ represents a hydrogen atom, a methyl group which may have a substituent, or a group represented by —$CH_2$—$R_9$. $R_9$ represents a hydroxyl group or a monovalent organic group, and examples thereof include an alkyl group having a carbon number of 5 or less and an acyl group having a carbon number of 5 or less. The monovalent organic group is preferably an alkyl group having a carbon number of 3 or less, more preferably a methyl group. $Xa_1$ is preferably a hydrogen atom, a methyl group, a trifluoromethyl group or a hydroxymethyl group.

T represents a single bond or a divalent linking group.

Each of $Rx_1$ to $Rx_3$ independently represents an alkyl group (linear or branched) or a cycloalkyl group (monocyclic or polycyclic).

Two members out of Rx$_1$ to Rx$_3$ may combine to form a cycloalkyl group (monocyclic or polycyclic).

Examples of the divalent linking group of T include an alkylene group, a —COO-Rt- group and a —O-Rt- group, wherein Rt represents an alkylene group or a cycloalkylene group.

T is preferably a single bond or a —COO-Rt- group. Rt is preferably an alkylene group having a carbon number of 1 to 5, more preferably a —CH$_2$— group, a —(CH$_2$)$_2$— group or a —(CH$_2$)$_3$— group.

The alkyl group of Rx$_1$ to Rx$_3$ is preferably an alkyl group having a carbon number of 1 to 4, such as methyl group, ethyl group, n-propyl group, isopropyl group, n-butyl group, isobutyl group and tert-butyl group.

The cycloalkyl group of Rx$_1$ to Rx$_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining two members out of Rx$_1$ to Rx$_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a monocyclic cycloalkyl group having a carbon number of 5 to 6.

An embodiment where Rx$_1$ is a methyl group or an ethyl group and Rx$_2$ and Rx$_3$ are combined to form the above-described cycloalkyl group is preferred.

Each of the groups above may have a substituent, and examples of the substituent include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). The carbon number is preferably 8 or less.

The content in total of the acid-decomposable group-containing repeating units other than the repeating unit (a) is preferably from 20 to 70 mol %, more preferably from 30 to 50 mol %, based on all repeating units in the resin.

Specific preferred examples of the acid-decomposable group-containing repeating unit other than the repeating unit (a) are set forth below, but the present invention is not limited thereto.

In specific examples, each of Rx and Xa$_1$ represents a hydrogen atom, CH$_3$, CF$_3$ or CH$_2$OH, and each of Rxa and Rxb represents an alkyl group having a carbon number of 1 to 4. Z represents a polar group other than a cyano group and when a plurality of Z's are present, these are independent of each other. Examples of the polar group other than a cyano group of Z are the same as those for R$_{10}$ in formula (2-1) described later. p represents 0 or a positive integer.

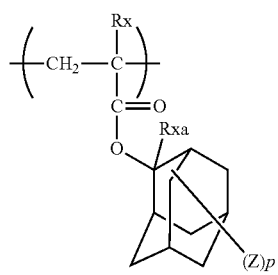

1

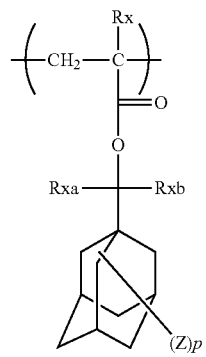

2

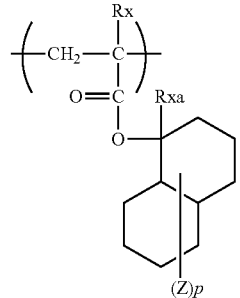

3

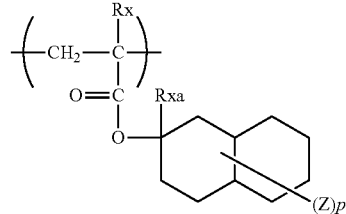

4

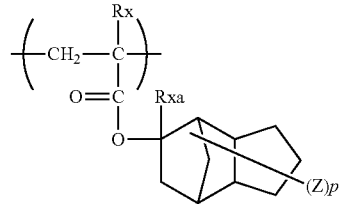

5

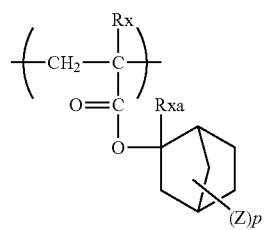

6

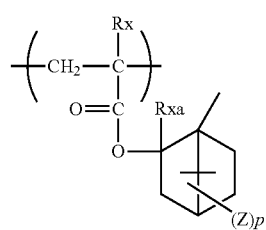

7

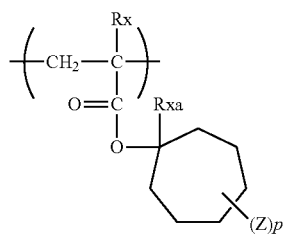
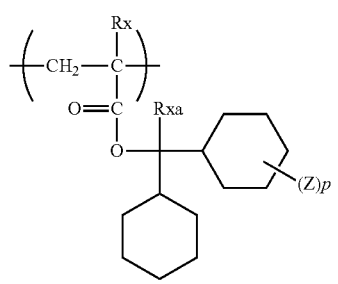
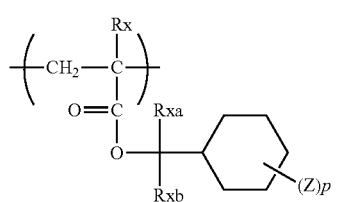
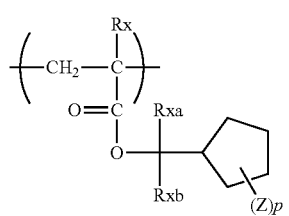
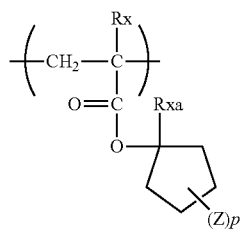
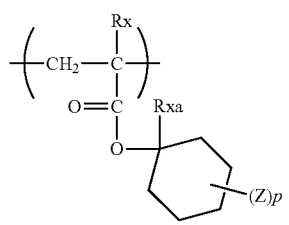
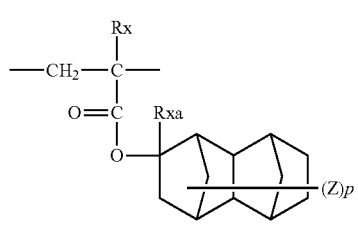
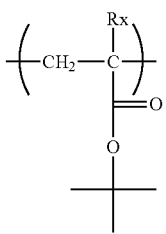
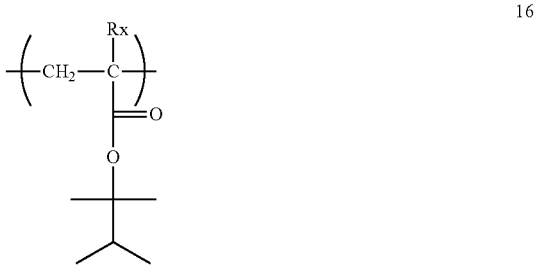
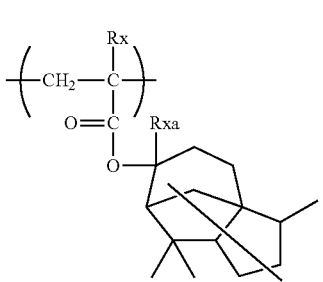
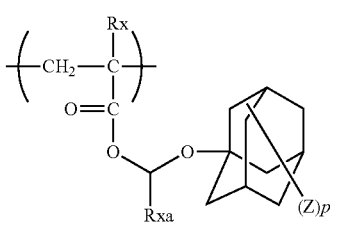
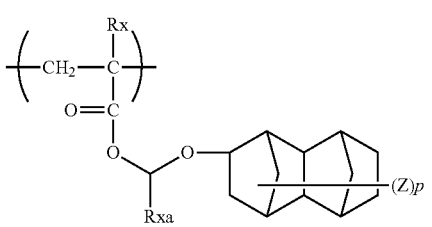
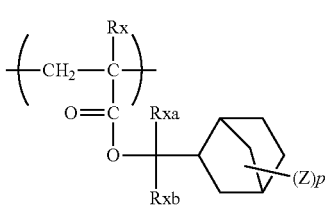

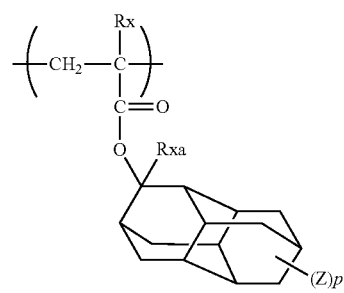
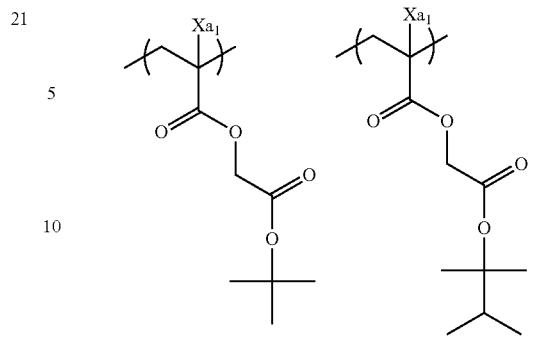
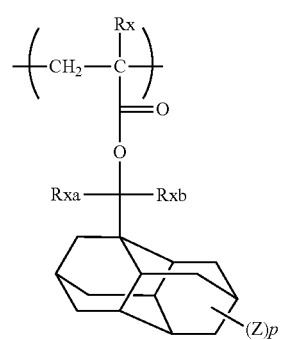
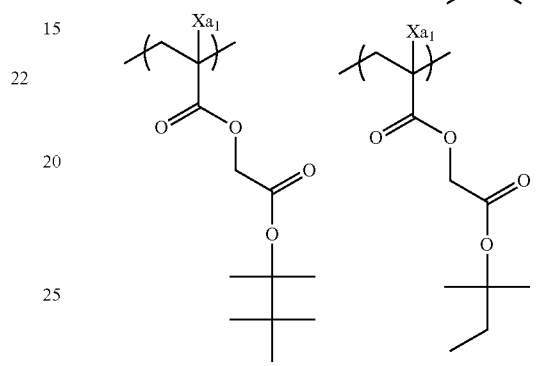
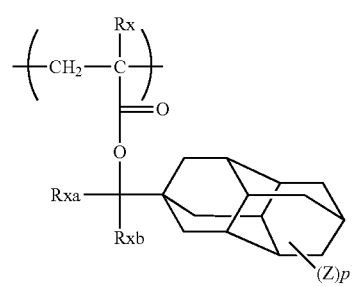
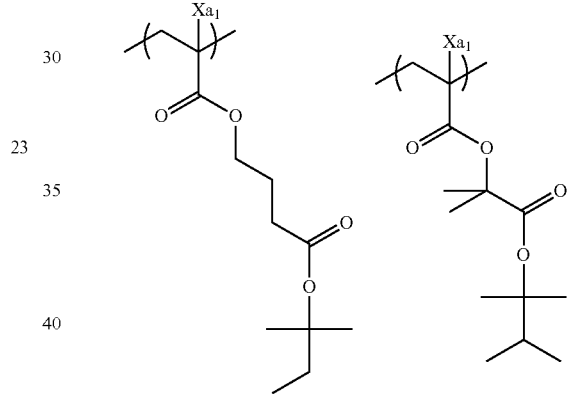
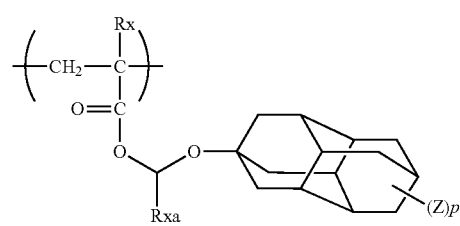
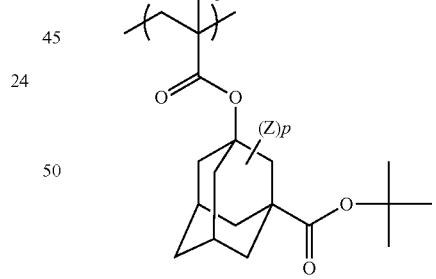
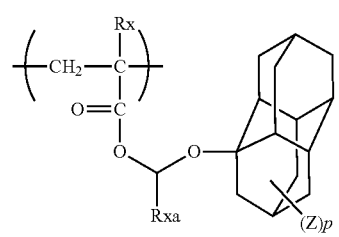
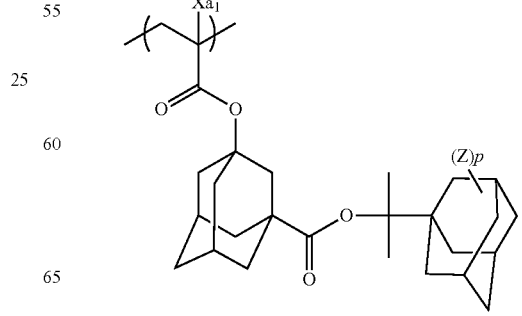

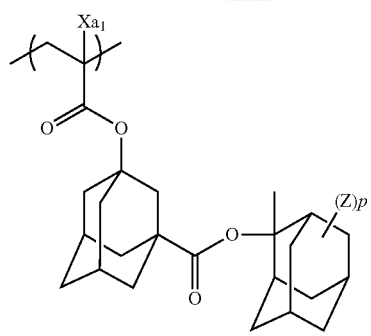
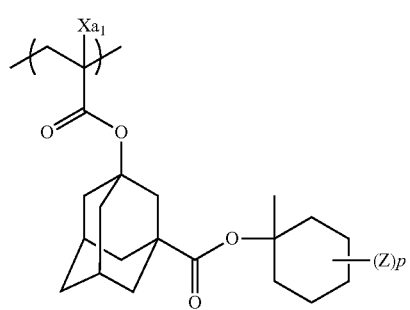
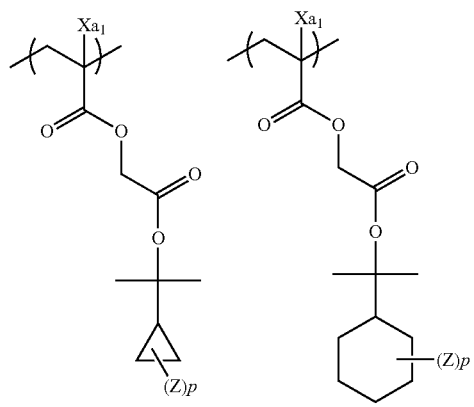
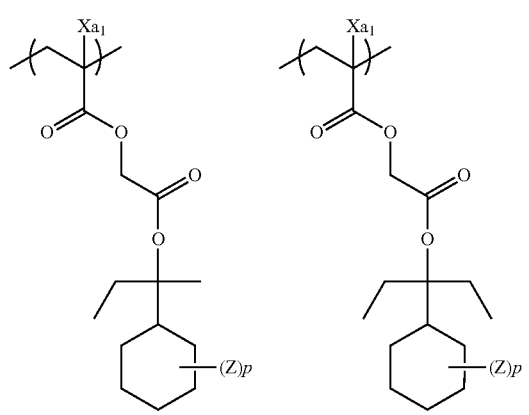
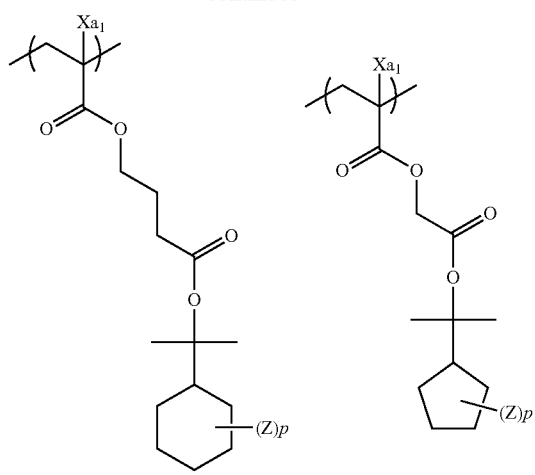
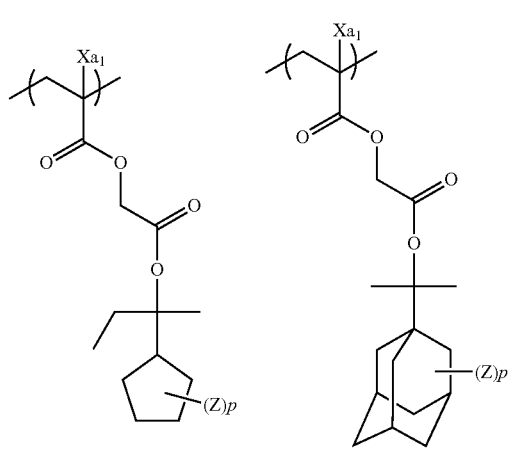
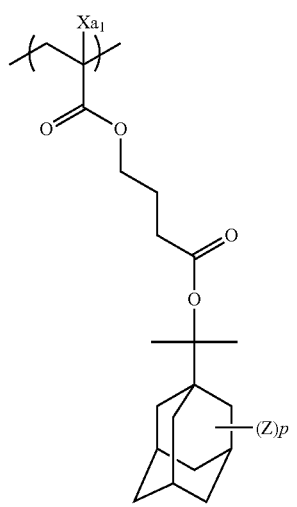

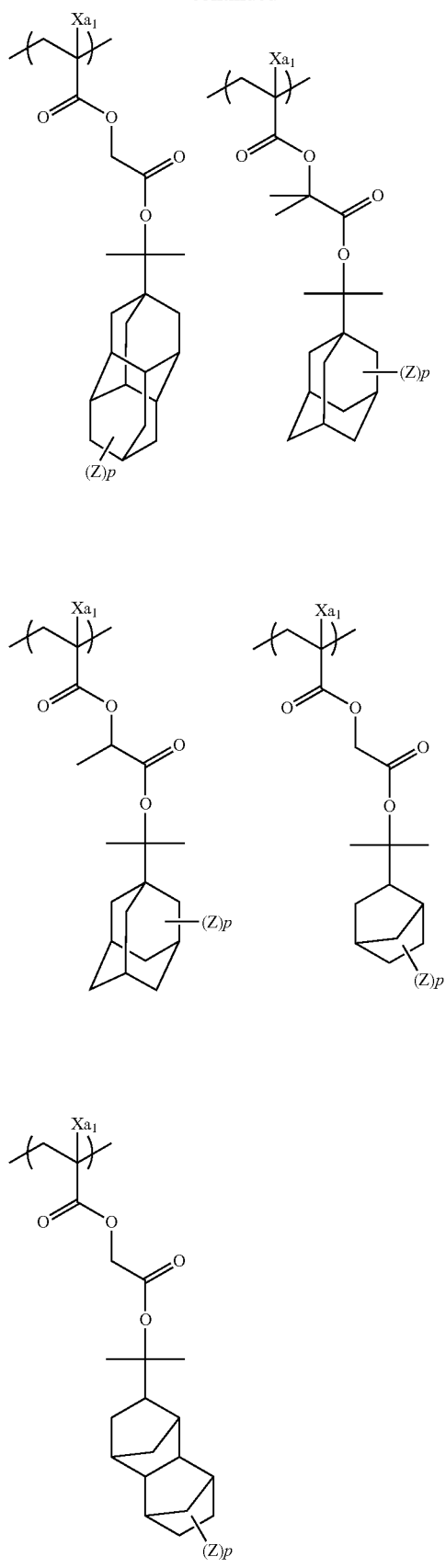
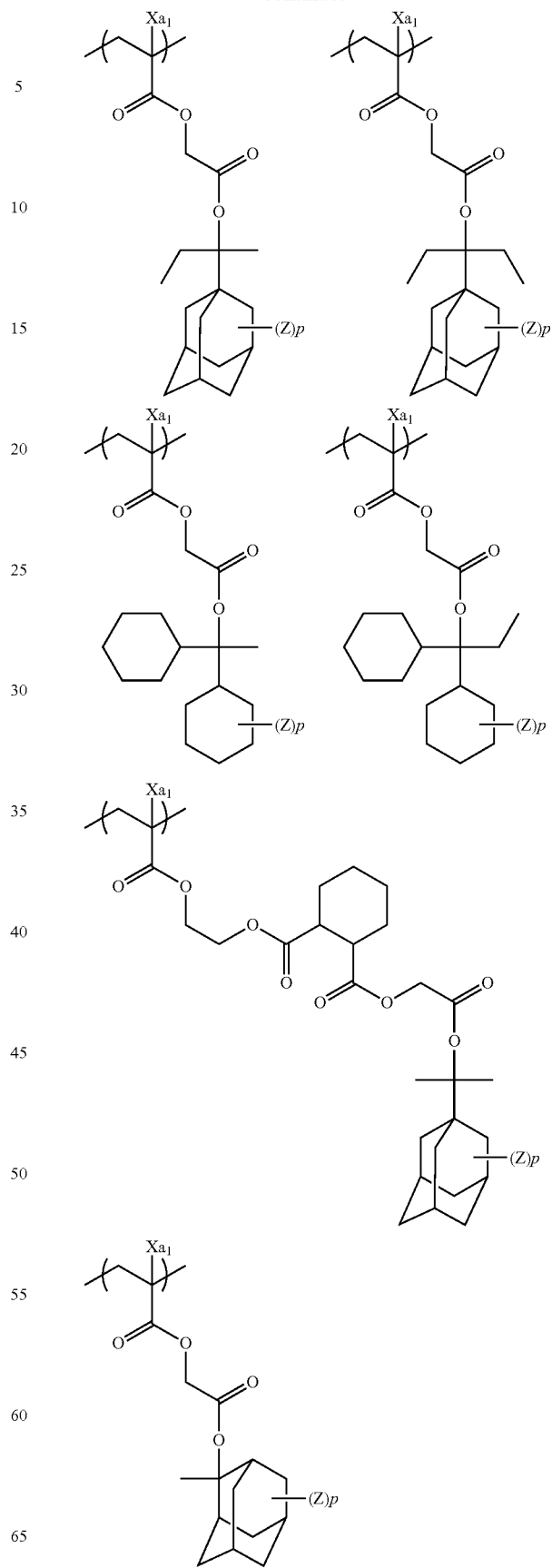

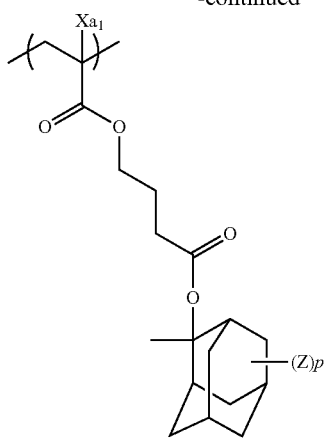
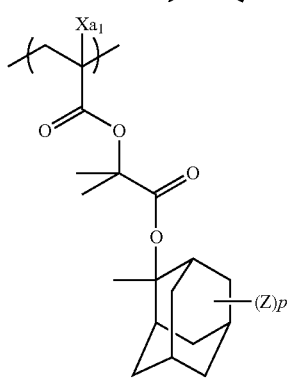
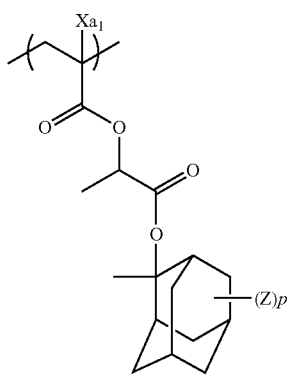
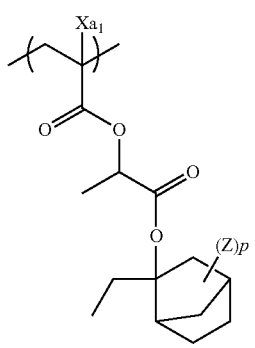
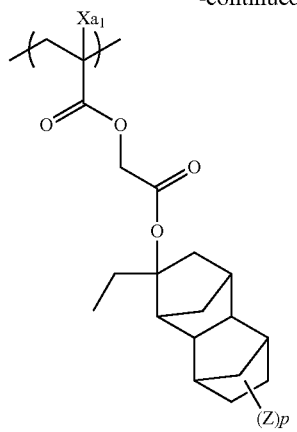
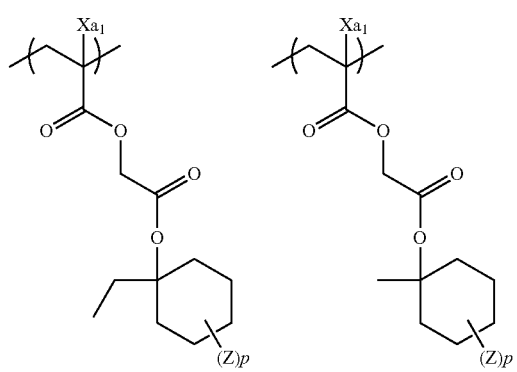
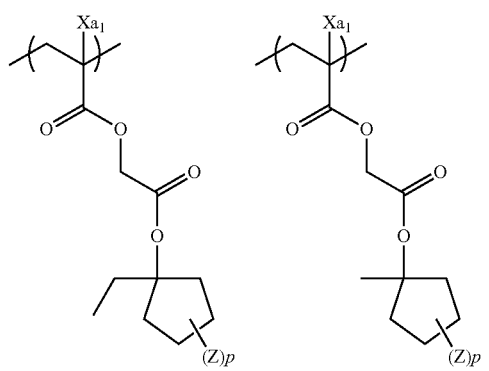
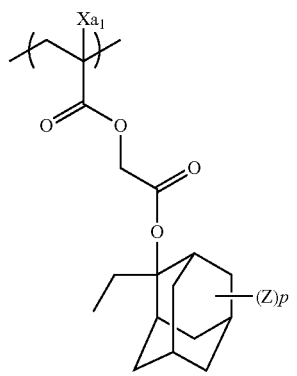

-continued

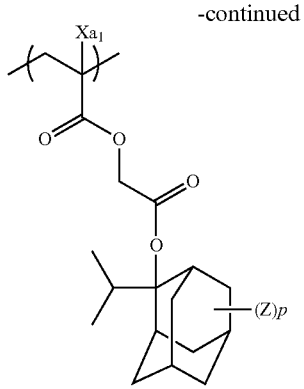

The resin (A) is more preferably a resin having, as the repeating unit represented by formula (AI), at least either a repeating unit represented by formula (1) or a repeating unit represented by formula (2).

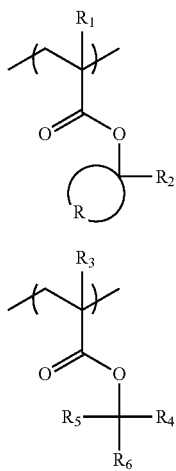

In formulae (1) and (2), each of $R_1$ and $R_3$ independently represents a hydrogen atom, a methyl group which may have a substituent, or a group represented by —$CH_2$—$R_9$. $R_9$ represents a monovalent organic group.

Each of $R_2$, $R_4$, $R_5$ and $R_6$ independently represents an alkyl group or a cycloalkyl group.

R represents an atomic group necessary for forming an alicyclic structure together with the carbon atom.

$R_1$ is preferably a hydrogen atom, a methyl group, a trifluoromethyl group or a hydroxymethyl group.

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having a carbon number of 1 to 10, still more preferably an alkyl group having a carbon number of 1 to 5, and examples thereof include a methyl group and an ethyl group.

Examples of the substituent which the alkyl group of $R_2$ may further have include an aryl group (e.g., a phenyl group, a naphthyl group), an aralkyl group, a hydroxyl group, an alkoxy group (e.g., a methoxy group, an ethoxy group, a butoxy group, an octyloxy group, a dodecyloxy group), an acyl group (e.g., an acetyl group, a propanoyl group, a benzoyl group) and an oxo group, and the carbon number of the substituent is preferably 15 or less.

Examples of the substituent which the cycloalkyl group of $R_2$ may further have include an alkyl group (e.g., a methyl group, an ethyl group, a propyl group, an isopropyl group, a butyl group, a tert-butyl group, a hexyl group) and groups described above as the substituent which the alkyl group of $R_2$ may further have, and the carbon number of the substituent is preferably 15 or less.

The alicyclic structure formed by R is preferably a monocyclic alicyclic structure, and the carbon number thereof is preferably from 3 to 7, more preferably 5 or 6.

$R_3$ is preferably a hydrogen atom or a methyl group, more preferably a methyl group.

The alkyl group in $R_4$, $R_5$ and $R_6$ may be linear or branched and may have a substituent. The alkyl group is preferably an alkyl group having a carbon number of 1 to 4, such as methyl group, ethyl group, n-propyl group, isopropyl group, n-butyl group, isobutyl group and tert-butyl group.

The cycloalkyl group in $R_4$, $R_5$ and $R_6$ may be monocyclic or polycyclic and may have a substituent. The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

Specific examples and preferred examples of the monovalent organic group in $R_9$ are the same as those described above for $R_9$ of formula (AI).

The repeating unit represented by formula (1) includes, for example, a repeating unit represented by the following formula (1-a):

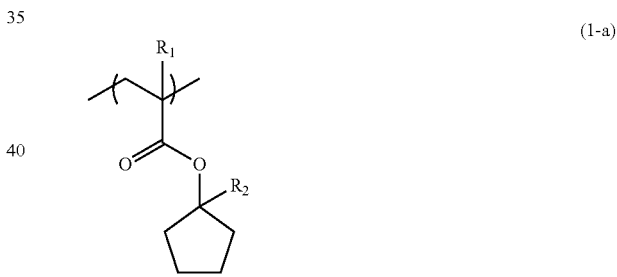

In the formula, $R_1$ and $R_2$ have the same meanings as those in formula (1).

The repeating unit represented by formula (2) is preferably a repeating unit represented by the following formula (2-1):

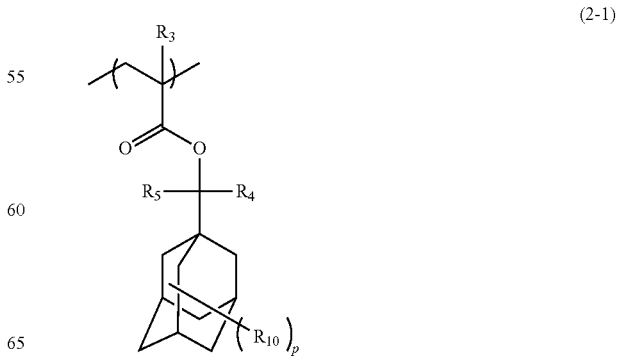

In formula (2-1), $R_3$ to $R_5$ have the same meanings as those in formula (2).

$R_{10}$ represents a substituent containing a polar group other than a cyano group. In the case where a plurality of $R_{10}$'s are present, each $R_{10}$ may be the same as or different from every other $R_{10}$. Examples of the substituent containing a polar group other than a cyano group include a polar group itself, such as hydroxyl group, amino group, alkylamide group and sulfonamide group, and a linear or branched alkyl or cycloalkyl group containing such a polar group. The substituent is preferably an alkyl group having a hydroxyl group, more preferably a branched alkyl group having a hydroxyl group, still more preferably an alkyl group (preferably having a carbon number of 3 to 5) having a hydroxyl group substituted on a tertiary carbon atom, yet still more preferably —$C(CH_3)_2OH$. The branched alkyl group is preferably an isopropyl group.

p represents an integer of 0 to 15. p is preferably an integer of 0 to 2, more preferably 0 or 1.

The acid-decomposable resin (A) is preferably a resin containing, as the repeating unit represented by formula (AI), a repeating unit represented by formula (1) and a repeating unit represented by formula (2). In another embodiment, the resin is preferably a resin containing, as the repeating unit represented by formula (AI), at least two kinds of repeating units represented by formula (1).

In the case where the resin (A) uses repeating units having an acid-decomposable group in combination, preferred examples of the combination are set forth below. In the formulae below, each R independently represents a hydrogen atom or a methyl group.

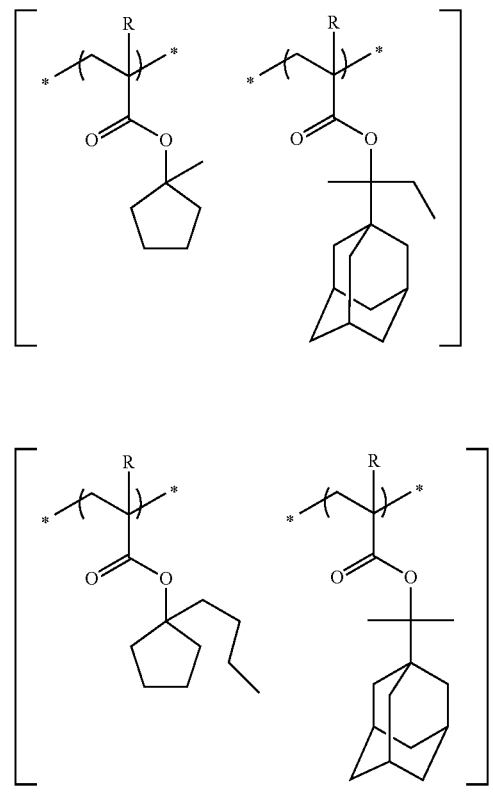

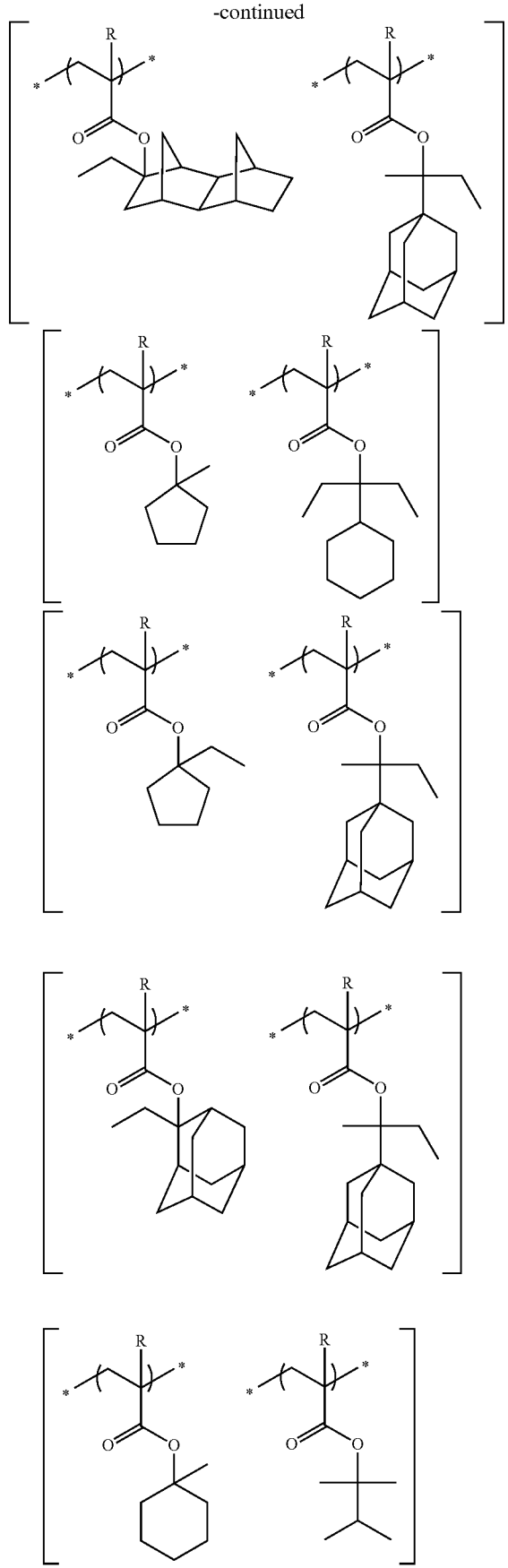

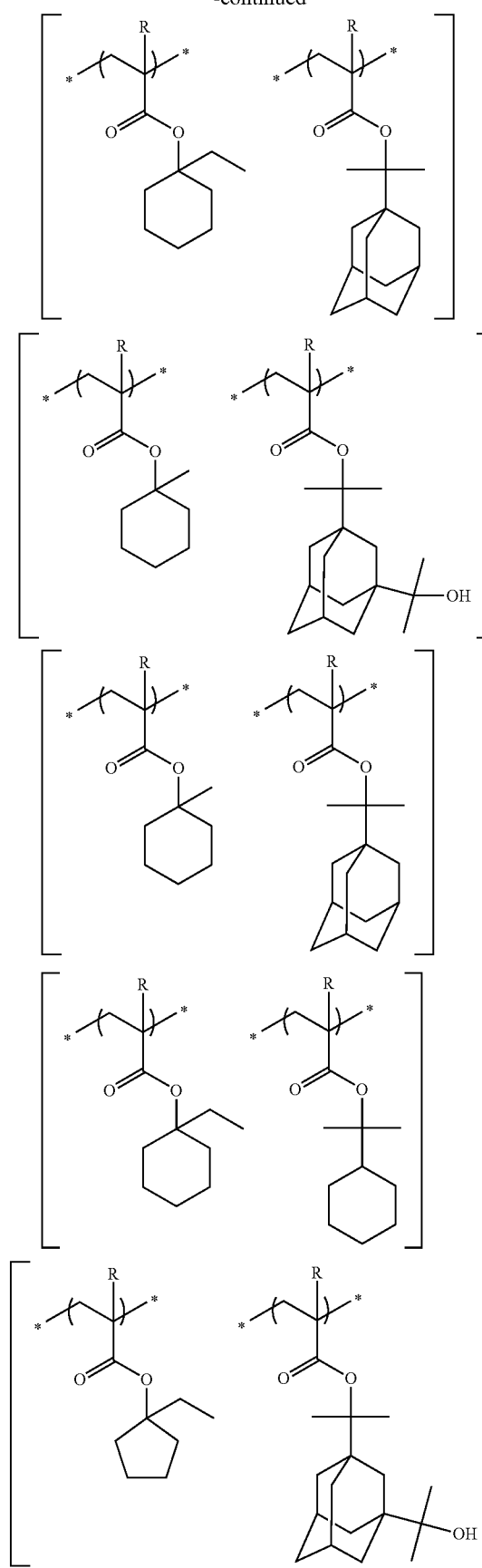
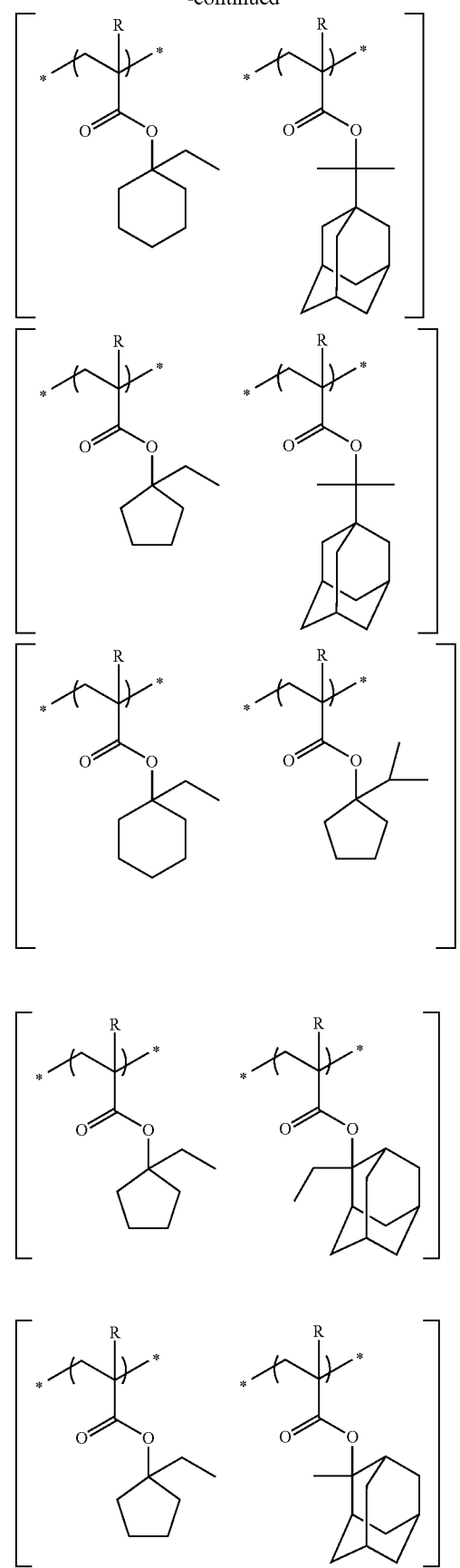

-continued

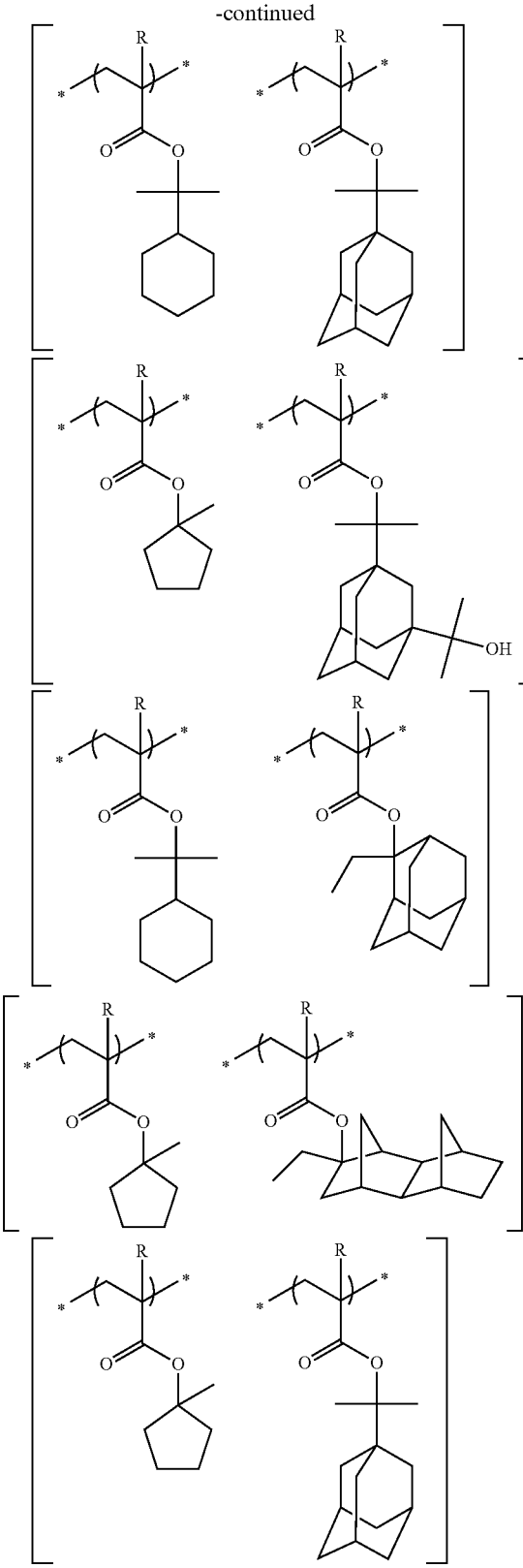

The resin (A) preferably further contains a repeating unit having a lactone group.

As for the lactone group, any group may be used as long as it has a lactone structure, but the lactone structure is prefer- ably a 5- to 7-membered ring lactone structure, and a structure where another ring structure is condensed to a 5- to 7-membered ring lactone structure in the form of forming a bicyclo or spiro structure is preferred. The resin more preferably contains a repeating unit having a lactone structure represented by any one of the following formulae (LC1-1) to (LC1-17). The lactone structure may be bonded directly to the main chain. Among these lactone structures, preferred are (LC1-1), (LC1-4), (LC1-5), (LC1-6), (LC1-13), (LC1-14) and (LC1-17). By selecting a specific lactone structure, LWR and development defect are improved.

LC1-1
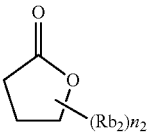

LC1-2
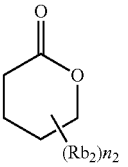

LC1-3
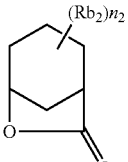

LC1-4
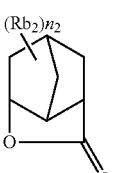

LC1-5
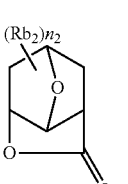

LC1-6
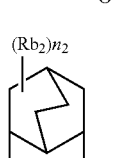

LC1-7
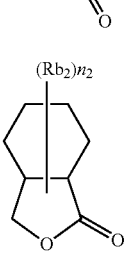

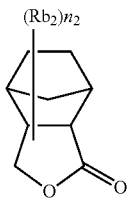
LC1-8

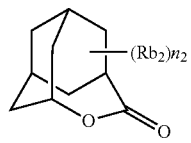
LC1-16

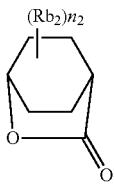
LC1-9

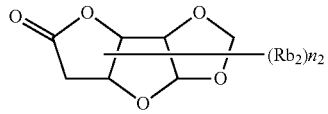
LC1-17

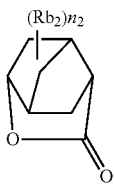
LC1-10

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, each substituent ($Rb_2$) may be the same as or different from every other substituents ($Rb_2$) and also, each substituent ($Rb_2$) may combine with every other substituents ($Rb_2$) to form a ring.

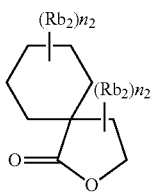
LC1-11

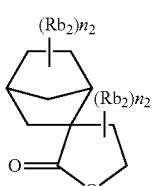
LC1-12

The repeating unit having a lactone structure is preferably a repeating unit represented by the following formula (AII):

(AII)

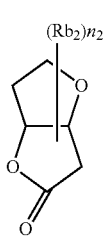
LC1-13

In formula (AII), $Rb_0$ represents a hydrogen atom, a halogen atom or an alkyl group having a carbon number of 1 to 4. Preferred examples of the substituent which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

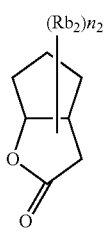
LC1-14

Ab represents a single bond, an alkylene group, a divalent linking group having a monocyclic or polycyclic alicyclic hydrocarbon structure, an ether bond, an ester bond, a carbonyl group, or a divalent linking group formed by combining these, and is preferably a single bond or a divalent linking group represented by -$Ab_1CO_2$—.

LC1-15

$Ab_1$ represents a linear or branched alkylene group or a monocyclic or polycyclic cycloalkylene group and is preferably a methylene group, an ethylene group, a cyclohexylene group, an adamantylene group or a norbornylene group.

V represents a group having a lactone structure and specifically includes, for example, a group having a structure represented by any one of formulae (LC1-1) to (LC1-17).

Specific examples of the repeating unit having a lactone structure are set forth below, but the present invention is not limited thereto.
(In the formulae, Rx represents H, CH$_3$, CH$_2$OH or CF$_3$.)
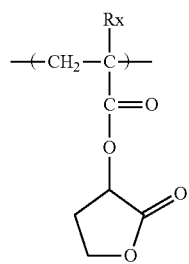
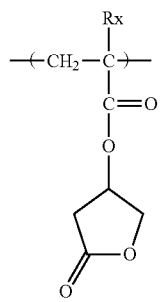
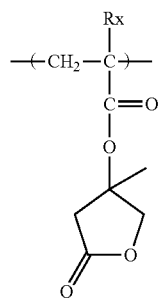
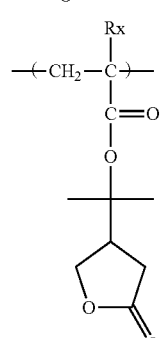
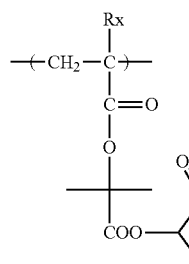
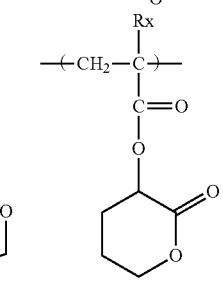
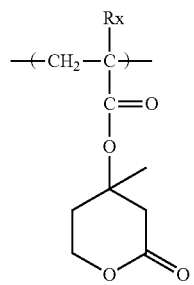
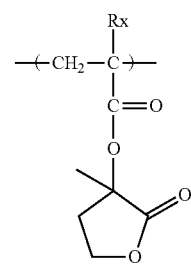
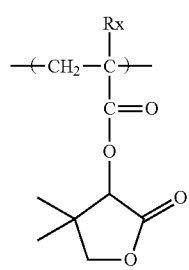
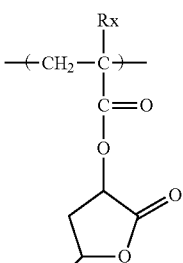
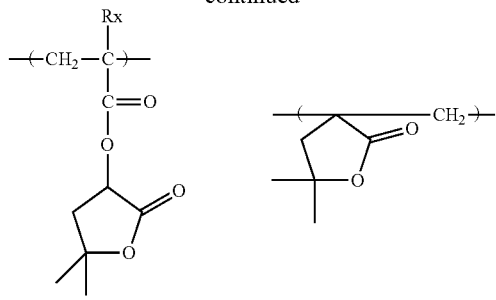
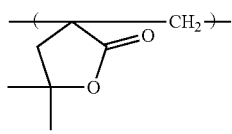
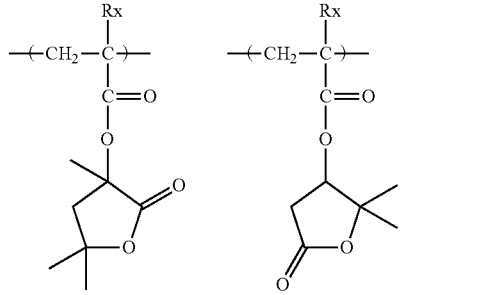
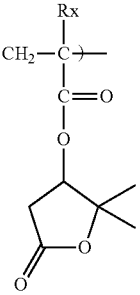
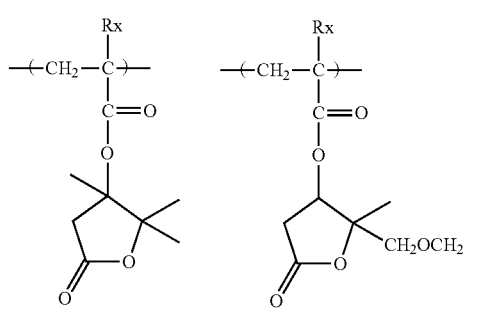
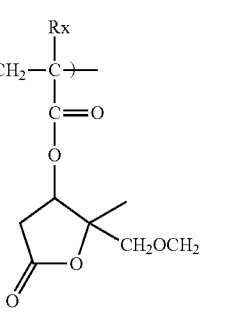
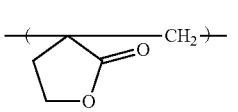
(In the formulae, Rx represents H, CH$_3$, CH$_2$OH or CF$_3$.)
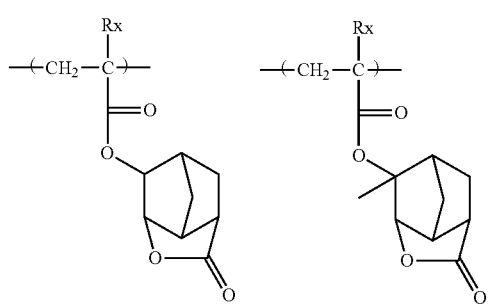
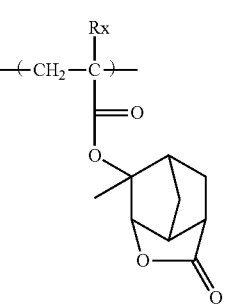

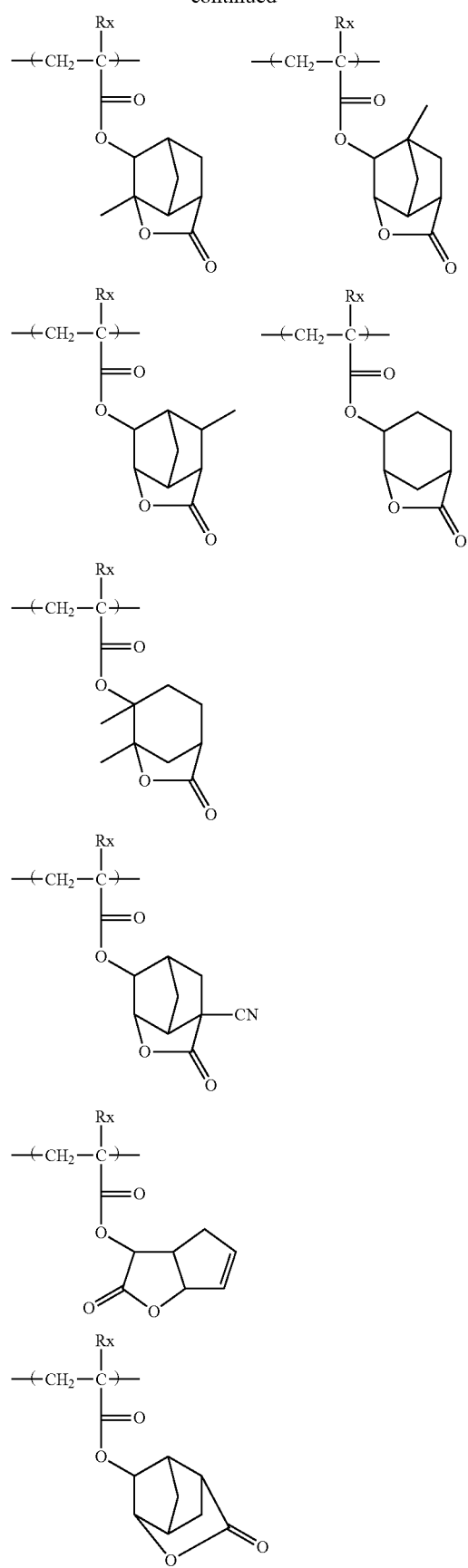
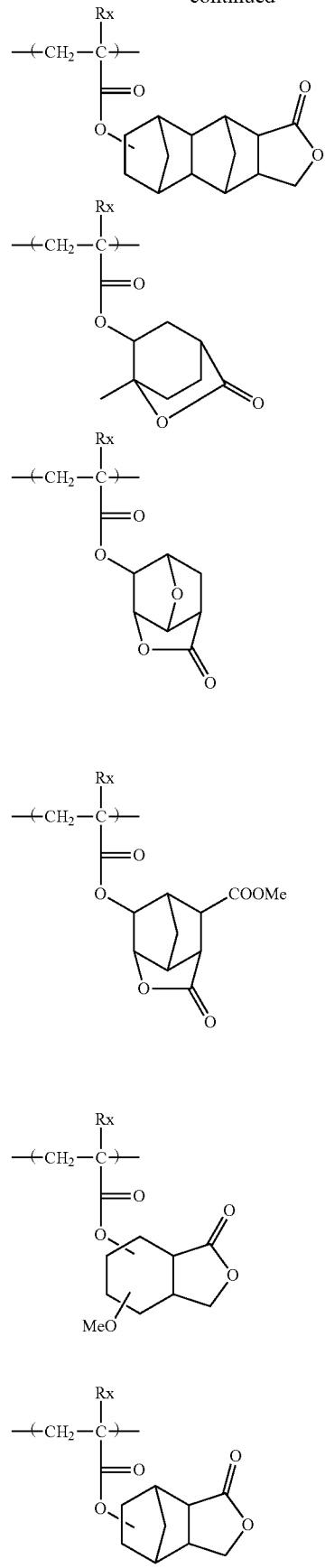

47
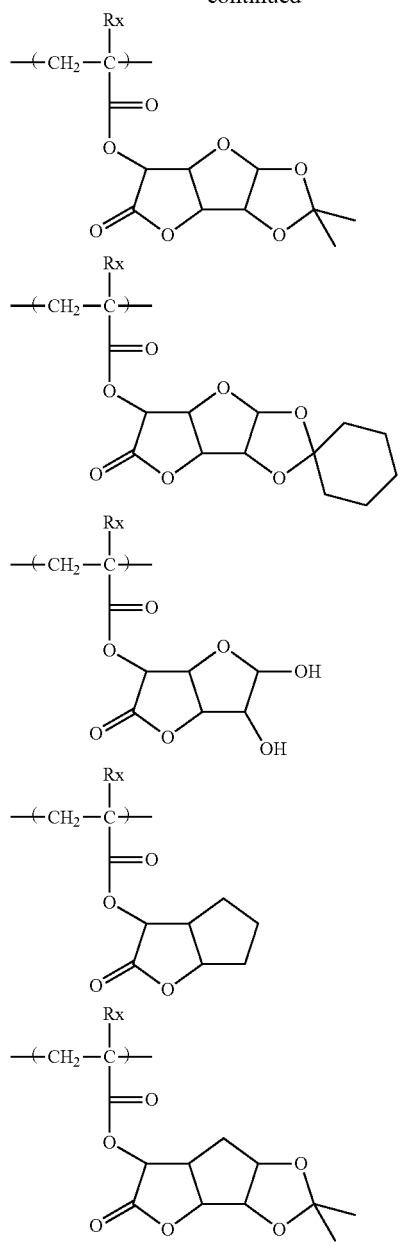
48
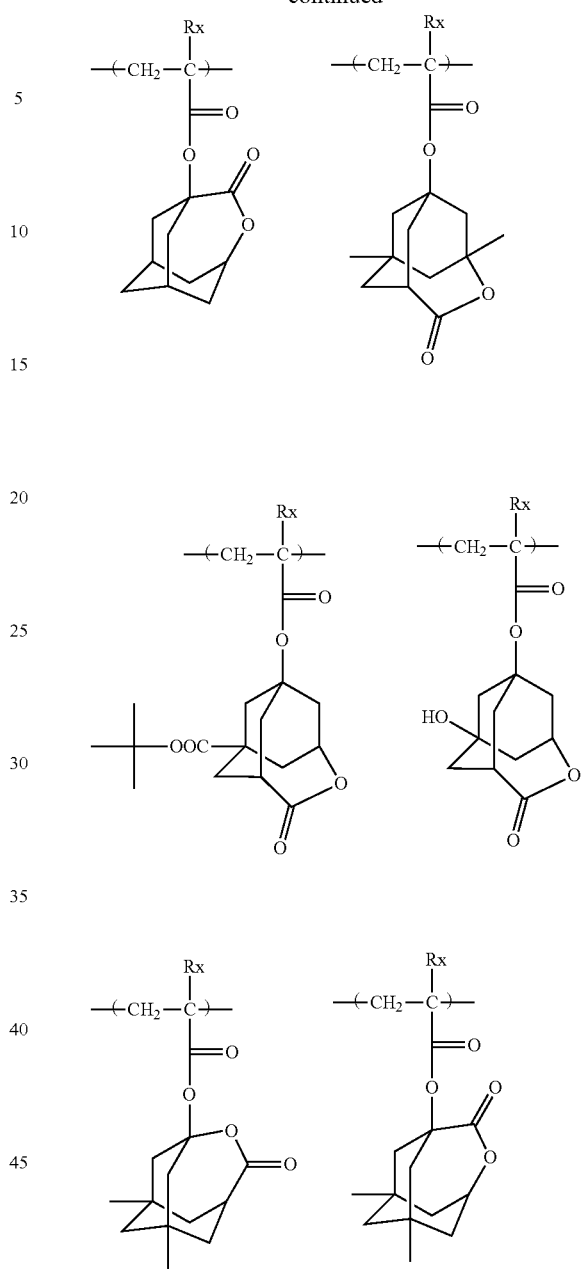
(In the formulae, Rx represents H, CH$_3$, CH$_2$OH or CF$_3$.)
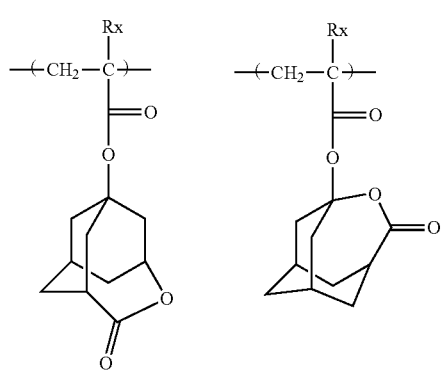
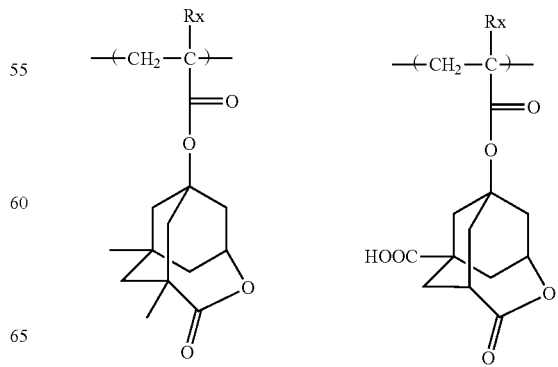

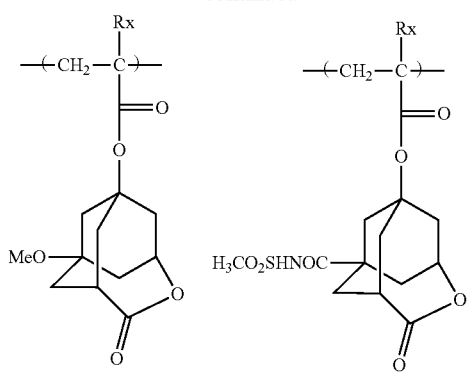

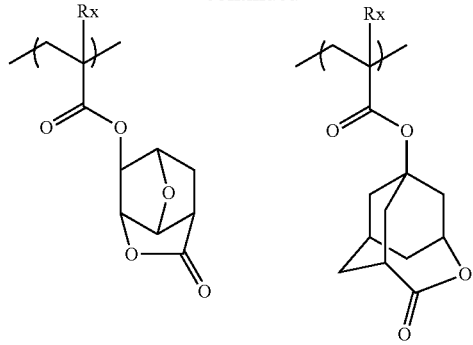

Out of the units represented by formula (AII), when Ab is a single bond, the repeating unit having a particularly preferred lactone group includes the repeating units shown below. In specific examples, Rx represents H, CH$_3$, CH$_2$OH or CF$_3$. By selecting an optimal lactone group, the pattern profile and the iso/dense bias are improved.

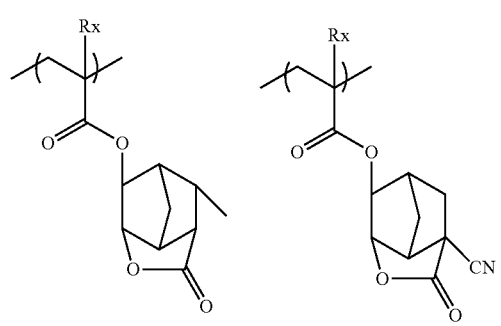

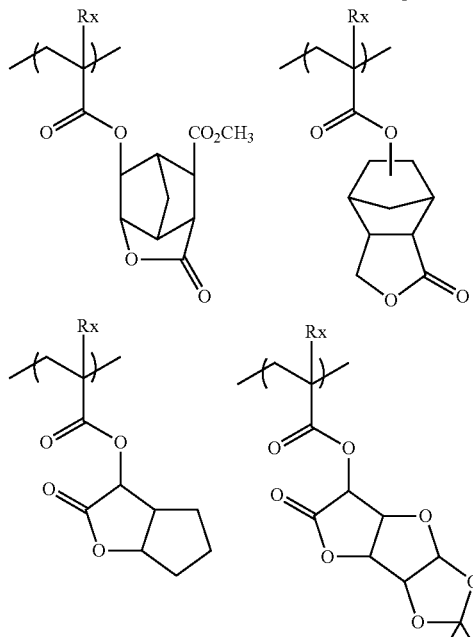

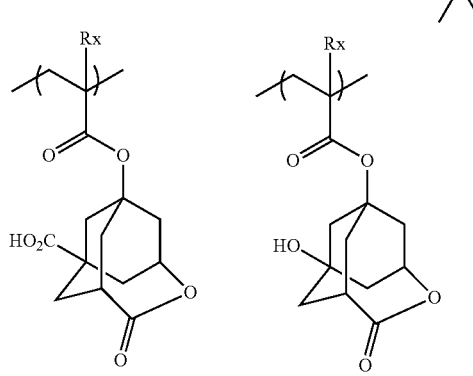

The resin (A) preferably contains a lactone structure-containing repeating unit represented by the following formula (3):

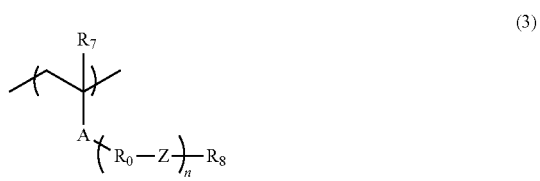

(3)

In formula (3), A represents an ester bond (a group represented by —COO—) or an amide bond (a group represented by —CONH—).

$R_0$ represents, when a plurality of $R_0$'s are present, each independently represents, an alkylene group, a cycloalkylene group or a combination thereof.

Z represents, when a plurality of Z's are present, each independently represents, an ether bond, an ester bond, an amide bond, a urethane bond (a group represented by

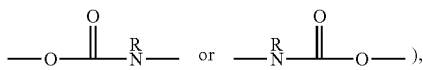

or a urea bond (a group represented by

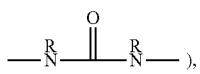

wherein R represents a hydrogen atom, an alkyl group, a cycloalkyl group or an aryl group.

$R_8$ represents a monovalent organic group having a lactone structure.

n is a repetition number of the structure represented by —$R_0$—Z— and represents an integer of 1 to 5. n is preferably 1.

$R_7$ represents a hydrogen atom, a halogen atom or an alkyl group.

The alkylene group and cycloalkylene group of $R_0$ may have a substituent.

Z is preferably an ether bond or an ester bond, more preferably an ester bond.

The alkyl group of $R_7$ is preferably an alkyl group having a carbon number of 1 to 4, more preferably a methyl group or an ethyl group, still more preferably a methyl group. The alkyl group in $R_7$ may be substituted, and examples of the substituent include a halogen atom such as fluorine atom, chlorine atom and bromine atom, a mercapto group, a hydroxyl group, an alkoxy group such as methoxy group, ethoxy group, isopropoxy group, tert-butoxy group and benzyloxy group, and an acetoxy group such as acetyl group and propionyl group. $R_7$ is preferably a hydrogen atom, a methyl group, a trifluoromethyl group or a hydroxymethyl group.

The chain alkylene group in $R_0$ is preferably a chain alkylene group having a carbon number of 1 to 10, more preferably a carbon number of 1 to 5, and examples thereof include a methylene group, an ethylene group and a propylene group. The cycloalkylene group is preferably a cycloalkylene group having a carbon number of 3 to 20, and examples thereof include a cyclohexylene group, a cyclopentylene group, a norbornylene group and an adamantylene group. For bringing out the effects of the present invention, a chain alkylene group is more preferred, and a methylene group is still more preferred.

The organic group having a lactone structure represented by $R_8$ is not limited as long as it has a lactone structure. Specific examples thereof include lactone structures represented by formulae (LC1-1) to (LC1-17) and of these, a structure represented by (LC1-4) is preferred. Structures where $n_2$ in (LC1-1) to (LC1-17) is an integer of 2 or less are more preferred.

$R_8$ is preferably a monovalent organic group having an unsubstituted lactone structure or a monovalent organic group containing a lactone structure having a methyl group, a cyano group or an alkoxycarbonyl group as the substituent, more preferably a monovalent organic group containing a lactone structure having a cyano group as the substituent (cyanolactone).

Specific examples of the lactone structure-containing repeating unit represented by formula (3) are set forth below, but the present invention is not limited thereto.

In specific examples, R represents a hydrogen atom, an alkyl group which may have an alkyl group, or a halogen atom, preferably a hydrogen atom, a methyl group, a hydroxymethyl group or an acetoxymethyl group.

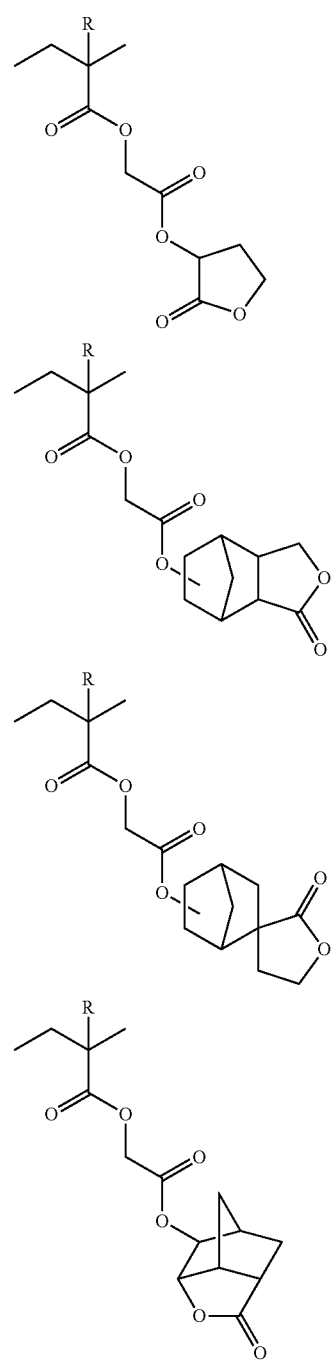

The lactone structure-containing repeating unit is more preferably a repeating unit represented by the following formula (3-1):

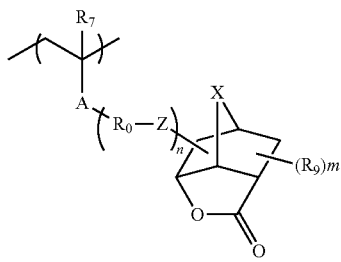

(3-1)

In formula (3-1), $R_7$, A, $R_0$, Z and n have the same meanings as those in formula (3).

$R_9$ represents, when a plurality of $R_9$'s are present, each independently represents, an alkyl group, a cycloalkyl group, an alkoxycarbonyl group, a cyano group, a hydroxyl group or an alkoxy group, and when a plurality of $R_9$'s are present, two members thereof may combine to form a ring.

X represents an alkylene group, an oxygen atom or a sulfur atom.

m is the number of substituents and represents an integer of 0 to 5. m is preferably 0 or 1.

The alkyl group of $R_9$ is preferably an alkyl group having a carbon number of 1 to 4, more preferably a methyl group or an ethyl group, and most preferably a methyl group. The cycloalkyl group includes a cyclopropyl group, a cyclobutyl group, a cyclopentyl group and a cyclohexyl group. The alkoxycarbonyl group is preferably an alkoxycarbonyl group having a carbon number of 2 to 5, and examples thereof include a methoxycarbonyl group, an ethoxycarbonyl group, an n-butoxycarbonyl group and a tert-butoxycarbonyl group. The alkoxy group is preferably an alkoxy group having a carbon number of 1 to 4, and examples thereof include a methoxy group, an ethoxy group, a propoxy group, an isopropoxy group and a butoxy group. These groups may have a substituent, and the substituent includes a hydroxy group, an alkoxy group such as methoxy group and ethoxy group, a cyano group, and a halogen atom such as fluorine atom.

$R_9$ is preferably a methyl group, a cyano group or an alkoxycarbonyl group, more preferably a cyano group.

Examples of the alkylene group of X include a methylene group and an ethylene group. X is preferably an oxygen atom or a methylene group, more preferably a methylene group.

When m is 1, at least one $R_9$ is preferably substituted at the α-position or β-position, more preferably at the α-position, of the carbonyl group of lactone.

Specific examples of the repeating unit having a lactone structure-containing group represented by formula (3-1) are set forth below, but the present invention is not limited thereto. In the formulae, R represents a hydrogen atom, an alkyl group which may have a substituent, or a halogen atom, preferably a hydrogen atom, a methyl group, a hydroxymethyl group or an acetoxymethyl group.

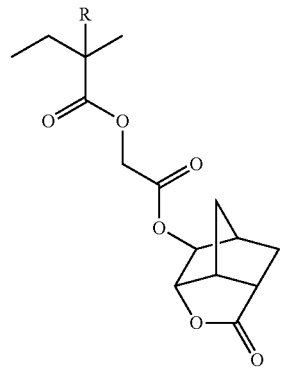

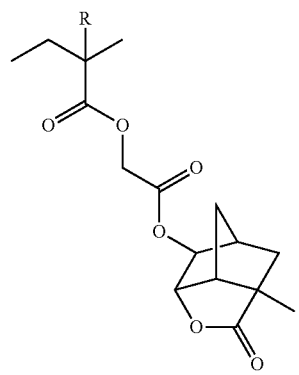

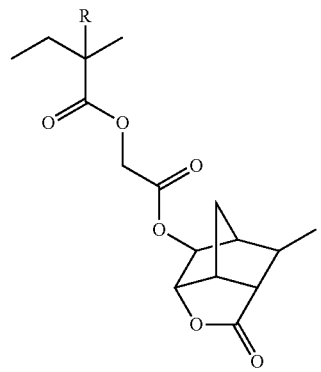

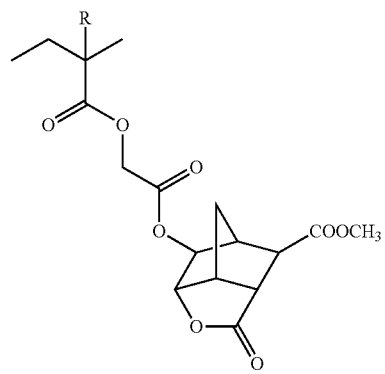

-continued
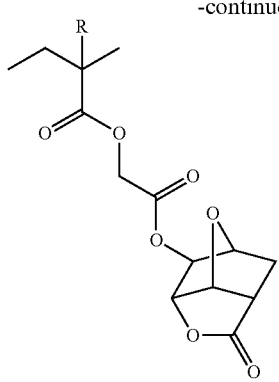
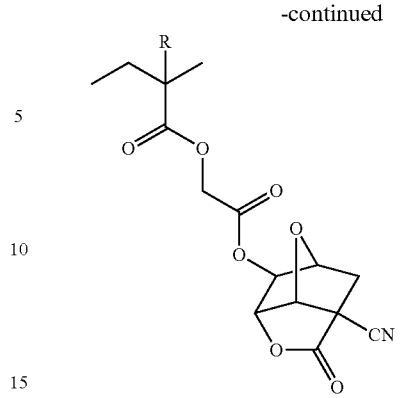
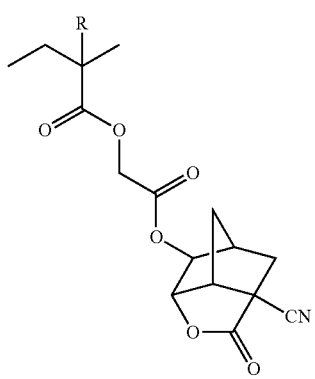
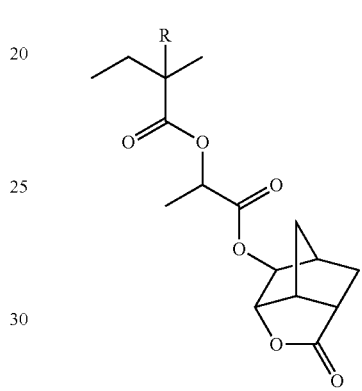
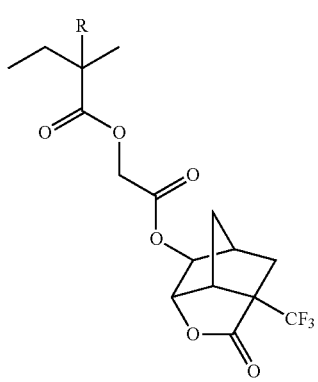
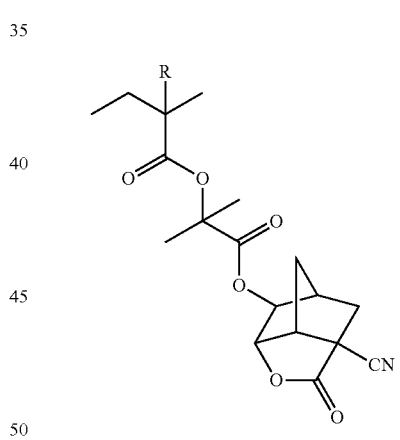
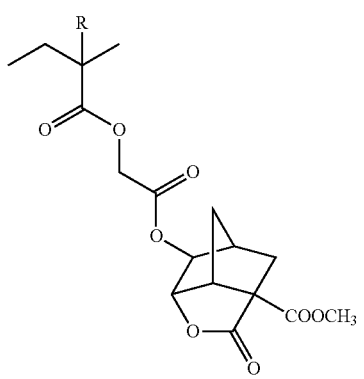
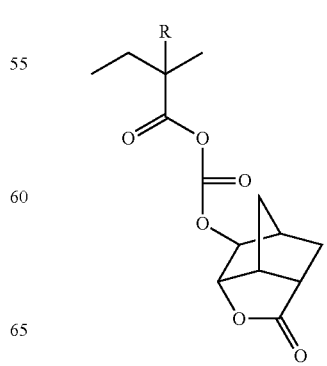

57
-continued
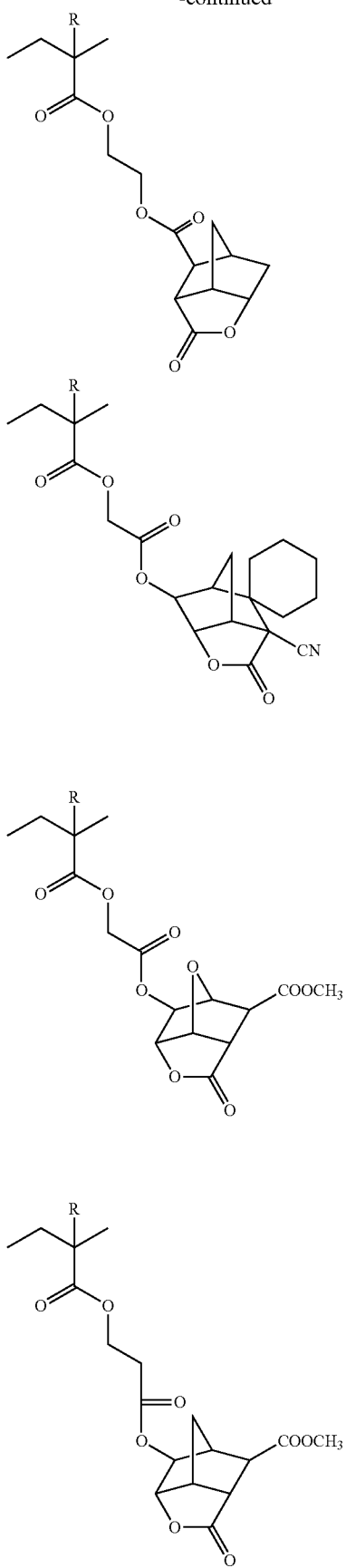
58
-continued
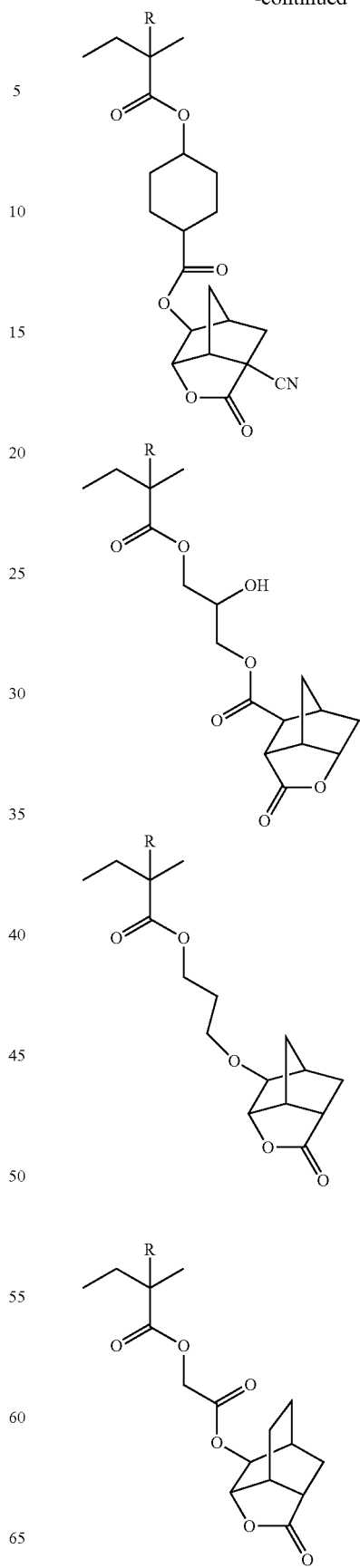

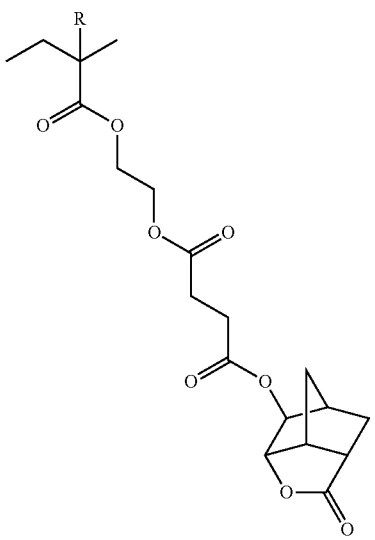

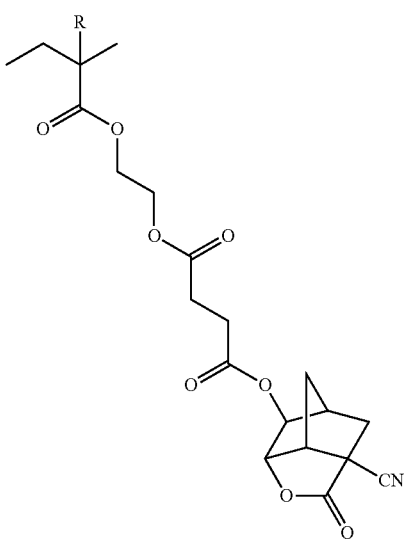

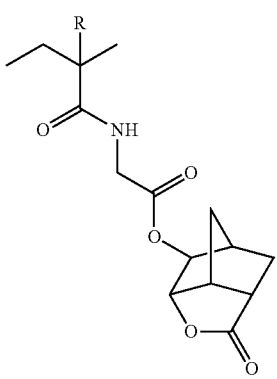

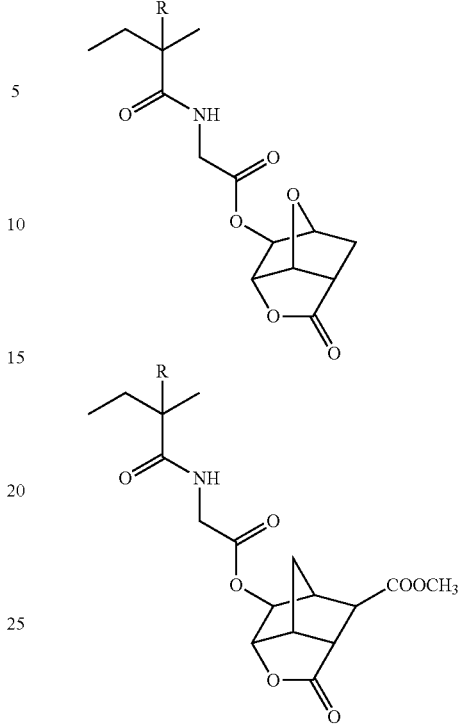

The repeating unit having a lactone group usually has an optical isomer, but any optical isomer may be used. One optical isomer may be used alone or a mixture of a plurality of optical isomers may be used. In the case of mainly using one optical isomer, the optical purity (ee) thereof is preferably 90% or more, more preferably 95% or more.

The content of the repeating unit having a lactone group is, when a plurality of kinds of lactone group-containing repeating units are contained, in total, preferably from 15 to 60 mol %, more preferably from 20 to 50 mol %, still more preferably from 30 to 50 mol %, based on all repeating units in the resin.

Two or more kinds of lactone structure-containing repeating units selected from formula (3) may also be used in combination for raising the effects of the present invention. When used in combination, two or more kinds of lactone structure-containing repeating units where n is 1 out of formula (3) are preferably selected and used in combination. It is also preferred to use in combination a lactone repeating unit where Ab in formula (AII) is a single bond and a lactone repeating unit where n is 1 out of formula (3).

The resin (A) preferably further contains a repeating unit having a hydroxyl group, in addition to the repeating unit (a) and the lactone structure-containing repeating unit. Thanks to this repeating unit, the adherence to substrate and the affinity for developer are enhanced. The repeating unit having a hydroxyl group is preferably a repeating unit having an alicyclic hydrocarbon structure substituted by a hydroxyl group and preferably contains no acid-decomposable group. The alicyclic hydrocarbon structure in the alicyclic hydrocarbon structure substituted by a hydroxyl group is preferably an adamantyl group, a diamantyl group or a norbornyl group. Preferred examples of the alicyclic hydrocarbon structure substituted by a hydroxyl group include a monohydroxyadamantyl group, a dihydroxyadamantyl group, a monohydroxydiamantyl group and a dihydroxydiamantyl group.

The repeating unit having the above-described atomic group includes repeating units represented by the following formulae (AIIa) to (AIIc):

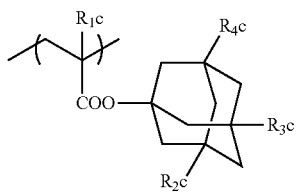
(AIIa)

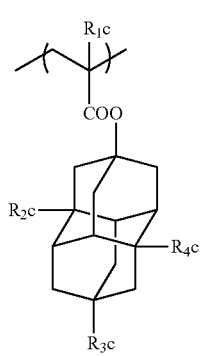
(AIIb)

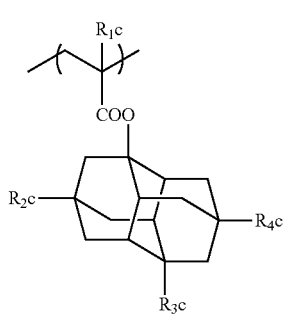
(AIIc)

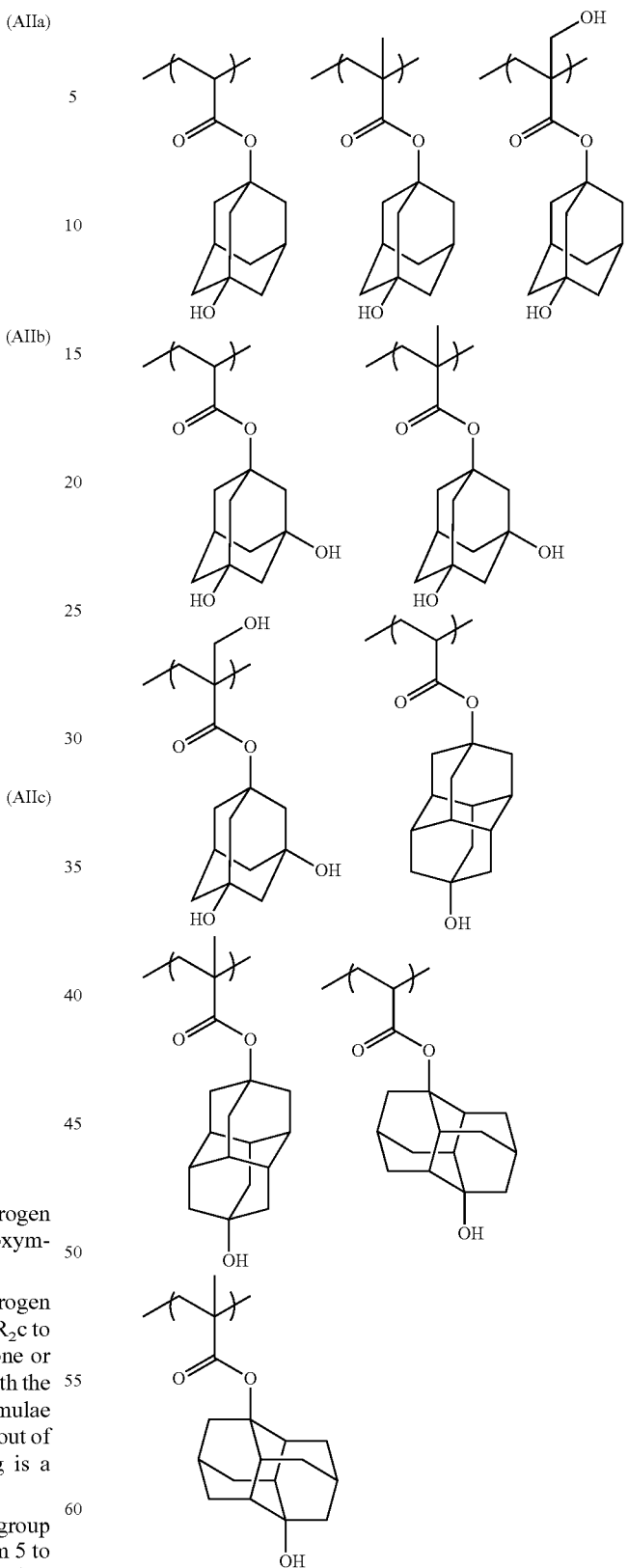

In formulae (AIIa) to (AIIc), $R_1c$ represents a hydrogen atom, a methyl group, a trifluoromethyl group or a hydroxymethyl group.

Each of $R_2c$ to $R_4c$ independently represents a hydrogen atom or a hydroxyl group, provided that at least one of $R_2c$ to $R_4c$ represents a hydroxyl group. A structure where one or two members out of $R_2c$ to $R_4c$ are a hydroxyl group with the remaining being a hydrogen atom is preferred. In formulae (AIIa) to (AIIc), it is more preferred that two members out of $R_2c$ to $R_4c$ are a hydroxyl group and the remaining is a hydrogen atom.

The content of the repeating unit having a hydroxyl group is preferably from 5 to 40 mol %, more preferably from 5 to 30 mol %, still more preferably from 10 to 25 mol %, based on all repeating units in the resin (A).

Specific examples of the repeating unit having a hydroxyl group are set forth below, but the present invention is not limited thereto.

The resin for use in the actinic ray-sensitive or radiation-sensitive resin composition of the present invention may contain a repeating unit having an alkali-soluble group. The alkali-soluble group includes a carboxyl group, a sulfonamide group, a sulfonylimide group, a bisulfonylimide group, and an aliphatic alcohol with the α-position being substituted by an electron-withdrawing group, such as hexafluoroisopropanol group. It is more preferred to contain a repeating unit having a carboxyl group. By virtue of containing a repeating unit having an alkali-soluble group, the resolution increases in the usage of forming contact holes. As for the repeating unit having an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred. The linking group may have a monocyclic or polycyclic hydrocarbon structure. Above all, a repeating unit by an acrylic acid or a methacrylic acid is preferred.

The content of the repeating unit having an alkali-soluble group is preferably from 0 to 20 mol %, more preferably from 3 to 15 mol %, still more preferably from 5 to 10 mol %, based on all repeating units in the resin (A).

Specific examples of the repeating unit having an alkali-soluble group are set forth below, but the present invention is not limited thereto. In specific examples, Rx is H, $CH_3$, $CH_2OH$ or $CF_3$.

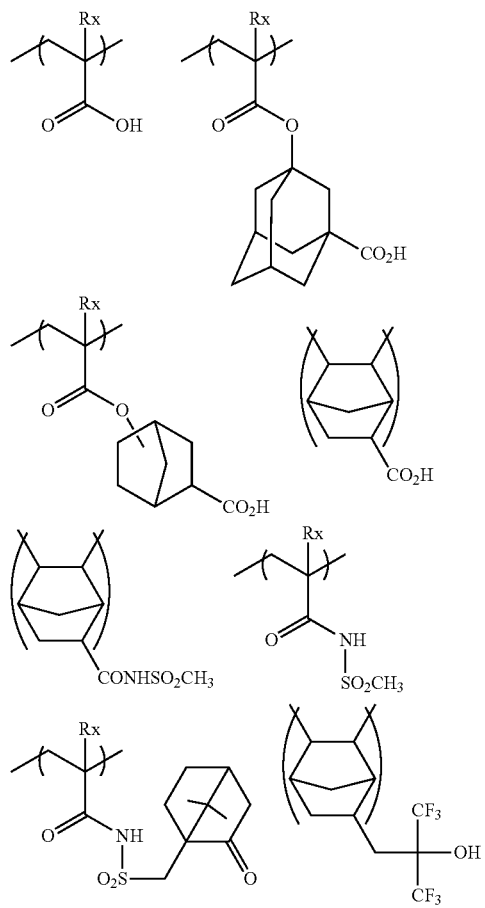

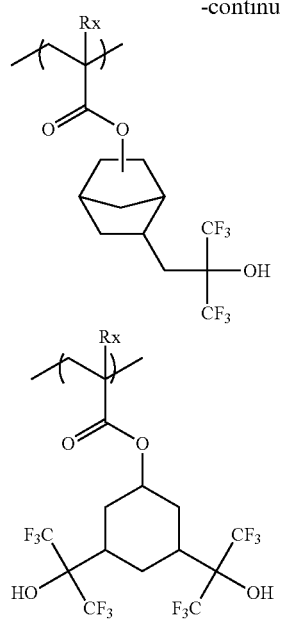

The resin (A) for use in the present invention may further contain a repeating unit having a polar group-free alicyclic hydrocarbon structure and not exhibiting acid decomposability. Thanks to this repeating unit, elution of a low molecular component into the immersion liquid from the resist film at the immersion exposure can be reduced. Such a repeating unit includes a repeating unit represented by formula (4):

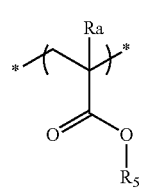

(4)

In formula (4), $R_5$ represents a hydrocarbon group having at least one cyclic structure and not having a polar group (e.g. a hydroxyl group or, a cyano group).

Ra represents a hydrogen atom, an alkyl group which may have a substituent, or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure of $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring gathered hydrocarbon group and a crosslinked cyclic hydrocarbon group. Examples of the ring gathered hydrocarbon group include a bicyclohexyl group and a perhydronaphthalenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.0$^{2,6}$]decane ring and tricyclo[4.3.1.1$^{2,5}$]undecane ring, and a tetracyclic hydrocarbon ring such as tetracyclo[4.4.0.1$^{2,5}$.1$^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by condensing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring. Preferred examples of the crosslinked cyclic hydrocarbon ring include a norbornyl group, an adamantyl group, a bicyclooctanyl group and a tricycle[5,2,1,0$^{2,6}$]decanyl group. Of these crosslinked cyclic hydrocarbon rings, a norbornyl group and an adamantyl group are more preferred.

These alicyclic hydrocarbon groups may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group is preferably an alkoxycarbonyl group having a carbon number of 2 to 4.

The content of the repeating unit having a polar group-free alicyclic hydrocarbon structure and not exhibiting acid decomposability is preferably from 0 to 40 mol %, more preferably from 0 to 20 mol %, based on all repeating units in the resin (A).

In the case where the resin (A) contains a repeating unit having a polar group-free alicyclic hydrocarbon structure and not exhibiting acid decomposability, the content of the repeating unit having a polar group-free alicyclic hydrocarbon structure and not exhibiting acid decomposability is preferably from 1 to 20 mol %, based on all repeating units in the resin (A).

Specific examples of the repeating unit having a polar group-free alicyclic hydrocarbon structure and not exhibiting acid decomposability are set forth below, but the present invention is not limited thereto. In the formulae, Ra represents H, CH$_3$, CH$_2$OH or CF$_3$.

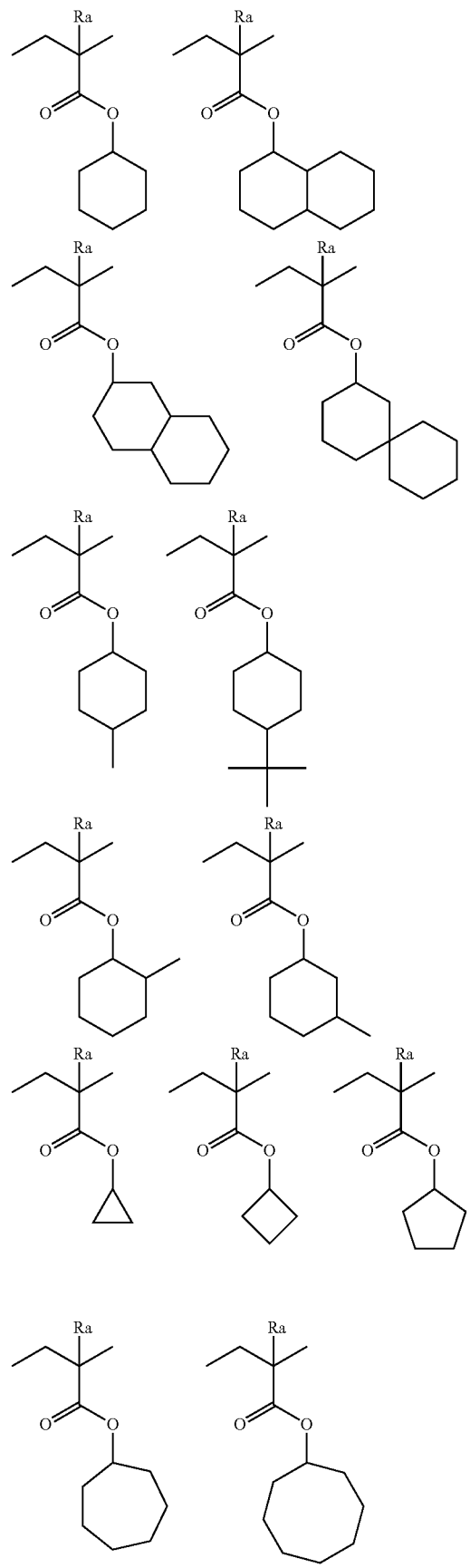

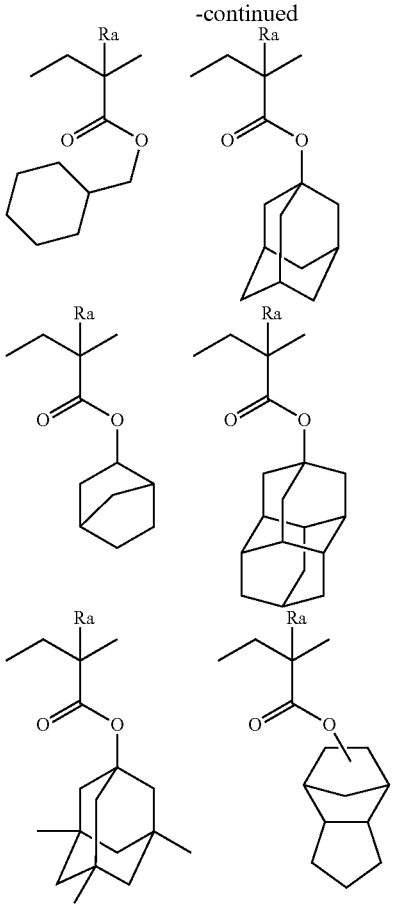

The resin for use in the actinic ray-sensitive or radiation-sensitive resin composition of the present invention may contain, in addition to the above-described repeating structural units, various repeating structural units for the purpose of controlling the dry etching resistance, suitability for standard developer, adherence to substrate, resist profile and properties generally required of a resist, such as resolution, heat resistance and sensitivity.

Examples of such a repeating structural unit include, but are not limited to, repeating structural units corresponding to the monomers described below.

Thanks to such a repeating structural unit, the performance required of the resin for use in the actinic ray-sensitive or radiation-sensitive resin composition of the present invention, particularly (1) solubility in the coating solvent, (2) film-forming property (glass transition point), (3) alkali developability, (4) film loss (selection of hydrophilic, hydrophobic or alkali-soluble group), (5) adherence of unexposed area to substrate, (6) dry etching resistance and the like can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin (A) for use in the actinic ray-sensitive or radiation-sensitive resin composition of the present invention, the molar ratio of respective repeating structural units contained is appropriately determined to control the dry etching resistance of resist, suitability for standard developer, adherence to substrate, resist profile and performances generally required of a resist, such as resolution, heat resistance and sensitivity.

In the case where the actinic ray-sensitive or radiation-sensitive resin composition of the present invention is used for ArF exposure, the resin (A) for use in the actinic ray-sensitive or radiation-sensitive resin composition of the present invention preferably has substantially no aromatic group (specifically, in the resin, the ratio of an aromatic group-containing repeating is preferably 5 mol % or less, more preferably 3 mol % or less, and ideally 0 mol %) in view of transparency to ArF light, and the resin (A) preferably has a monocyclic or polycyclic alicyclic hydrocarbon structure.

Also, the resin (A) preferably contains no fluorine atom and no silicon atom in view of compatibility with the later-described resin (C).

The resin (A) for use in the actinic ray-sensitive or radiation-sensitive resin composition of the present invention is preferably a resin where all repeating units are composed of a (meth)acrylate-based repeating unit. In this case, all repeating units may be a methacrylate-based repeating unit, all repeating units may be an acrylate-based repeating unit, or all repeating units may be composed of a methacrylate-based repeating unit and an acrylate-based repeating unit, but the content of the acrylate-based repeating unit is preferably 50 mol % or less based on all repeating units. A copolymerized polymer containing from 20 to 50 mol % of an acid decomposable group-containing (meth)acrylate-based repeating unit, from 20 to 50 mol % of a lactone group-containing (meth)acrylate-based repeating unit, from 5 to 30 mol % of a (meth)acrylate-based repeating unit having an alicyclic hydrocarbon structure substituted by a hydroxyl group or a cyano group, and from 0 to 20 mol % of other (meth)acrylate-based repeating units, is also preferred.

In the case of irradiating the composition of the present invention with KrF excimer laser light, electron beam, X-ray or high-energy beam at a wavelength of 50 nm or less (e.g., EUV), the resin (A) preferably further contains a hydroxystyrene-based repeating unit, more preferably a hydroxystyrene-based repeating unit, a hydroxystyrene-based repeating unit protected by an acid-decomposable group, and an acid-decomposable repeating unit such as tertiary alkyl (meth)acrylate.

Preferred examples of the hydroxystyrene-based repeating unit having an acid-decomposable group include repeating units composed of a tert-butoxycarbonyloxystyrene, a 1-alkoxyethoxystyrene or a tertiary alkyl (meth)acrylate. Repeating units composed of a 2-alkyl-2-adamantyl (meth)acrylate or a dialkyl(1-adamantyl)methyl (meth)acrylate are more preferred.

The resin (A) for use in the present invention can be synthesized by an ordinary method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the composition of the present invention. By the use of the same solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is pored in a solvent, and the desired polymer is collected by a method such as powder or solid recovery. The concentration at the reaction is from 5 to 50 mass %, preferably from 10 to 30 mass %, and the reaction temperature is usually from 10 to 150° C., preferably from 30 to 120° C., more preferably from 60 to 100° C.

The weight average molecular weight of the resin (A) for use in the present invention is preferably from 1,000 to 200,000, more preferably from 1,000 to 25,000, still more preferably from 2,000 to 20,000, yet still more preferably from 3,000 to 15,000, and most preferably from 3,000 to 10,000, in terms of polystyrene by the GPC method. When the weight average molecular weight is from 1,000 to 200,000, deterioration of heat resistance, dry etching resistance and developability can be avoided and the film-forming property can be prevented from deteriorating due to increase in the viscosity.

The polydispersity (molecular weight distribution) is usually from 1 to 3, preferably from 1 to 2.6, more preferably from 1 to 2, still more preferably from 1.4 to 2.0. As the molecular weight distribution is smaller, the resolution and resist profile are more excellent, the side wall of the resist pattern is smoother, and the roughness is more improved.

The amount of the resin (A) blended in the entire composition of the actinic ray-sensitive or radiation-sensitive resin composition of the present invention is preferably from 50 to 99 mass %, more preferably from 60 to 95 mass %, based on the entire solid content.

As regards the resin (A) for use in the present invention, one kind may be used or a plurality of kinds may be used in combination.

Also, a resin other than the resin (A) for use in the present invention may be used in combination within the range not impairing the effects of the present invention. The resin other than the resin (A) for use in the present invention includes an acid-decomposable resin that may contain a repeating unit which the resin (A) can contain, and other known acid-decomposable resins.

[2] (C) Resin that Contains at Least Either a Fluorine Atom or a Silicon Atom and Contains a Group Capable of Decomposing by the Action of an Alkali Developer to Increase the Solubility in an Alkali Developer (Polarity Converting Group):

The actinic ray-sensitive or radiation-sensitive resin composition of the present invention contains (C) a resin containing at least either a fluorine atom or a silicon atom and containing a polarity converting group. Addition of the resin (C) is preferred particularly from the standpoint of reducing the development defect.

The actinic ray-sensitive or radiation-sensitive resin composition of the present invention preferably contains (C) a resin containing at least either a fluorine atom or a silicon atom and containing (c) a repeating unit containing at least one polarity converting group.

Here, the polarity converting group is a group capable of decomposing by the action of an alkali developer to increase the solubility in an alkali developer. Examples thereof include a lactone group, a carboxylic acid ester group (—COO—), an acid anhydride group (—C(O)OC(O)—), an acid imide group (—NHCONH—), a carboxylic acid thioester group (—COS—), a carbonic acid ester group (—OC(O)O—), a sulfuric acid ester group (—OSO$_2$O—) and a sulfonic acid ester group (—SO$_2$O—).

Incidentally, an ester group directly bonded to the main chain of a repeating unit as in an acrylate is poor in the function of decomposing by the action of an alkali developer to increase the solubility in an alkali developer and is not included in the polarity converting group of the present invention.

The repeating unit (c) includes, for example, a repeating unit represented by formula (K0):

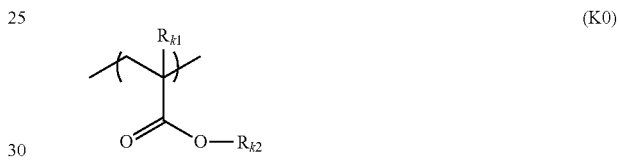

In the formula, $R_{k1}$ represents a hydrogen atom, a halogen atom, a hydroxyl group, an alkyl group, a cycloalkyl group, an aryl group, or a polarity converting group-containing group.

$R_{k2}$ represents an alkyl group, a cycloalkyl group, an aryl group, or a polarity converting group-containing group, provided that at least either one of $R_{k1}$ and $R_{k2}$ has a polarity converting group.

Incidentally, as described above, the ester group directly bonded to the main chain of the repeating unit represented by formula (K0) is not included in the polarity converting group of the present invention.

The polarity converting group is preferably a group X in a partial structure represented by formula (KA-1) or (KB-1):

In formulae (KA-1) and (KB-1), X represents a carboxylic acid ester group: —COO—, an acid anhydride group: —C(O)OC(O)—, an acid imide group: —NHCONH—, a carboxylic acid thioester group: —COS—, a carbonic acid ester group: —OC(O)O—, a sulfuric acid ester group: —OSO$_2$O—, or a sulfonic acid ester group: —SO$_2$O—.

Each of $Y^1$ and $Y^2$, which may be the same or different, represents an electron-withdrawing group.

Incidentally, the repeating unit (c) has a preferred polarity converting group by containing a group having a partial structure represented by formula (KA-1) or (KB-1), but as in the case of the partial structure represented by formula (KA-1) or the partial structure represented by formula (KB-1) where $Y^1$ and $Y^2$ are monovalent, when the partial structure does not have a bond, the group having the partial structure is a group having a monovalent or greater valent group formed by removing at least one arbitrary hydrogen atom in the partial structure. The partial structure represented by formula (KA-1) or (KB-1) is connected to the main chain of the resin (C) at an arbitrary position through a substituent.

The partial structure represented by formula (KA-1) is a structure forming a ring structure together with the group as X.

In formula (KA-1), X is preferably a carboxylic acid ester group (that is, a case of forming a lactone ring structure as KA-1), an acid anhydride group or a carbonic acid ester group, more preferably a carboxylic acid ester group.

The ring structure represented by formula (KA-1) may have a substituent and, for example, may have nka substituents $Z_{ka1}$.

$Z_{ka1}$ represents, when a plurality of $Z_{ka1}$'s are present, each independently represents, an alkyl group, a cycloalkyl group, an ether group, a hydroxyl group, an amide group, an aryl group, a lactone ring group or an electron-withdrawing group.

$Z_{ka1}$'s may combine with each other to form a ring. Examples of the ring formed by combining $Z_{ka1}$'s with each other include a cycloalkyl ring and a heterocycle (e.g., cyclic ether ring, lactone ring).

nka represents an integer of 0 to 10 and is preferably an integer of 0 to 8, more preferably an integer of 0 to 5, still more preferably an integer of 1 to 4, and most preferably an integer of 1 to 3.

The electron-withdrawing group as $Z_{ka1}$ has the same meaning as the later-described electron-withdrawing group of $Y^1$ and $Y^2$ typified by a halogen atom.

The electron-withdrawing group above may be substituted by another electron-withdrawing group.

$Z_{ka1}$ is preferably an alkyl group, a cycloalkyl group, an ether group, a hydroxyl group or an electron-withdrawing group, more preferably an alkyl group, a cycloalkyl group or an electron-withdrawing group. The ether group is preferably an ether group substituted, for example, by an alkyl group or a cycloalkyl group, that is, an alkyl ether group or the like. Preferred examples of the electron-withdrawing group are the same as those of the later-described electron-withdrawing group of $Y^1$ and $Y^2$.

Examples of the halogen atom as $Z_{ka1}$ include a fluorine atom, a chlorine atom, a bromine atom and an iodine atom, with a fluorine atom being preferred.

The alkyl group as $Z_{ka1}$ may have a substituent and may be either linear or branched. The linear alkyl group is preferably an alkyl group having a carbon number of 1 to 30, more preferably from 1 to 20, and examples thereof include a methyl group, an ethyl group, an n-propyl group, an n-butyl group, a sec-butyl group, a tert-butyl group, an n-pentyl group, an n-hexyl group, an n-heptyl group, an n-octyl group, an n-nonyl group and an n-decanyl group. The branched alkyl group is preferably an alkyl group having a carbon number of 3 to 30, more preferably from 3 to 20, and examples thereof include an i-propyl group, an i-butyl group, a tert-butyl group, an i-pentyl group, a tert-pentyl group, an i-hexyl group, a tert-hexyl group, an i-heptyl group, a tert-heptyl group, an i-octyl group, a tert-octyl group, an i-nonyl group and a tert-decanoyl group. An alkyl group having a carbon number of 1 to 4, such as methyl group, ethyl group, n-propyl group, i-propyl group, n-butyl group, i-butyl group and tert-butyl group, is preferred.

The cycloalkyl group as $Z_{ka1}$ may have a substituent, may be monocyclic or polycyclic, and may be crosslinked. For example, the cycloalkyl group may have a bridged structure.

The monocyclic cycloalkyl group is preferably a cycloalkyl group having a carbon number of 3 to 8, and examples thereof include a cyclopropyl group, a cyclopentyl group, a cyclohexyl group, a cyclobutyl group and a cyclooctyl group. Examples of the polycyclic cycloalkyl group include a group having a bicyclo, tricyclo or tetracyclo structure and having a carbon number of 5 or more. A cycloalkyl group having a carbon number of 6 to 20 is preferred, and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group. As for the cycloalkyl group, structures shown below are also preferred. Incidentally, a part of carbon atoms in the cycloalkyl group may be replaced by a heteroatom such as oxygen atom.

(1)

(2)

(3)

(4)

(5)

(6)

(7)

(8)

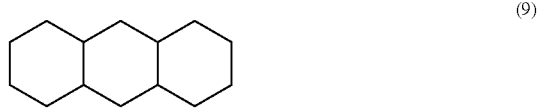

(9)

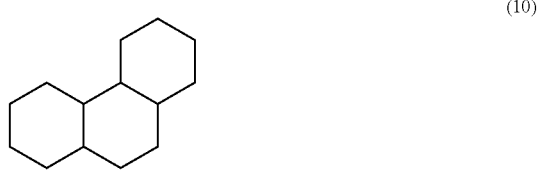

(10)

-continued
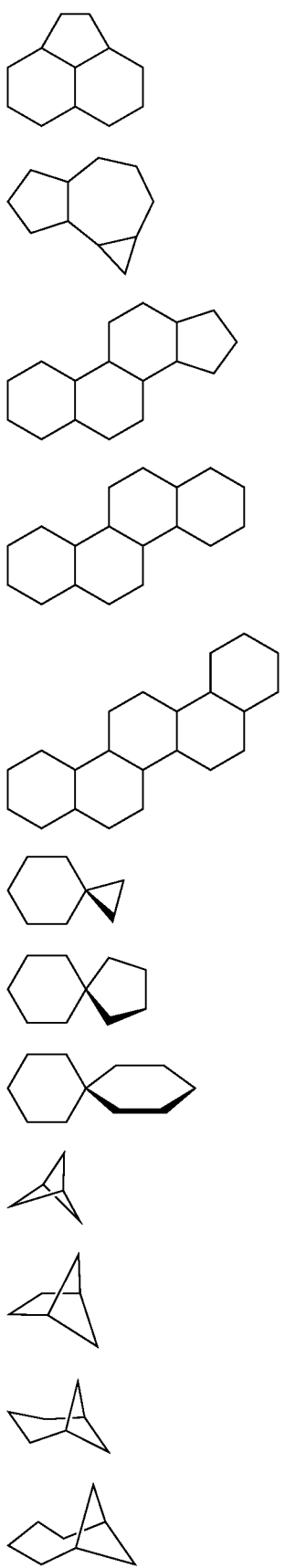
-continued
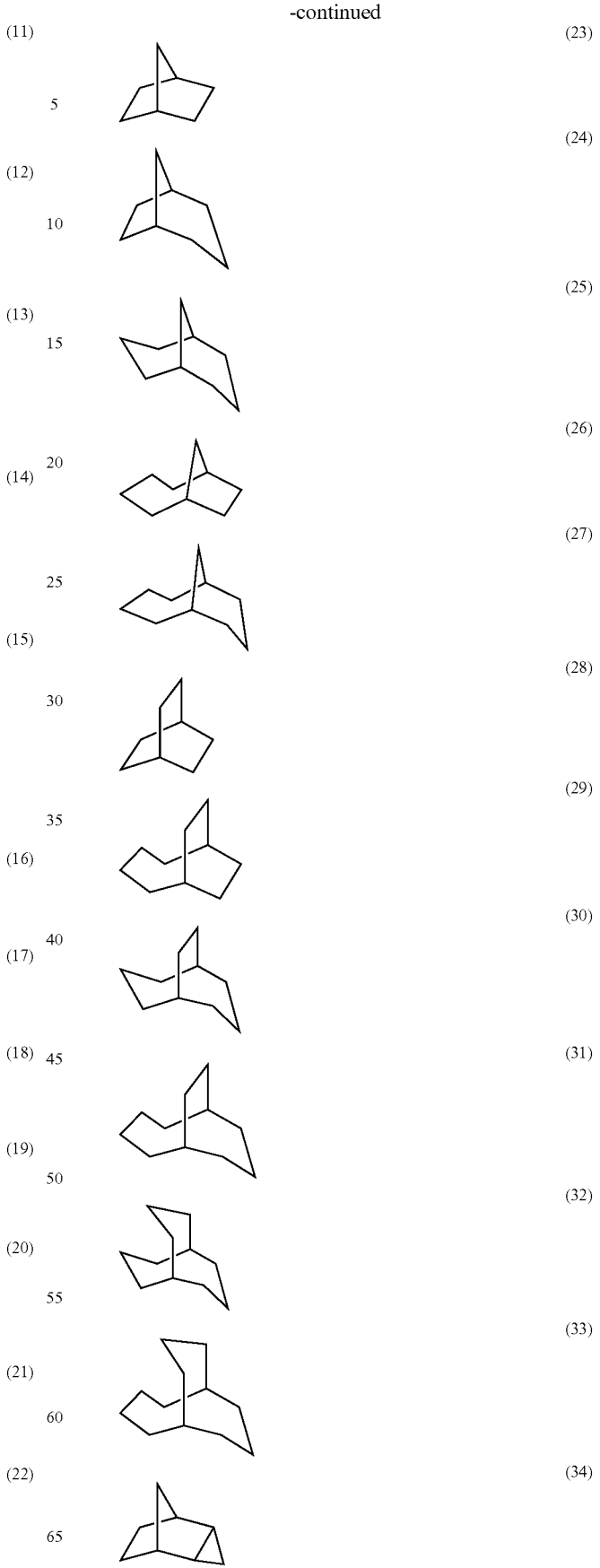

(35) 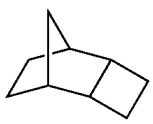

(36) 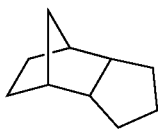

(37) 

(38) 

(39) 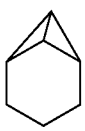

(40) 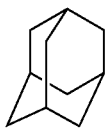

(41) 

(42) 

(43) 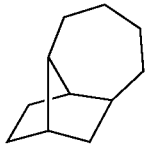

(44) 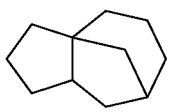

(45) 

(46) 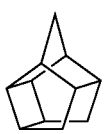

(47) 

(48) 

(49) 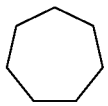

(50) 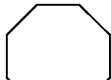

The preferred alicyclic moiety includes an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. An adamantyl group, a decalin group, a norbornyl group, a cedrol group, a cyclohexyl group, a cycloheptyl group, a cyclooctyl group, a cyclodecanyl group, a cyclododecanyl group and a tricyclodecanyl group are more preferred.

The substituent of the alicyclic structure includes an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably a methyl group, an ethyl group, a propyl group or an isopropyl group. The alkoxy group is preferably an alkoxy group having a carbon number of 1 to 4, such as methoxy group, ethoxy group, propoxy group and butoxy group. Examples of the substituent which the alkyl group and alkoxy group may have include a hydroxyl group, a halogen atom and an alkoxy group (preferably having a carbon number of 1 to 4).

Examples of the lactone ring group of $Z_{ka1}$ include a group formed by removing a hydrogen atom from a structure represented by any one of (KA-1-1) to (KA-1-17) described later.

Examples of the aryl group of $Z_{ka1}$ include a phenyl group and a naphthyl group.

Examples of the substituent which the alkyl group, cycloalkyl group and aryl group of $Z_{ka1}$ may further have include a hydroxyl group, a halogen atom (e.g., fluorine, chlorine, bromine, iodine), a nitro group, a cyano group, the above-described alkyl group, an alkoxy group such as methoxy group, ethoxy group, hydroxyethoxy group, propoxy group, hydroxypropoxy group, n-butoxy group, isobutoxy group, sec-butoxy group and tert-butoxy group, an alkoxycarbonyl group such as methoxycarbonyl group and ethoxycarbonyl group, an aralkyl group such as benzyl group, phenethyl group and cumyl group, an aralkyloxy group, an acyl group such as formyl group, acetyl group, butyryl group, benzoyl group, cinnamyl group and valeryl group, an acyloxy group such as butyryloxy group, the above-described alkenyl group, an alkenyloxy group such as vinyloxy group, propenyloxy group, allyloxy group and butenyloxy group, the above-described aryl group, an aryloxy group such as phenoxy group, and an aryloxycarbonyl group such as benzoyloxy group.

In a preferred embodiment, X in formula (KA-1) is a carboxylic acid ester group and the partial structure represented by formula (KA-1) is a lactone ring, preferably a 5- to 7-membered lactone ring.

Incidentally, it is preferred that as in (KA-1-1) to (KA-1-17) shown below, another ring structure is condensed to a 5- to 7-membered lactone ring as the partial structure represented by formula (KA-1) in the form of forming a bicyclo or spiro structure.

Examples of the peripheral ring structure with which the ring structure represented by formula (KA-1) may combine include those in (KA-1-1) to (KA-1-17) shown below and structures based on these structures.

The structure containing the lactone ring structure represented by formula (KA-1) is more preferably a structure represented by any one of the following (KA-1-1) to (KA-1-17). The lactone structure may be bonded directly to the main chain. Preferred structures are (KA-1-1), (KA-1-4), (KA-1-5), (KA-1-6), (KA-1-13), (KA-1-14) and (KA-1-17).

KA-1-1
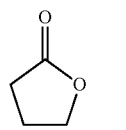

KA-1-2
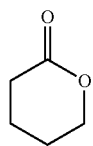

KA-1-3

KA-1-4
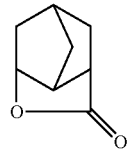

KA-1-5
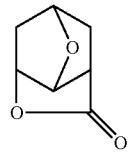

KA-1-6
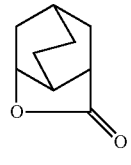

KA-1-7
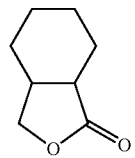

-continued

KA-1-8
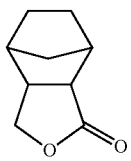

KA-1-9
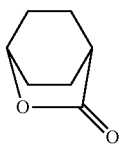

KA-1-10
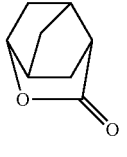

KA-1-11
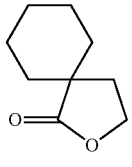

KA-1-12
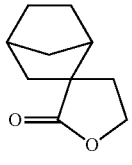

KA-1-13
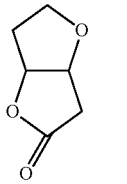

KA-1-14
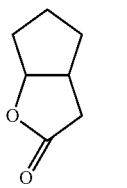

KA-1-15
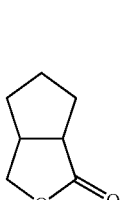

KA-1-16

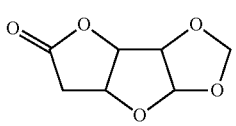
KA-1-17

The structure containing the above-described lactone ring structure may or may not have a substituent. Preferred examples of the substituent are the same as those of the substituent which the ring structure represented by formula (KA-1) may have.

Some lactone structures have an optical isomer, but any optical isomer may be used. One optical isomer may be used alone or a mixture of a plurality of optical isomers may be used. In the case of mainly using one optical isomer, the optical purity (ee) thereof is preferably 90% or more, more preferably 95% or more, and most preferably 98% or more.

In formula (KB-1), X is preferably a carboxylic acid ester group (—COO—).

In formula (KB-1), each of $Y^1$ and $Y^2$ independently represents an electron-withdrawing group.

The electron-withdrawing group is a partial structure represented by the following formula (EW). In formula (EW), * indicates a bond directly bonded to (KA-1) or a bond directly bonded to X of (KB-1).

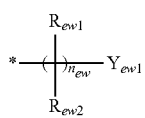

(EW)

In formula (EW), $n_{ew}$ is a repetition number of the linking group represented by —C($R_{ew1}$)($R_{ew2}$)— and represents an integer of 0 or 1. In the case where $n_{ew}$ is 0, this indicates that the bonding is formed by a single bond and $Y_{ew1}$ is directly bonded.

$Y_{ew1}$ is a halogen atom, a cyano group, a nitrile group, a nitro group, a halo(cyclo)alkyl or haloaryl group represented by —C($R_{f1}$)($R_{f2}$)—$R_{f3}$, an oxy group, a carbonyl group, a sulfonyl group, a sulfinyl group, or a combination thereof. The electron-withdrawing group may be, for example, a structure shown below.

The term "halo(cyclo)alkyl group" indicates an alkyl or cycloalkyl group that is at least partially halogenated, and the "haloaryl group" indicates an aryl group that is at least partially halogenated. Each of $R_{ew3}$ and $R_{ew4}$ independently represents an arbitrary structure. The partial structure represented by formula (EW) has an electron-withdrawing property irrespective of structures of $R_{ew3}$ and $R_{ew4}$, and each of $R_{ew3}$ and $R_{ew4}$ may be connected, for example, to the main chain of the resin but is preferably an alkyl group, a cycloalkyl group or an alkyl fluoride group.

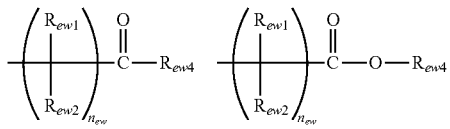

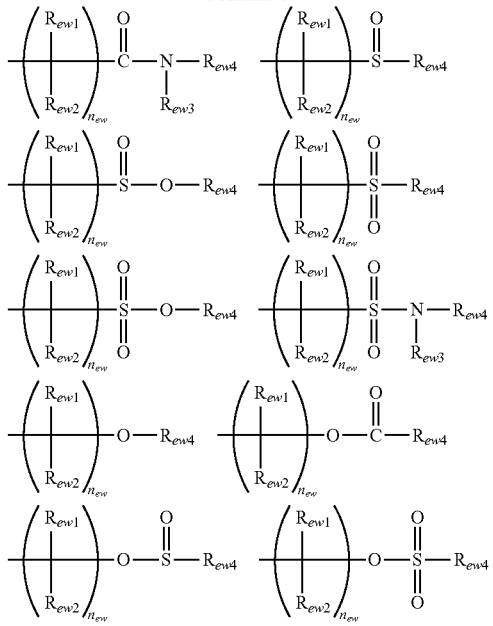

In the case where $Y_{ew1}$ is a divalent or greater valent group, the remaining bond forms bonding with an arbitrary atom or substituent. At least any one group of $Y_{ew1}$, $R_{ew1}$ and $R_{ew2}$ may combine with the main chain of the resin (C) through a further substituent.

$Y_{ew1}$ is preferably a halogen atom or a halo(cyclo)alkyl or haloaryl group represented by —C($R_{f1}$)($R_{f2}$)—$R_{f3}$.

Each of $R_{ew1}$ and $R_{ew2}$ independently represents an arbitrary substituent, for example, represents a hydrogen atom, an alkyl group, a cycloalkyl group or an aryl group.

At least two members out of $R_{ew1}$, $R_{ew2}$ and $Y_{ew1}$ may combine with each other to form a ring.

$R_{f1}$ represents a halogen atom, a perhaloalkyl group, a perhalocycloalkyl group or a perhaloaryl group and is preferably a fluorine atom, a perfluoroalkyl group or a perfluorocycloalkyl group, more preferably a fluorine atom or a trifluoromethyl group.

Each of $R_{f2}$ and $R_{f3}$ independently represents a hydrogen atom, a halogen atom or an organic group, and $R_{f2}$ and $R_{f3}$ may combine to faun a ring. Examples of the organic group include an alkyl group, a cycloalkyl group and an alkoxy group. $R_{f2}$ preferably represents the same group as $R_{f1}$ or combines with $R_{f3}$ to form a ring.

$R_{f1}$ to $R_{f3}$ may combine to form a ring, and examples of the ring fanned include a (halo)cycloalkyl ring and a (halo)aryl ring.

Examples of the (halo)alkyl group in $R_{f1}$ to $R_{f3}$ include the alkyl groups in $Z_{ka1}$ and halogenated structures thereof.

Examples of the (per)halocycloalkyl group and (per)haloaryl group in $R_{f1}$ to $R_{f3}$ or in the ring formed by combining $R_{f2}$ and $R_{f3}$ include structures resulting from halogenation of cycloalkyl groups in $Z_{ka1}$, and a fluoroalkyl group represented by —$C_{(n)}F_{(2n-2)}H$ and a perfluoroaryl group represented by —$C_{(n)}F_{(n-1)}$ are preferred, where the carbon number n is not particularly limited but is preferably from 5 to 13, more preferably 6.

The ring which may be formed by combining at least two members of $R_{ew1}$, $R_{ew2}$ and $Y_{ew1}$ with each other is preferably a cycloalkyl group or a heterocyclic group, and the heterocyclic group is preferably a lactone ring group. Examples of the lactone ring include structures represented by formulae (KA1-1) to (KA-1-17).

Incidentally, the repeating unit (c) may have a plurality of partial structures represented by formula (KA-1), a plurality of partial structures represented by formula (KB-1), or both a partial structure of formula (KA-1) and a partial structure of formula (KB-1).

Here, the partial structure of formula (KA-1) may partially or entirely serve also as the electron-withdrawing group of $Y^1$ or $Y^2$ in formula (KB-1). For example, when X in formula (KA-1) is a carboxylic acid ester group, the carboxylic acid ester group may function as the electron-withdrawing group of $Y^1$ or $Y^2$ in formula (KB-1).

The repeating unit (c) may be (c') a repeating unit having at least either a fluorine atom or a silicon atom and having a polarity converting group on one side chain, (c*) a repeating unit having a polarity converting group and having neither a fluorine atom nor a silicon atom, or (c") a repeating unit having a polarity converting group on one side chain and at the same time, having at least either a fluorine atom or a silicon atom on a side chain different from the side chain above in the same repeating unit, but the resin (C) preferably contains the repeating unit (c') as the repeating unit (c).

In the case where the resin (C) contains the repeating unit (c*), the resin is preferably a copolymer with a repeating unit having at least either a fluorine atom or a silicon atom (the repeating unit (c1) described later). Also, it is preferred that in the repeating unit (c"), the side chain having a polarity converting group and the side chain having at least either a fluorine atom or a silicon atom are preferably bonded to the same carbon atom in the main chain, that is, a positional relationship like the following formula (4) is established. In the formula, B1 represents a partial structure having a polarity converting group and B2 represents a partial structure having at least either a fluorine atom or a silicon atom.

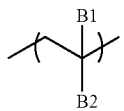

(4)

Also, in the repeating unit (c*) and the repeating unit (c"), the polarity converting group is more preferably a partial structure represented by —COO— in the structure of formula (KA-1).

The polarity converting group decomposes by the action of an alkali developer to effect polarity conversion, whereby the receding contact angle with water of the resin composition film after alkali development can be decreased.

The receding contact angle with water of the resin composition film after alkali development is preferably 50° or less, more preferably 40° or less, still more preferably 35° or less, and most preferably 30° or less, at the temperature during exposure, usually at room temperature 23±3° C., and a humidity of 45±5%.

The receding contact angle is a contact angle measured when a contact line recedes on the liquid droplet-substrate interface, and this is generally known to be useful in simulating the mobility of a liquid droplet in a dynamic state. In a simple manner, the receding contact angle can be defined as a contact angle at the time of the liquid droplet interface receding when a liquid droplet ejected from a needle tip is landed on a substrate and then the liquid droplet is again suctioned into the needle. In general, the receding contact angle can be measured by a contact angle measuring method called an expansion-contraction method.

The hydrolysis rate of the resin (C) with an alkali developer is preferably 0.001 nm/sec or more, more preferably 0.01 nm/sec or more, still more preferably 0.1 nm/sec or more, and most preferably 1 nm/sec or more.

The hydrolysis rate of the resin (C) with an alkali developer is a rate at which the thickness of a resin film formed of the resin (C) alone decreases when treated with TMAH (an aqueous tetramethylammonium hydroxide solution) (2.38 mass %) at 23° C.

The resin (C) for use in the present invention preferably contains (c) a repeating unit containing two or more polarity converting groups and is more preferably (C1) a resin containing at least either a fluorine atom or a silicon atom and containing (c) a repeating unit containing two or more polarity converting groups.

In the case where the repeating unit (c) contains at least two polarity converting groups, it is preferred to have a group containing a partial structure having two polarity converting groups, represented by the following formula (KY-1). Incidentally, when the structure represented by formula (KY-1) does not have a bond, this is a group having a monovalent or greater valent group formed by removing at least one arbitrary hydrogen atom in the structure.

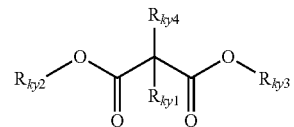

(KY-1)

In formula (KY-1), each of $R_{ky1}$ and $R_{ky4}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amide group or an aryl group. Alternatively, $R_{ky1}$ and $R_{ky4}$ may be bonded to the same atom to form a double bond. For example, $R_{ky1}$ and $R_{ky4}$ may be bonded to the same oxygen atom to form a part (=O) of a carbonyl group.

Each of $R_{ky2}$ and $R_{ky3}$ independently represents an electron-withdrawing group, or $R_{ky1}$ and $R_{ky2}$ combine to form a lactone ring and $R_{ky3}$ is an electron-withdrawing group. The lactone ring formed is preferably a structure of (KA-1-1) to (KA-1-17). Examples of the electron-withdrawing group is the same as those for $Y^1$ and $Y^2$ in formula (KB-1), and a halogen atom and a halo(cyclo)alkyl or haloaryl group represented by —C($R_{f1}$)($R_{f2}$)—$R_{f3}$ are preferred. Preferably, $R_{ky3}$ is a halogen atom or a halo(cyclo)alkyl or haloaryl group represented by —C($R_{f1}$)($R_{f2}$)—$R_{f3}$ and $R_{ky2}$ combines with $R_{ky1}$ to form a lactone ring or is an electron-withdrawing group containing no halogen atom.

$R_{ky1}$, $R_{ky2}$ and $R_{ky4}$ may combine with each other to form a monocyclic or polycyclic structure.

Specific examples of $R_{ky1}$ and $R_{ky4}$ include the same groups as those for $Z_{ka1}$ in formula (KA-1).

The lactone ring formed by combining $R_{ky1}$ and $R_{ky2}$ is preferably a structure of (KA-1-1) to (KA-1-17). Examples of the electron-withdrawing group are the same as those for $Y^1$ and $Y^2$ in formula (KB-1).

The structure represented by formula (KY-1) is preferably a structure represented by the following formula (KY-2). Here, the structure represented by formula (KY-2) is a group having a monovalent or greater valent group formed by removing at least one arbitrary hydrogen atom in the structure.

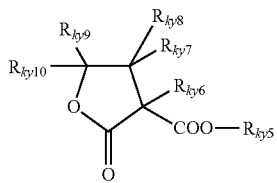

(KY-2)

In formula (KY-2), each of $R_{ky6}$ to $R_{ky10}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amide group or an aryl group.

Two or more members of $R_{ky6}$ to $R_{ky10}$ may combine with each other to form a monocyclic or polycyclic structure.

$R_{ky5}$ represents an electron-withdrawing group. Examples of the electron-withdrawing group are the same as those for $Y^1$ and $Y^2$ in formula (KB-1), and a halogen atom and a halo(cyclo)alkyl or haloaryl group represented by $—C(R_{f1})(R_{f2})—R_{f3}$ are preferred.

Specific examples of $R_{ky5}$ to $R_{ky10}$ include the same groups as those for $Z_{ka1}$ in formula (KA-1).

The structure represented by formula (KY-2) is preferably a partial structure represented by the following formula (KY-3).

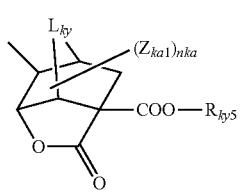

(KY-3)

In formula (KY-3), $Z_{ka1}$ and nka have the same meanings as those in formula (KA-1). $R_{ky5}$ has the same meaning as that in formula (KY-2).

$L_{ky}$ represents an alkylene group, an oxygen atom or a sulfur atom. Examples of the alkylene group of $L_{ky}$ include a methylene group and an ethylene group. $L_{ky}$ is preferably an oxygen atom or a methylene group, more preferably a methylene group.

The repeating unit (c) is not limited as long as it is a repeating unit obtained by polymerization such as addition polymerization, condensation polymerization and addition condensation, but a repeating unit obtained by addition polymerization of a carbon-carbon double bond is preferred. Examples thereof include an acrylate-based repeating unit (including a system having a substituent at the α- or β-position), a styrene-based repeating unit (including a system having a substituent at the α- or β-position), a vinyl ether-based repeating unit, a norbornene-based repeating unit, and a maleic acid derivative (e.g., maleic anhydride or a derivative thereof, maleimide) repeating unit. An acrylate-based repeating unit, a styrene-based repeating unit, a vinyl ether-based repeating unit and a norbornene-based repeating unit are preferred, an acrylate-based repeating unit, a vinyl ether-based repeating unit and a norbornene-based repeating unit are more preferred, and an acrylate-based repeating unit is most preferred.

The repeating unit (c) may be a repeating unit having a partial structure shown below.

As for the more specific structure of the repeating unit (c), a repeating unit having a partial structure shown below is preferred.

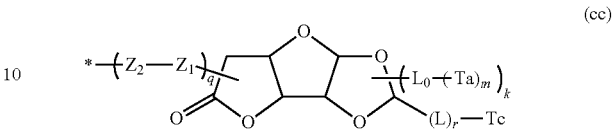

(cc)

In formula (cc), each $Z_1$ independently represents a single bond, an ether bond, an ester bond, an amide bond, a urethane bond or a urea bond and is preferably an ester bond.

Each $Z_2$ independently represents a chain or cyclic alkylene group and is preferably an alkylene group having a carbon number of 1 or 2 or a cycloalkylene group having a carbon number of 5 to 10.

Each Ta independently represents an alkyl group, a cycloalkyl group, an alkoxy group, a nitrile group, a hydroxyl group, an amide group, an aryl group or an electron-withdrawing group (having the same meaning as the electron-withdrawing group of $Y^1$ and $Y^2$ in formula (KB-1)) and is preferably an alkyl group, a cycloalkyl group or an electron-withdrawing group, more preferably an electron-withdrawing group. When a plurality of Ta's are present, Ta's may combine with each other to form a ring.

$L_0$ represents a single bond or an (m+1)-valent hydrocarbon group (preferably having a carbon number of 20 or less) and is preferably a single bond. The single bond as $L_o$ is formed when m is 1. The (m+1)-valent hydrocarbon group as $L_0$ is, for example, an (m+1)-valent hydrocarbon group formed by removing m−1 arbitrary hydrogen atoms from an alkylene group, a cycloalkylene group, a phenylene group or a combination thereof. When k is 2, two $L_0$'s may combine with each other to form a ring.

Each L independently represents a carbonyl group, a carbonyloxy group or an ether group. Tc represents a hydrogen atom, an alkyl group, a cycloalkyl group, a nitrile group, a hydroxyl group, an amide group, an aryl group or an electron-withdrawing group (having the same meaning as the electron-withdrawing group of $Y^1$ and $Y^2$ in formula (KB-1)).

* represents a bond to the main or side chain of the resin. That is, a partial structure represented by formula (cc) may be directly bonded to the main chain, or a partial structure represented by formula (cc) may be bonded to the side chain of the resin. Incidentally, the bond to the main chain is a bond to an atom present in bonds constituting the main chain, and the bond to the side chain is a bond to an atom present in the portion other than the bonds constituting the main chain.

m represents an integer of 0 to 28 and is preferably an integer of 1 to 3, more preferably 1.

k represents an integer of 0 to 2 and is preferably 1.

q represents an integer of 0 to 5 and is preferably an integer of 0 to 2.

r represents an integer of 0 to 5.

Incidentally, $-L_0-(Ta)_m$ may be substituted in place of $-(L)_r-Tc$.

It is also preferred to have a fluorine atom at the terminal of sugar lactone or have a fluorine atom on a side chain different from the side chain on the sugar lactone side in the same repeating unit (repeating unit (c")).

As for the more specific structure of the repeating unit (c), a repeating unit having a partial structure shown below is preferred.

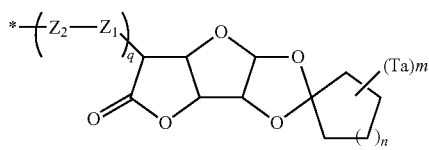

(ca-2)

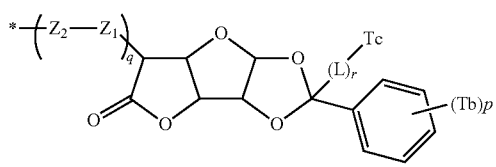

(cb-2)

In formulae (ca-2) and (cb-2), $Z_1$, $Z_2$, Tc, Ta, L, q and r have the same meaning as those in formula (cc).

Each Tb independently represents an alkyl group, a cycloalkyl group, an alkoxy group, a nitrile group, a hydroxyl group, an amide group, an aryl group or an electron-withdrawing group (having the same meaning as the electron-withdrawing group of $Y^1$ and $Y^2$ in formula (KB-1)).

* represents a bond to the main or side chain of the resin. That is, a partial structure represented by formula (ca-2) or (cb-2) may be directly bonded to the main chain, or a partial structure represented by formula (ca-2) or (cb-2) may be bonded to the side chain of the resin.

m represents an integer of 1 to 28 and is preferably an integer of 1 to 3, more preferably 1.

n represents an integer of 0 to 11 and is preferably an integer of 0 to 5, more preferably 1 or 2.

p represents an integer of 0 to 5 and is preferably an integer of 0 to 3, more preferably 1 or 2.

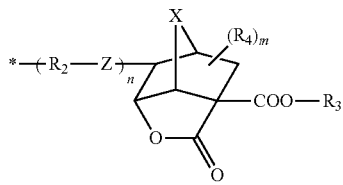

(2)

In formula (2), $R_2$ represents a chain or cycloalkylene group and when a plurality of $R_2$'s are present, each $R_2$ may be the same as or different from every other $R_2$.

$R_3$ represents a linear, branched or cyclic hydrocarbon group where a part or all of hydrogen atoms on the constituent carbons are replaced by a fluorine atom.

$R_4$ represents a halogen atom, a cyano group, a hydroxy group, an amide group, an alkyl group, a cycloalkyl group, an alkoxy group, a phenyl group, an acyl group, an alkoxycarbonyl group or a group represented by R—C(=O)— or R—C(=O)O— (wherein R represents an alkyl group or a cycloalkyl group). When a plurality of $R_4$'s are present, each $R_4$ may be the same as or different from every other $R_4$, and two or more $R_4$'s may combine to form a ring.

X represents an alkylene group, an oxygen atom or a sulfur atom.

Z represents a single bond, an ether bond, an ester bond, an amide bond, a urethane bond or a urea bond and when a plurality of Z's are present, each Z may be the same as or different from every other Z.

* represents a bond to the main chain of the resin.

n is a repetition number and represents an integer of 0 to 5.

m is the number of substituents and represents an integer of 0 to 7.

The structure of —$R_2$—Z— is preferably a structure represented by —$(CH_2)_l$—COO— (wherein l represents an integer of 1 to 5).

Specific examples of the repeating unit (c) having a polarity converting group are set forth below, but the present invention is not limited thereto.

Ra represents a hydrogen atom, a fluorine atom, a methyl group or a trifluoromethyl group.

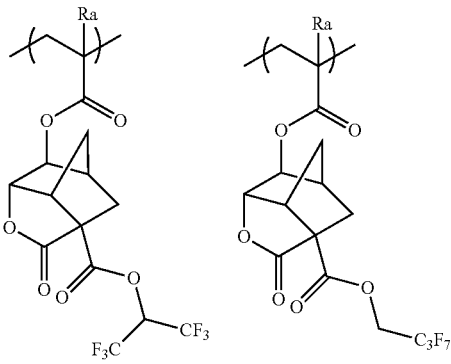

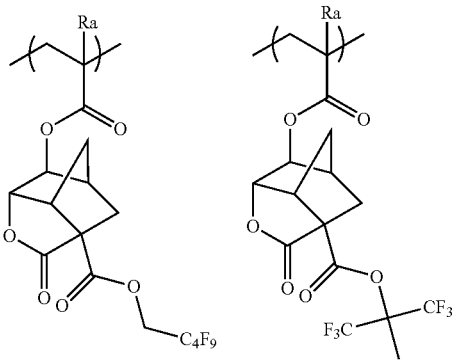

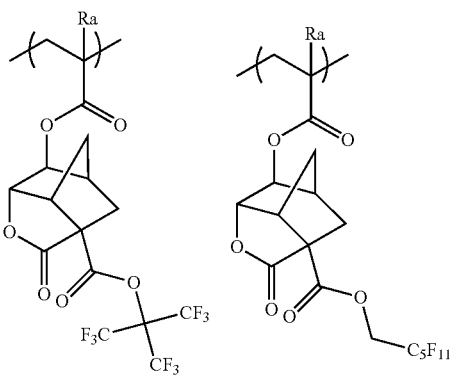

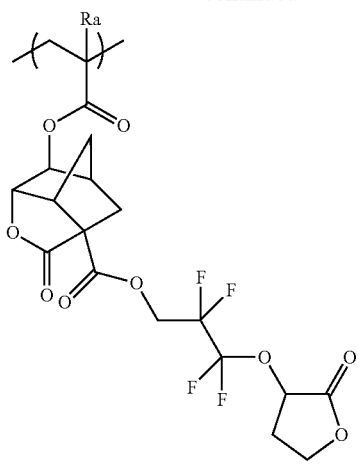
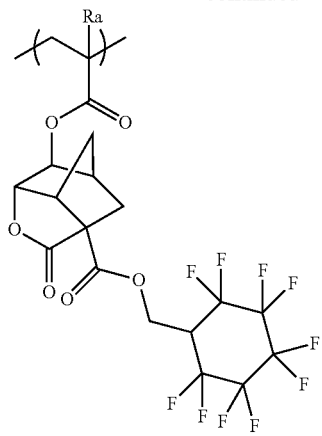
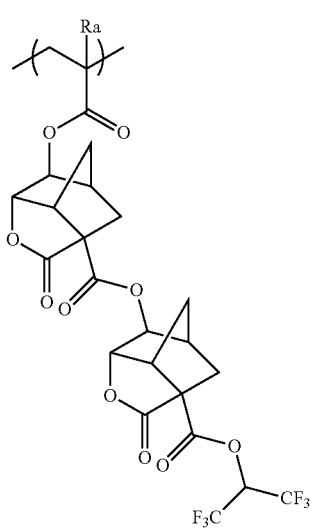
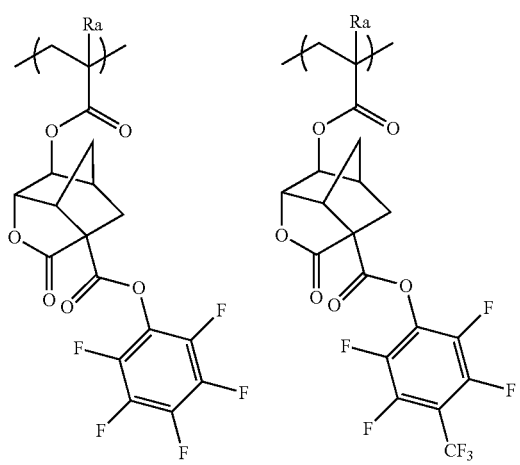
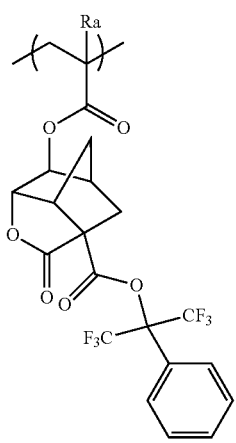
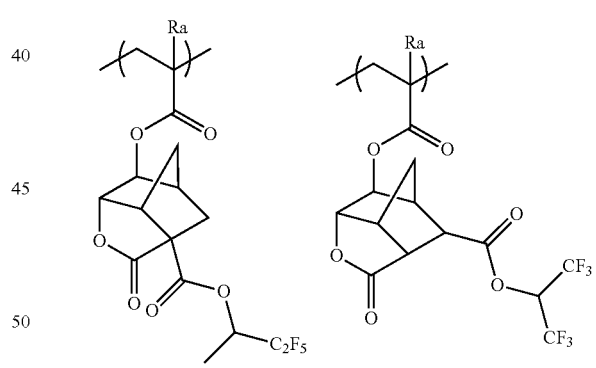
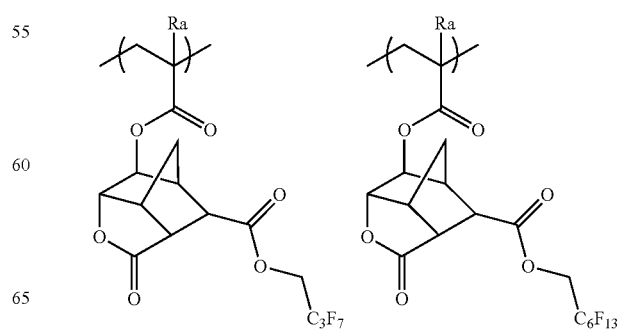

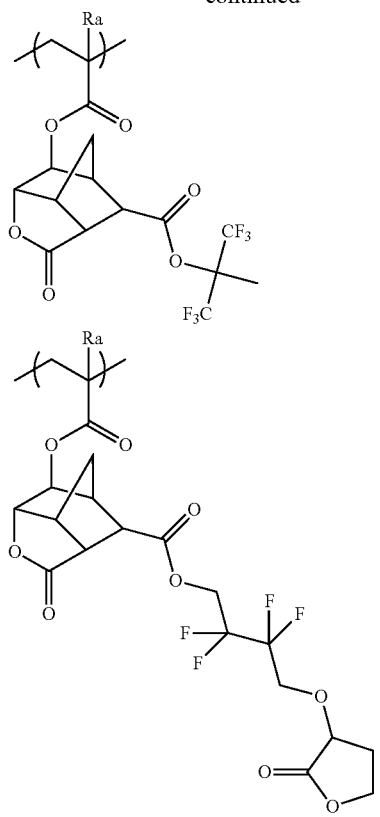
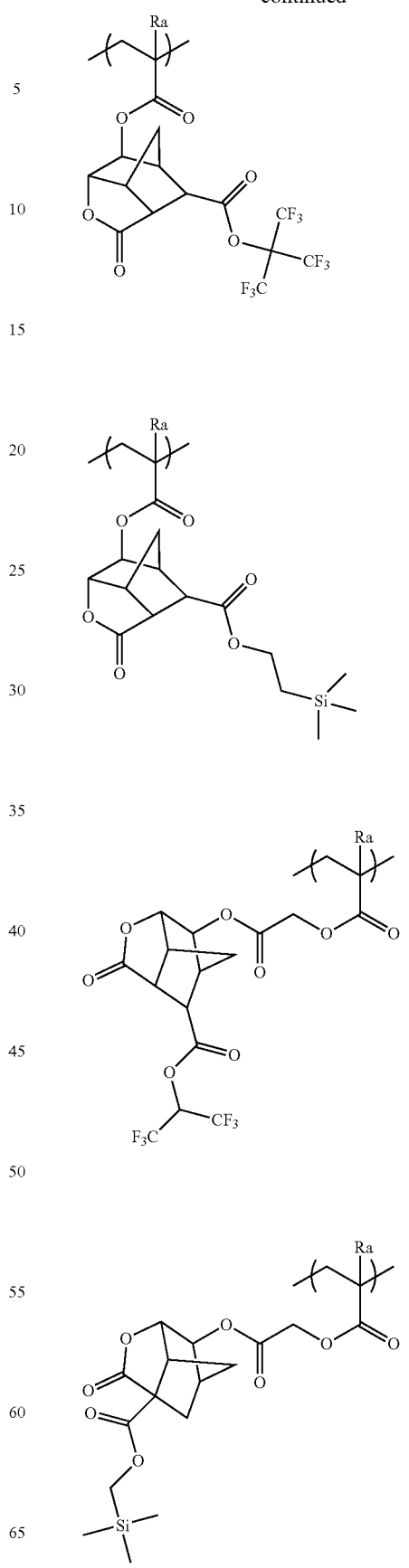

-continued
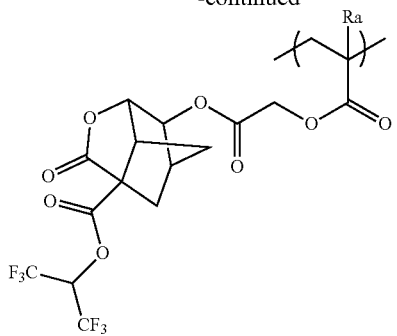
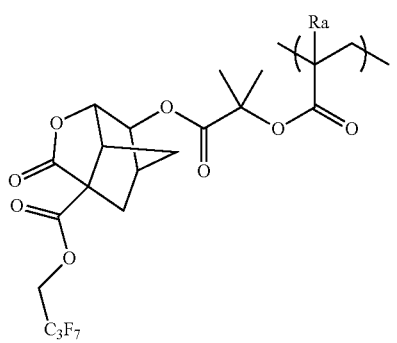
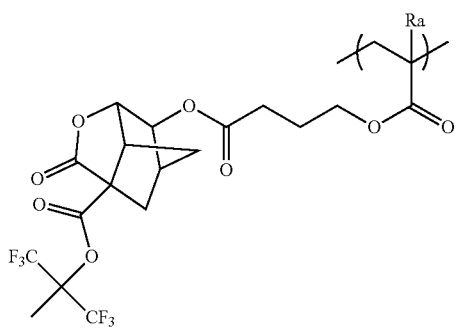
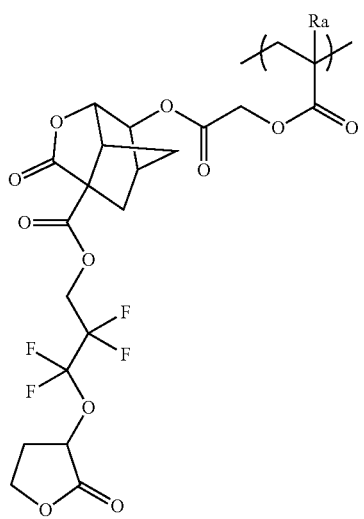
-continued
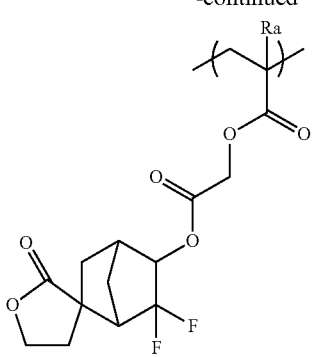
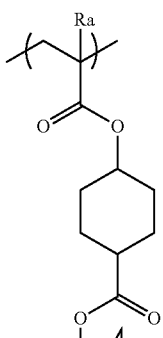
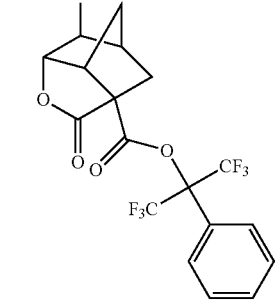
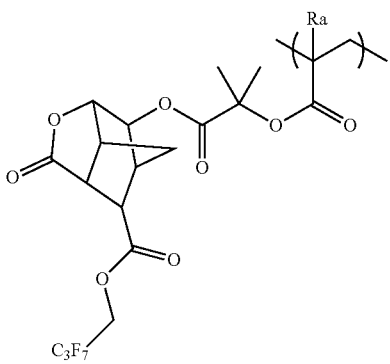
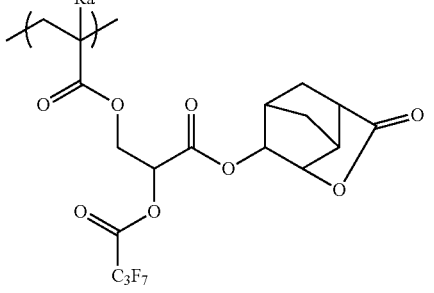

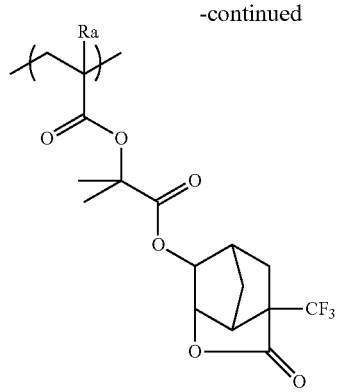
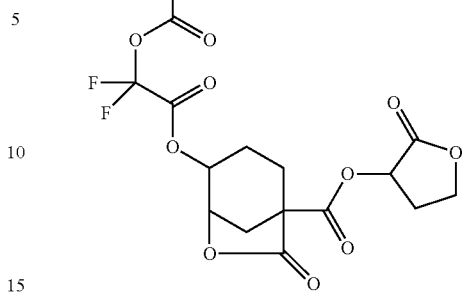
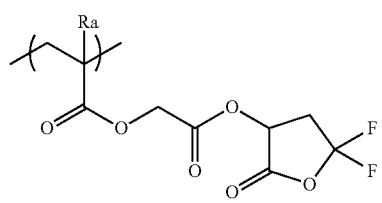
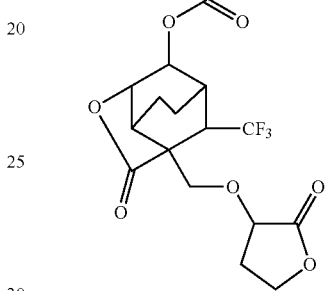
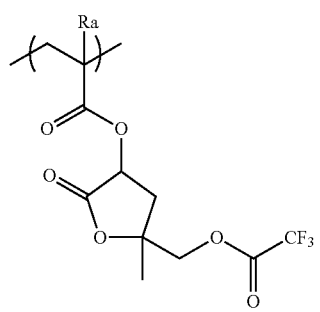
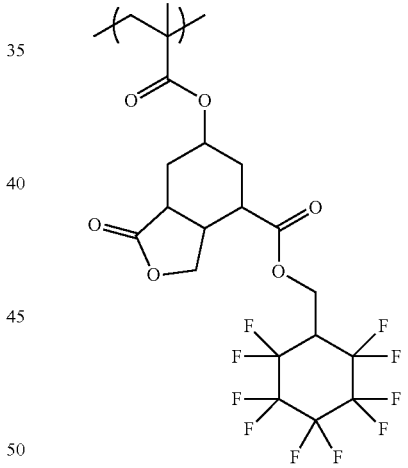
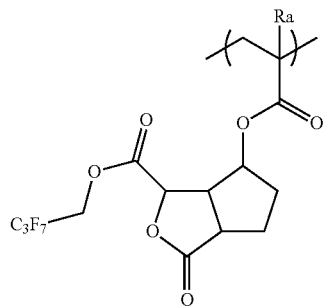
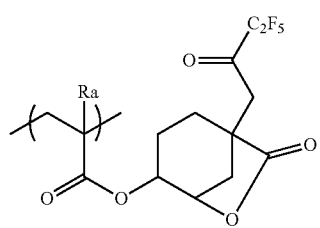
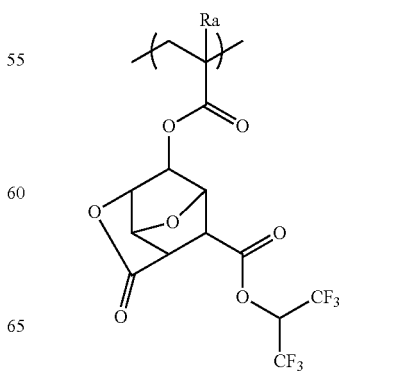

95
-continued
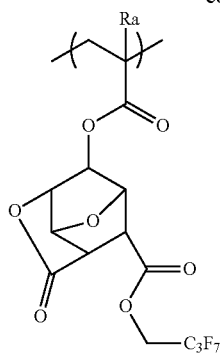
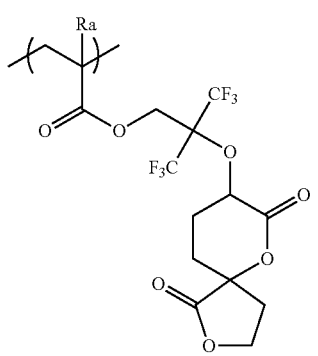
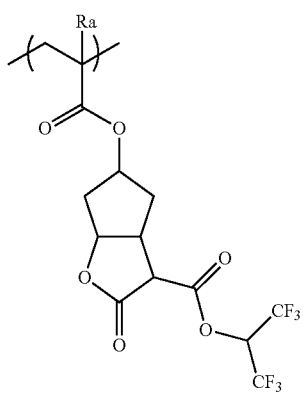
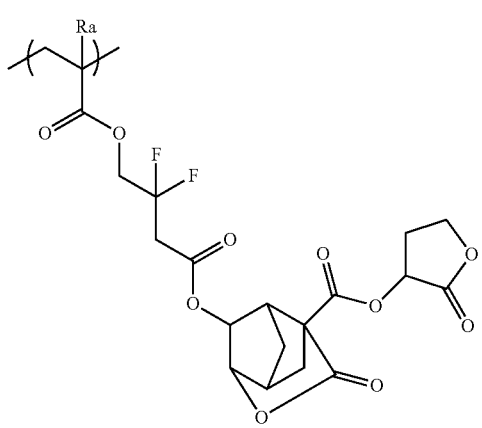
96
-continued
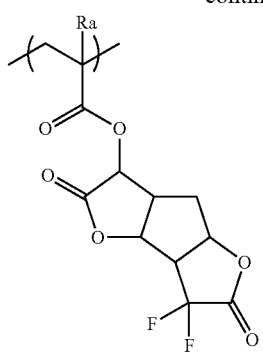
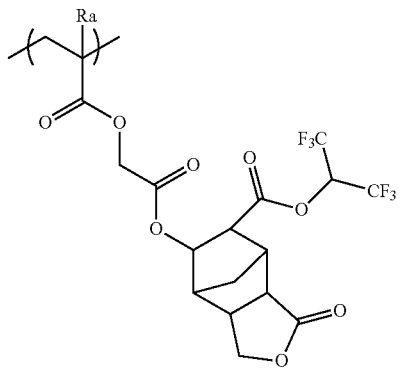
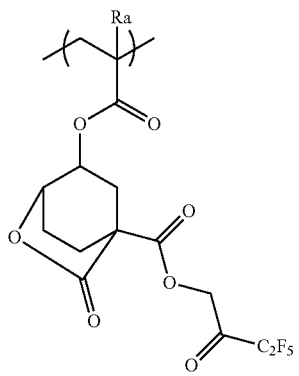
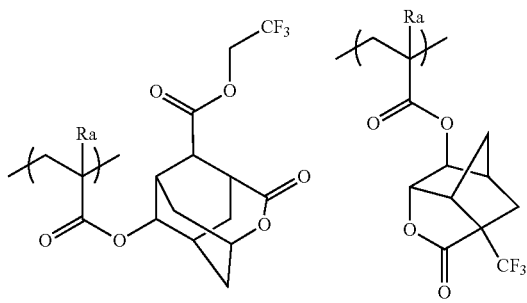

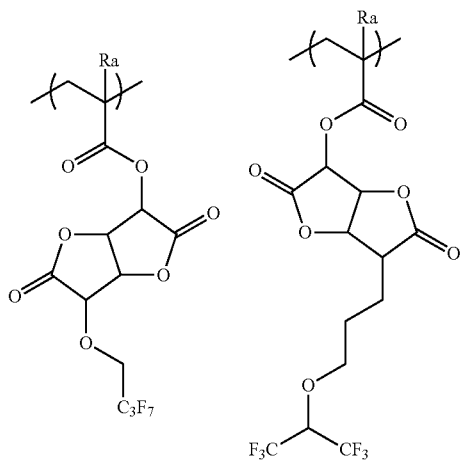
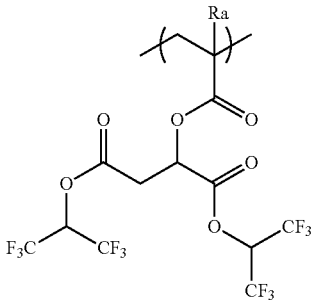
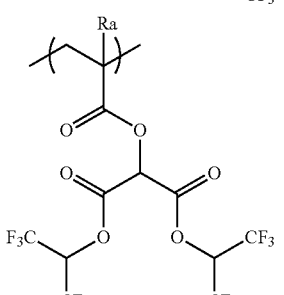
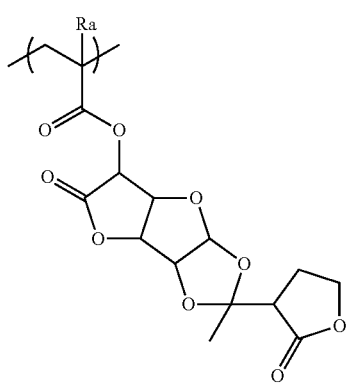
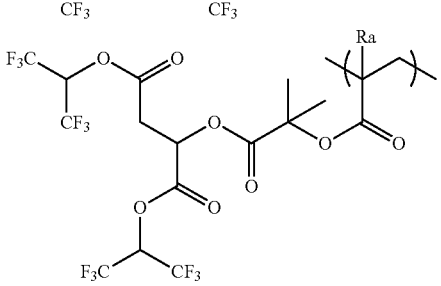
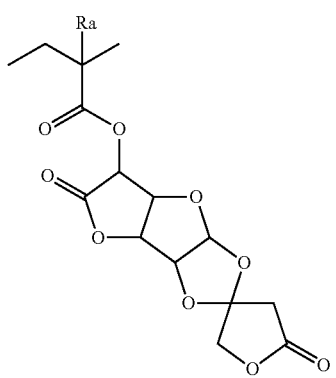
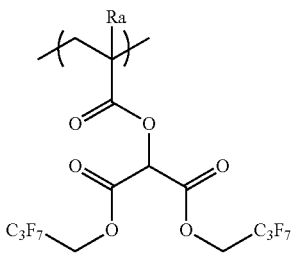
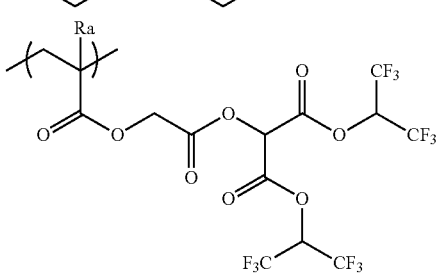
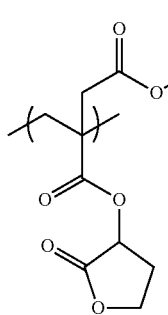
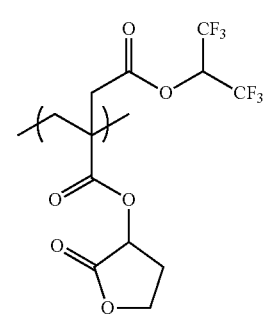
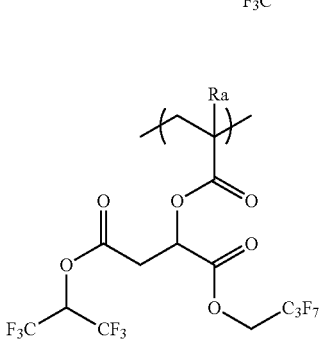

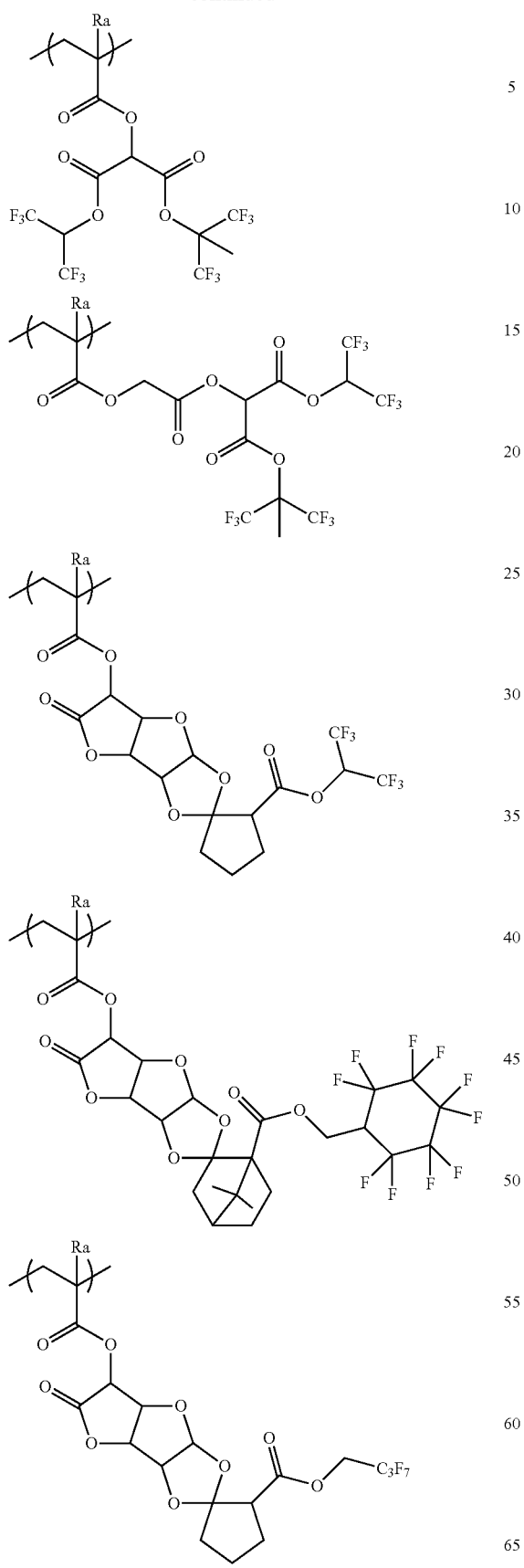
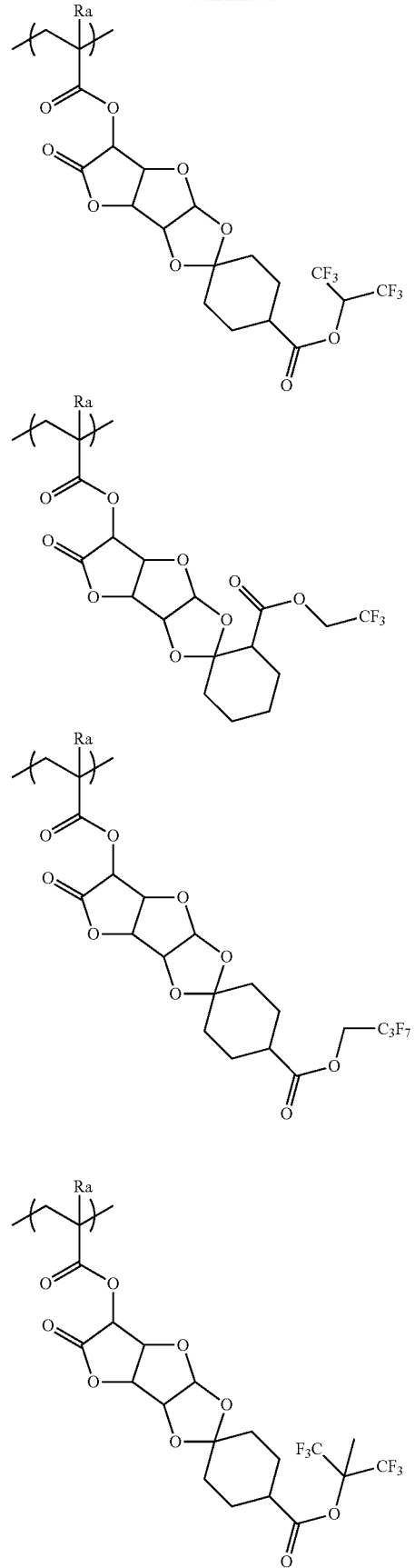

101
-continued
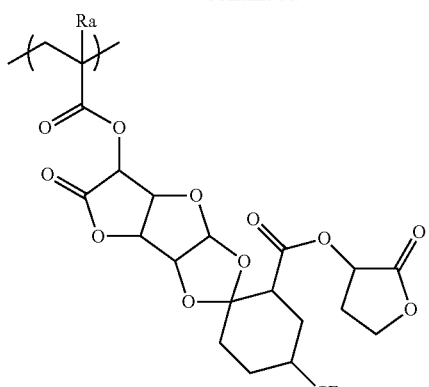
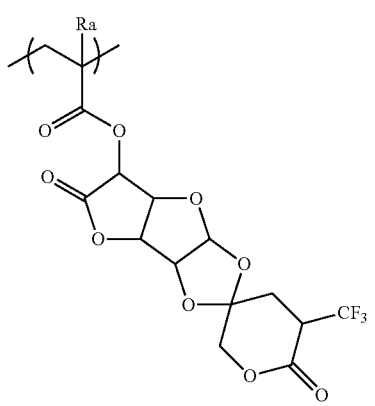
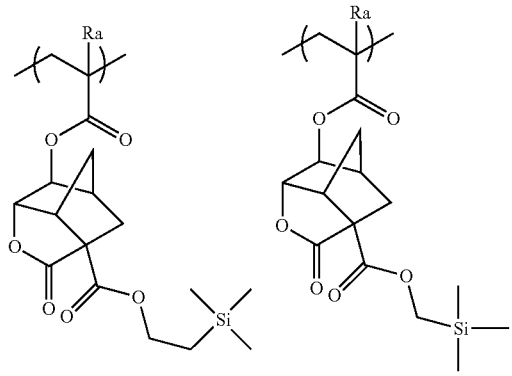
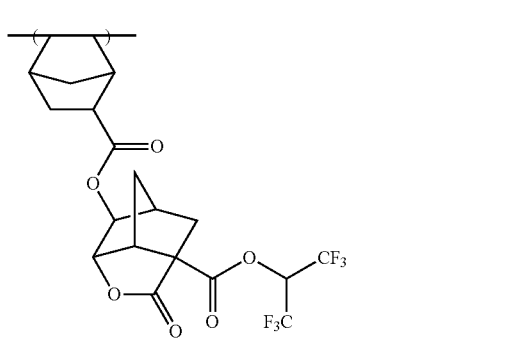
102
-continued
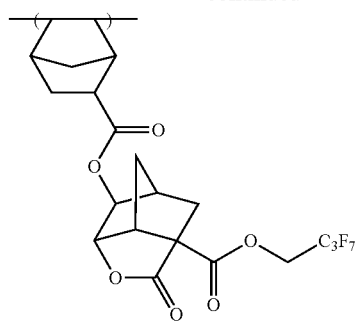
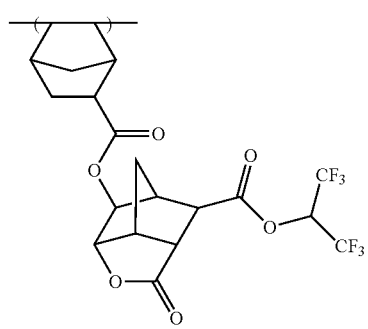
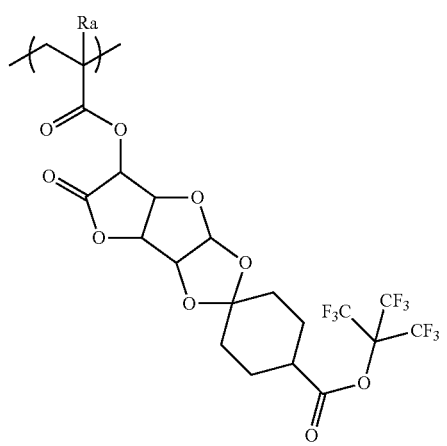
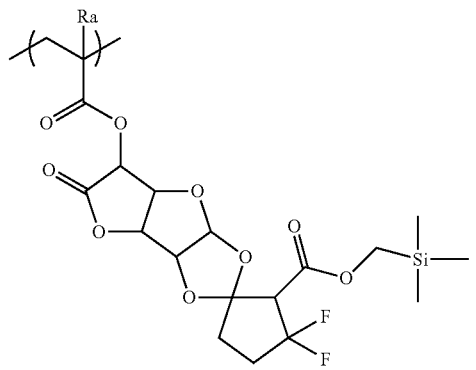

103
-continued
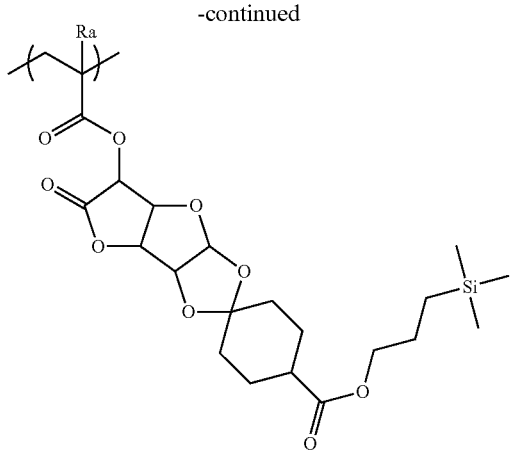
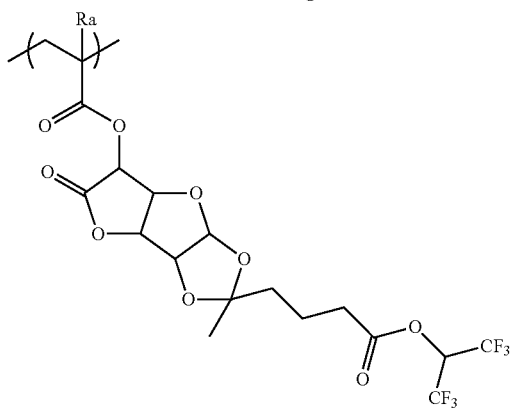
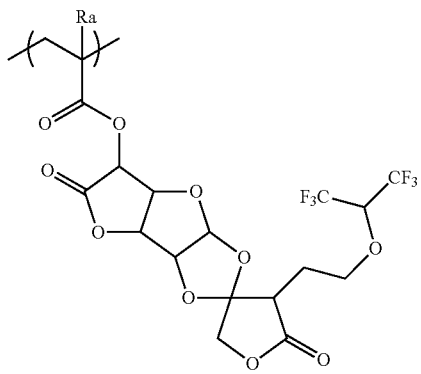
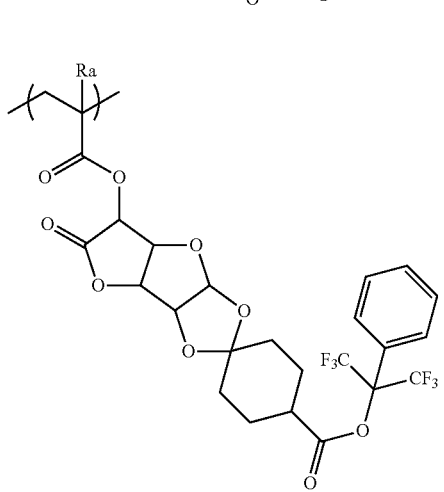
104
-continued
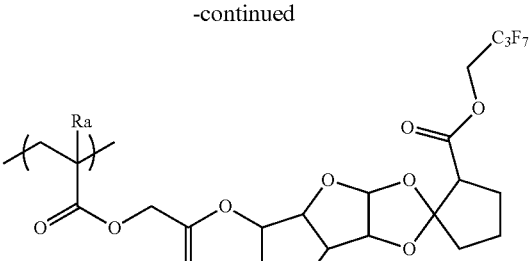
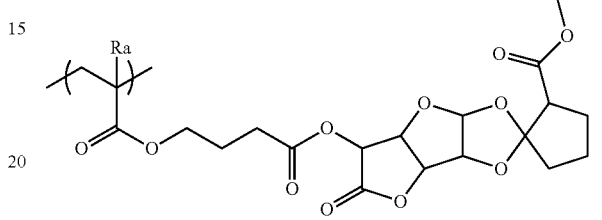
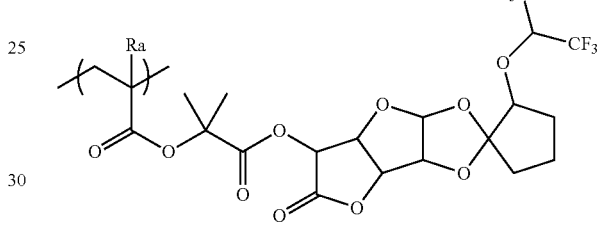
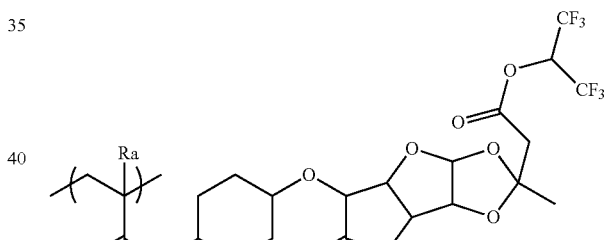
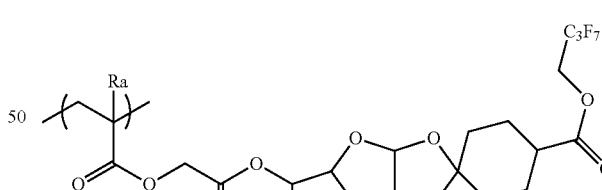
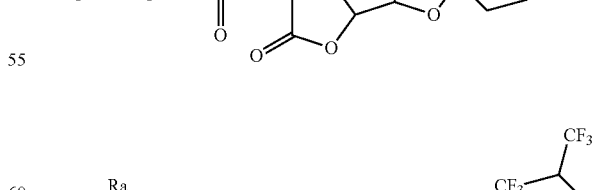
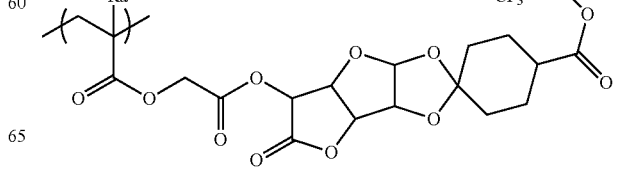

105
-continued
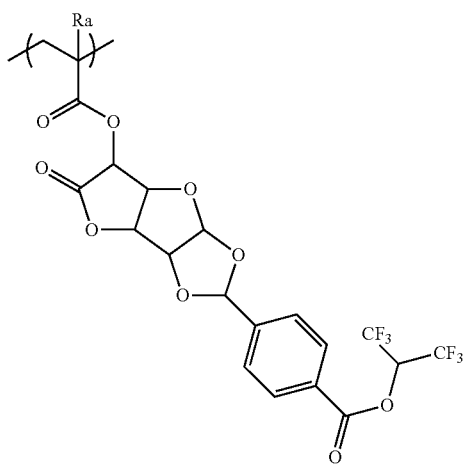
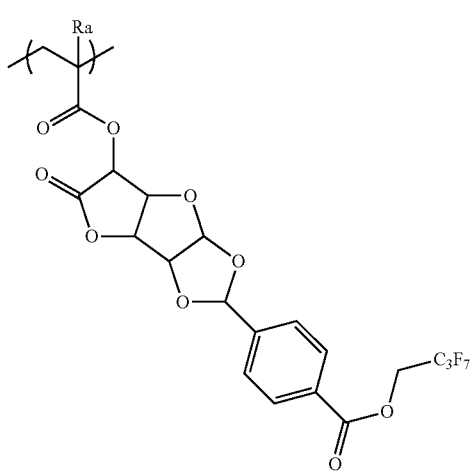
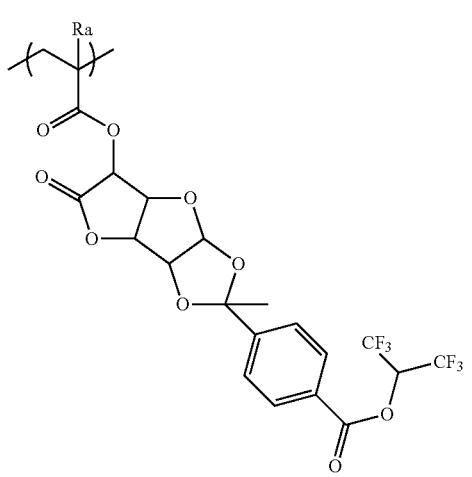
106
-continued
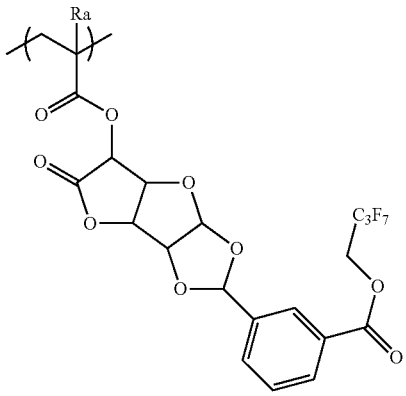
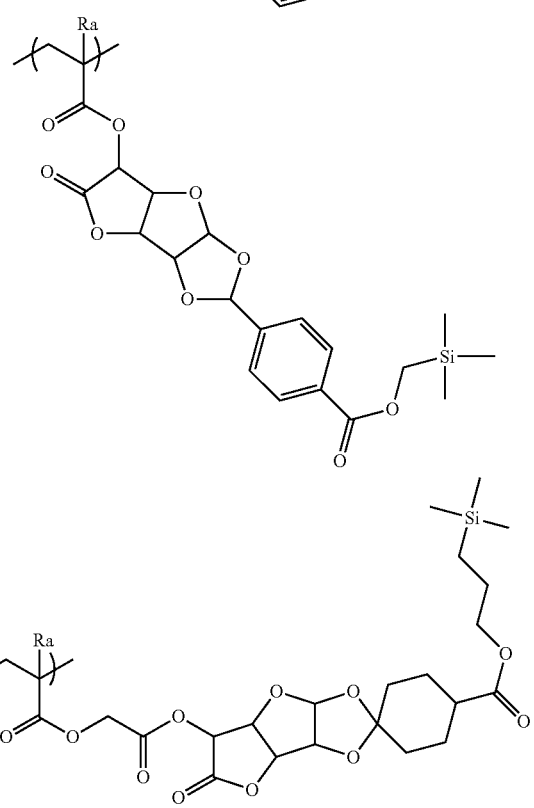
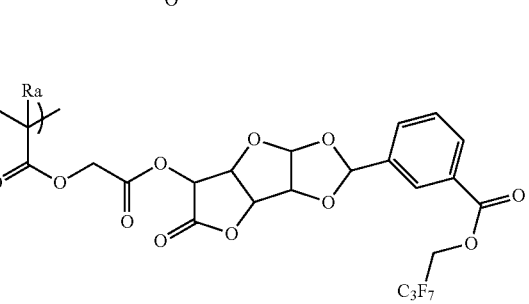
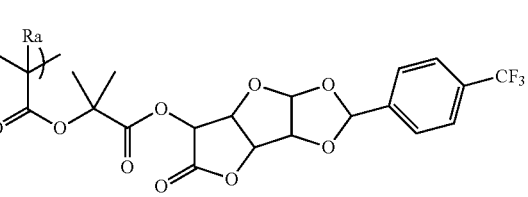

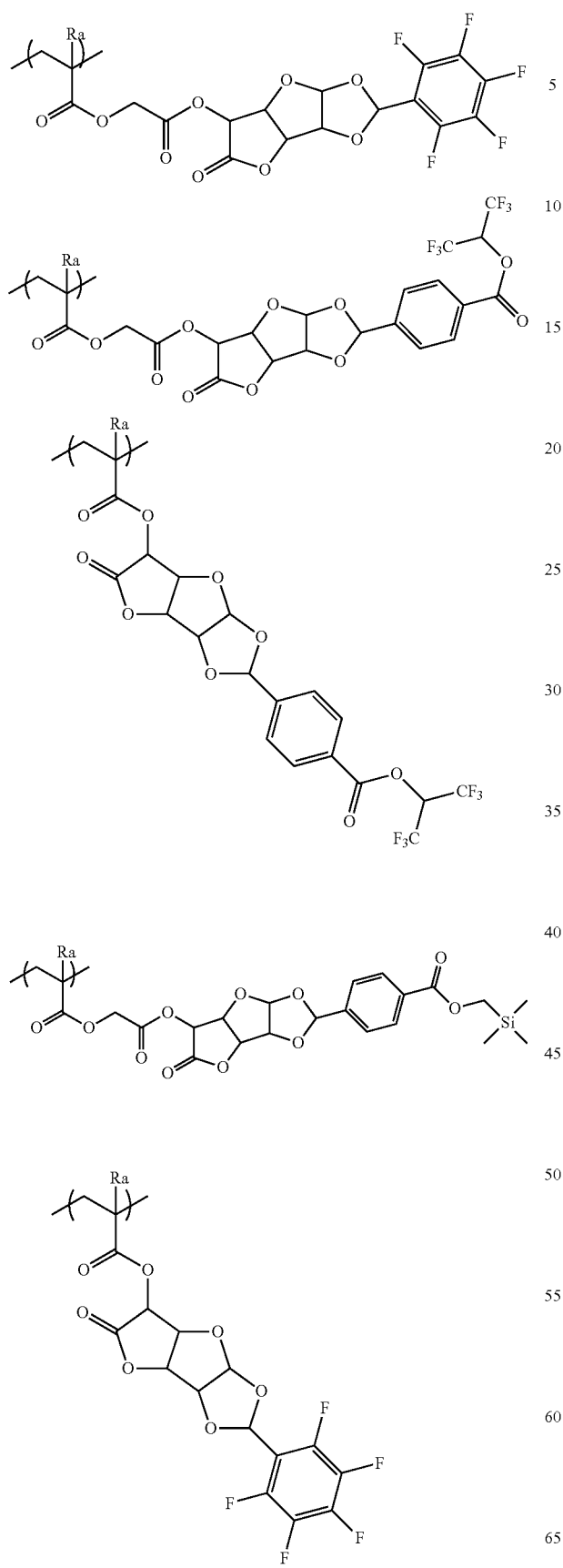
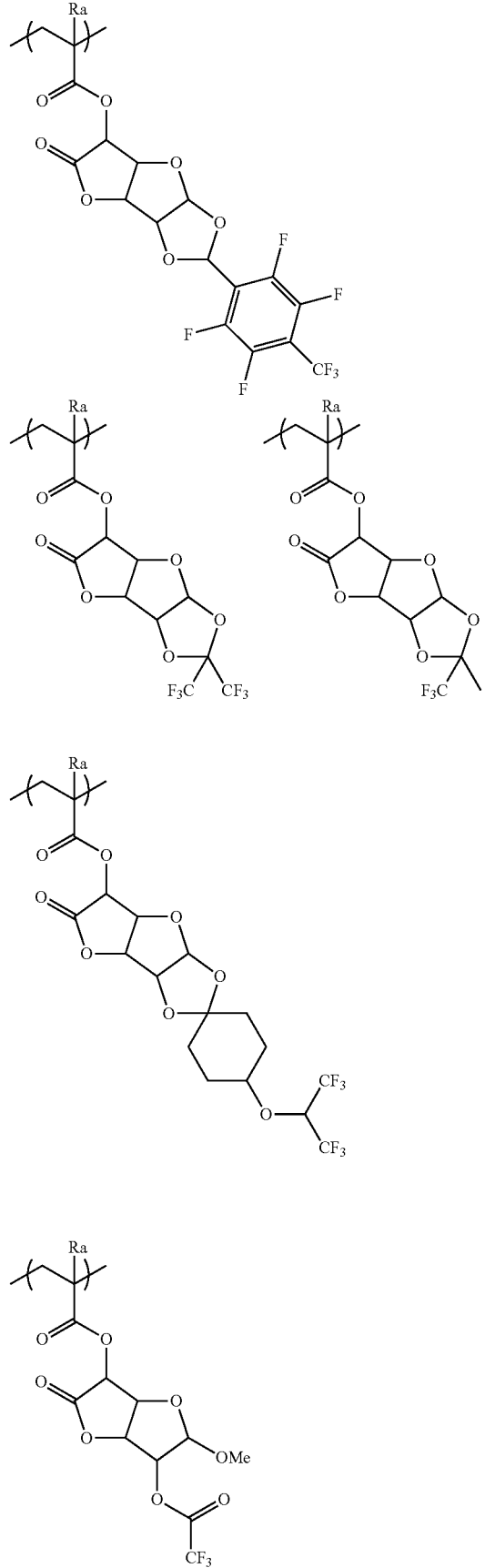

109
-continued
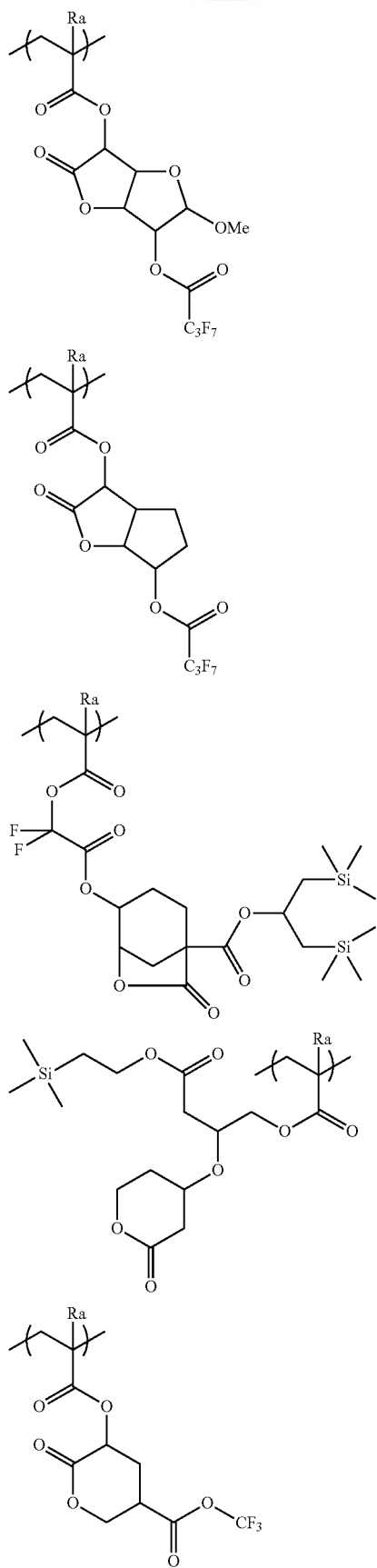
110
-continued
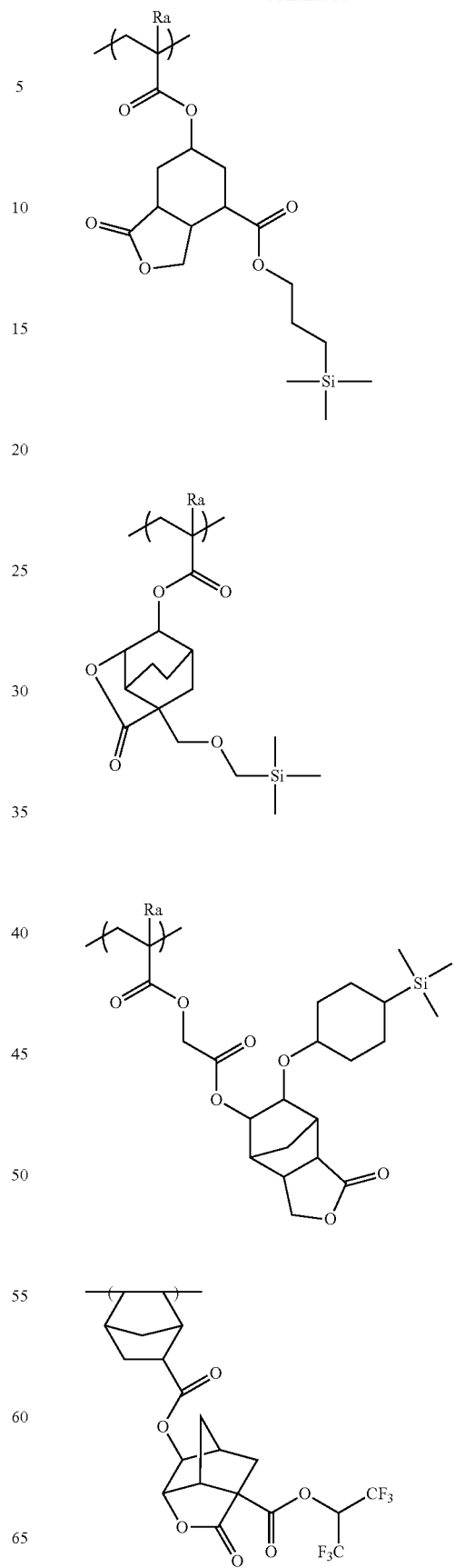

111
-continued
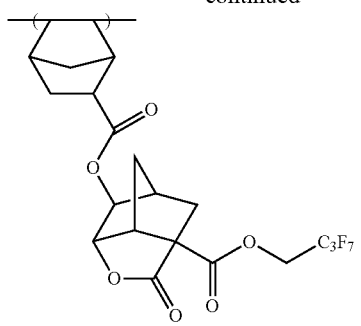
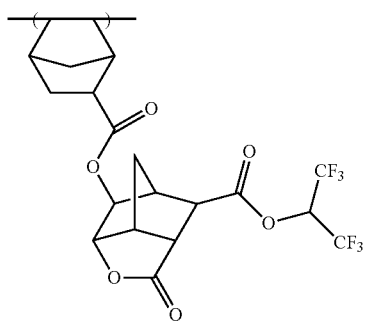
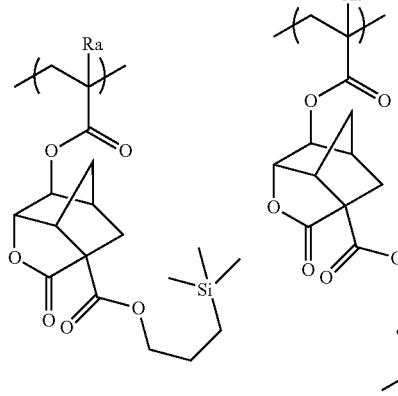
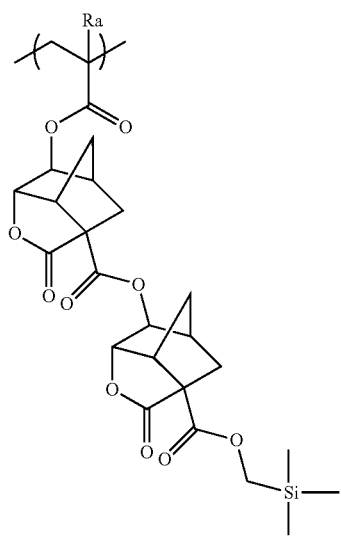
112
-continued
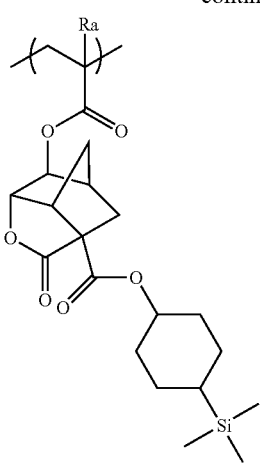
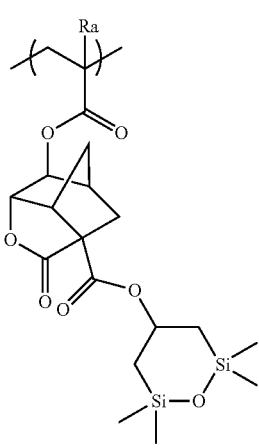
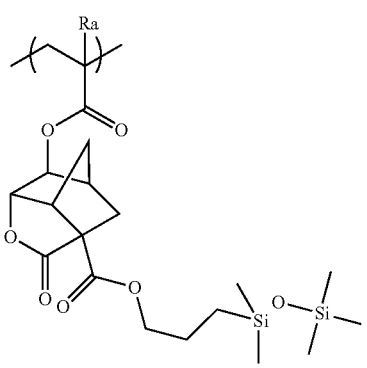

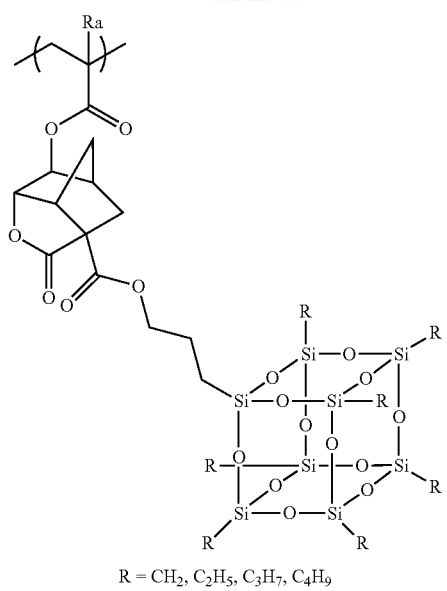
R = CH₂, C₂H₅, C₃H₇, C₄H₉
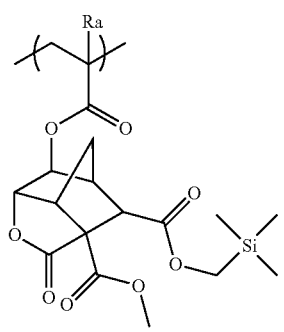
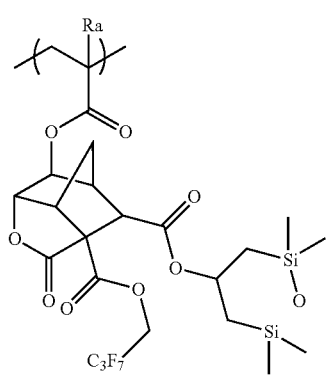
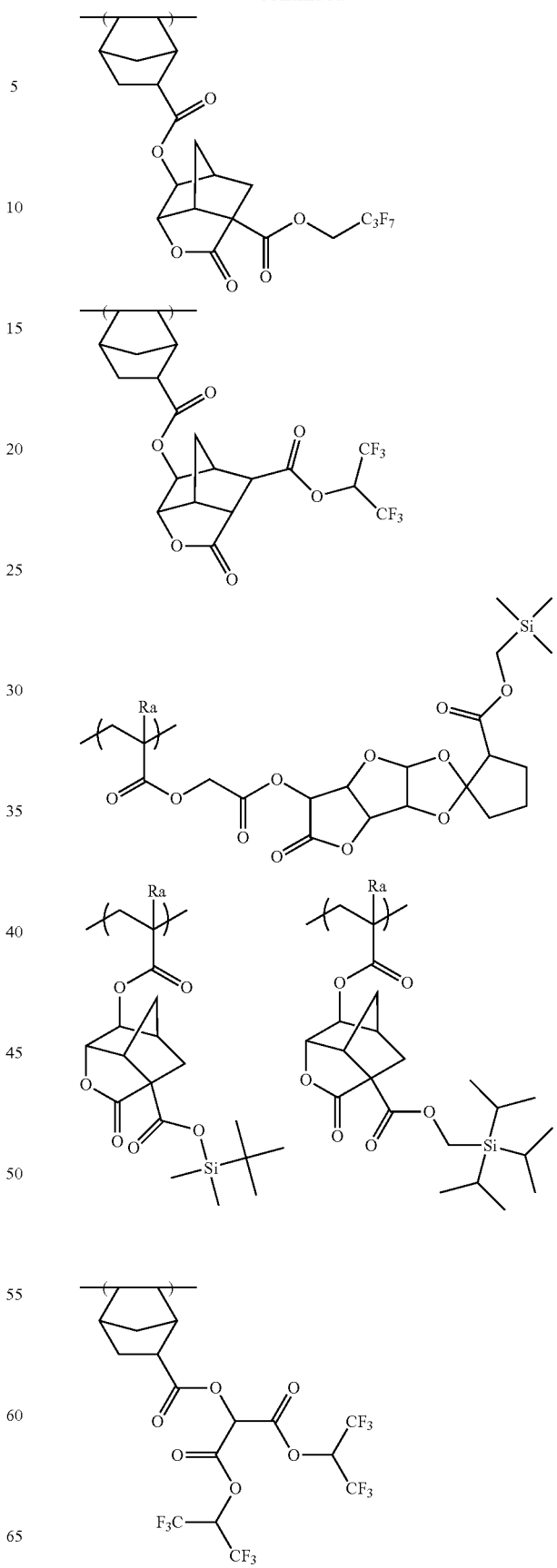

115
-continued
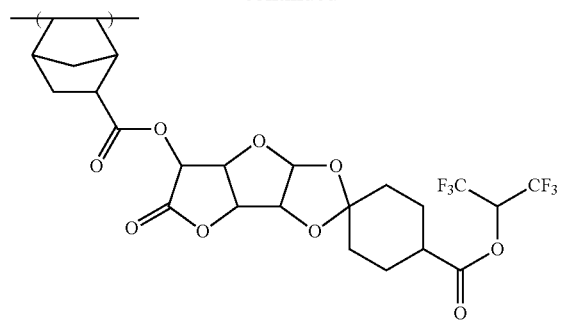
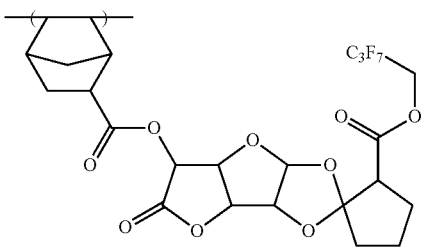
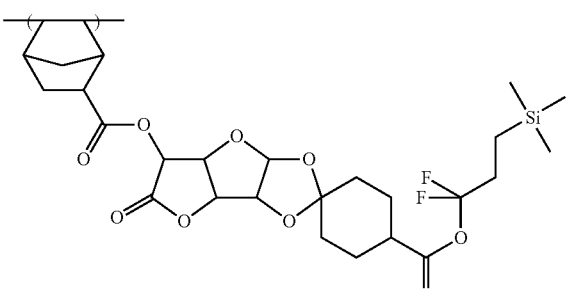
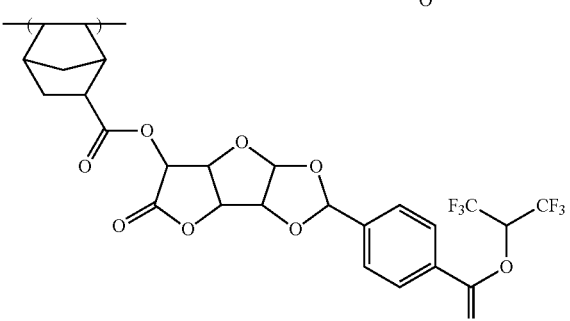
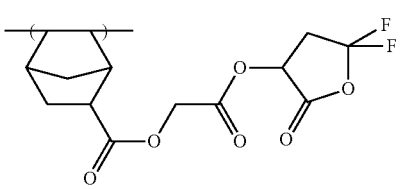
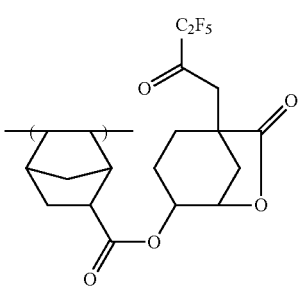
116
-continued
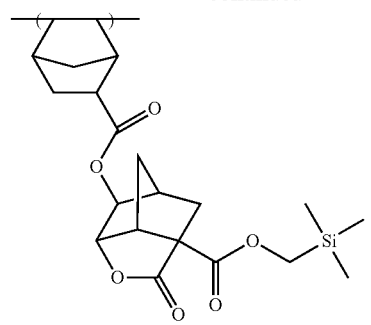
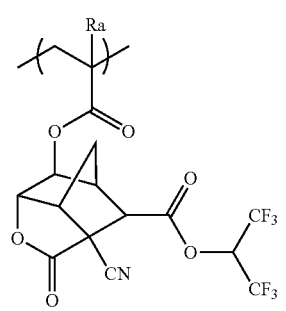
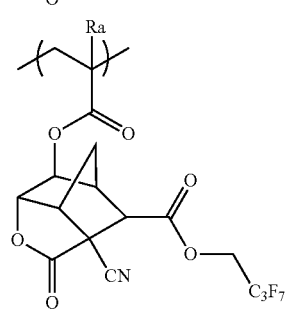
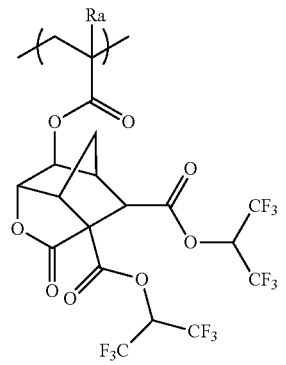
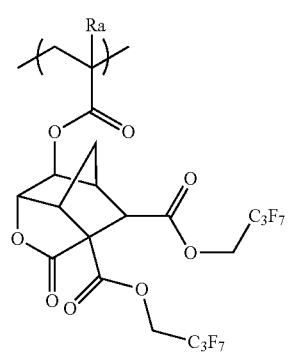

117
-continued
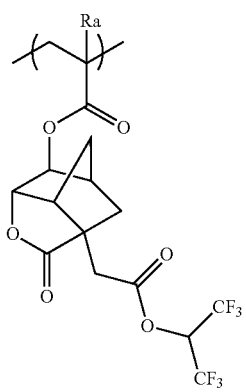
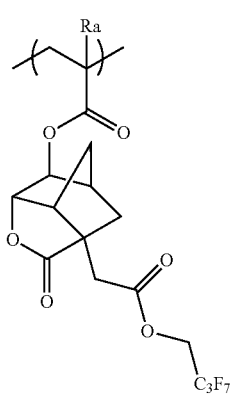
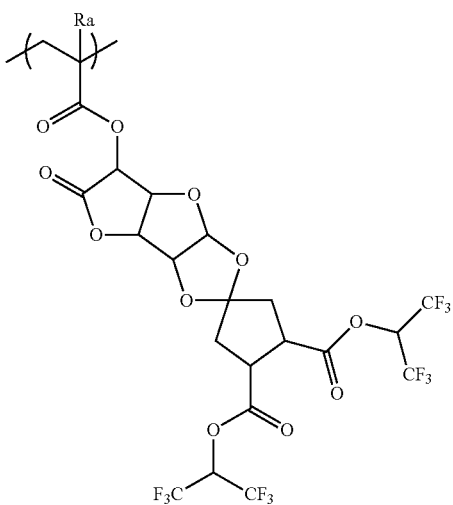
118
-continued
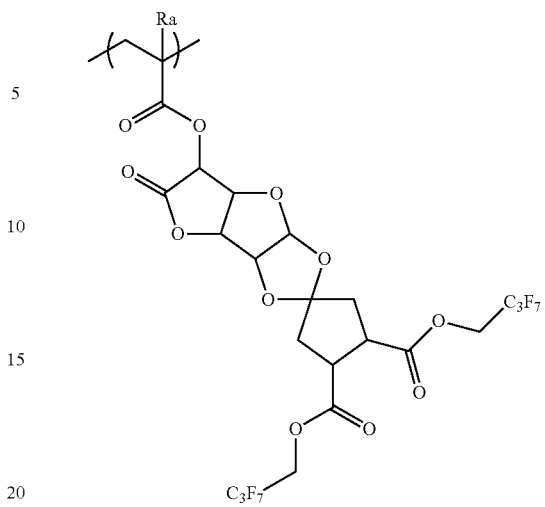
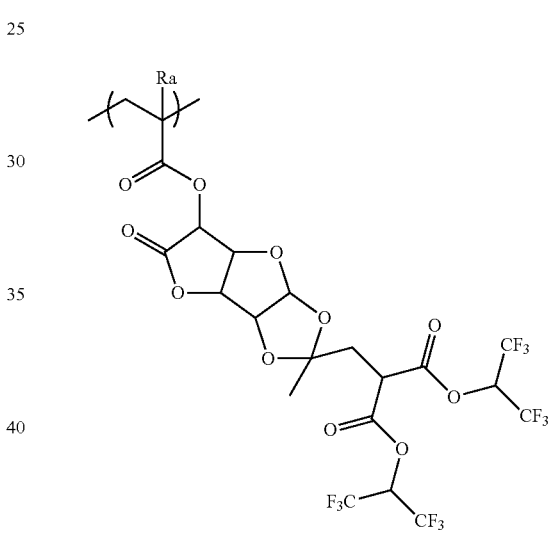
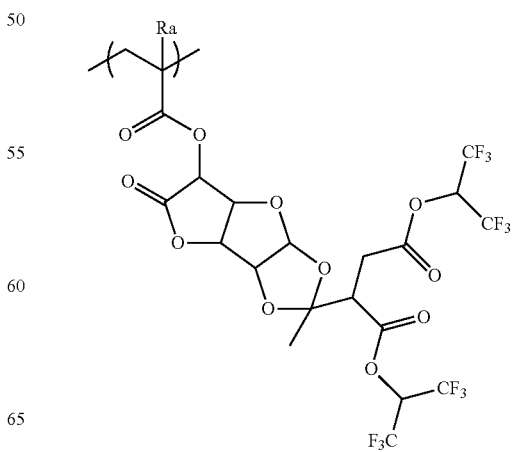

119
-continued
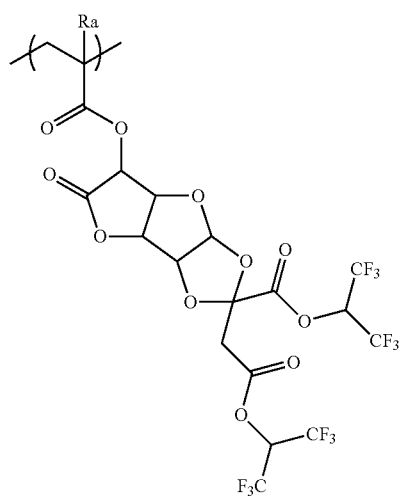
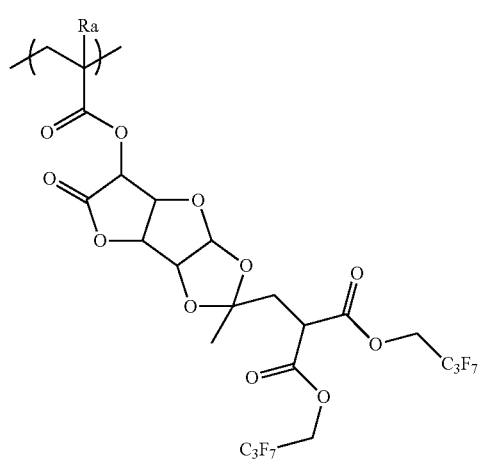
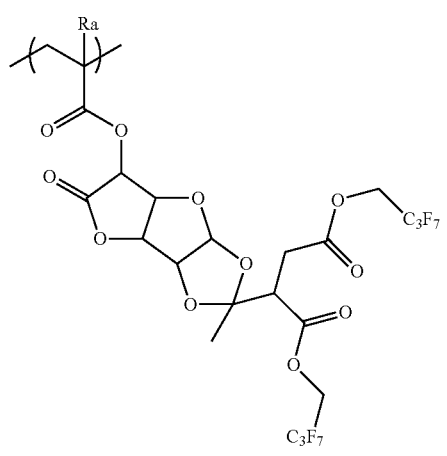
120
-continued
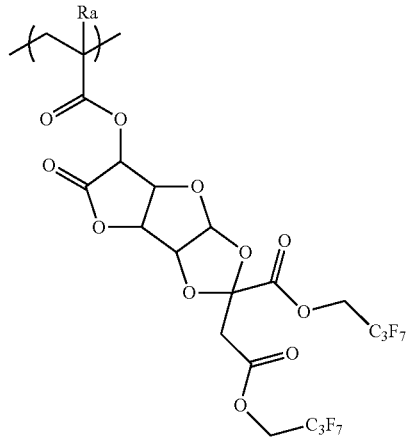
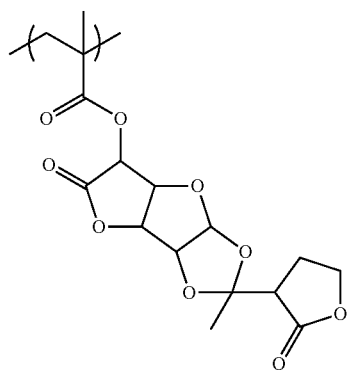
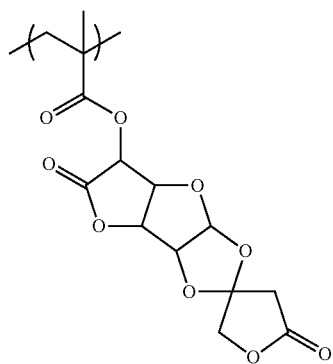
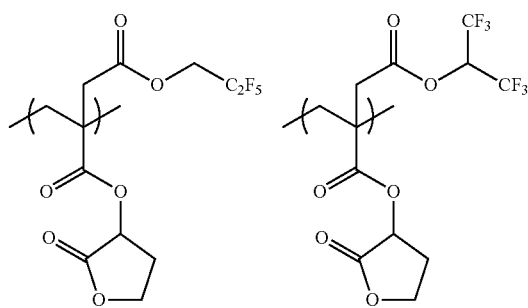

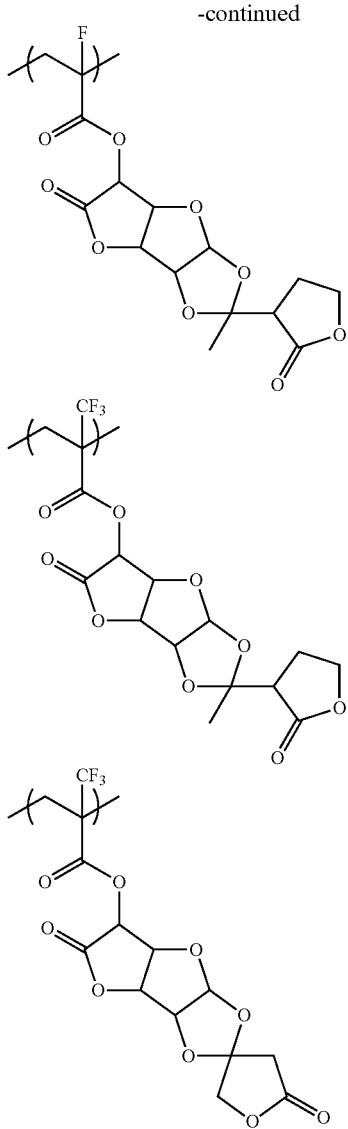

Also, the resin (C) contains at least either a fluorine atom or a silicon atom and preferably contains a repeating unit containing at least either a fluorine atom or a silicon atom.

Thanks to this repeating unit, the resin (C) is unevenly distributed to the surface layer of an actinic ray-sensitive or radiation-sensitive resin film and when the immersion medium is water, the receding contact angle for water on the resist film surface of an actinic ray-sensitive or radiation-sensitive resin film formed as well as followability of the immersion liquid can be enhanced.

The receding contact angle of the actinic ray-sensitive or radiation-sensitive resin film is preferably from 60 to 90°, more preferably 65° or more, still more preferably 70° or more, yet still more preferably 75° or more, at the temperature during exposure, usually at room temperature 23±3° C., and a humidity of 45±5%.

The resin (C) is, as described above, unevenly distributed to the interface but unlike a surfactant, need not have necessarily a hydrophilic group in the molecule and may not contribute to uniform mixing of polar/nonpolar substances.

In the immersion exposure step, the immersion liquid must move on a wafer following the movement of an exposure head that is scanning the wafer at a high speed and forming an exposure pattern. Therefore, the contact angle of the immersion liquid with the resist film in a dynamic state is important, and the resist is required to have a performance of allowing a liquid droplet to follow the high-speed scanning of an exposure head with no remaining.

The resin (C) contains at least either a fluorine atom or a silicon atom, whereby the hydrophobicity (water followability) on the resist surface is enhanced and the development residue (scum) is reduced.

A repeating unit having, as a partial structure of the fluorine atom-containing repeating unit, a fluorine atom-containing alkyl group, a fluorine atom-containing cycloalkyl group or a fluorine atom-containing aryl group is preferred.

The fluorine atom-containing alkyl group (preferably having a carbon number of 1 to 10, more preferably from 1 to 4) is a linear or branched alkyl group with at least one hydrogen atom being replaced by a fluorine atom and may further have other substituents.

The fluorine atom-containing cycloalkyl group is a monocyclic or polycyclic cycloalkyl group with at least one hydrogen atom being replaced by a fluorine atom and may further have other substituents.

The fluorine atom-containing aryl group is an aryl group (e.g., phenyl, naphthyl) with at least one hydrogen atom being replaced by a fluorine atom and may further have other substituents.

The fluorine atom-containing alkyl group, fluorine atom-containing cycloalkyl group or fluorine atom-containing aryl group is preferably a group represented by any one of the following formulae (F2) to (F4), but the present invention is not limited thereto.

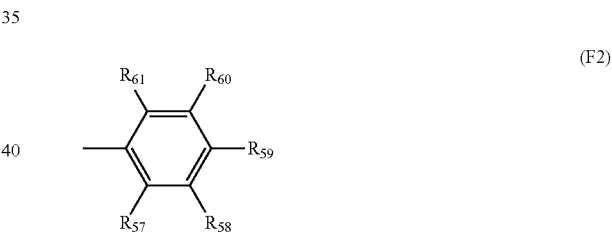

In formulae (F2) to (F4), each of $R_{57}$ to $R_{68}$ independently represents a hydrogen atom, a fluorine atom or an alkyl group (linear or branched), provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being replaced by a fluorine atom.

It is preferred that $R_{57}$ to $R_{61}$ and $R_{65}$ to $R_{67}$ all are a fluorine atom. Each of $R_{62}$, $R_{63}$ and $R_{68}$ is preferably a fluoroalkyl group (preferably having a carbon number of 1 to 4), more preferably a perfluoroalkyl group having a carbon number of 1 to 4. $R_{62}$ and $R_{63}$ may combine with each other to form a ring. $R_{64}$ is preferably a hydrogen atom.

Specific examples of the group represented by formula (F2) include a p-fluorophenyl group, a pentafluorophenyl group and a 3,5-di(trifluoromethyl)phenyl group.

Specific examples of the group represented by formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-tert-butyl group, a perfluoroisopentyl group, a perfluorooctyl group, a perfluoro(trimethyl)hexyl group, a 2,2,3,3-tetrafluorocyclobutyl group and a perfluorocyclohexyl group. Among these, a hexafluoroisopropyl group, a heptafluoroisopropyl group, a hexafluoro(2-methyl)isopropyl group, an octafluoroisobutyl group, a nonafluoro-tert-butyl group and a perfluoroisopentyl group are preferred, and a hexafluoroisopropyl group and a heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

The fluorine-containing partial structure may be directly bonded to the main chain or may be bonded to the main chain through a sole group or a combination of two or more groups selected from the group consisting of an alkylene group, a phenylene group, an ether group, a thioether group, a carbonyl group, an ester group, an amide group, a urethane group and a ureylene group.

As for the repeating unit having a fluorine atom, those shown below are preferred.

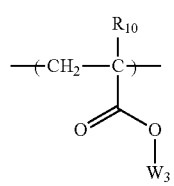
(C-Ia)

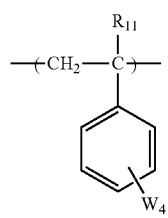
(C-Ib)

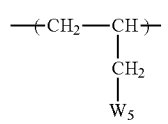
(C-Ic)

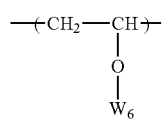
(C-Id)

In the formulae, each of $R_{10}$ and $R_{11}$ independently represents a hydrogen atom, a fluorine atom or an alkyl group. The alkyl group is preferably a linear or branched alkyl group having a carbon number of 1 to 4 and may have a substituent, and the alkyl group having a substituent includes, in particular, a fluorinated alkyl group.

Each of $W_3$ to $W_6$ independently represents an organic group having at least one or more fluorine atoms. Specific examples thereof include the atomic groups of (F2) to (F4).

Other than these, the resin (C) may contain, as the repeating unit having a fluorine atom, a repeating unit shown below.

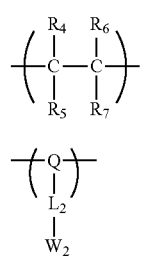
(C-II)

(C-III)

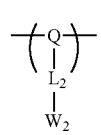

In the formulae, each of $R_4$ to $R_7$ independently represents a hydrogen atom, a fluorine atom or an alkyl group. The alkyl group is preferably a linear or branched alkyl group having a carbon number of 1 to 4 and may have a substituent, and the alkyl group having a substituent includes, in particular, a fluorinated alkyl group. However, at least one of $R_4$ to $R_7$ represents a fluorine atom. $R_4$ and $R_5$, or $R_6$ and $R_7$ may form a ring.

$W_2$ represents an organic group having at least one fluorine atom. Specific examples thereof includes the atomic groups of (F2) to (F4).

$L_2$ represents a single bond or a divalent linking group. The divalent linking group is a substituted or unsubstituted arylene group, a substituted or unsubstituted alkylene group, a substituted or unsubstituted cycloalkylene group, —O—, —SO$_2$—, —CO—, —N(R)— (wherein R represents a hydrogen atom or an alkyl group), —NHSO$_2$—, or a divalent linking group formed by combining a plurality of these groups.

Q represents an alicyclic structure. The alicyclic structure may have a substituent, may be monocyclic or polycyclic, and may be crosslinked. The monocyclic structure is preferably a cycloalkyl group having a carbon number of 3 to 8, and examples thereof include a cyclopentyl group, a cyclohexyl group, a cyclobutyl group and a cyclooctyl group. Examples of the polycyclic structure include a group containing a bicyclo, tricyclo or tetracyclo structure having a carbon number of 5 or more. A cycloalkyl group having a carbon number of 6 to 20 is preferred, and examples thereof include an adamantyl group, a norbornyl group, a dicyclopentyl group, a tricyclodecanyl group and a tetracyclododecyl group. A part of carbon atoms in the cycloalkyl group may be replaced by a heteroatom such as oxygen atom.

The repeating unit containing a silicon atom is described below.

The repeating unit containing a silicon atom preferably has, as the silicon atom-containing partial structure, an alkylsilyl structure (preferably a trialkylsilyl group) or a cyclic siloxane structure.

Specific examples of the alkylsilyl structure and cyclic siloxane structure include the groups represented by the following formulae (CS-1) to (CS-3):

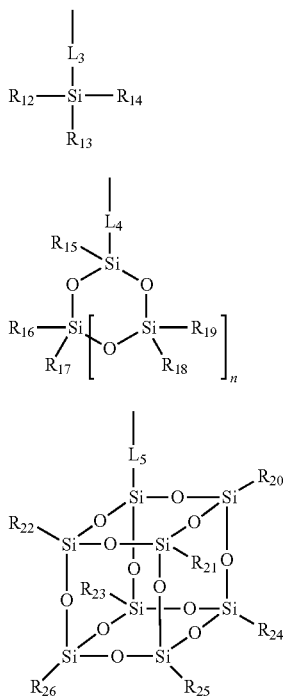

(CS-1)

(CS-2)

(CS-3)

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group includes a sole group or a combination of two or more groups selected from the group consisting of an alkylene group, a phenylene group, an ether group, a thioether group, a carbonyl group, an ester group, an amide group, a urethane group and a ureylene group.

n represents an integer of 1 to 5. n is preferably an integer of 2 to 4.

In the resin (C), the content of the repeating unit (c) is preferably from 10 to 100 mol %, more preferably from 20 to 100 mol %, still more preferably from 30 to 100 mol %, and most preferably from 40 to 100 mol %, based on all repeating units in the resin (C).

The content of the repeating unit (c') is preferably from 10 to 100 mol %, more preferably from 20 to 100 mol %, still more preferably from 30 to 100 mol %, and most preferably from 40 to 100 mol %, based on all repeating units in the resin (C).

The content of the repeating unit (c*) is preferably from 10 to 90 mol %, more preferably from 15 to 85 mol %, still more preferably from 20 to 80 mol %, and most preferably from 25 to 75 mol %, based on all repeating units in the resin (C). The content of the repeating unit having at least either a fluorine atom or a silicon atom, which is used together with the repeating unit (c*), is preferably from 10 to 90 mol %, more preferably from 15 to 85 mol %, still more preferably from 20 to 80 mol %, and most preferably from 25 to 75 mol %, based on all repeating units in the resin (C).

The content of the repeating unit (c") is preferably from 10 to 100 mol %, more preferably from 20 to 100 mol %, still more preferably from 30 to 100 mol %, and most preferably from 40 to 100 mol %, based on all repeating units in the resin (C).

The fluorine atom or silicon atom in the resin (C) may be present in the main chain of the resin or may be substituted on the side chain.

The resin (C) may further contain (c1) a repeating unit having at least either a fluorine atom or a silicon atom, which is different from the repeating units (c') and (c").

Examples of the fluorine atom-containing partial structure in the repeating unit (c1) are the same as those described above, and the groups represented by formula (F2) to (F4) are preferred.

Examples of the silicon atom-containing partial structure in the repeating unit (c1) are the same as those described above, and the groups represented by formulae (CS-1) to (CS-3) are preferred.

The repeating unit (c1) having at least either a fluorine atom or a silicon atom is preferably a (meth)acrylate-based repeating unit.

Specific examples of the repeating unit (c1) are set forth below, but the present invention is not limited thereto. In specific examples, $X_1$ represents a hydrogen atom, —$CH_3$, —F or —$CF_3$, and $X_2$ represents —F or —$CF_3$.

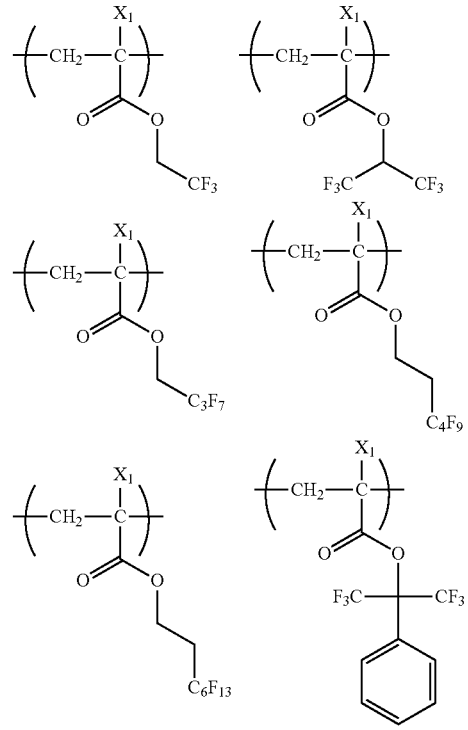

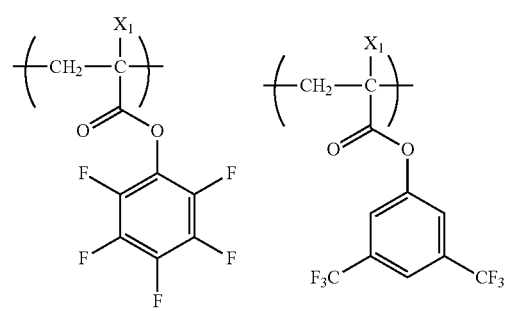

127
-continued
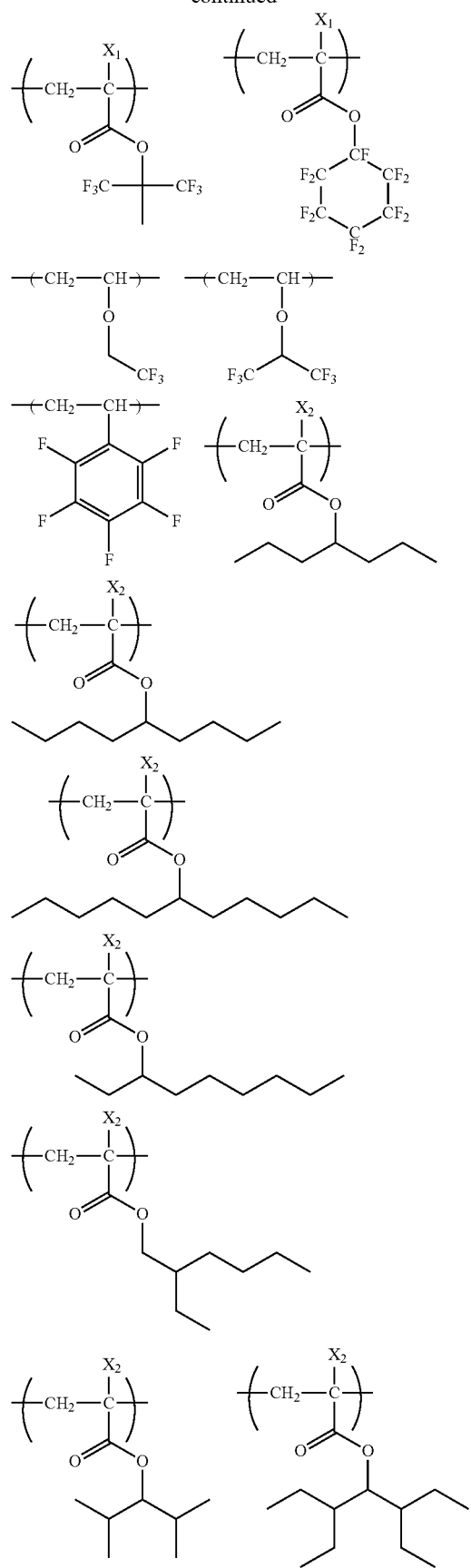
128
-continued
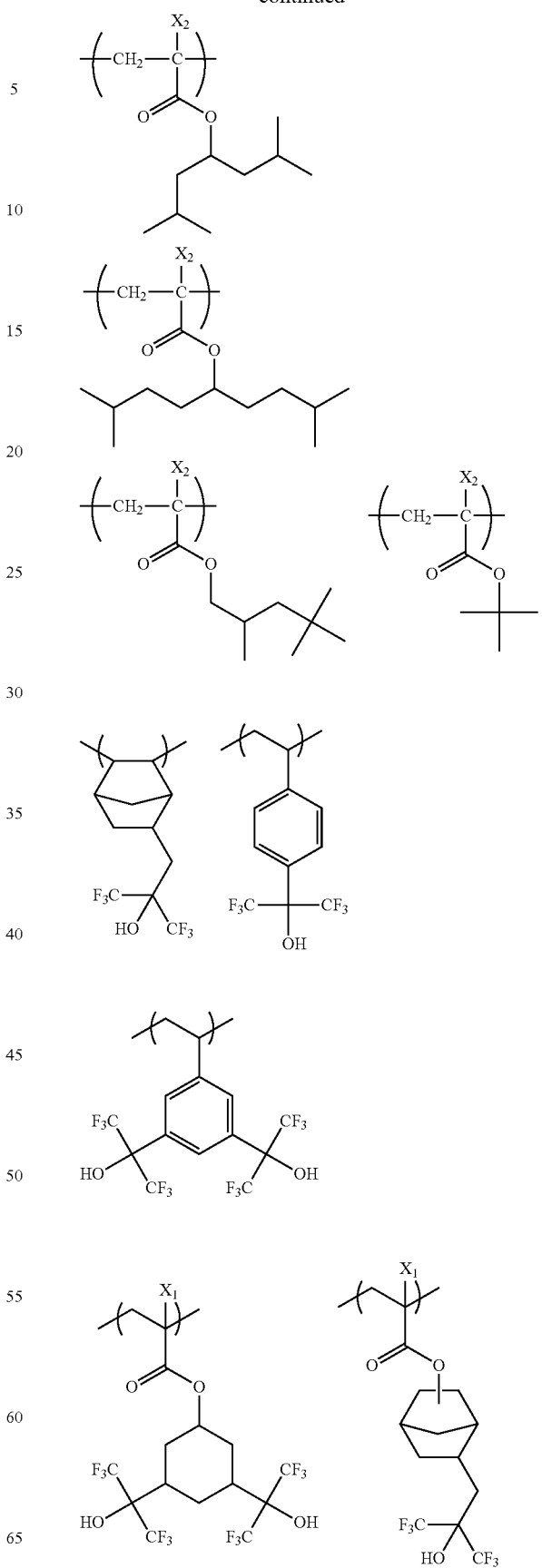

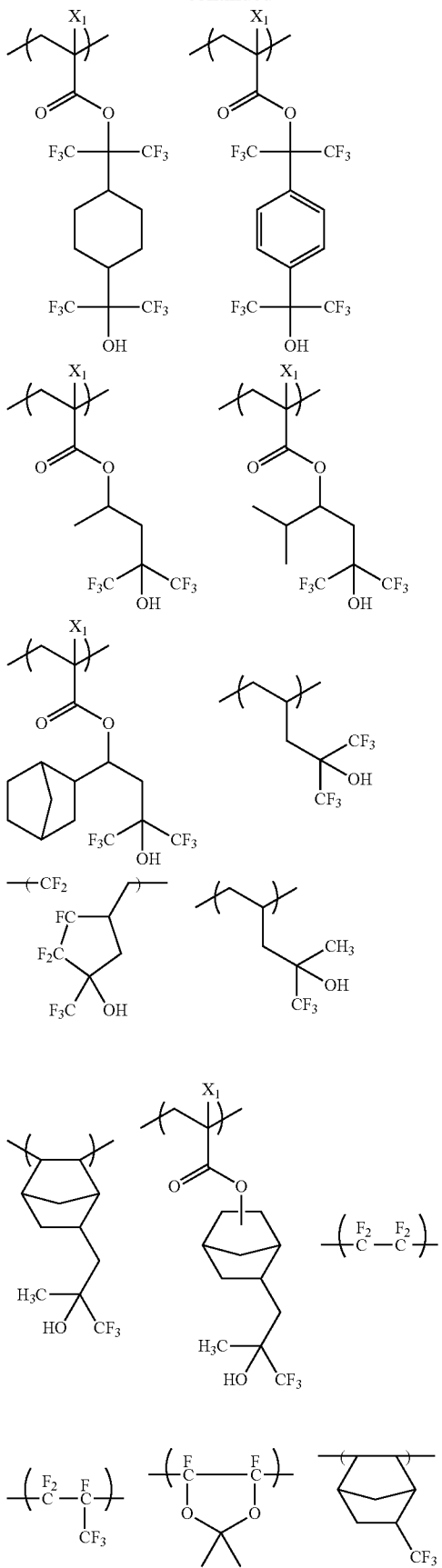

131

-continued

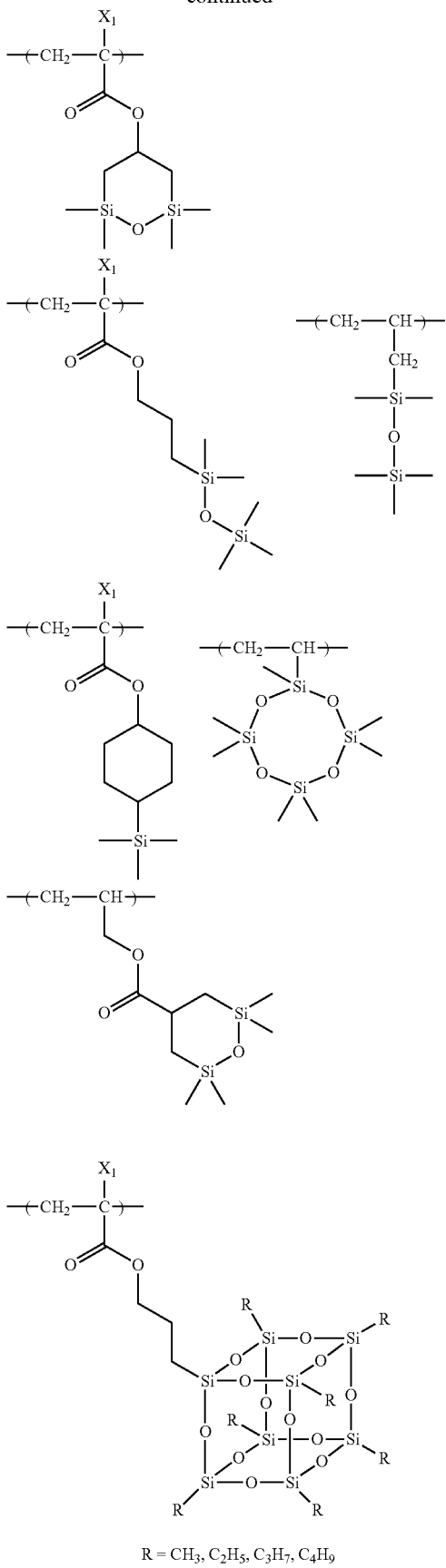

R = CH₃, C₂H₅, C₃H₇, C₄H₉

132

-continued

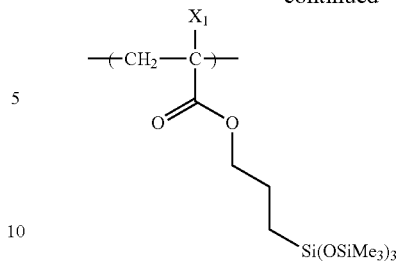

The resin (C) may further contain at least one group selected from the group consisting of following (x) and (z):

(x) an alkali-soluble group, and (z) a group capable of decomposing by the action of an acid.

Examples of the alkali-soluble group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred alkali-soluble groups are a fluorinated alcohol group (preferably hexafluoroisopropanol), a sulfonimide group and a bis(carbonyl)methylene group.

Examples of the repeating unit having (x) an alkali-soluble group include a repeating unit where an alkali-soluble group is directly bonded to the resin main chain, such as repeating unit by an acrylic acid or a methacrylic acid, and a repeating unit where an alkali-soluble group is bonded to the resin main chain through a linking group, and an alkali-soluble group may also be introduced into the polymer chain terminal by using an alkali-soluble group-containing polymerization initiator or chain transfer agent at the polymerization. All of these cases are preferred.

The content of the repeating unit having (x) an alkali-soluble group is preferably from 1 to 50 mol %, more preferably from 3 to 35 mol %, still more preferably from 5 to 30 mol %, based on all repeating units in the resin (C).

Specific examples of the repeating unit having (x) an alkali-soluble group are set forth below, but the present invention is not limited thereto. In specific examples, Rx represents H, CH₃, CH₂OH or CF₃.

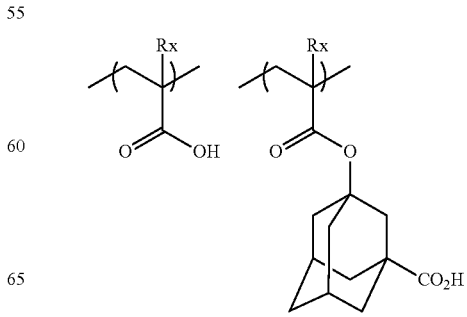

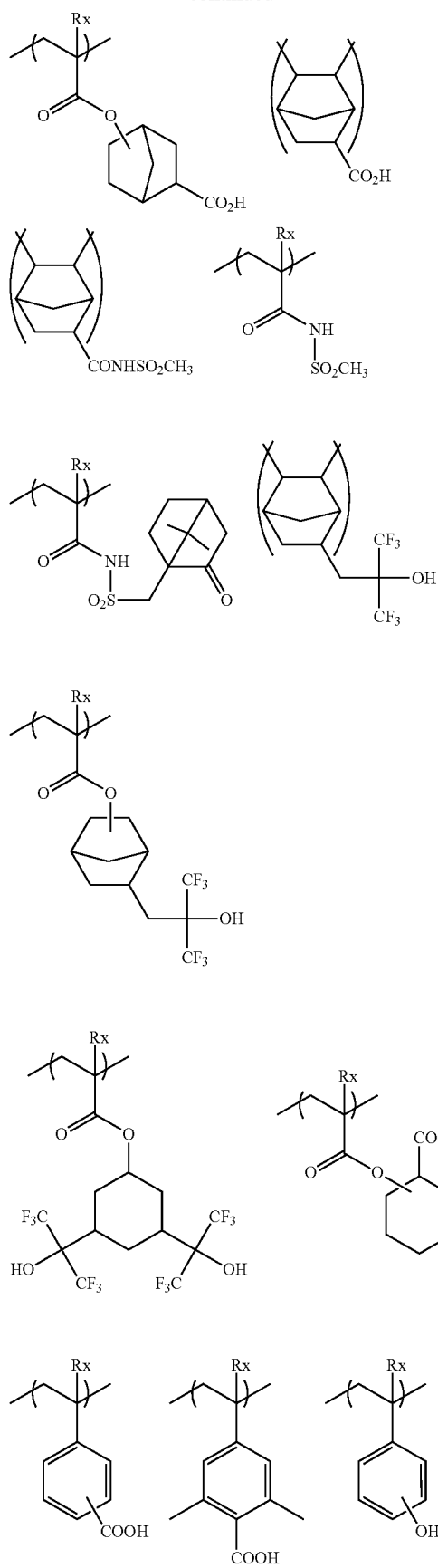
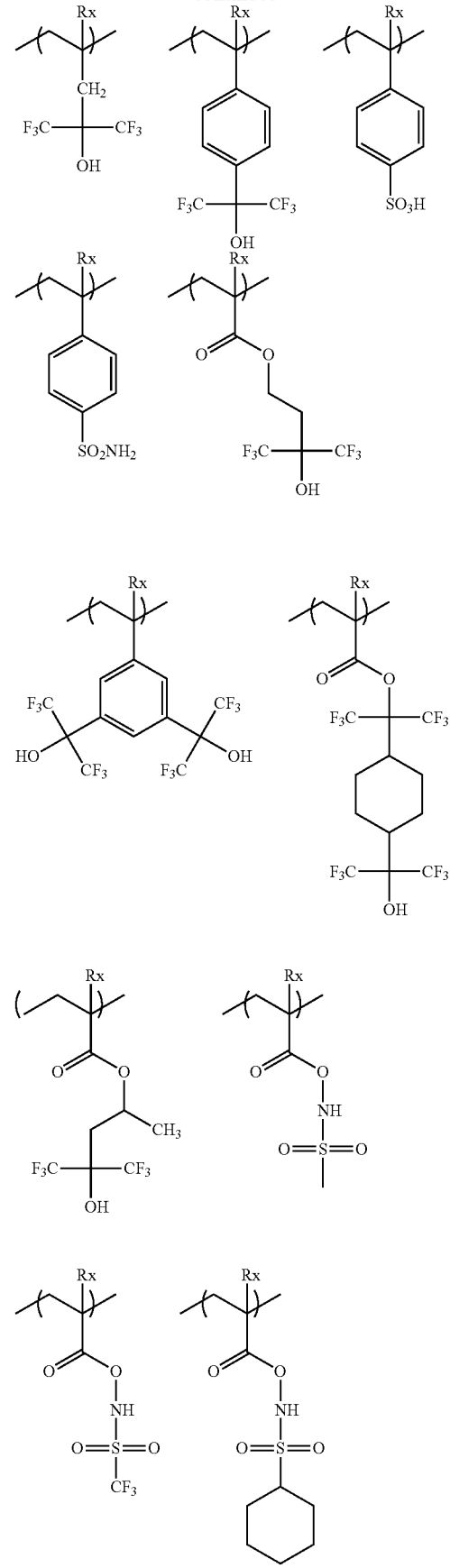

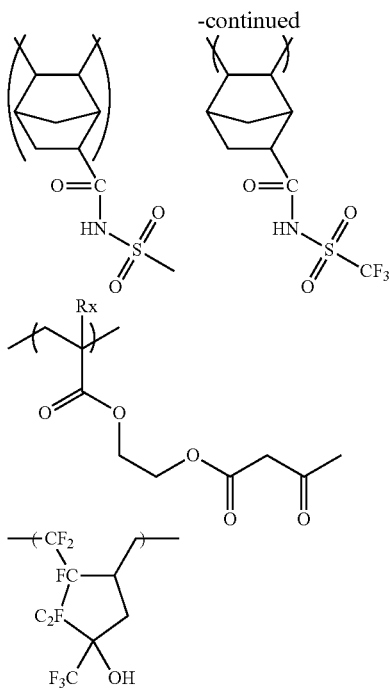

Examples of the repeating unit having (z) a group capable of decomposing by the action of an acid, contained in the resin (C), are the same as those of the repeating unit having an acid-decomposable group described for the resin of the component (A). The acid-decomposable group is preferably a cumyl ester group, an enol ester group, an acetal ester group, a tertiary alkyl ester group or the like, more preferably a tertiary alkyl ester group.

The repeating unit having an acid-decomposable group is preferably a repeating unit represented by the following formula (CAI):

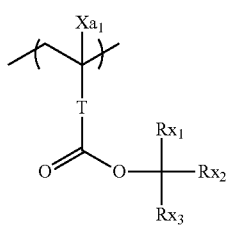

(CAI)

In formula (CAI), $Xa_1$ represents a hydrogen atom, a methyl group which may have a substituent or a group represented by —$CH_2$—$R_9$. $R_9$ represents a hydroxyl group or a monovalent organic group, and examples of the monovalent organic group include an alkyl group having a carbon number of 5 or less and an acyl group having a carbon number of 5 or less. Of these, an alkyl group having a carbon number of 3 or less is preferred, and a methyl group is more preferred. $Xa_1$ is preferably a hydrogen atom, a methyl group, a trifluoromethyl group or a hydroxymethyl group.

T represents a single bond or a divalent linking group.

Each of $Rx_1$ to $Rx_3$ independently represents an alkyl group (linear or branched) or a cycloalkyl group (monocyclic or polycyclic).

Two members of $Rx_1$ to $Rx_3$ may combine to form a cycloalkyl group (monocyclic or polycyclic).

Examples of the divalent linking group of T include an alkylene group, a —COO-Rt- group and a —O-Rt- group, wherein Rt represents an alkylene group or a cycloalkylene group.

T is preferably a single bond or a —COO-Rt- group. Rt is preferably an alkylene group having a carbon number of 1 to 5, more preferably a —$CH_2$— group, a —$(CH_2)_2$— group or a —$(CH_2)_3$— group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a monocyclic cycloalkyl group having a carbon number of 5 to 6.

An embodiment where $Rx_1$ is a methyl group or an ethyl group and $Rx_2$ and $Rx_3$ are combined to form the above-described cycloalkyl group is preferred.

Each of these groups may have a substituent, and examples of the substituent include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). The carbon number of the substituent is preferably 8 or less.

In the resin (C), the content of the repeating unit having (z) a group capable of decomposing by the action of an acid is preferably from 1 to 80 mol %, more preferably from 10 to 80 mol %, still more preferably from 20 to 60 mol %, based on all repeating units in the resin (C). By virtue of having (z) a group capable of decomposing by the action of an acid, LWR can be improved.

The resin (C) may further contain other repeating units. Preferred embodiments of other repeating units include the followings:

(cy1) a repeating unit having a fluorine atom and/or a silicon atom and being stable to an acid and sparingly soluble or insoluble in an alkali developer;

(cy2) a repeating unit having no fluorine atom and no silicon atom and being stable to an acid and sparingly soluble or insoluble in an alkali developer;

(cy3) a repeating unit having a fluorine atom and/or a silicon atom and having a polar group except for (x) and (z) above; and (cy4) a repeating unit having no fluorine atom and no silicon atom and having a polar group except for (x) and (z) above.

The expression "sparingly soluble or insoluble in an alkali developer" in the repeating units of (cy1) and (cy2) means that (cy1) or (cy2) does not contain an alkali-soluble group or a group capable of producing an alkali-soluble group by the action of an acid or an alkali developer (for example, an acid-decomposable group or a polarity converting group).

The repeating units (cy1) and (cy2) preferably have an alicyclic hydrocarbon structure containing no polar group.

Preferred embodiments of the repeating units (cy1) to (cy4) are described below.

The repeating units (cy1) and (cy2) are preferably a repeating unit represented by the following formula (CIII):

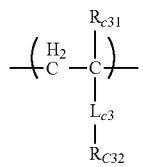

(CIII)

In formula (CIII), $R_{c31}$ represents a hydrogen atom, an alkyl group which may be substituted by a fluorine atom, a cyano group or a —$CH_2$—O-$Rac_2$ group, wherein $Rac_2$ represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group or a cycloalkenyl group. These groups may be substituted by a fluorine atom or a silicon atom.

$L_{c3}$ represents a single bond or a divalent linking group.

In formula (CIII), the alkyl group of $R_{c32}$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The aryl group is preferably an aryl group having a carbon number of 6 to 20, such as phenyl group and naphthyl group, and these groups may have a substituent.

$R_{c32}$ is preferably an unsubstituted alkyl group or a fluorine atom-substituted alkyl group. The divalent linking group of $L_{c3}$ is preferably an alkylene group (preferably having a carbon number of 1 to 5), an oxy group, a phenylene group or an ester group (a group represented by —COO—).

The repeating units (cy1) and (cy2) are preferably a repeating unit represented by the following formula (C4) or (C5):

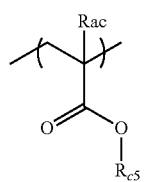

(C4)

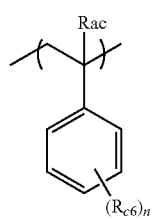

(C5)

In formula (C4), $R_{c5}$ represents a hydrocarbon group having at least one cyclic structure and having neither a hydroxyl group nor a cyano group.

Rac represents a hydrogen atom, an alkyl group which may be substituted by a fluorine atom, a cyano group or a —$CH_2$—O-$Rac_2$ group, wherein $Rac_2$ represents a hydrogen atom, an alkyl group or an acyl group. Rac is preferably a hydrogen atom, a methyl group, a hydroxymethyl group or a trifluoromethyl group, more preferably a hydrogen atom or a methyl group.

The cyclic structure in $R_{c5}$ includes a monocyclic hydrocarbon group and a polycyclic hydrocarbon group. Examples of the monocyclic hydrocarbon group include a cycloalkyl group having a carbon number of 3 to 12, and a cycloalkenyl group having a carbon number of 3 to 12. The monocyclic hydrocarbon group is preferably a monocyclic hydrocarbon group having a carbon number of 3 to 7.

The polycyclic hydrocarbon group includes a ring gathered hydrocarbon group and a crosslinked cyclic hydrocarbon group. Examples of the crosslinked cyclic hydrocarbon ring include a bicyclic hydrocarbon ring, a tricyclic hydrocarbon ring and a tetracyclic hydrocarbon ring. The crosslinked cyclic hydrocarbon ring also includes a condensed cyclic hydrocarbon ring (for example, a condensed ring formed by condensing a plurality of 5- to 8-membered cycloalkane rings). Preferred examples of the crosslinked cyclic hydrocarbon ring include a norbornyl group and an adamantyl group.

These alicyclic hydrocarbon groups may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group is preferably an alkoxycarbonyl group having a carbon number of 2 to 4.

$R_{c5}$ may also be an aryl group or an aralkyl group.

The aryl group is preferably an aryl group having a carbon number of 6 to 12, and specific examples thereof include a phenyl group, a naphthyl group and a biphenyl group. The aryl group may be further substituted by an alkyl group, a cycloalkyl group or the like.

The aralkyl group is preferably an aralkyl group having a carbon number of 7 to 15, and specific examples thereof include a benzyl group, a naphthylmethyl group and a naphthylethyl group. The aralkyl group may be further substituted by an alkyl group, a cycloalkyl group or the like.

In formula (C5), $R_{c6}$ represents an alkyl group, a cycloalkyl group, an alkenyl group, a cycloalkenyl group, an alkoxycarbonyl group or an alkylcarbonyloxy group, and these groups may be substituted by a fluorine atom or a silicon atom.

The alkyl group of $R_{c6}$ is preferably a linear or branched alkyl group having a carbon number of 1 to 20, and the cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The alkoxycarbonyl group is preferably an alkoxycarbonyl group having a carbon number of 2 to 20.

The alkoxycarbonyloxy group is preferably an alkoxycarbonyloxy group having a carbon number of 2 to 20.

n represents an integer of 0 to 5. When n is an integer of 2 or more, each $R_{c6}$ may be the same as or different from every other $R_{c6}$.

$R_{c6}$ is preferably an unsubstituted alkyl group or an alkyl group substituted by a fluorine atom, more preferably a trifluoromethyl group or a tert-butyl group.

Rac has the same meaning as Rac in formula (C4).

The repeating units (cy1) and (cy2) are also preferably a repeating unit represented by the following formula (CII-AB):

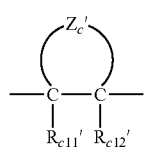

(CII-AB)

In formula (CII-AB), each of $R_{c11}'$ and $R_{c12}'$ independently represents a hydrogen atom, a cyano group, a halogen atom or an alkyl group.

$Z_c'$ represents an atomic group for forming an alicyclic structure containing two bonded carbon atoms (C—C).

Formula (CII-AB) is more preferably the following formula (CII-AB1) or (CII-AB2):

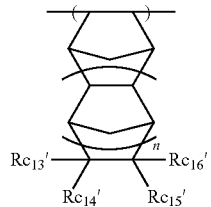

CII-AB1

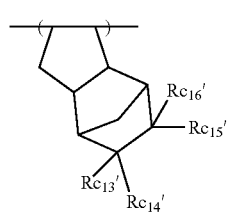

CII-AB2

In formulae (CII-AB1) and (CII-AB2), each of $R_{c13}'$ to $R_{c16}'$ independently represents a hydrogen atom, a halogen atom, an alkyl group or a cycloalkyl group.

At least two members out of $R_{c13}'$ to $R_{c16}'$ may combine to form a ring.

n represents 0 or 1.

Specific examples of (cy1) and (cy2) are set forth below, but the present invention is not limited thereto. In the formulae, Ra represents H, $CH_3$, $CH_2OH$, $CF_3$ or CN.

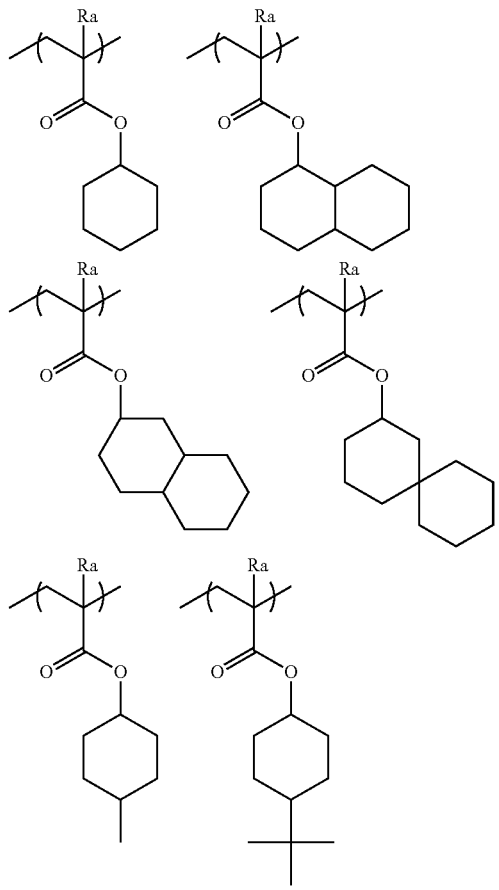

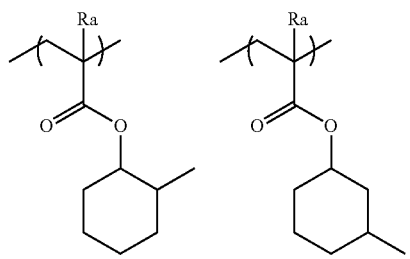

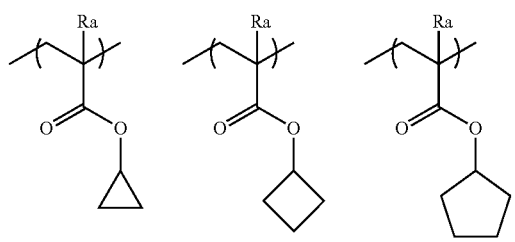

-continued

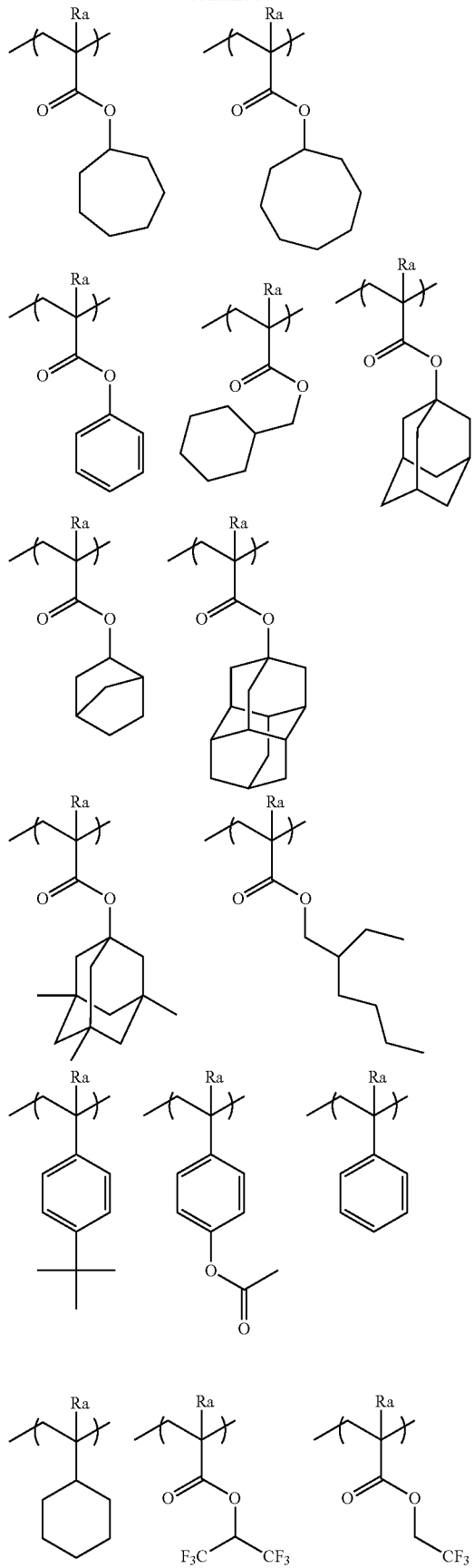
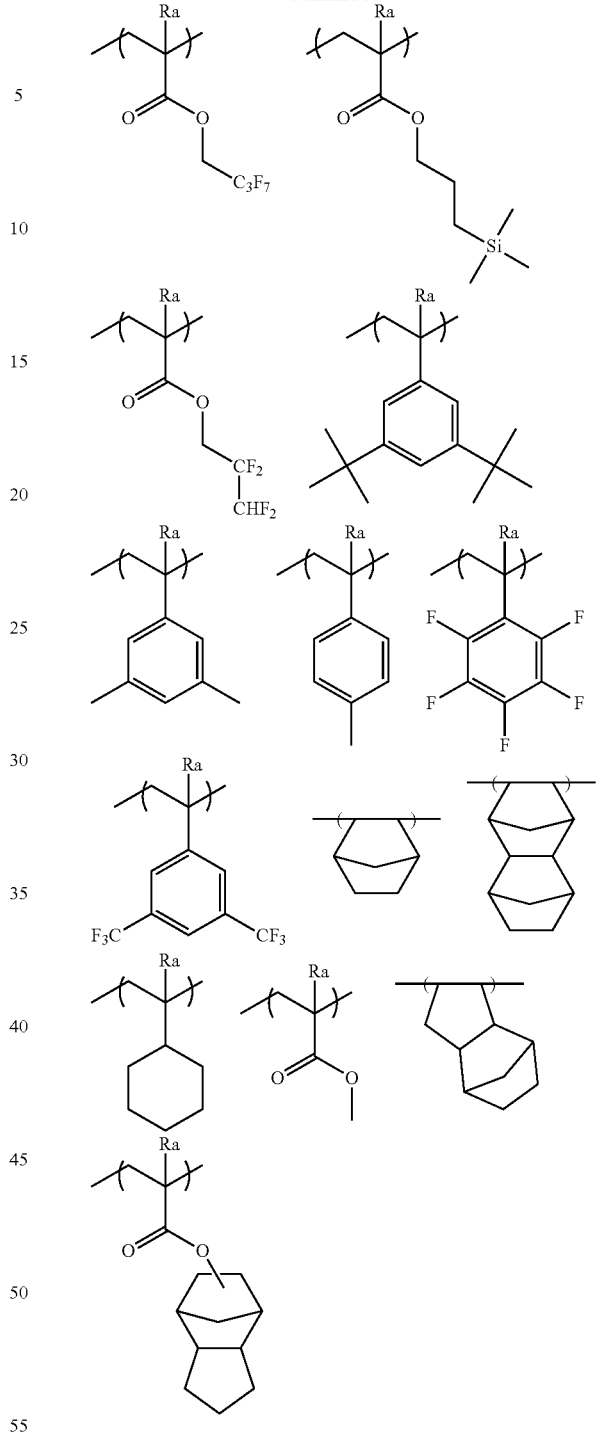

The repeating units (cy3) and (cy4) are preferably a repeating unit having a hydroxyl group or a cyano group as the polar group. Thanks to this repeating unit, the affinity for developer is enhanced. The repeating unit having a hydroxyl group or a cyano group is preferably a repeating unit having an alicyclic hydrocarbon structure substituted by a hydroxyl group or a cyano group. The alicyclic hydrocarbon structure in the alicyclic hydrocarbon structure substituted by a hydroxyl group or a cyano group is preferably an adamantyl group, a diamantyl group or a norbornyl group. Preferred examples of the alicyclic hydrocarbon structure substituted by a hydroxyl group or a cyano group include a monohydroxyadamantyl group, dihydroxyadamantyl group, a monohydroxydiamantyl group, a dihydroxydiamantyl group and a norbornyl group substituted by a cyano group.

The repeating unit having such an atomic group includes repeating units represented by the following formulae (CAIIa) to (CAIId):

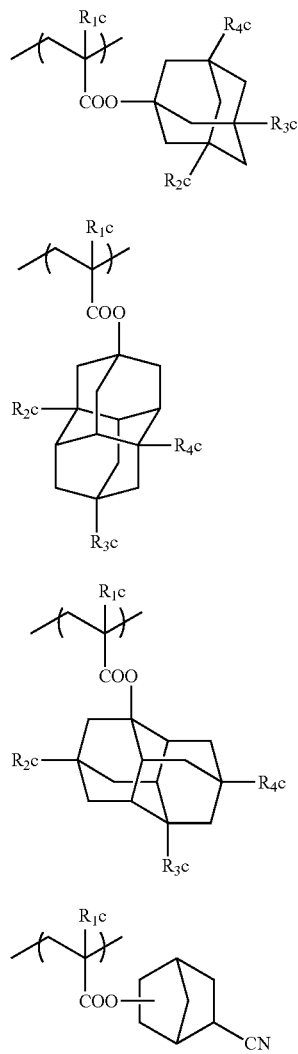

(CAIIa)

(CAIIb)

(CAIIc)

(CAIId)

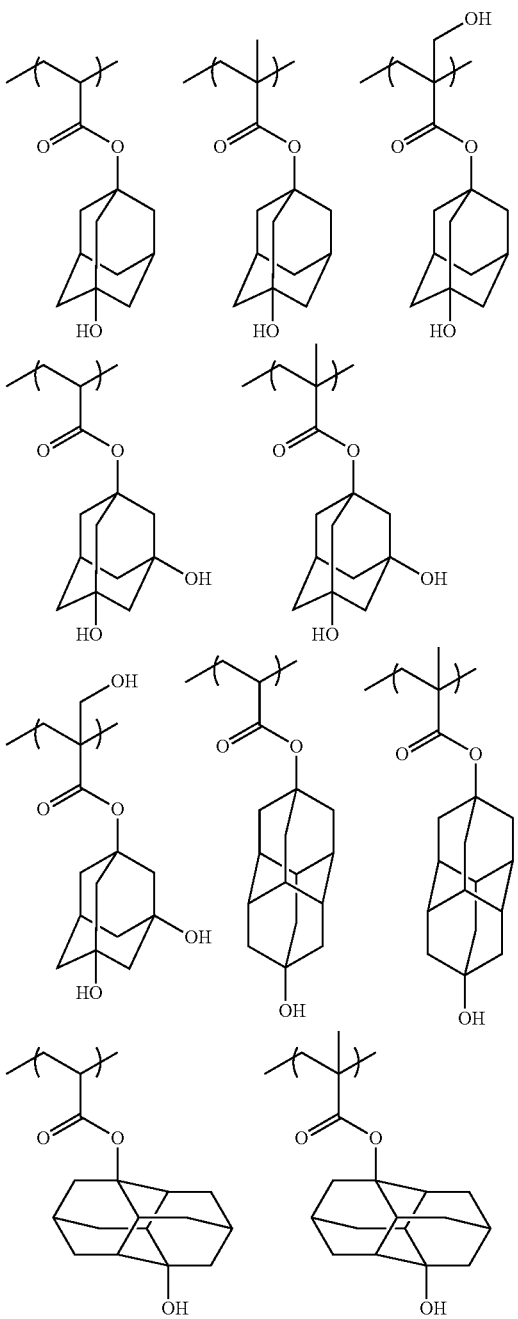

In formulae (CAIIa) to (CAIId), $R_1c$ represents a hydrogen atom, a methyl group, a trifluoromethyl group or a hydroxymethyl group.

Each of $R_2c$ to $R_4c$ independently represents a hydrogen atom, a hydroxyl group or a cyano group, provided that at least one of $R_2c$ to $R_4c$ represents a hydroxyl group or a cyano group. An embodiment where one or two members out of $R_2c$ to $R_4c$ are a hydroxyl group with the remaining being a hydrogen atom is preferred. In formula (CAIIa), it is more preferred that two members out of $R_2c$ to $R_4c$ are a hydroxyl group and the remaining is a hydrogen atom.

Specific examples of the repeating units (cy3) and (cy4) are set forth below, but the present invention is not limited thereto.

The content of the repeating unit of (cy1) to (cy4) is preferably from 5 to 40 mol %, more preferably from 5 to 30 mol %, still more preferably from 10 to 25 mol %, based on all repeating units in the resin (C).

The resin (C) may contain a plurality of repeating units of (cy1) to (cy4).

In the case where the resin (C) contains a fluorine atom, the fluorine atom content is preferably from 5 to 80 mass %, more preferably from 10 to 80 mass %, based on the weight average molecular weight of the resin (C). Also, the fluorine atom-containing repeating unit preferably occupies from 10 to 100 mol %, more preferably from 30 to 100 mol %, based on all repeating units in the resin (C).

In the case where the resin (C) contains a silicon atom, the silicon atom content is preferably from 2 to 50 mass %, more preferably from 2 to 30 mass %, based on the weight average molecular weight of the resin (C). Also, the silicon atom-containing repeating unit preferably occupies from 10 to 90 mol %, more preferably from 20 to 80 mol %, based on all repeating units in the resin (C).

The standard polystyrene-equivalent weight average molecular of the resin (C) is preferably from 1,000 to 100,000, more preferably from 1,000 to 50,000, still more preferably from 2,000 to 15,000.

The resin (C) in the actinic ray-sensitive or radiation-sensitive resin composition may be used by appropriately adjusting its content to give an actinic ray-sensitive or radiation-sensitive resin film having a receding contact angle in the range above, but the content of the resin is preferably from 0.01 to 10 mass %, more preferably from 0.1 to 9 mass %, still more preferably from 0.5 to 8 mass %, based on the entire solid content of the actinic ray-sensitive or radiation-sensitive resin composition.

In the resin (C), similarly to the resin of the component (A), it is of course preferred that the content of impurities such as metal is small, but also, the content of residual monomers or oligomer components is preferably from 0 to 10 mass %, more preferably from 0 to 5 mass %, still more preferably from 0 to 1 mass %. When these conditions are satisfied, a resist free of extraneous substances in the liquid or change with aging of sensitivity or the like can be obtained. Furthermore, in view of resolution, resist profile, side wall of resist pattern, roughness and the like, the molecular weight distribution (Mw/Mn, sometimes referred to as "polydispersity") is preferably from 1 to 3, more preferably from 1 to 2, still more preferably from 1 to 1.8, and most preferably from 1 to 1.5.

As for the resin (C), various commercially available products may be used or the resin may be synthesized by an ordinary method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate (PGMEA), propylene glycol monomethyl ether (PGME) and cyclohexanone. The polymerization is more preferably performed using the same solvent as the solvent used in the actinic ray-sensitive or radiation-sensitive resin composition of the present invention. By the use of this solvent, production of particles during storage can be suppressed.

The polymerization reaction is preferably performed in an inert gas atmosphere such as nitrogen and argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The concentration in the reaction is usually from 5 to 50 mass %, preferably from 30 to 50 mass %. The reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of applying water washing or combining an appropriate solvent to remove residual monomers or oligomer components; a purification method in a solution sate, such as ultrafiltration of removing by extraction only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent to the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

Specific examples of the resin (C) are set forth below. Also, the molar ratio of repeating units (corresponding to repeating units starting from the left), weight average molecular weight (Mw) and polydispersity (Mw/Mn) of each resin are shown in Table 1 later.

(C-1)
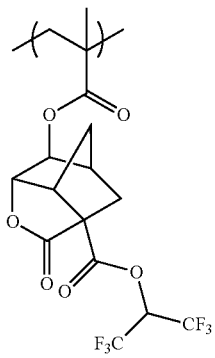

(C-2)
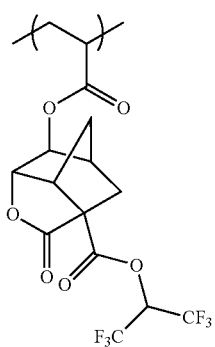

(C-3)
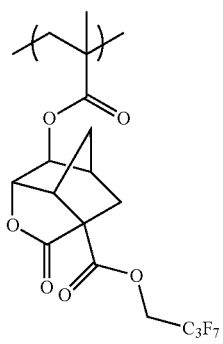

(C-4)
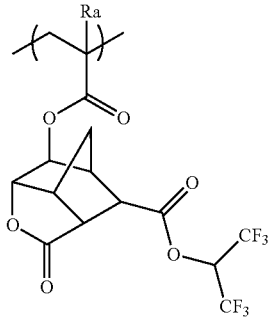

-continued (C-5)
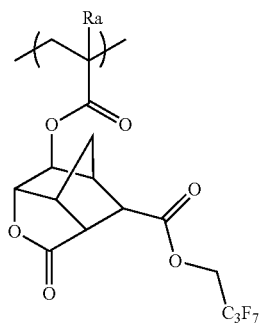

(C-6)
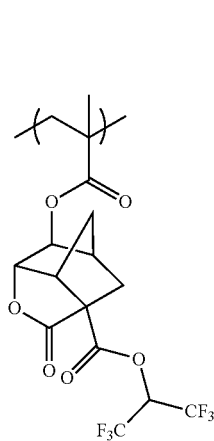 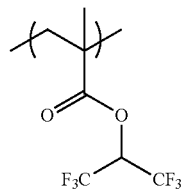

(C-7)
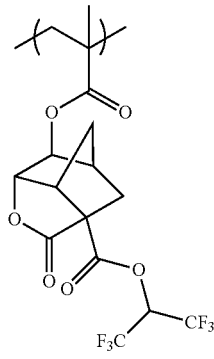 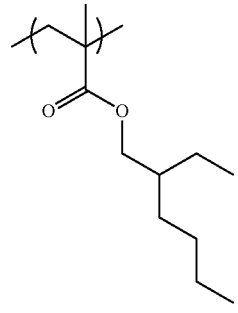

(C-8)
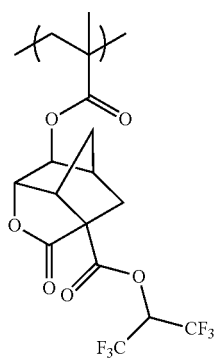 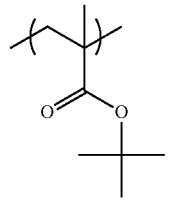

(C-9)
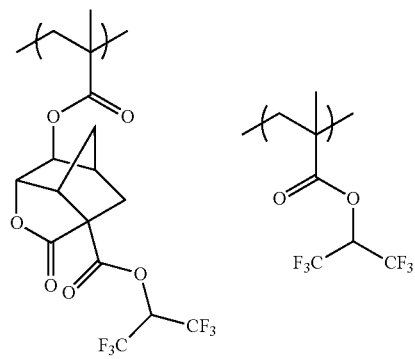
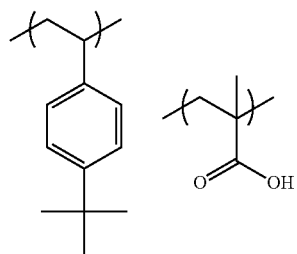
(C10)
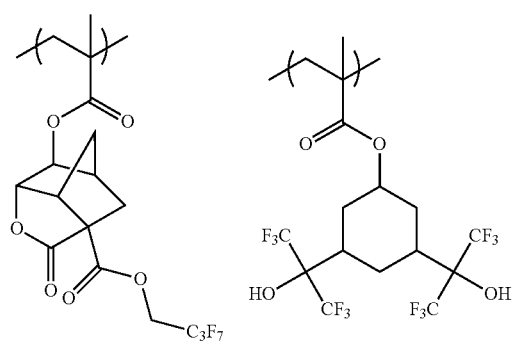
(C-11)
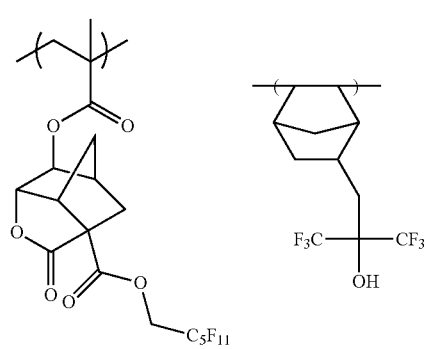
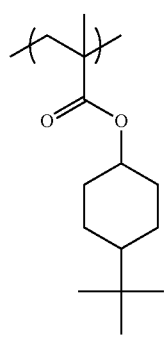
(C-12)
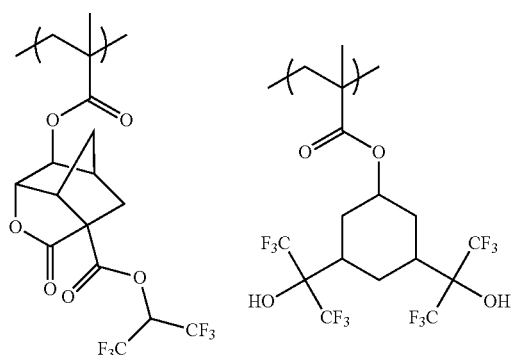
(C-13)
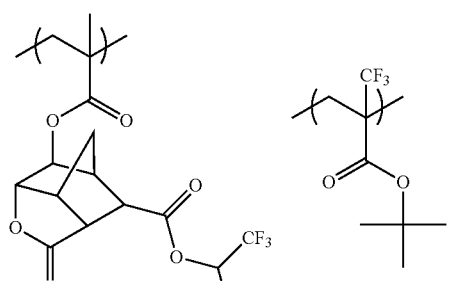
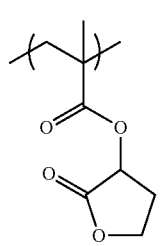
(C-14)
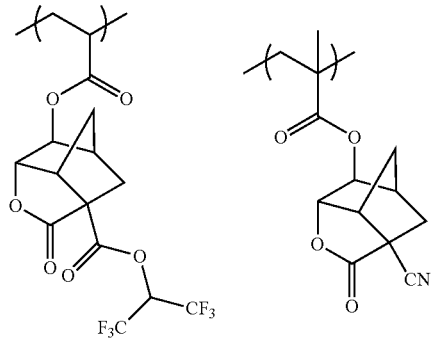
(C-15)
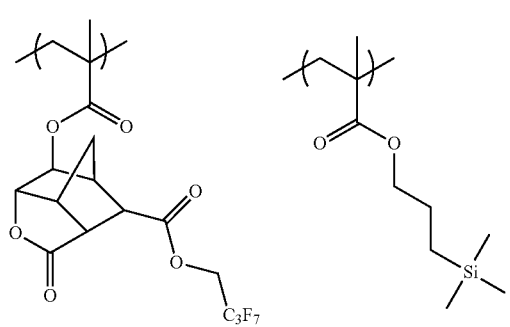

(C-16)
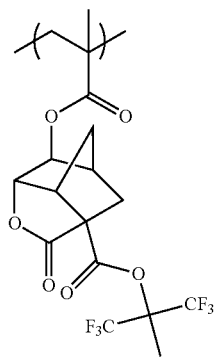
(C-17)
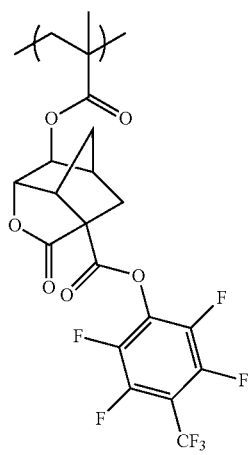
(C-18)
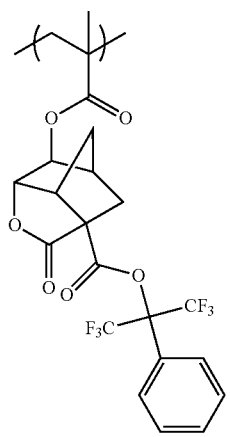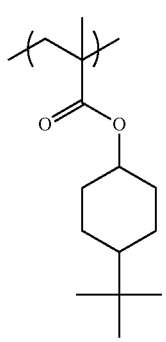
(C-19)
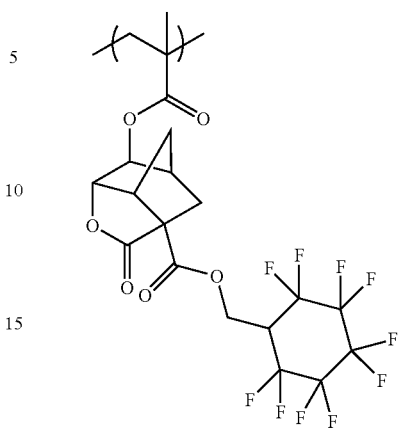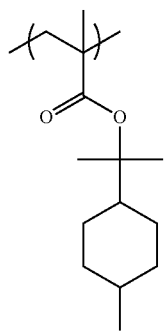
(C-20)
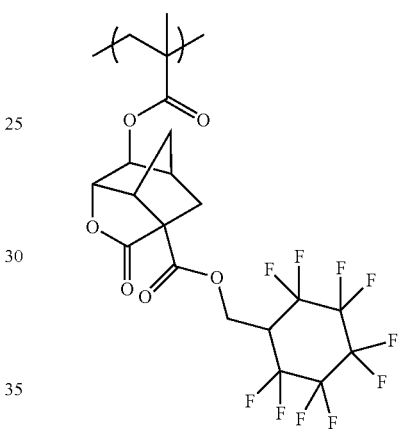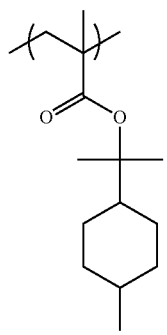
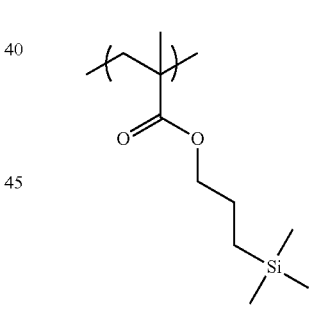
(C-21)
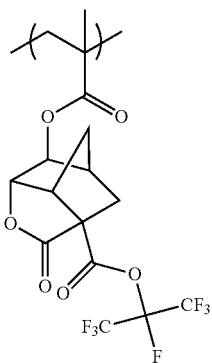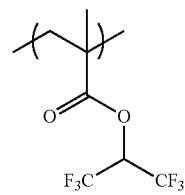

-continued
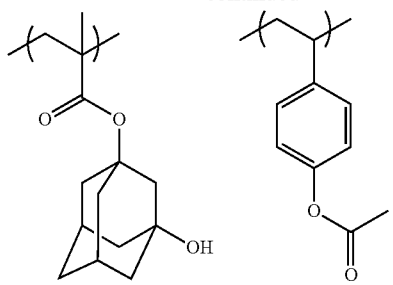
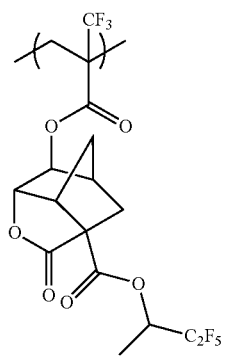
(C-22)
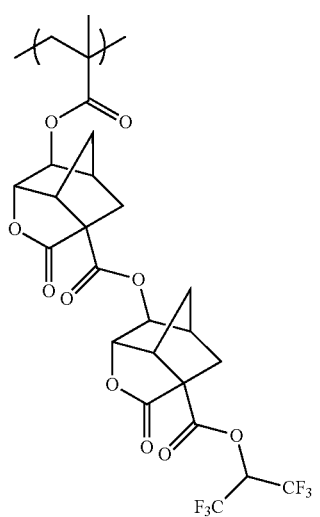
(C-23)
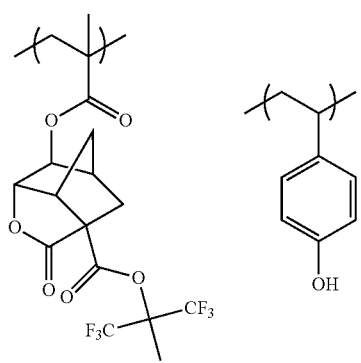
(C-24)
-continued
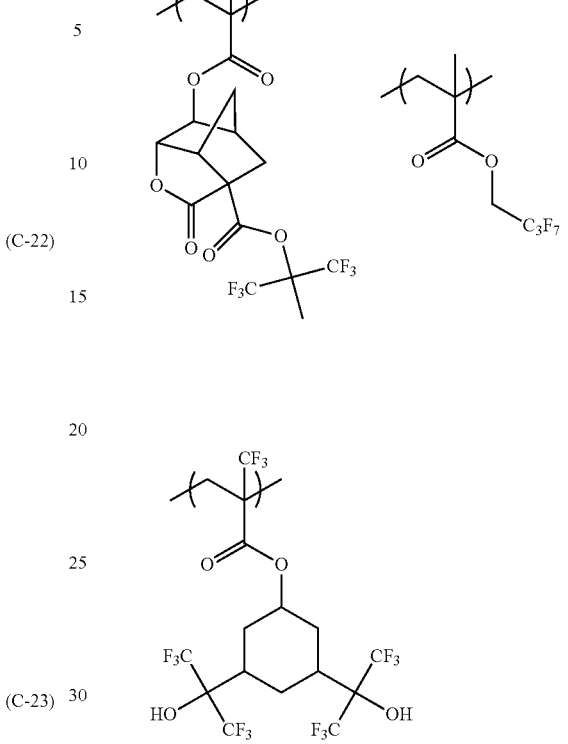
(C-25)
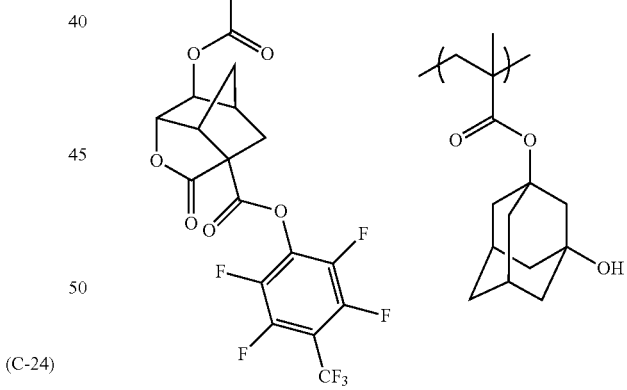
(C-26)
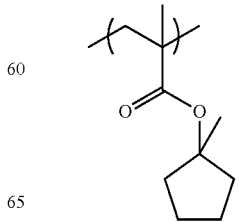

(C-27) 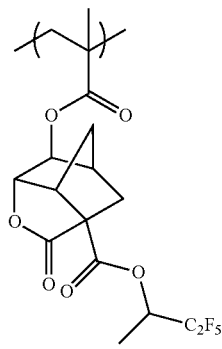 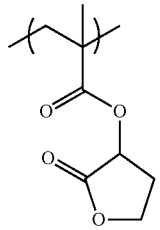
(C-28) 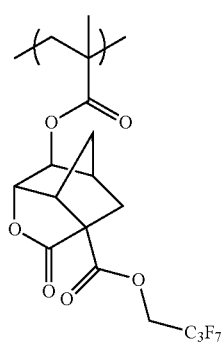 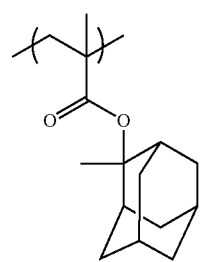
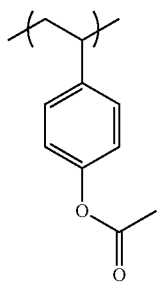
(C-29) 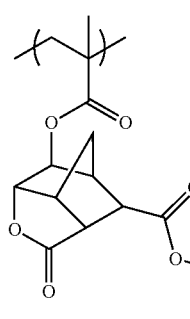 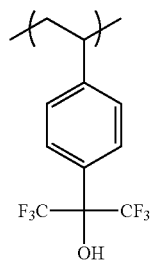
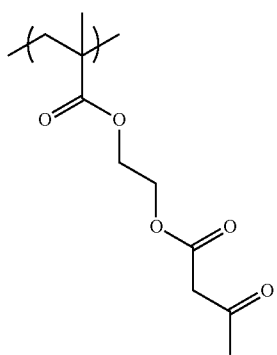
(C-30) 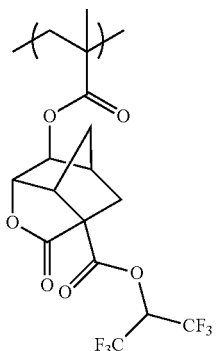 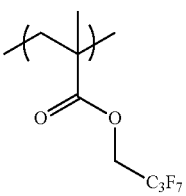
(C-31) 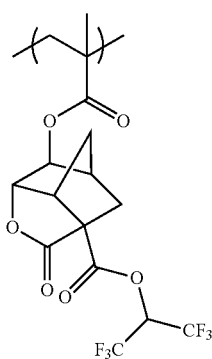 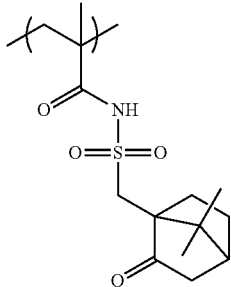
(C-32) 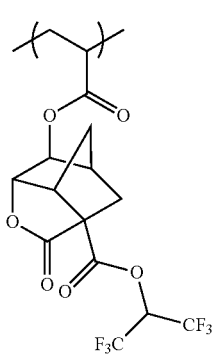 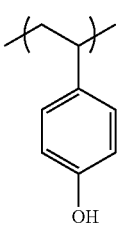
(C-33) 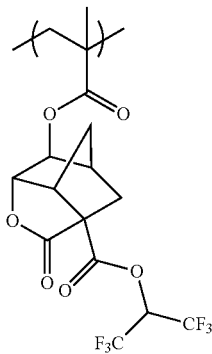 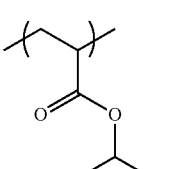

(C-34)
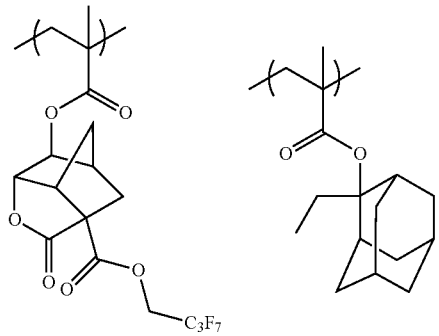
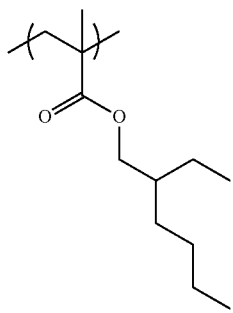
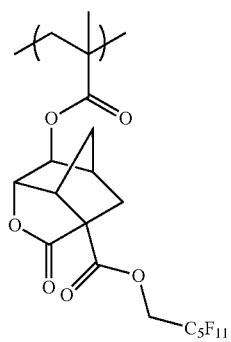
(C-35)
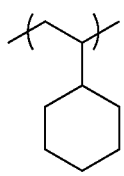
(C-36)
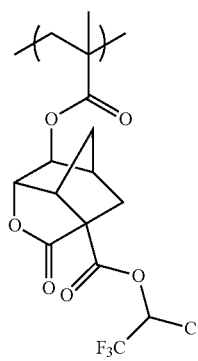
(C-37)
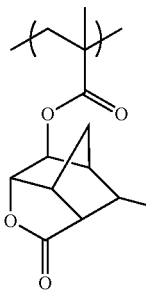 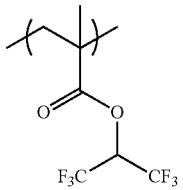
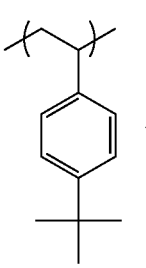 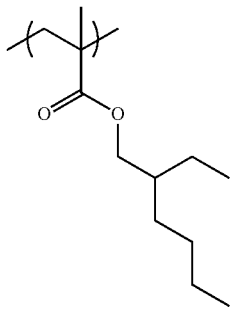
(C-38)
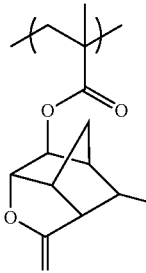 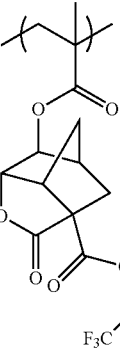
(C-39)
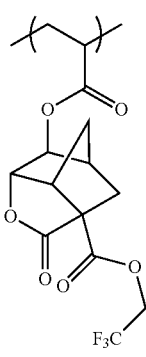 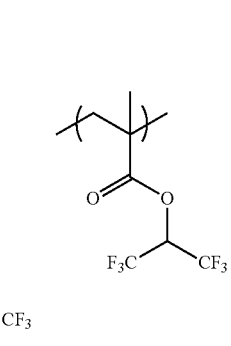

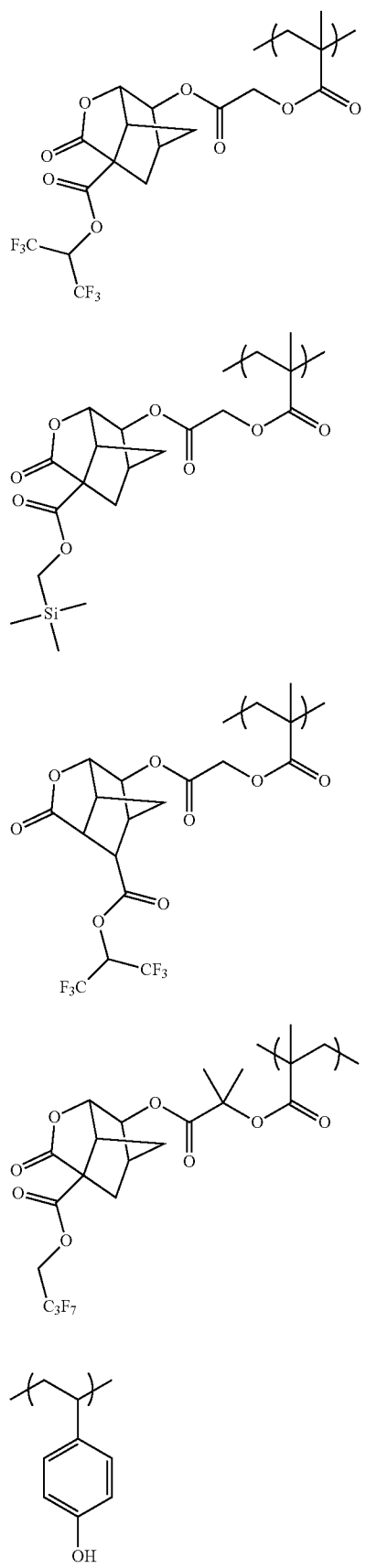
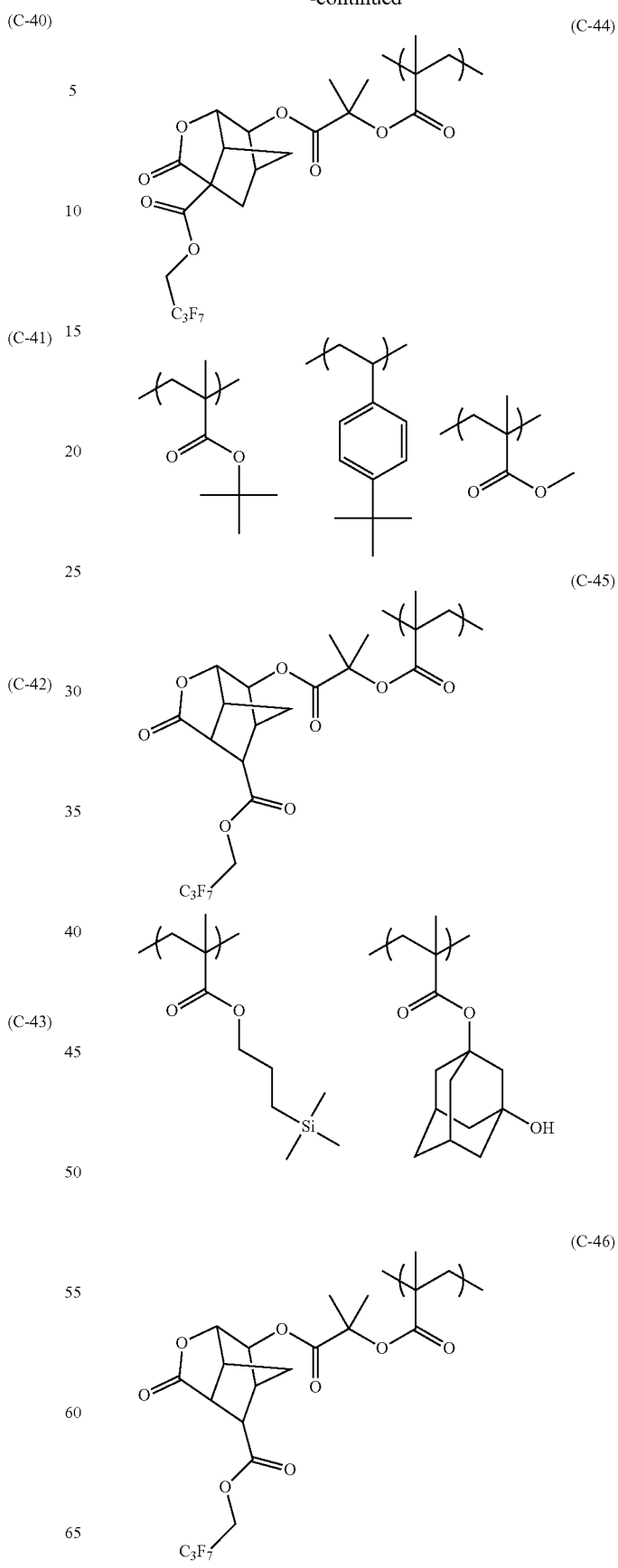

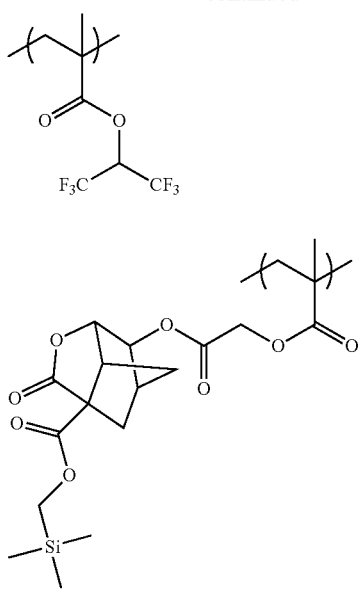
(C-47)
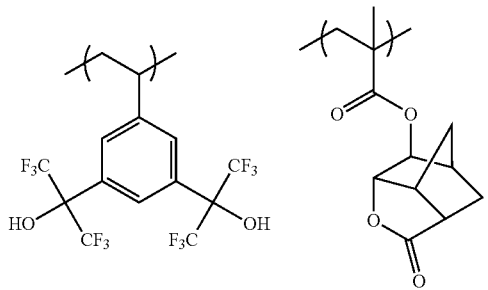
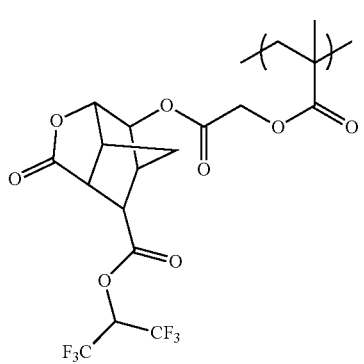
(C-48)
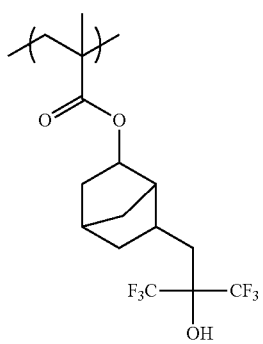
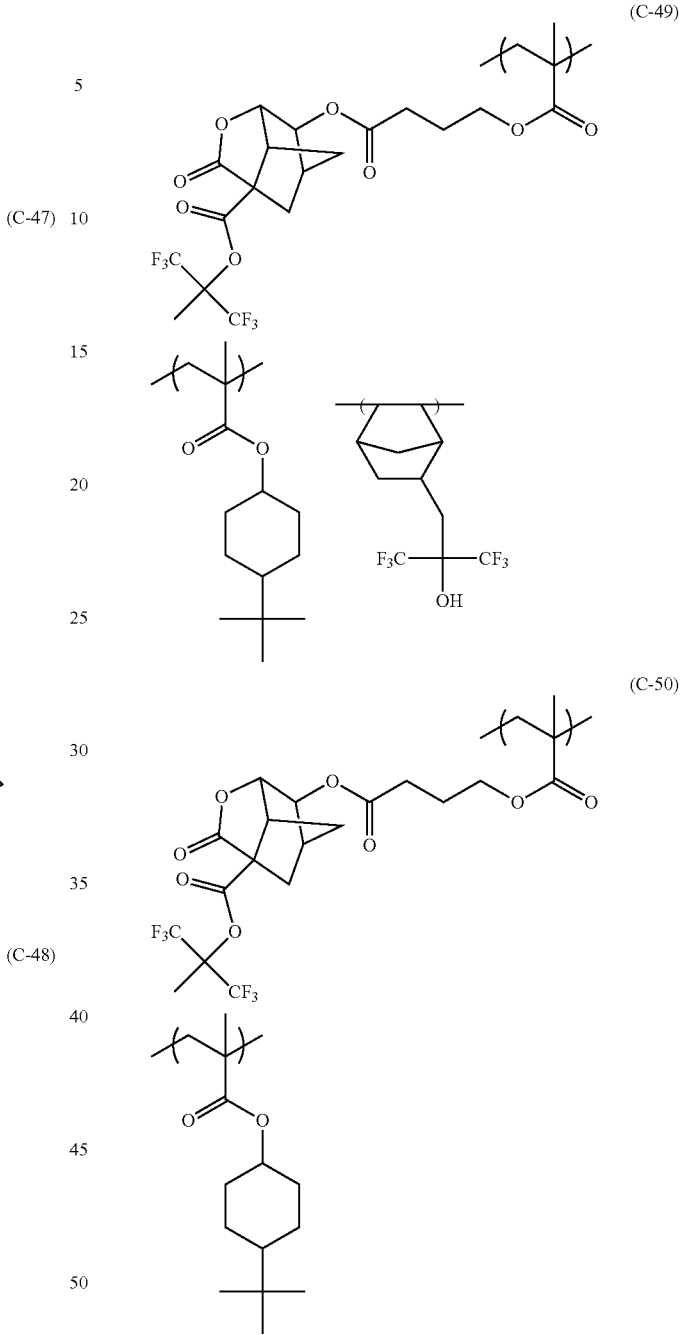
(C-49)
(C-50)
(C-51)
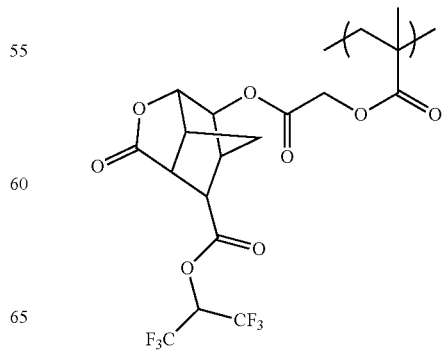

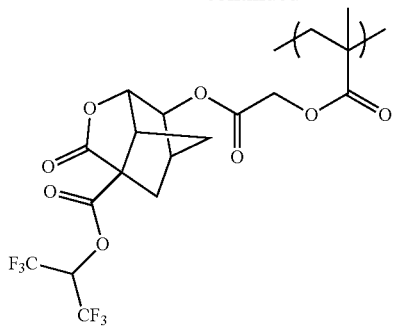
(C-52)
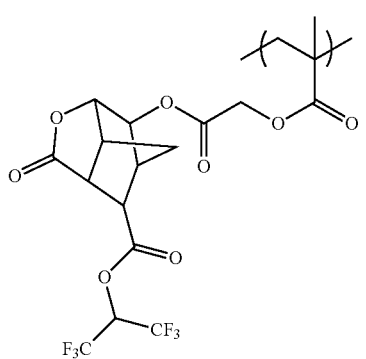
(C-53)
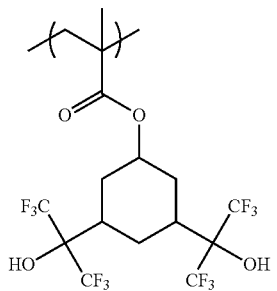
(C-54)
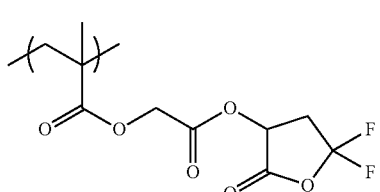
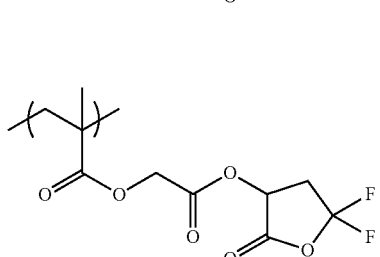
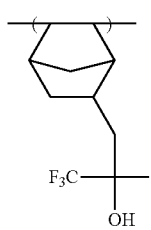 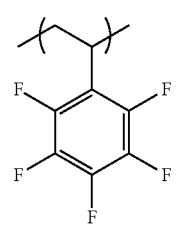
(C-55)
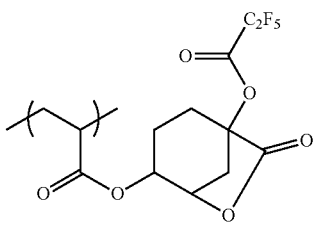
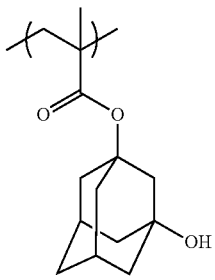
(C-56)
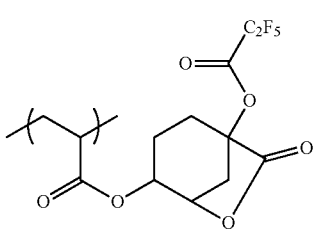 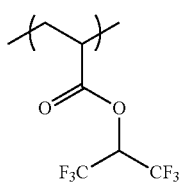
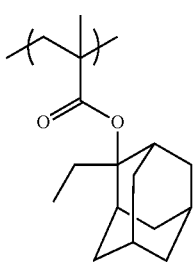
(C-57)
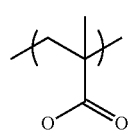
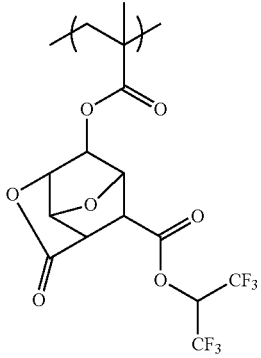

(C-58)
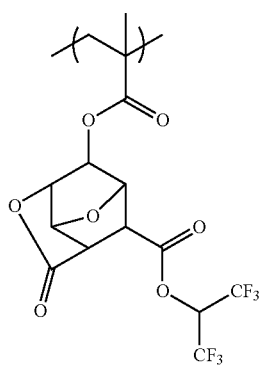
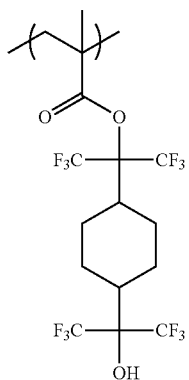
(C-59)
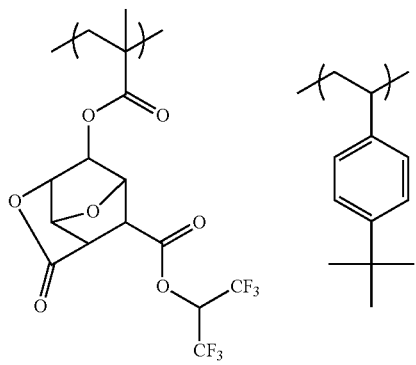
(C-60)
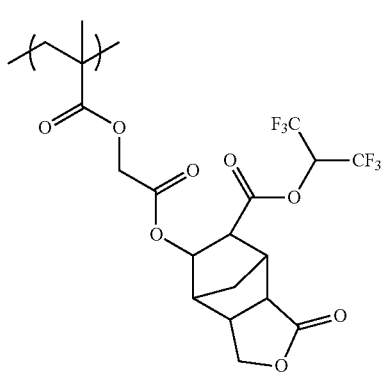
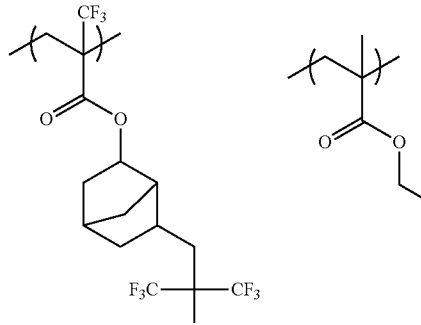
(C-61)
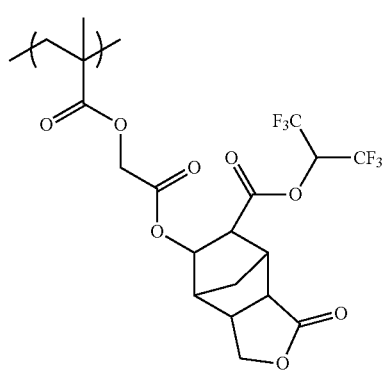
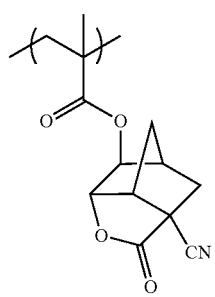
(C-62)
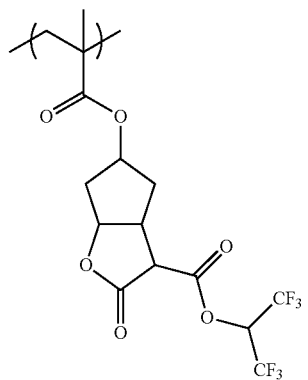

-continued
(C-63)
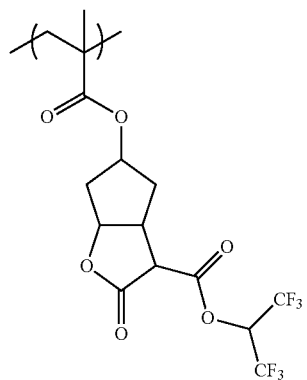
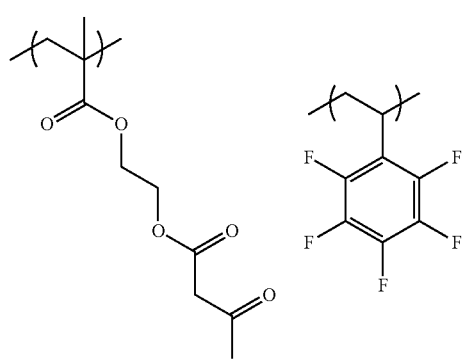
(C-64)
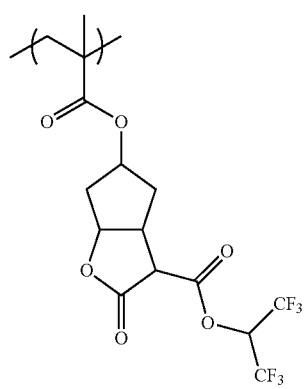
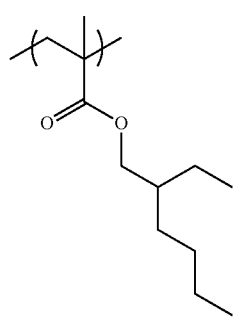
-continued
(C-65)
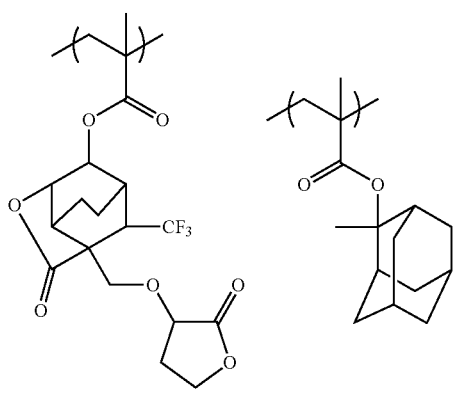
(C-66)
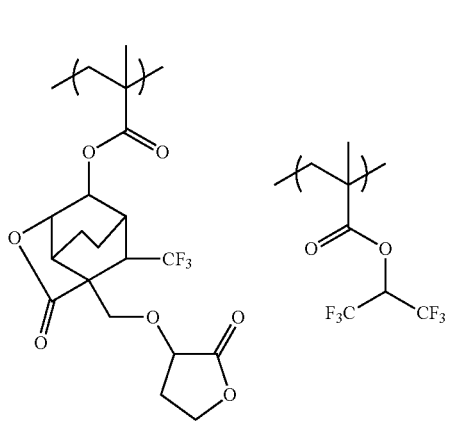
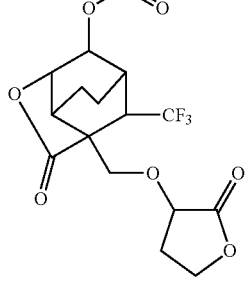
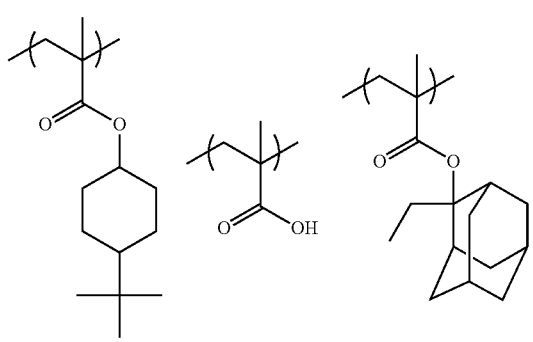
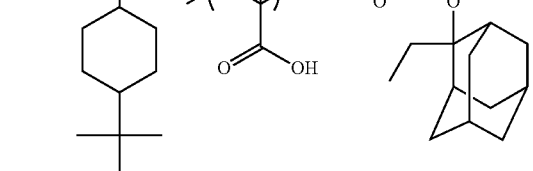
(C-67)
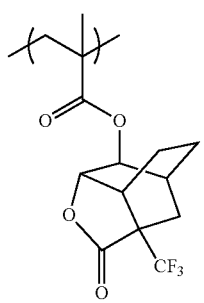

(C-68)
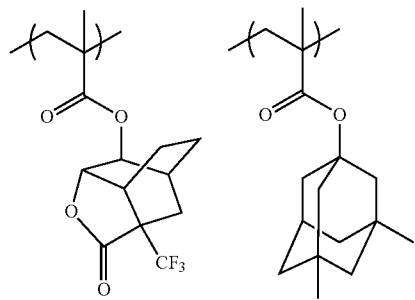
(C-69)
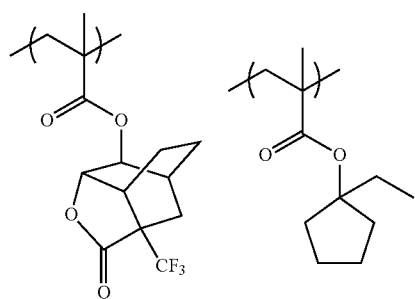
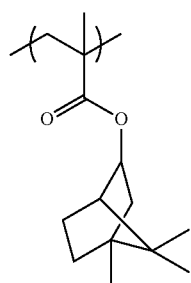
(C-70)
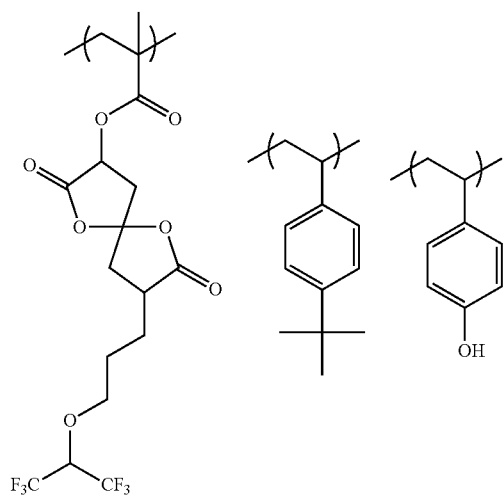
(C-71)
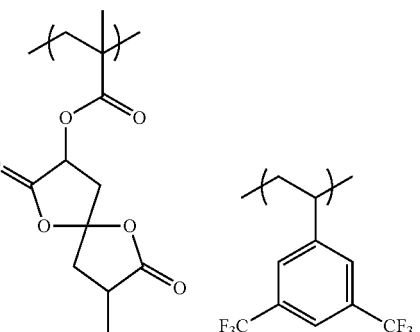
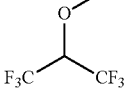
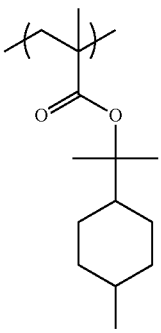
(C-72)
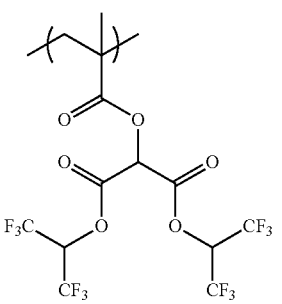
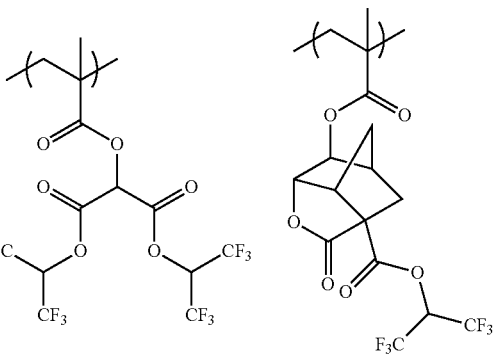

-continued
(C-74)
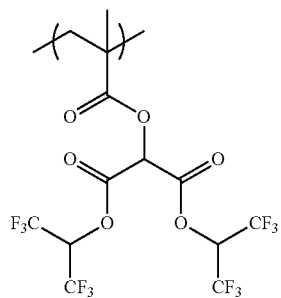
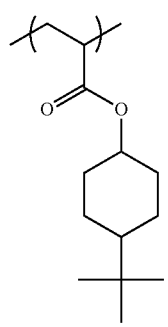
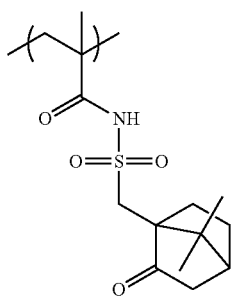
(C-75)
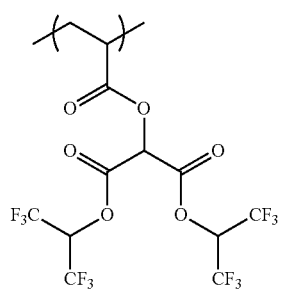
(C-76)
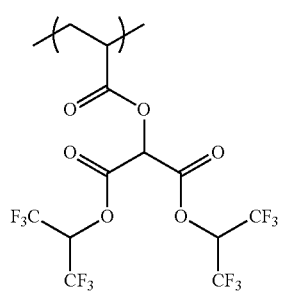
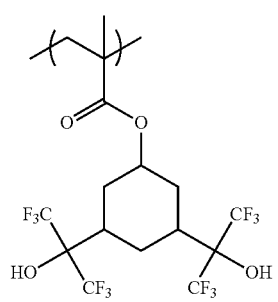
-continued
(C-77)
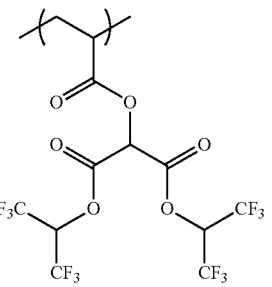
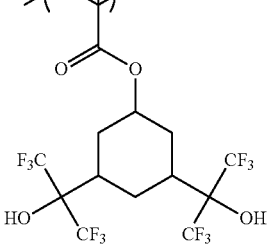
(C-78)
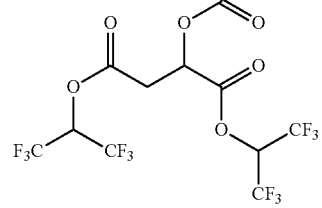
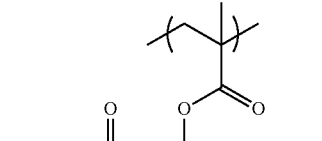
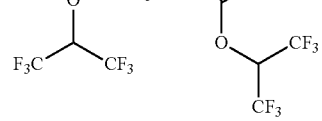
(C-79)
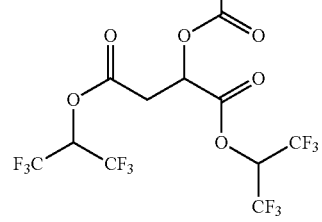

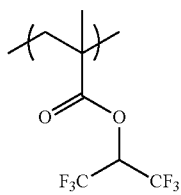
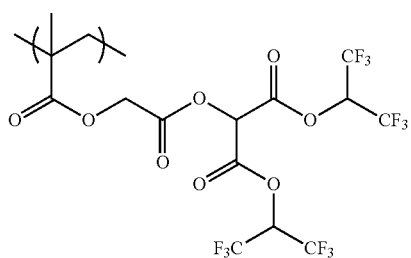
(C-80)
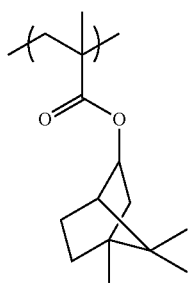
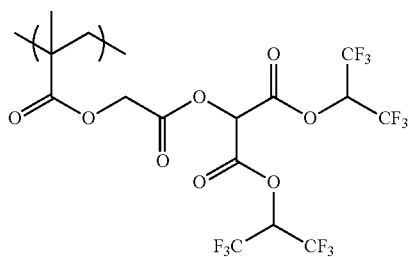
(C-81)
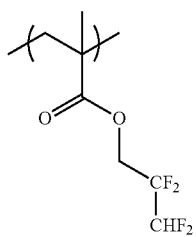
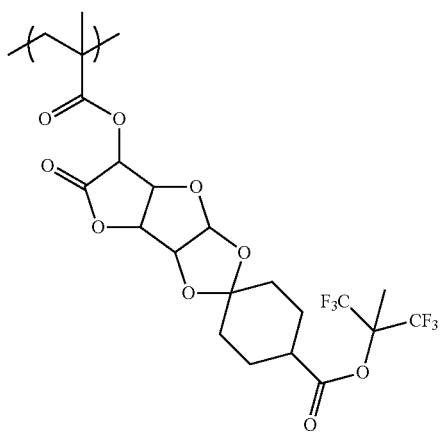
(C-82)
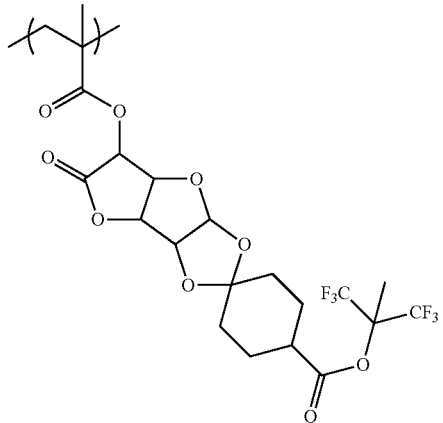
(C-83)
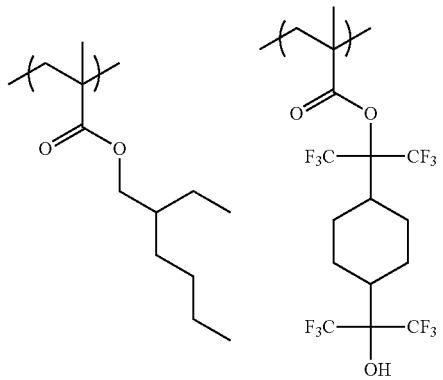
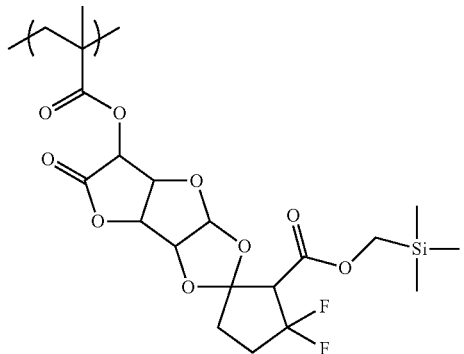
(C-84)
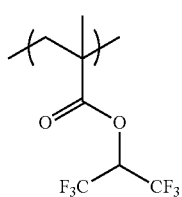

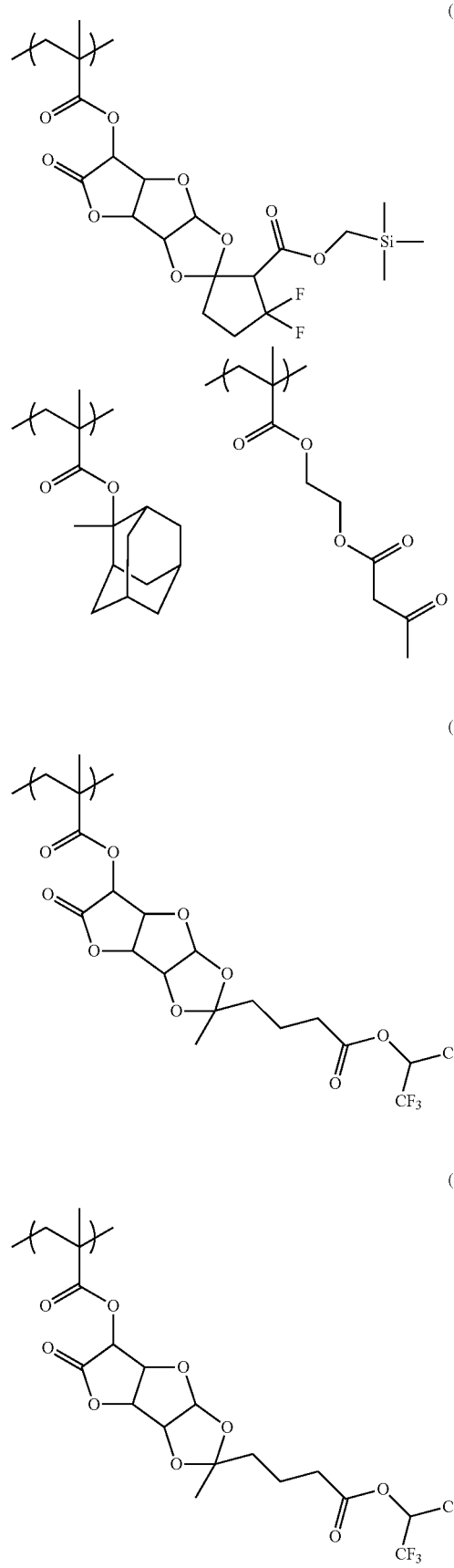
(C-85)
(C-86)
(C-87)
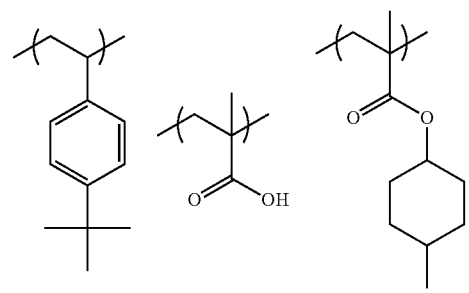
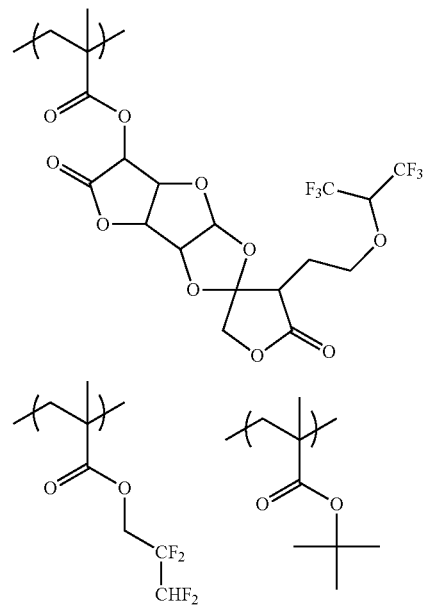
(C-88)
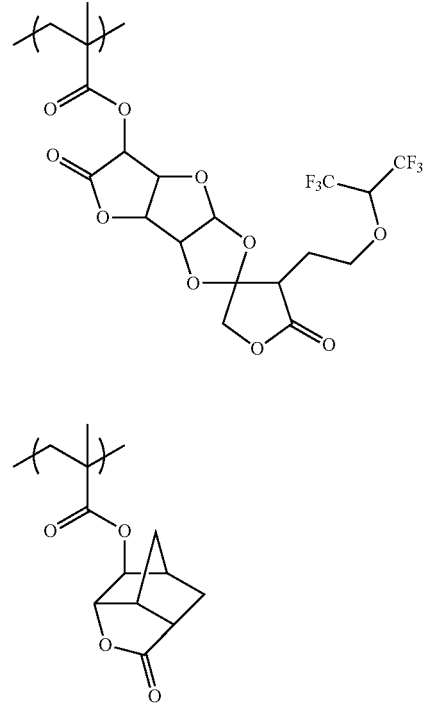
(C-89)

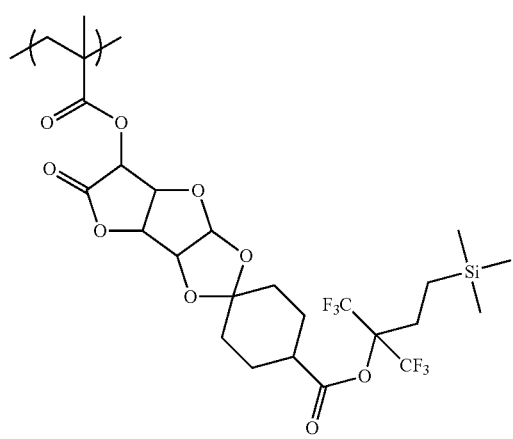
(C-90)
(C-91)
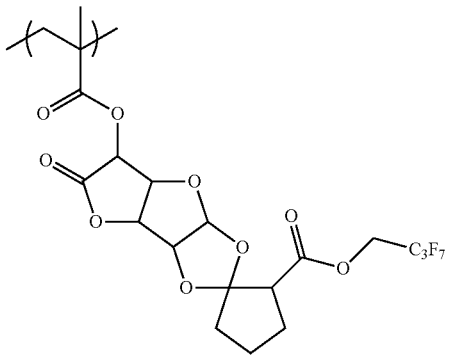
(C-92)
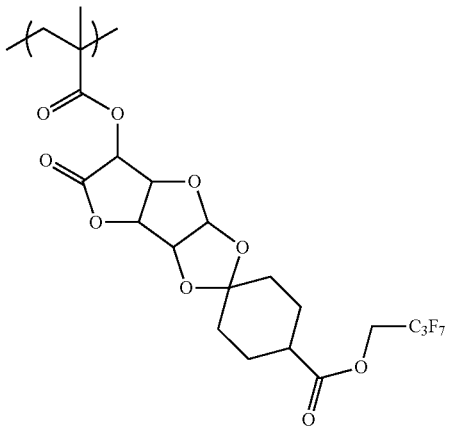
(C-93)
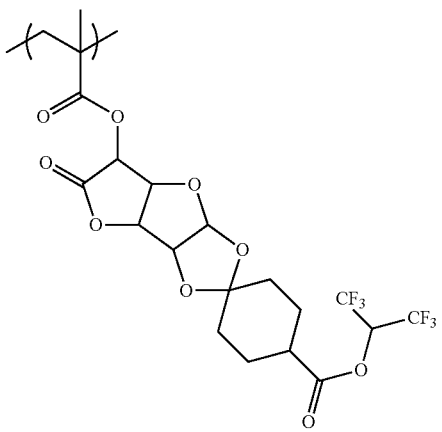
(C-94)
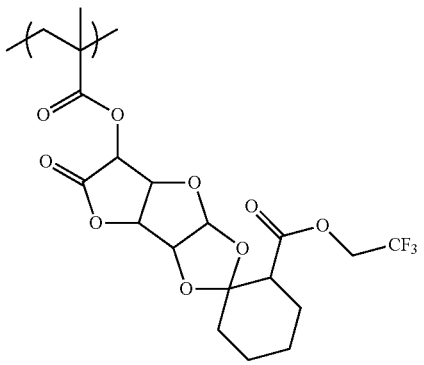
(C-95)

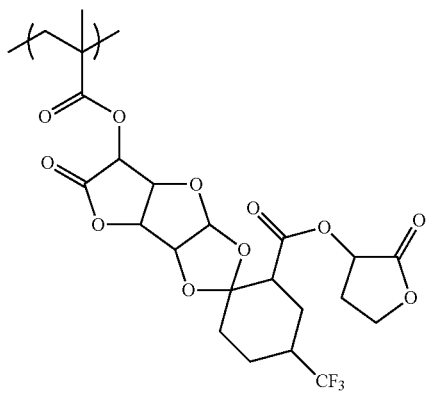
(C-96)
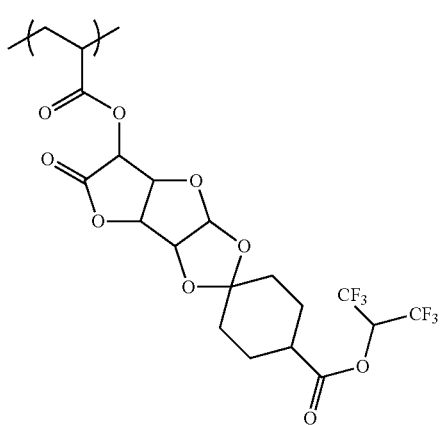
(C-97)
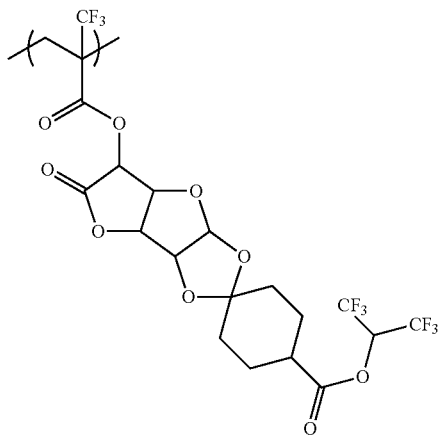
(C-98)
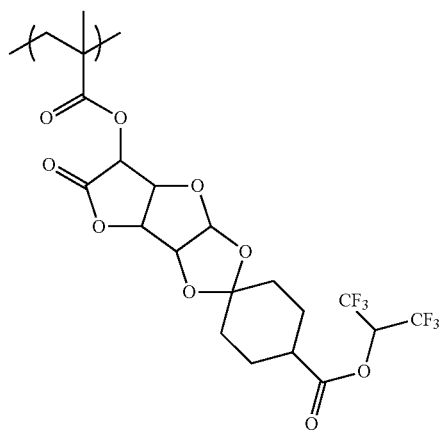
(C-99)
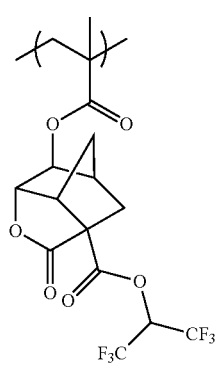
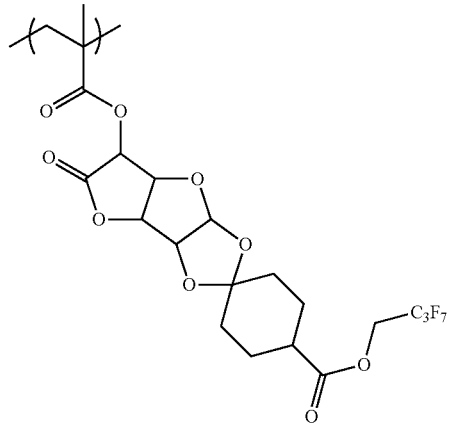
(C-100)

(C-101)
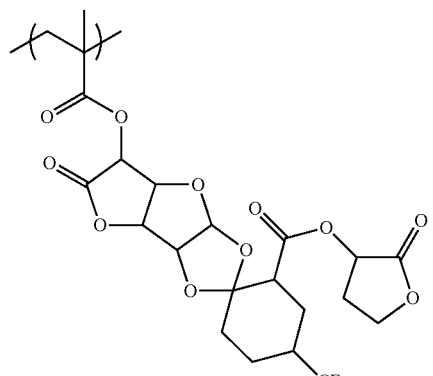
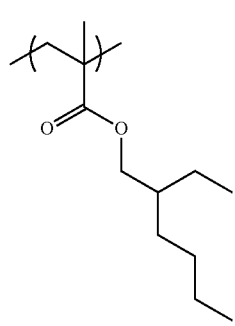
(C-102)
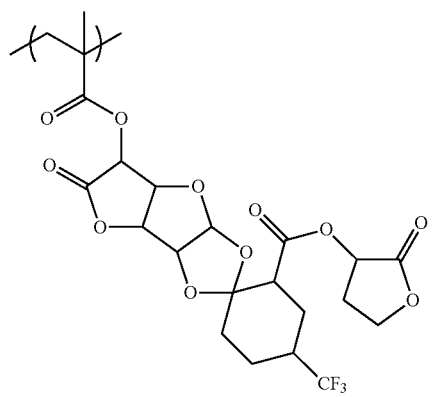
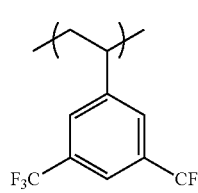 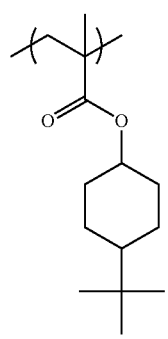
(C-103)
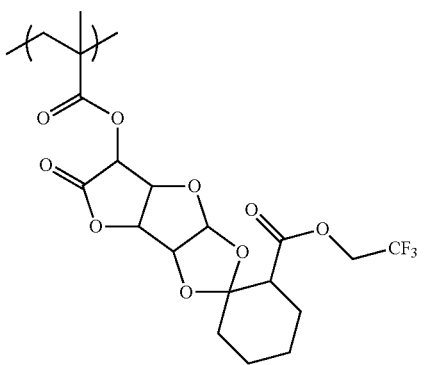
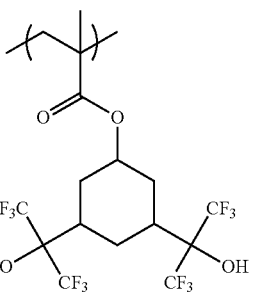
(C-104)
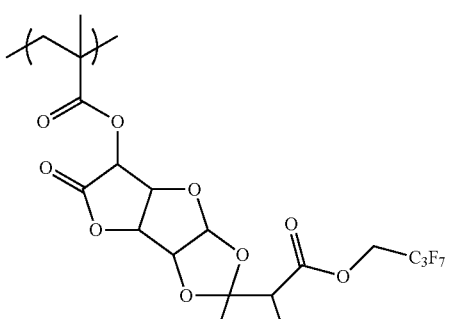
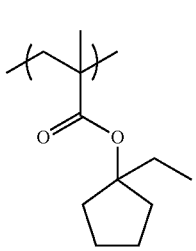 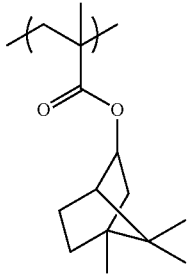
(C-105)
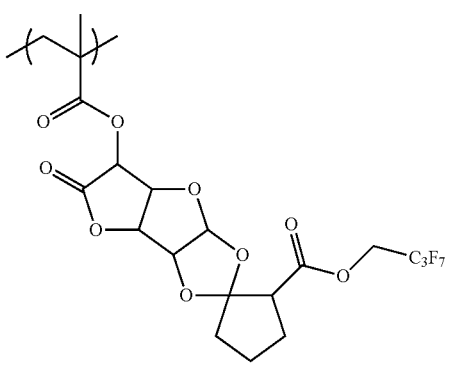

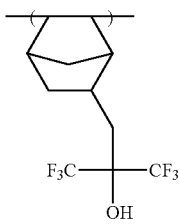
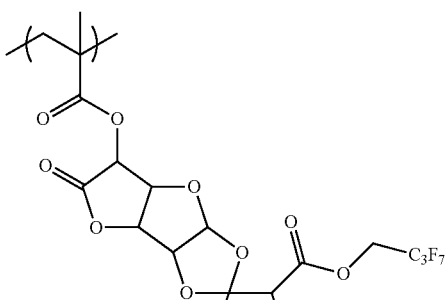
(C-106)
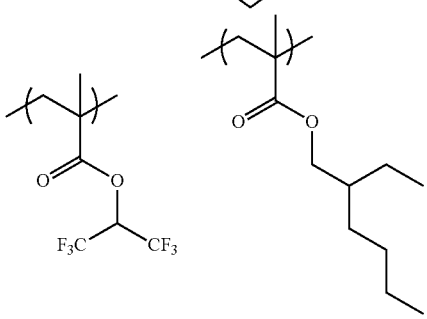
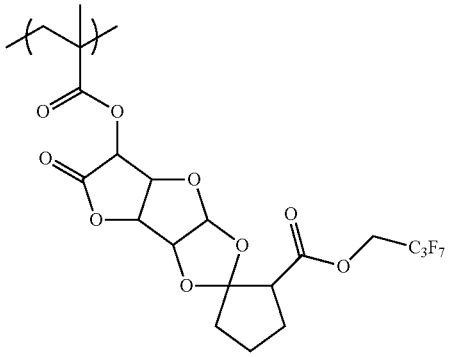
(C-107)
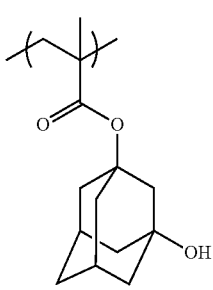
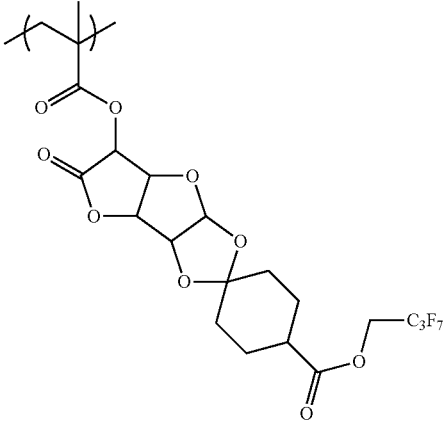
(C-108)
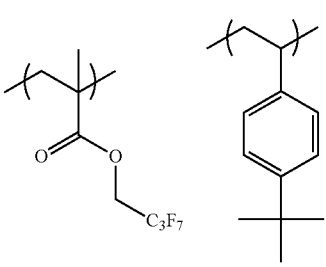
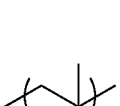
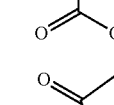
(C-109)
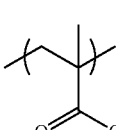
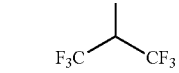

(C-110)
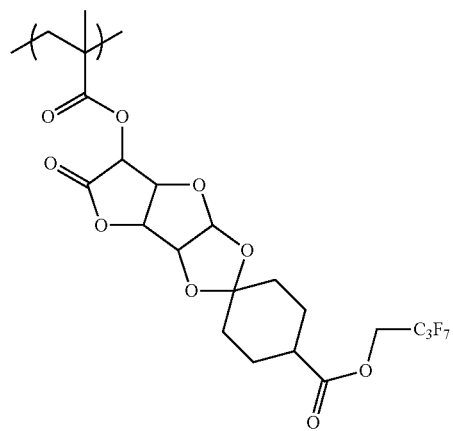
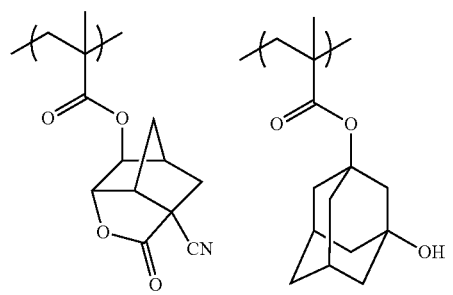
(C-112)
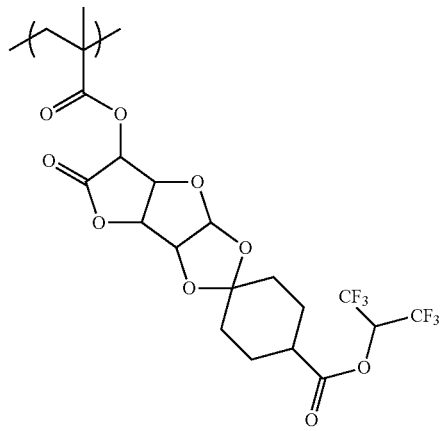
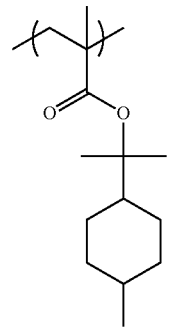
(C-111)
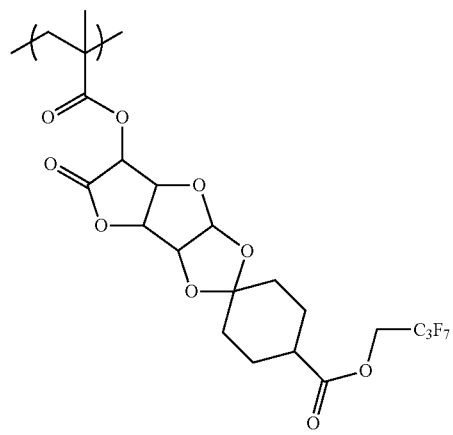
(C-113)
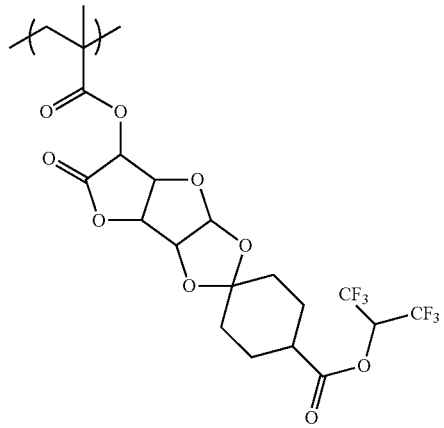
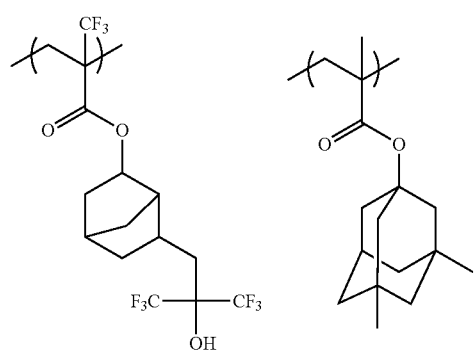
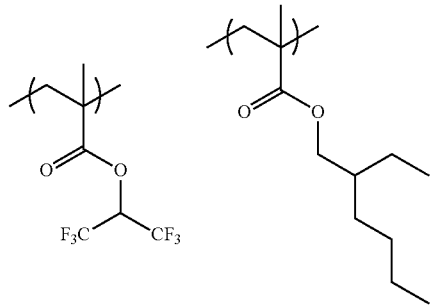

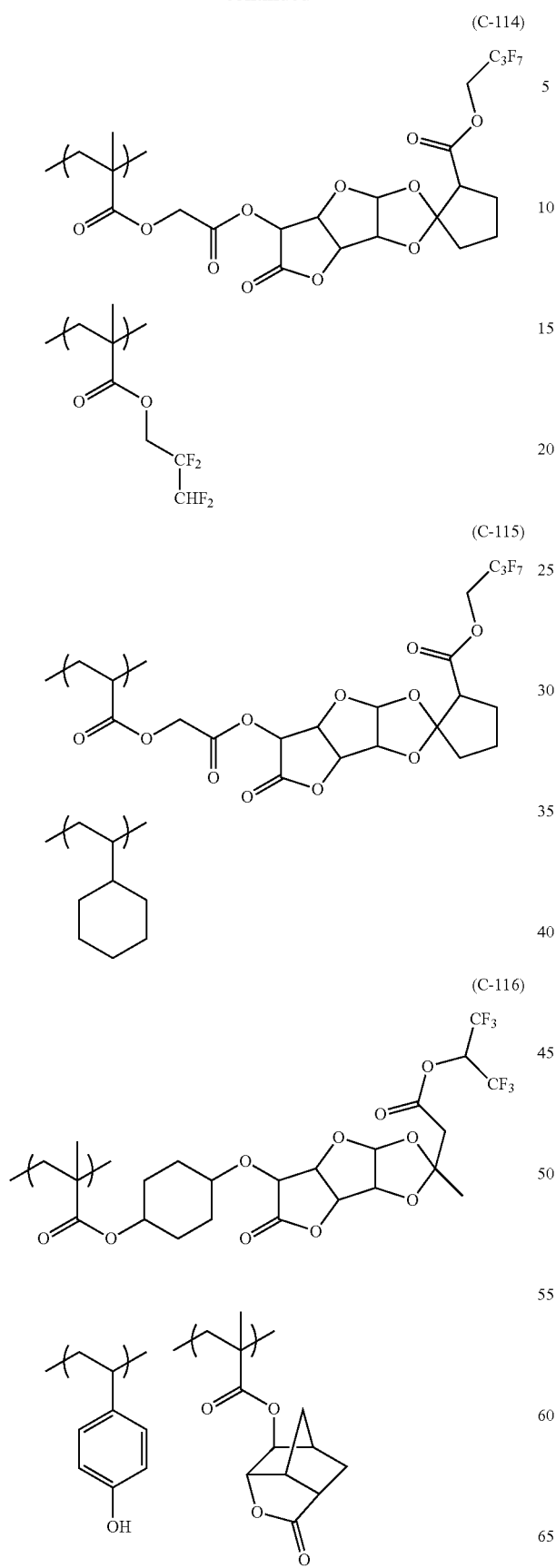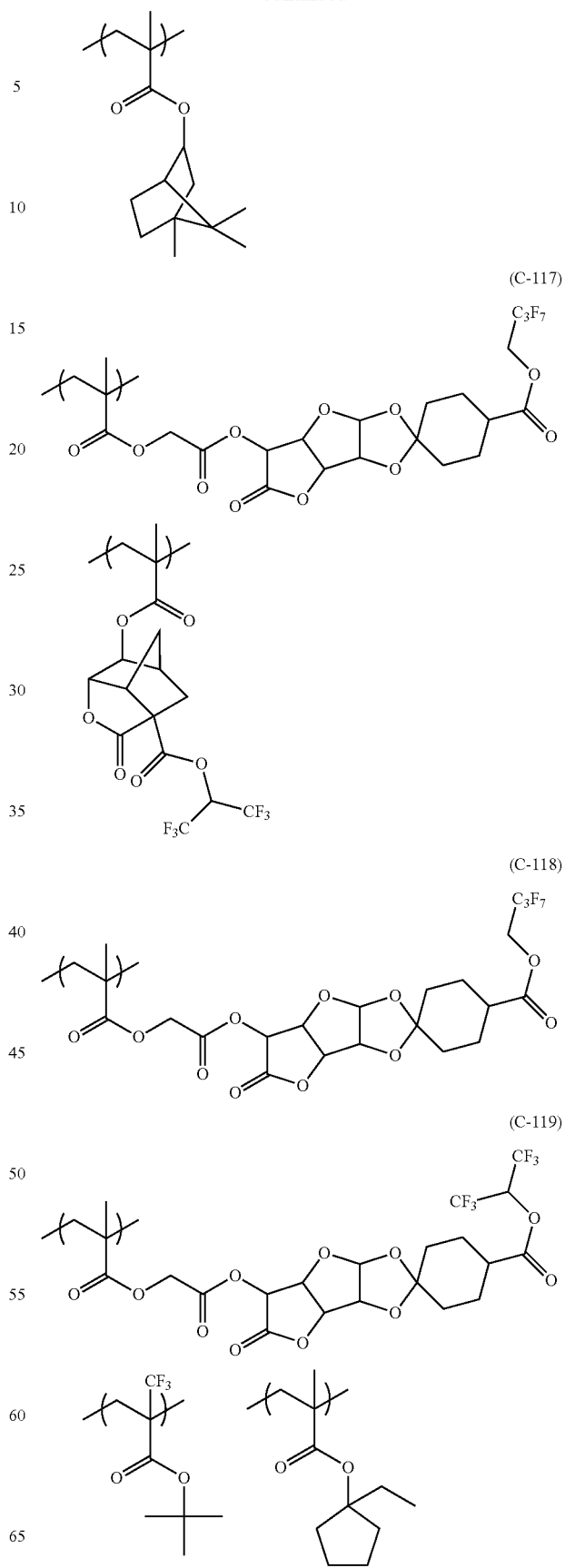

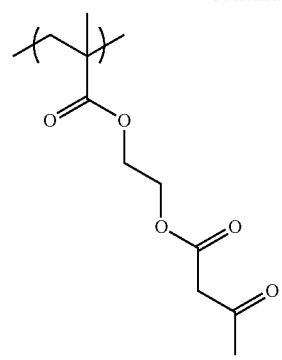
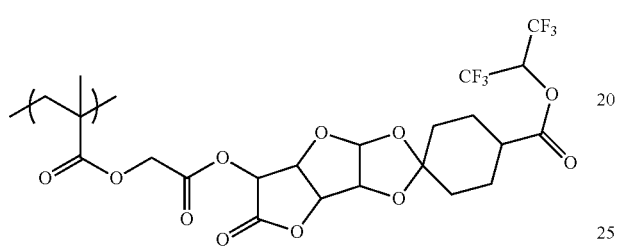
(C-120)
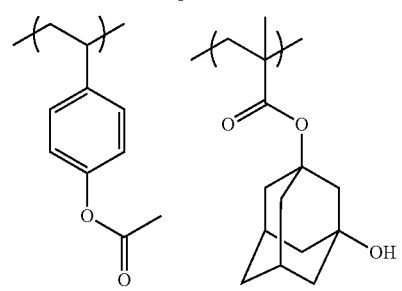
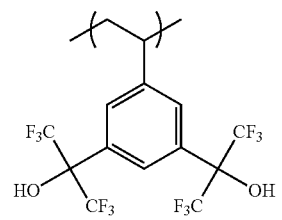
(C-121)
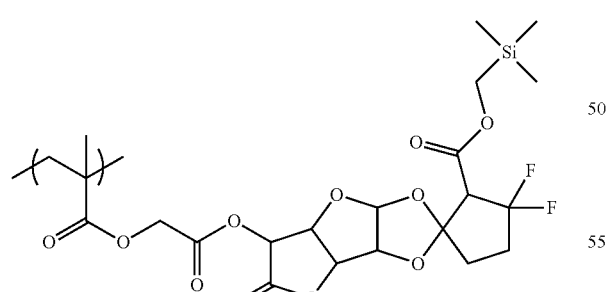
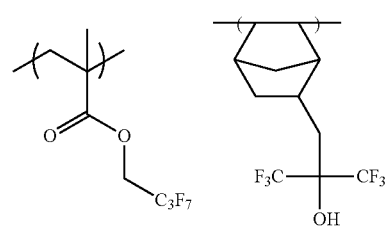
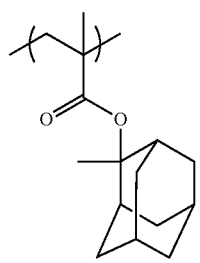
(C-122)
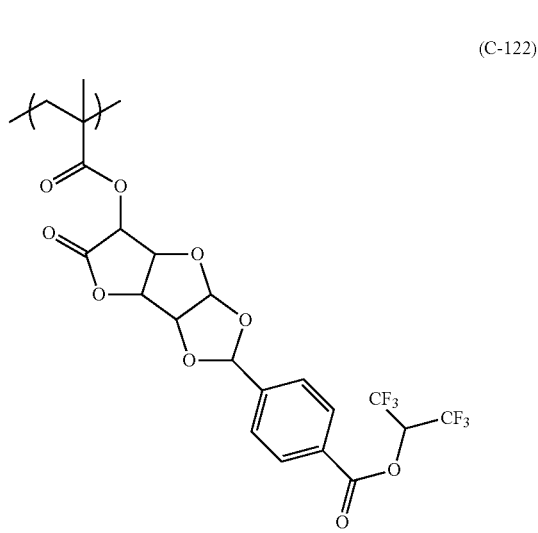
(C-123)
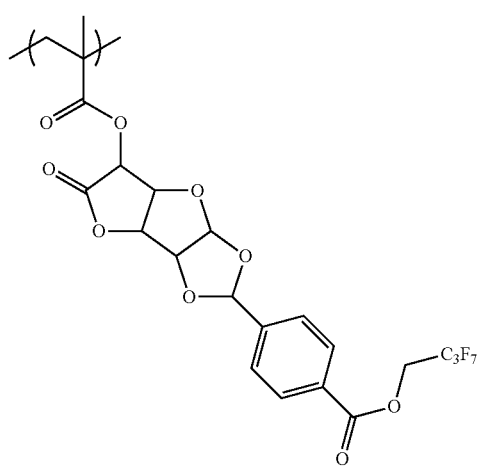

-continued
(C-124)
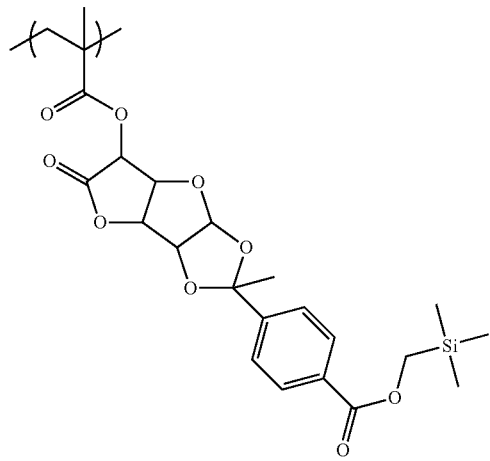
(C-125)
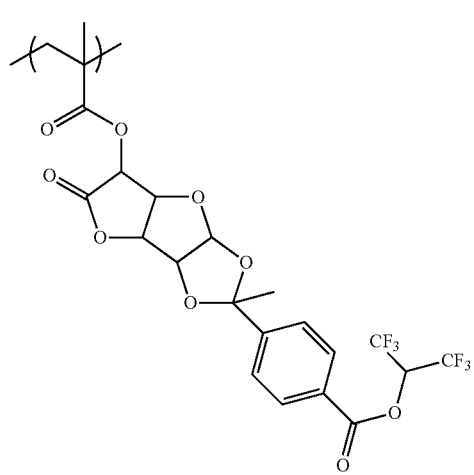
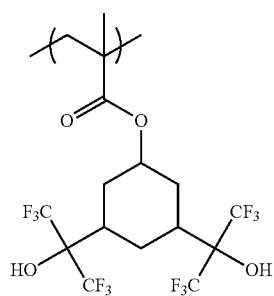
-continued
(C-126)
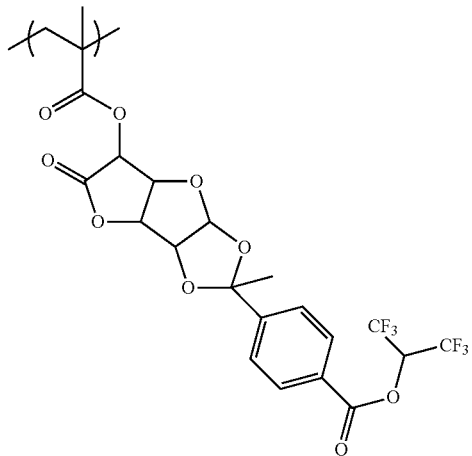
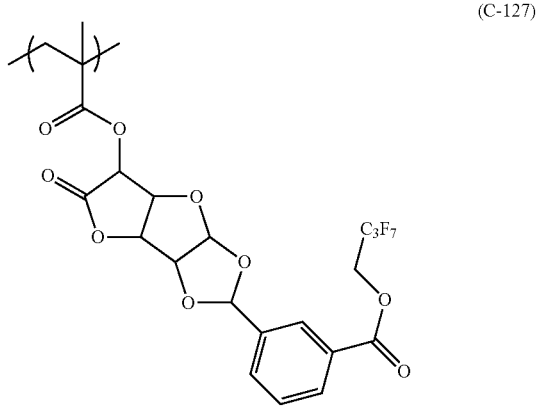
(C-127)
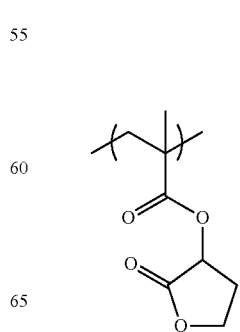

(C-128)
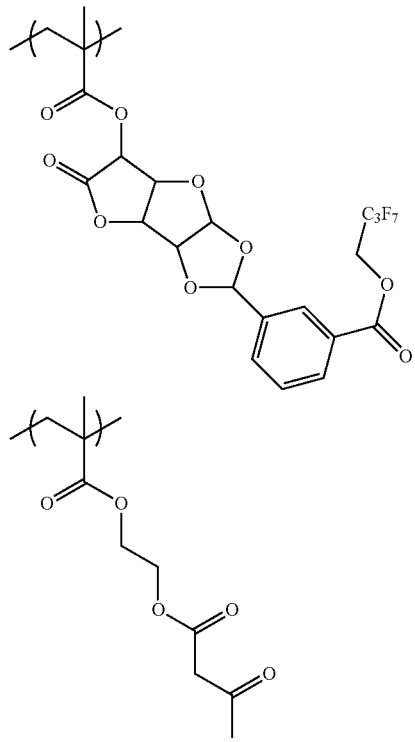
(C-130)
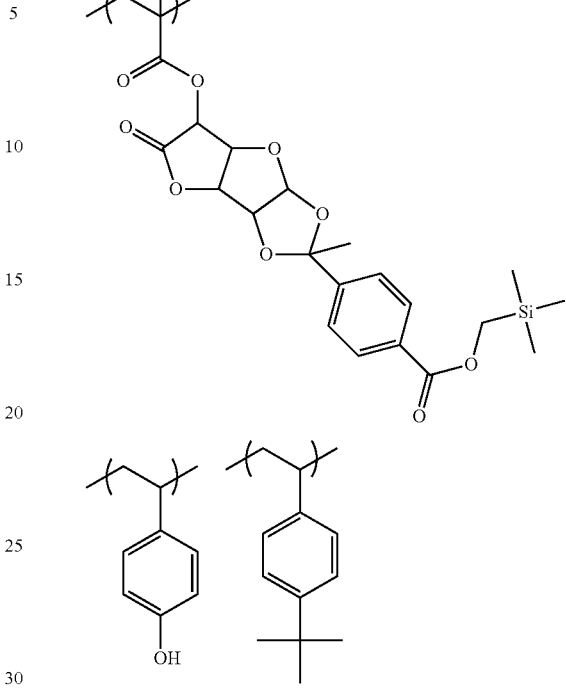
(C-129)
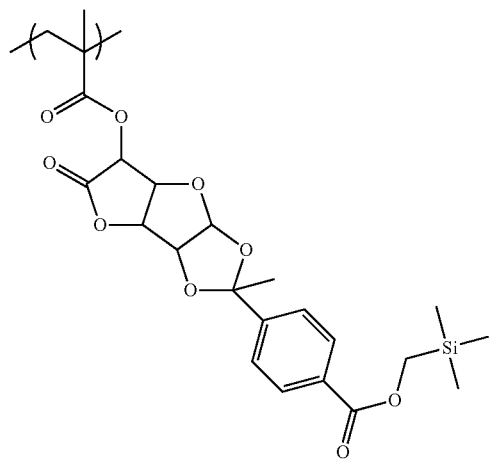
(C-131)
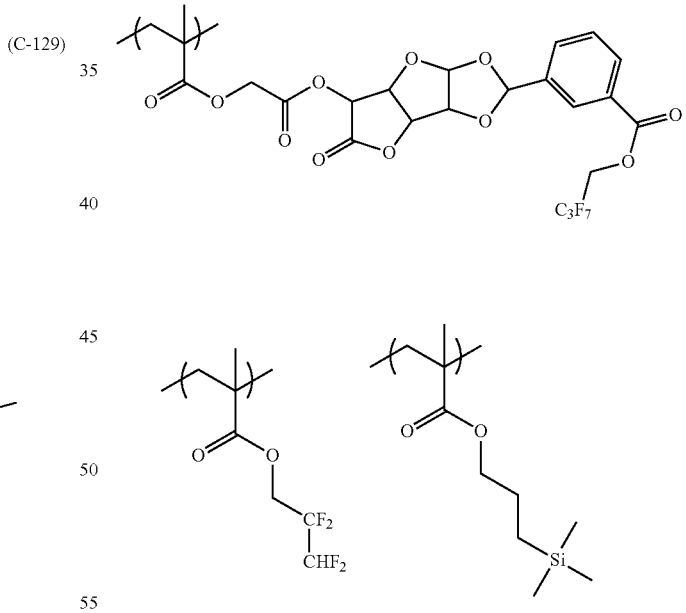
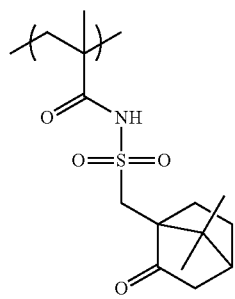
(C-132)
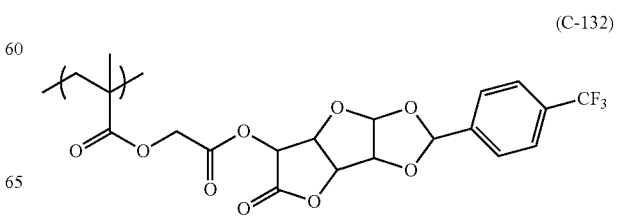

195
-continued
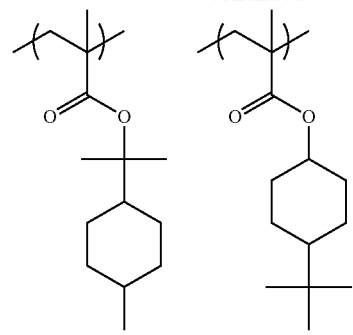
(C-133)
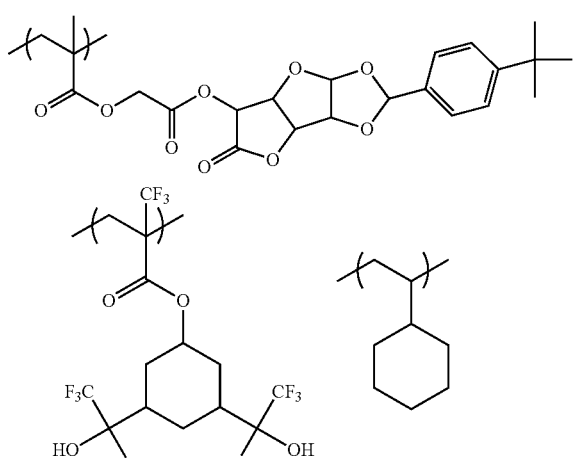
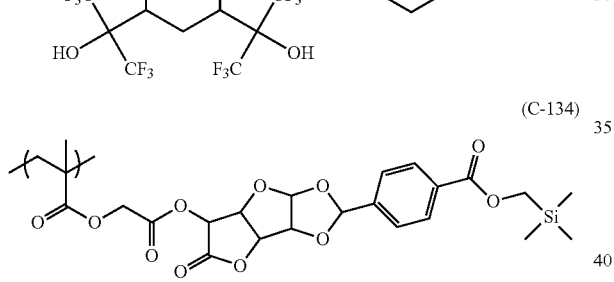
(C-134)
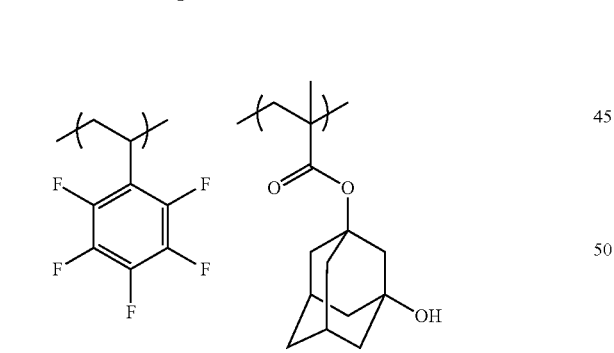
(C-135)
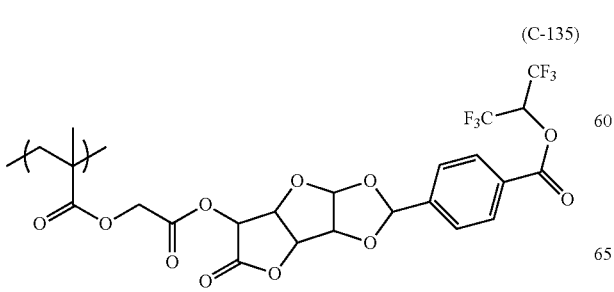
196
-continued
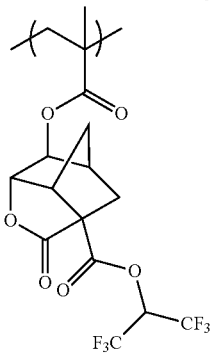
(C-136)
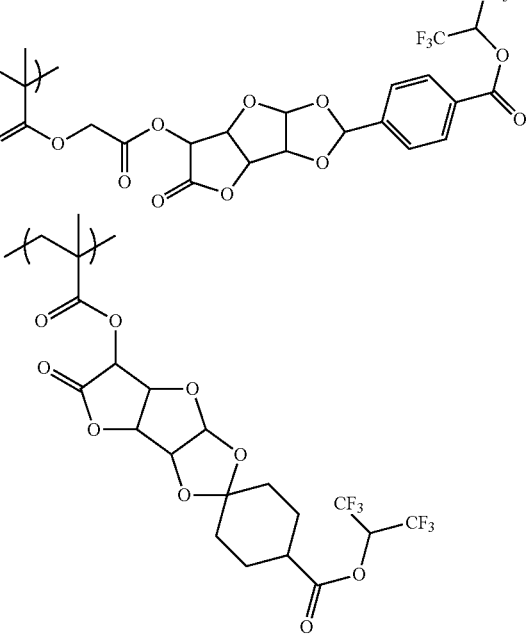
(C-137)
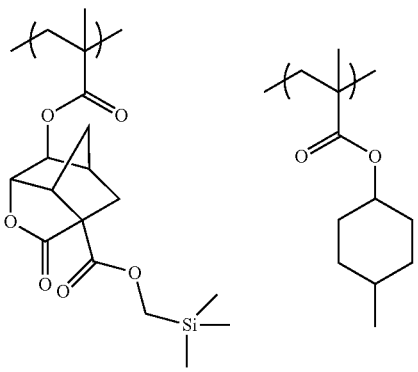
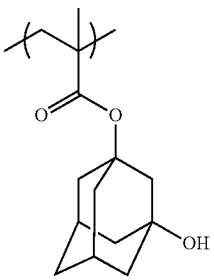

-continued
(C-138)
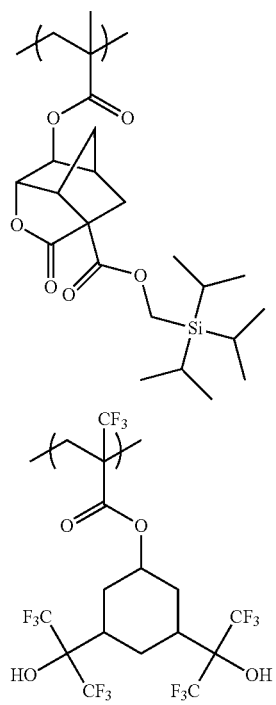
(C-139)
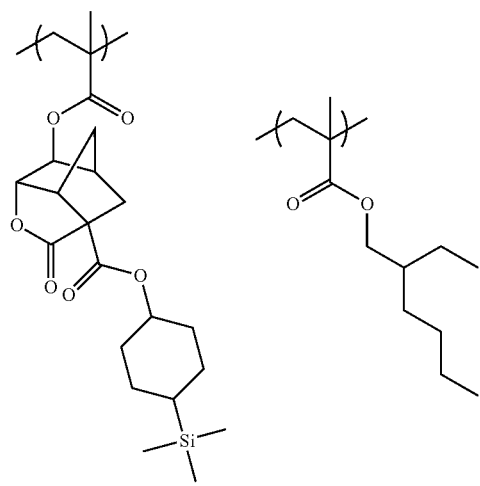
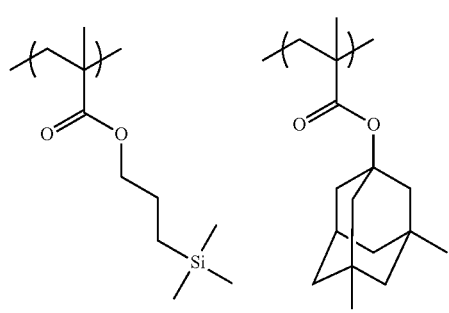
-continued
(C-140)
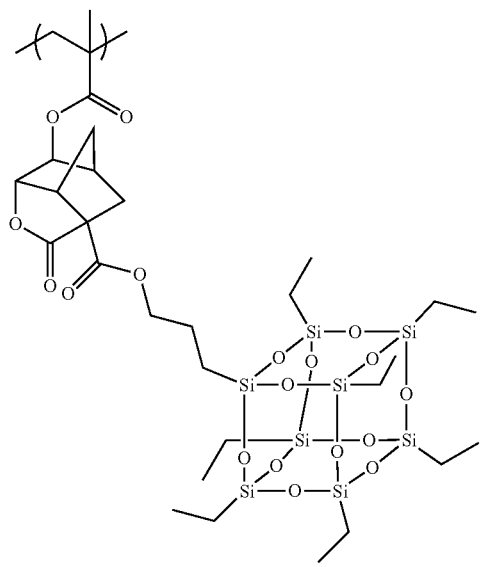
(C-141)
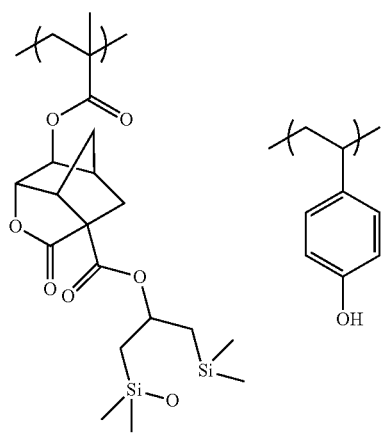
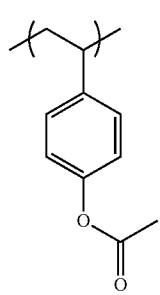

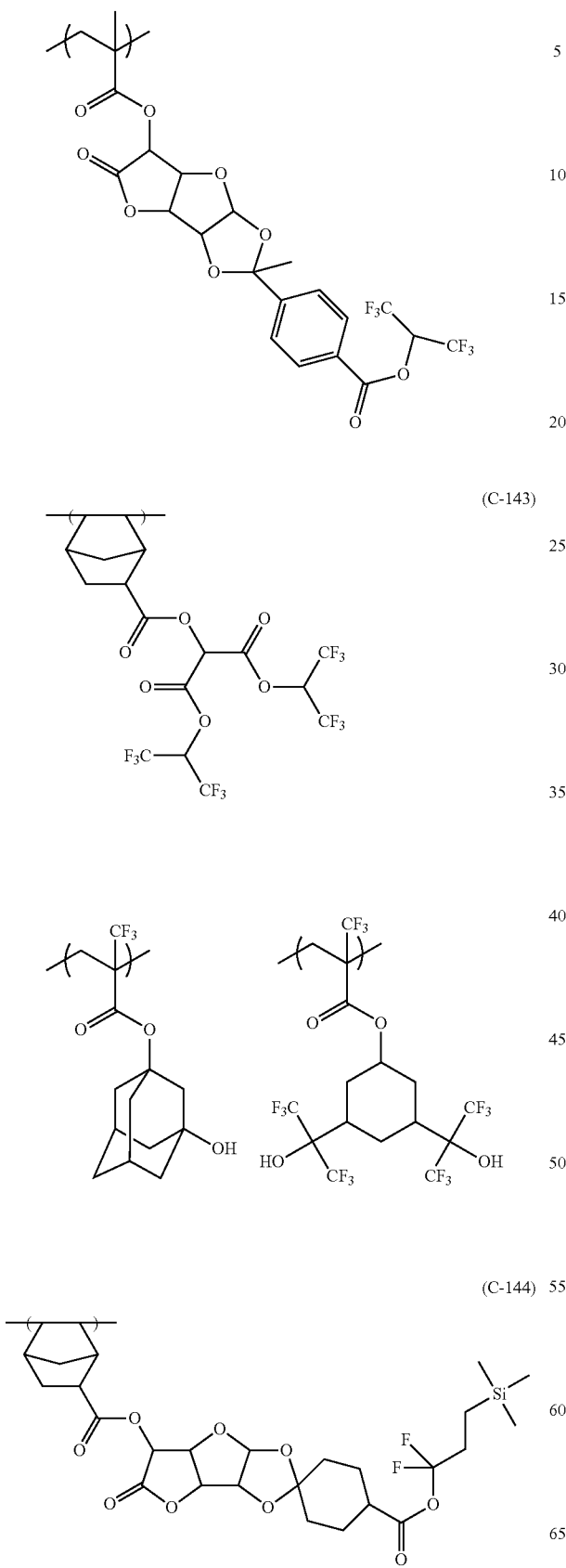
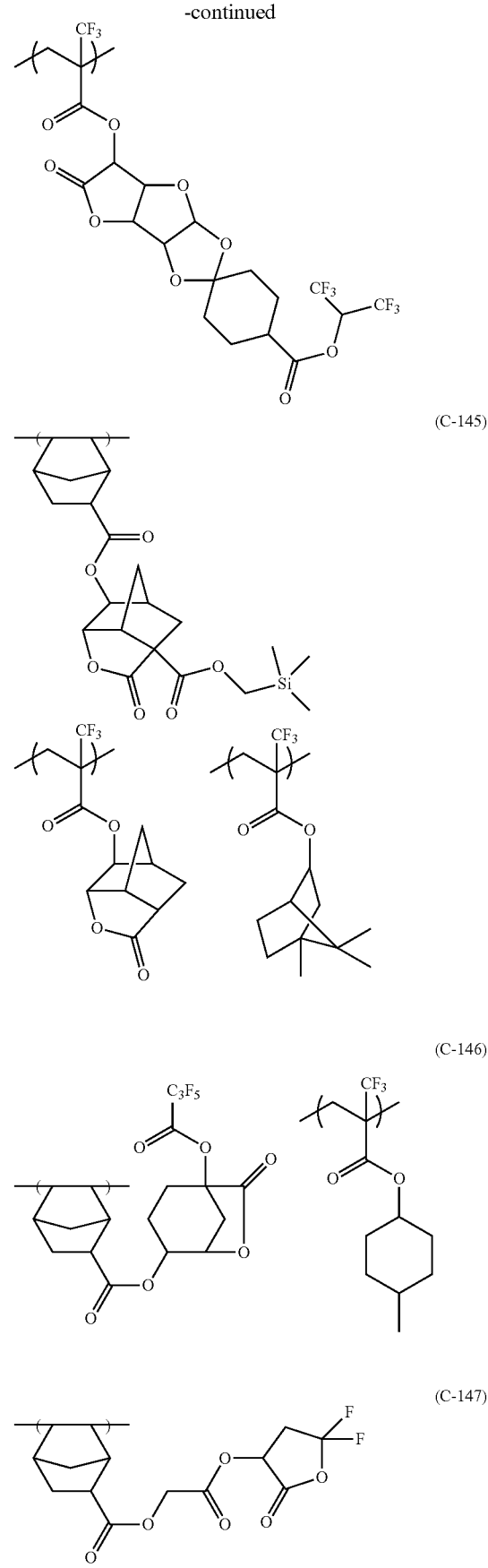

201
-continued
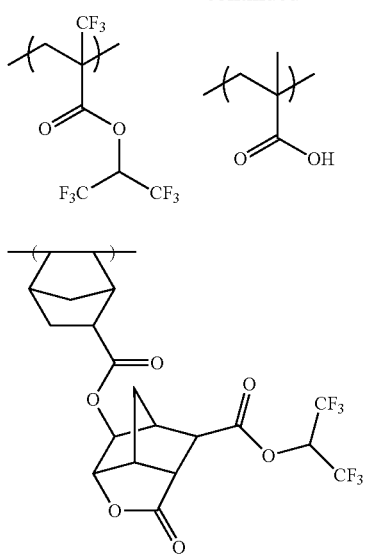
202
-continued
(C-150)
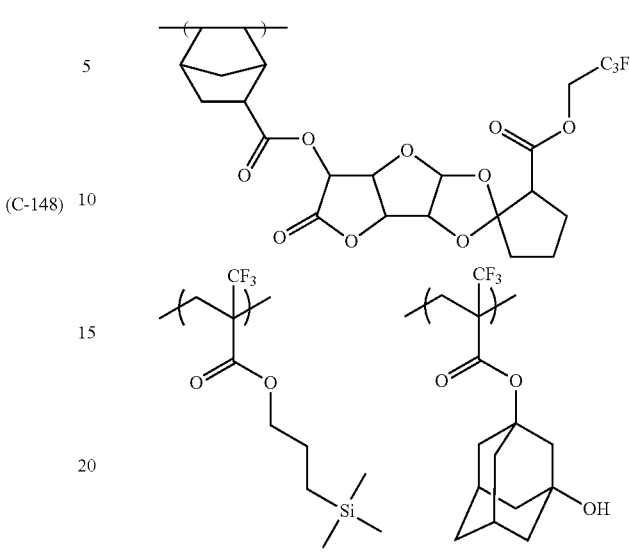
(C-148)
(C-151)
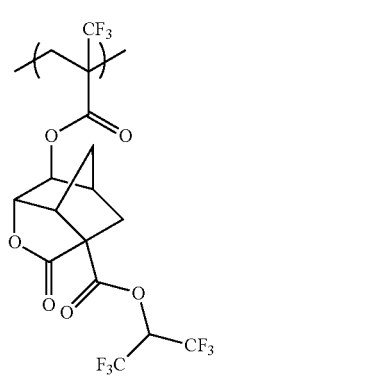
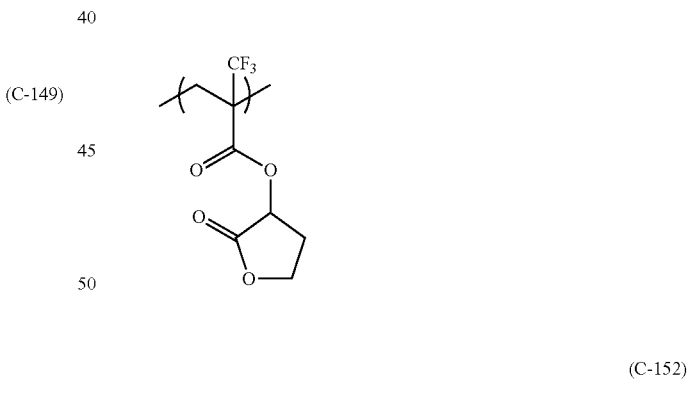
(C-149)
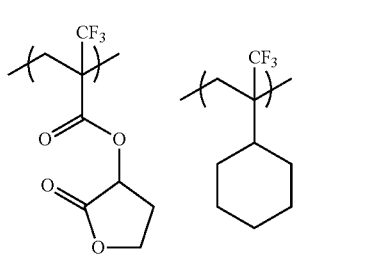
(C-152)
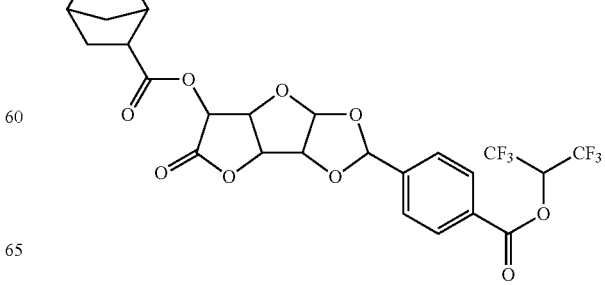

203
-continued
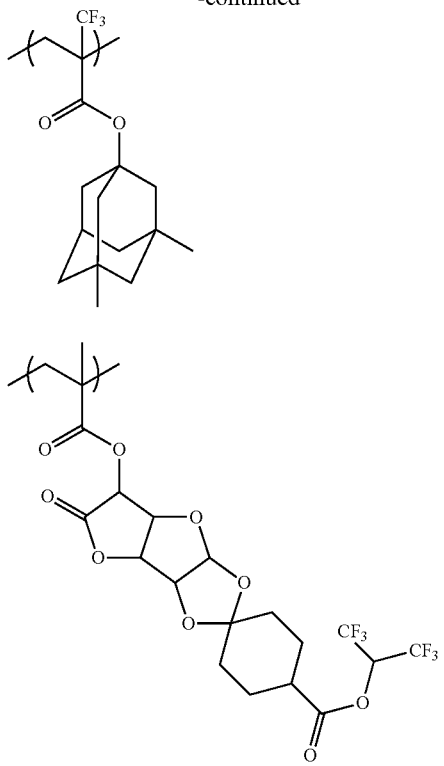
(C-153)
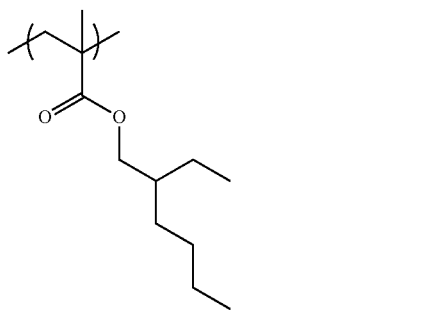
(C-154)
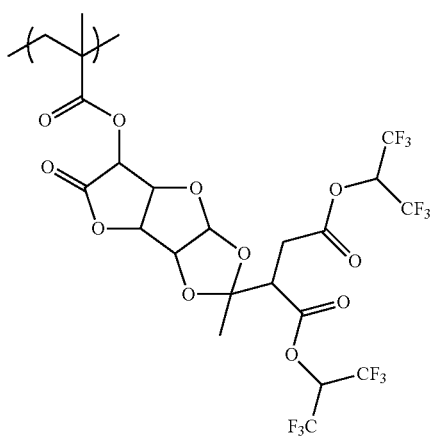
204
-continued
(C-155)
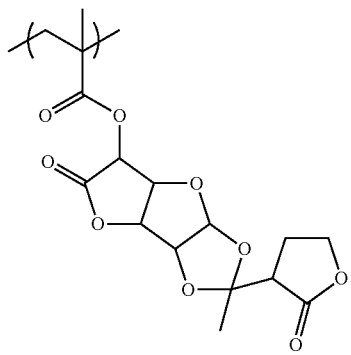
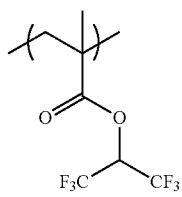
(C-156)
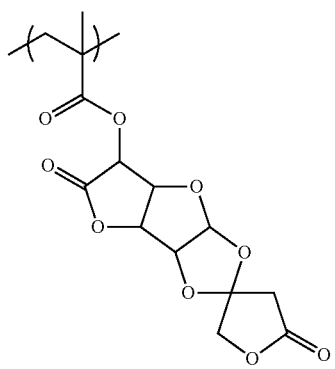 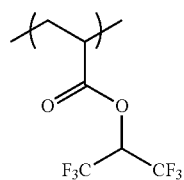
(C-157)
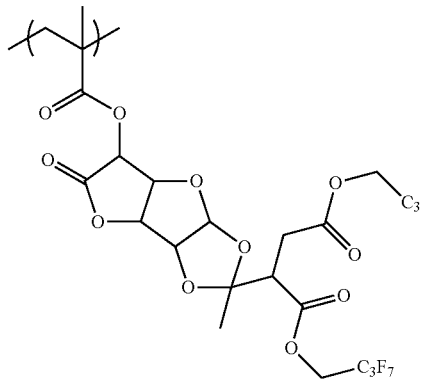

-continued
(C-158)
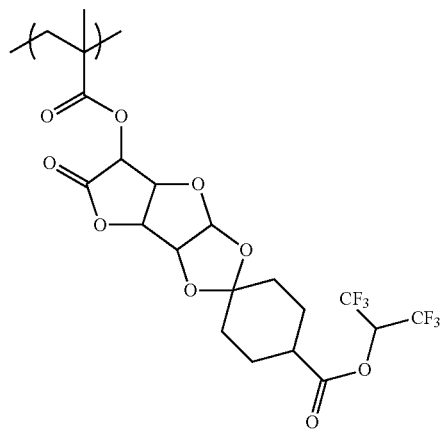
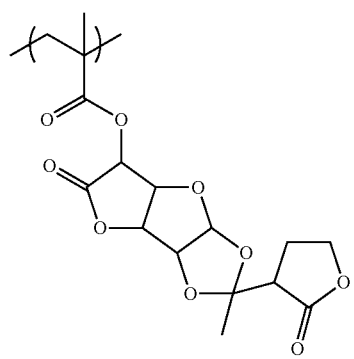
(C-159)
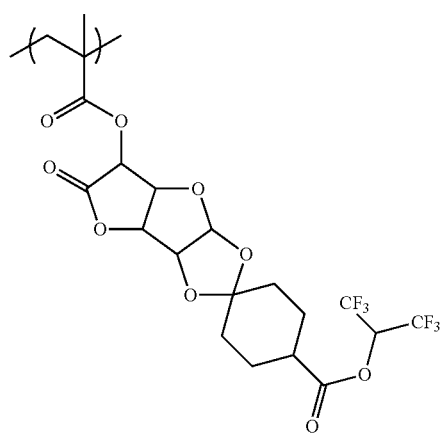
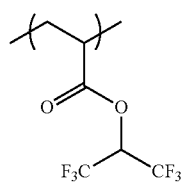
-continued
(C-160)
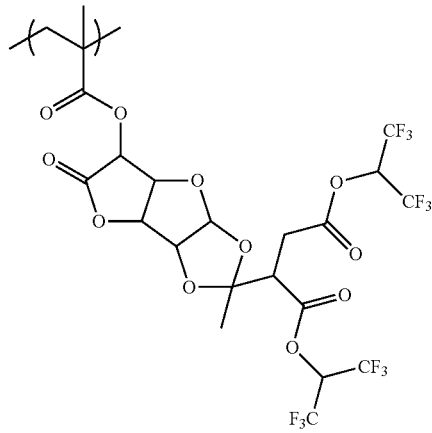
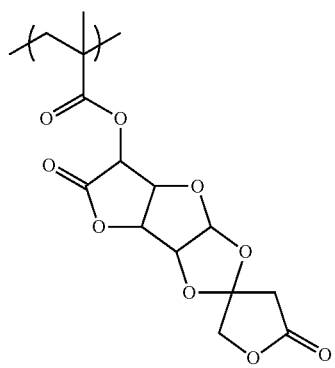
(C-161)
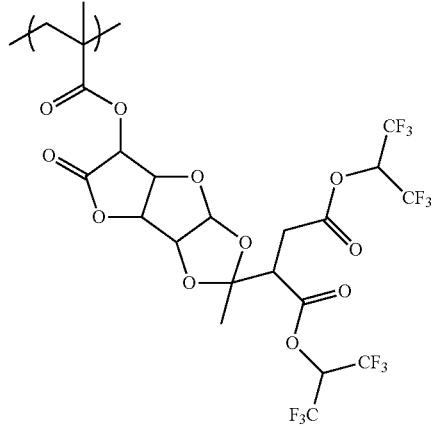
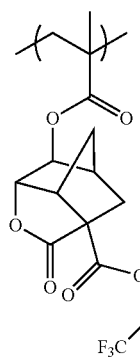

(C-162)
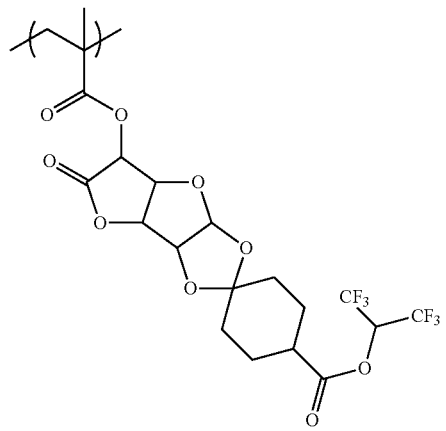
(C-163)
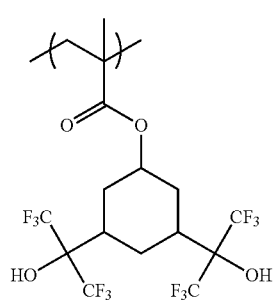
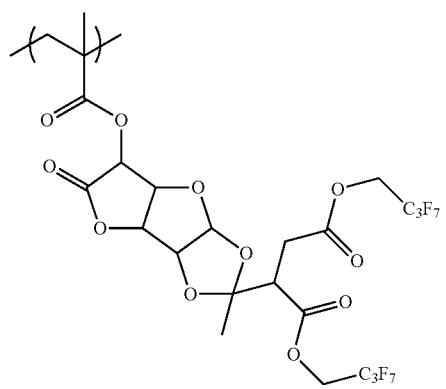
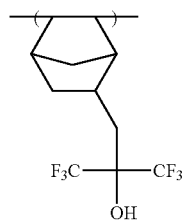
(C-164)
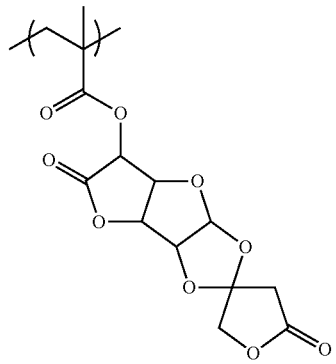
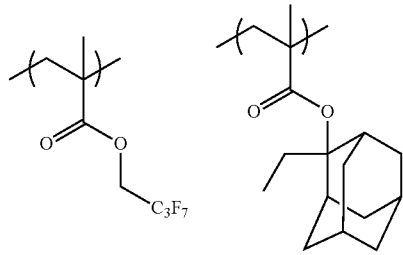
(C-165)
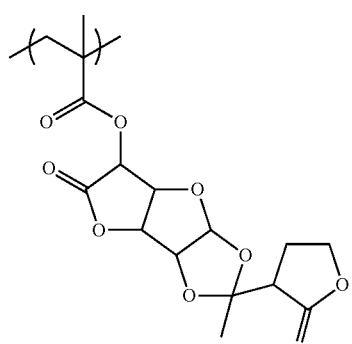
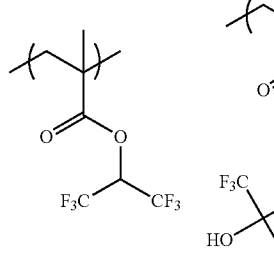
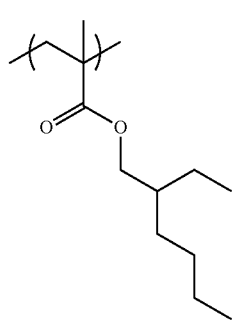

(C-166)
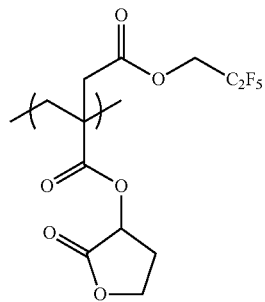
(C-167)
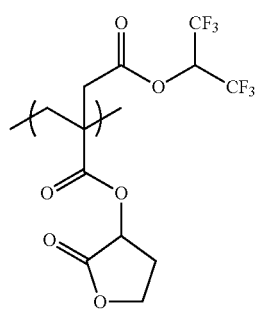
(C-168)
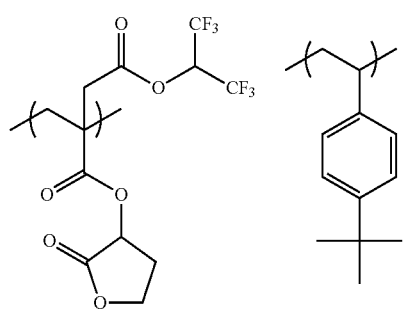
(C-169)
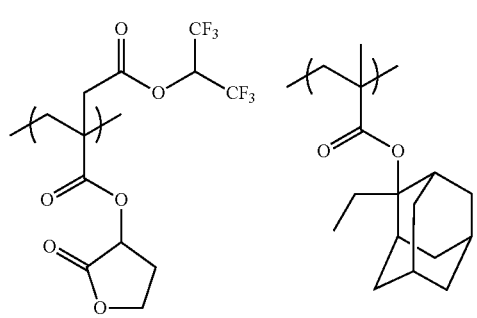
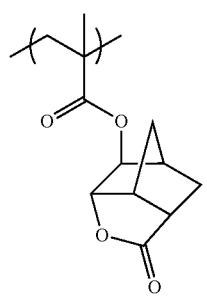
(C-170)
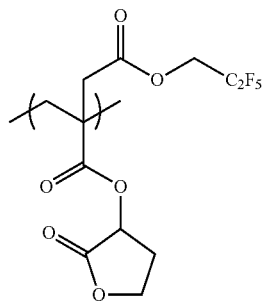
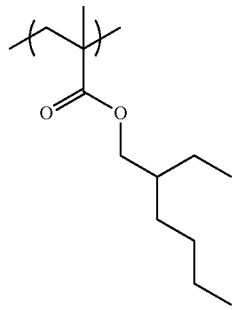
(C-171)
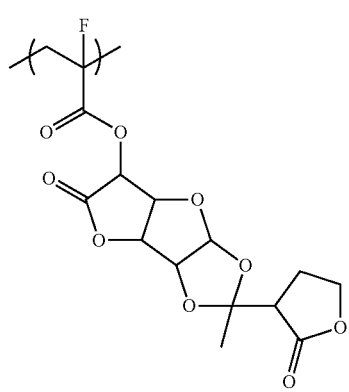
(C-172)
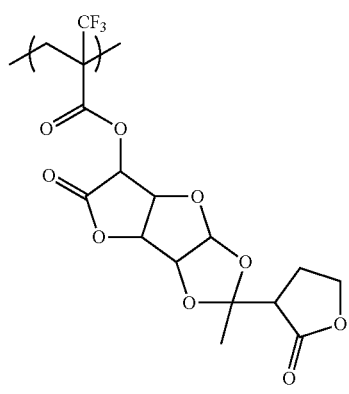

(C-173)
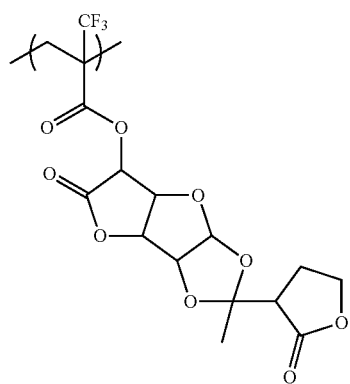
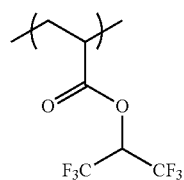
(C-174)
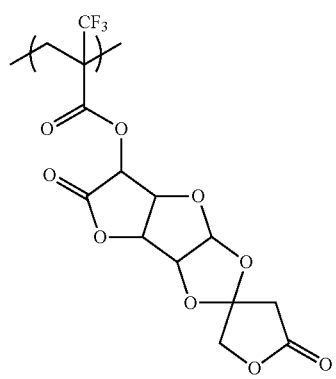
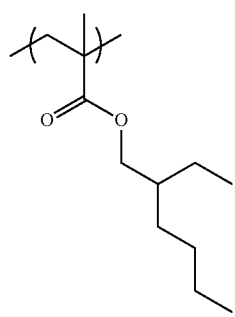
(C-175)
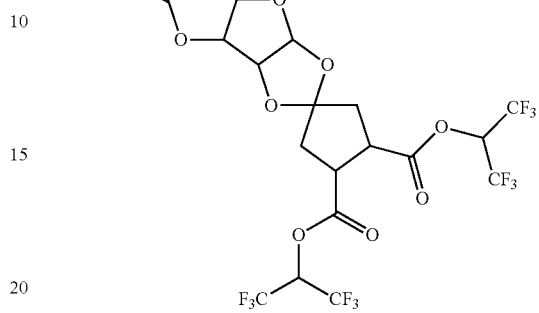
(C-176)
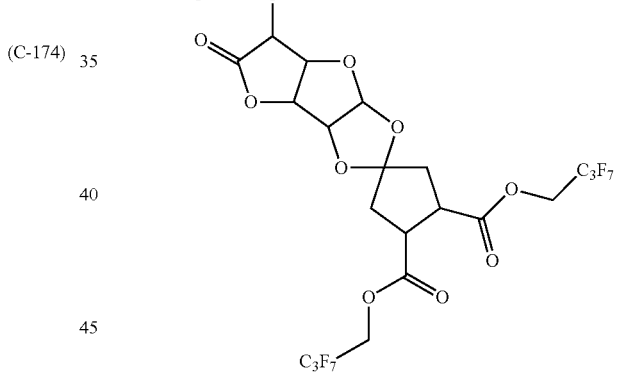
(C-177)
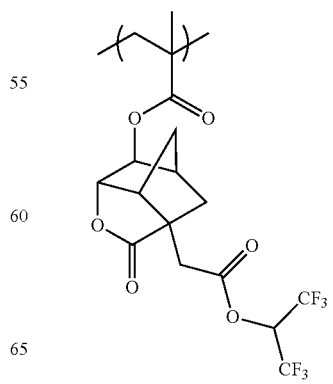

(C-178) 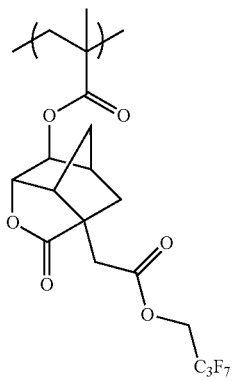
(C-179) 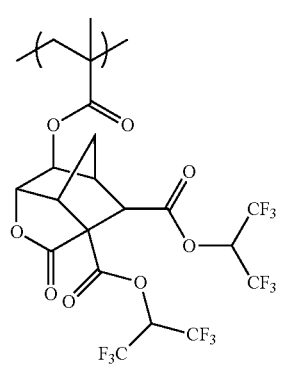
(C-180) 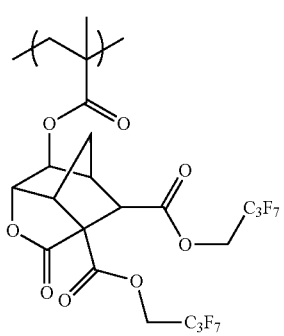
(C-181) 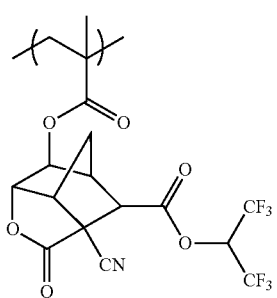
(C-182) 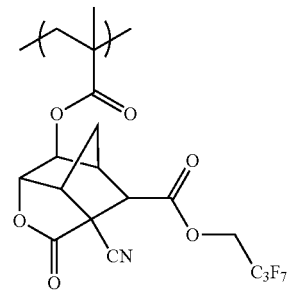
(C-183) 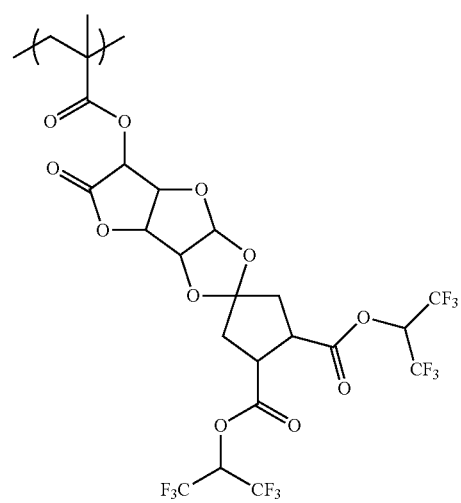
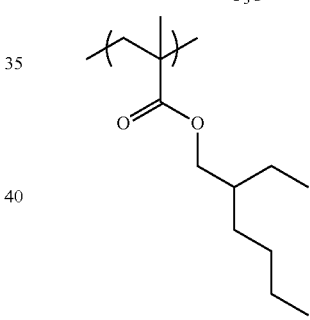
(C-184) 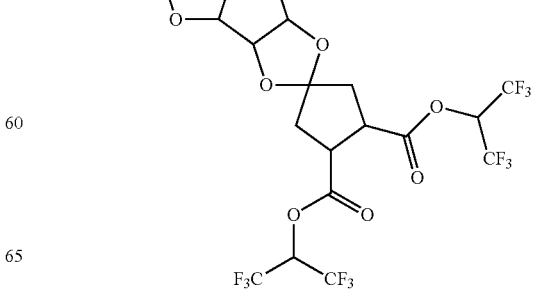

215
-continued
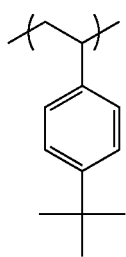
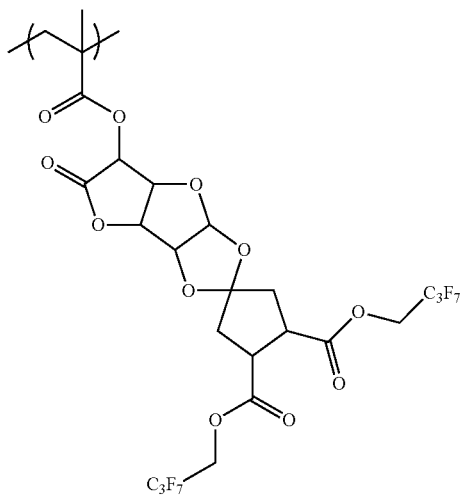
(C-185)
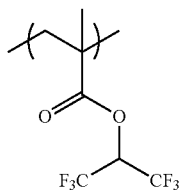
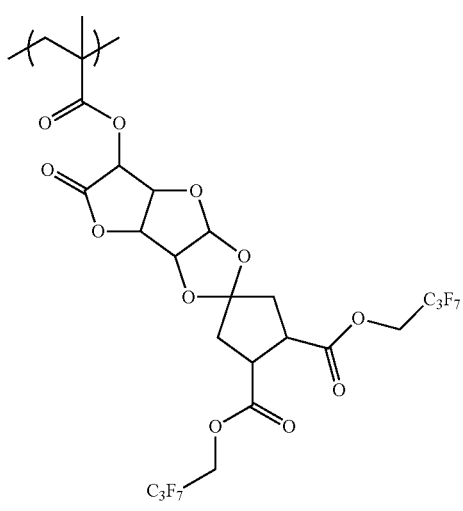
(C-186)
216
-continued
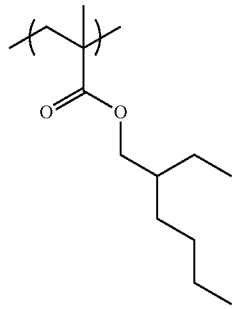
(C-187)
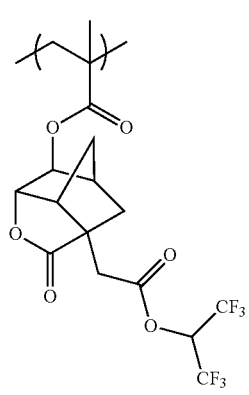 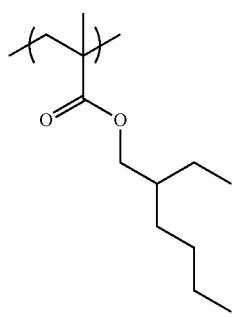
(C-188)
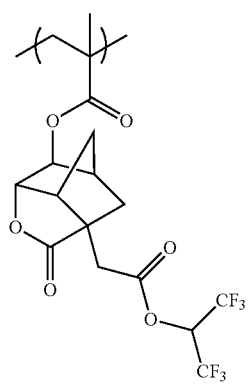 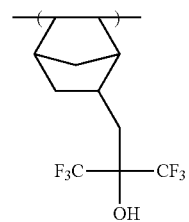
(C-189)
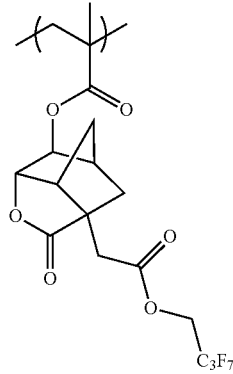 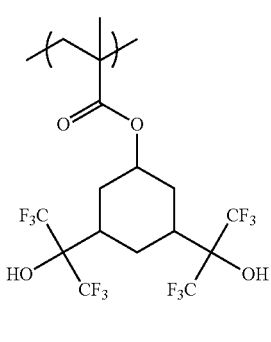

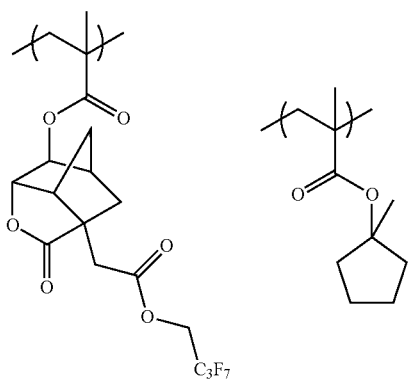
(C-190)
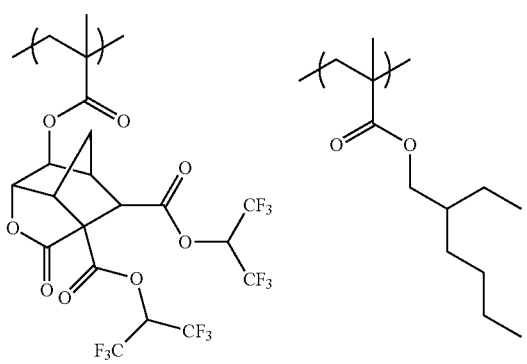
(C-191)
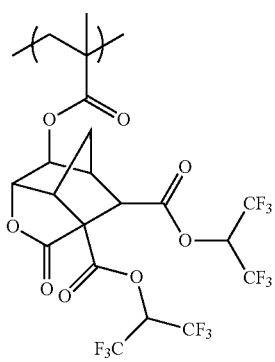
(C-192)
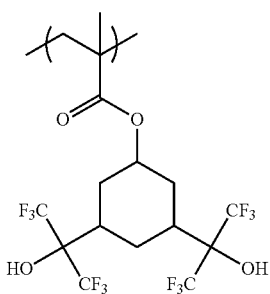
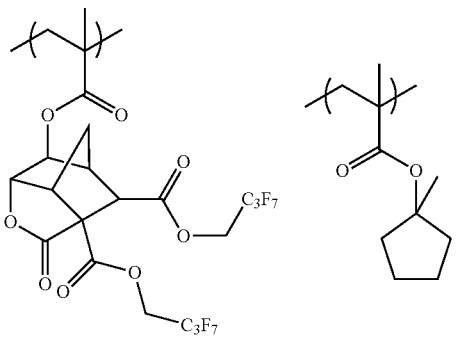
(C-193)
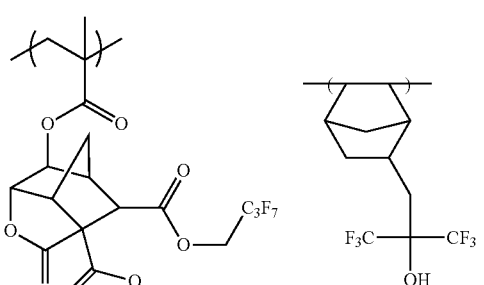
(C-194)
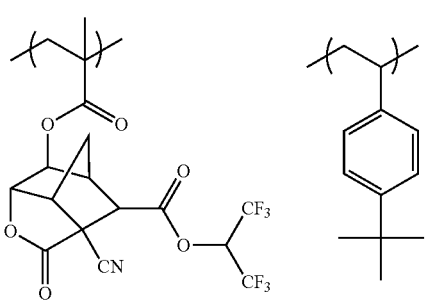
(C-195)
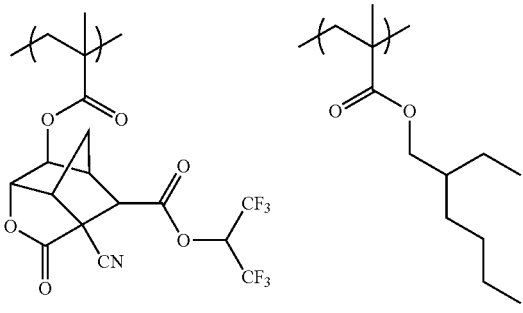
(C-196)
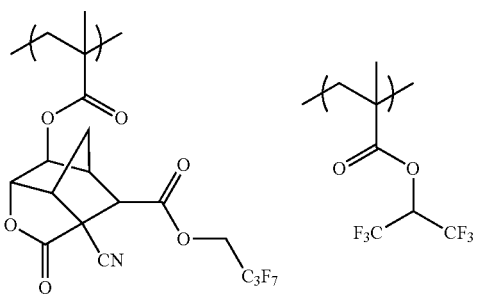
(C-197)

(C-198)
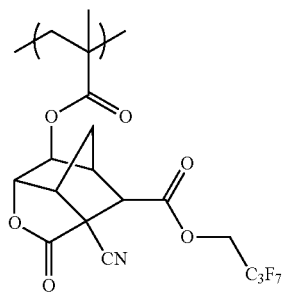 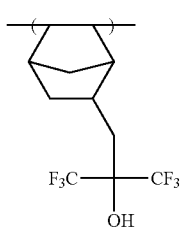
(C-199)
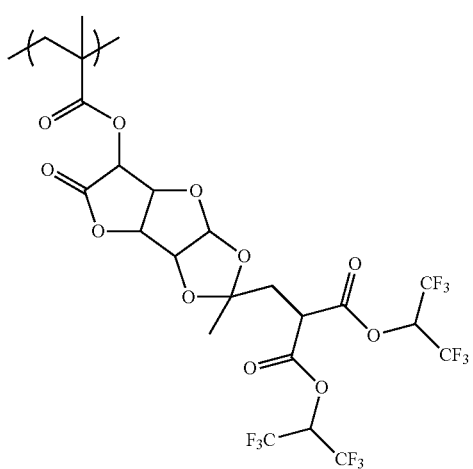
(C-200)
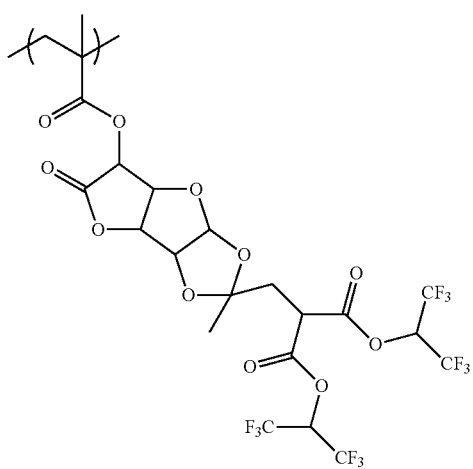
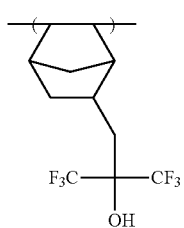
(C-201)
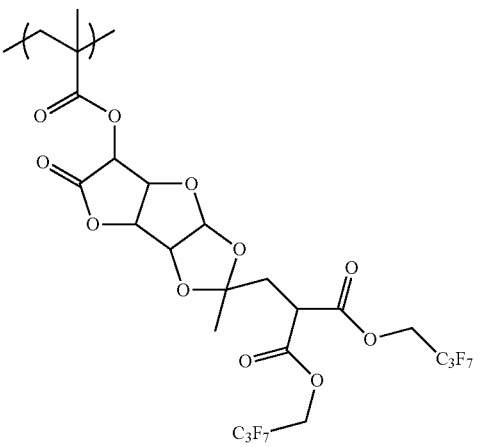
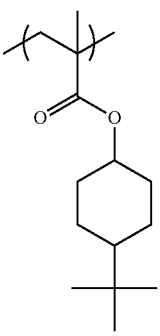
(C-202)
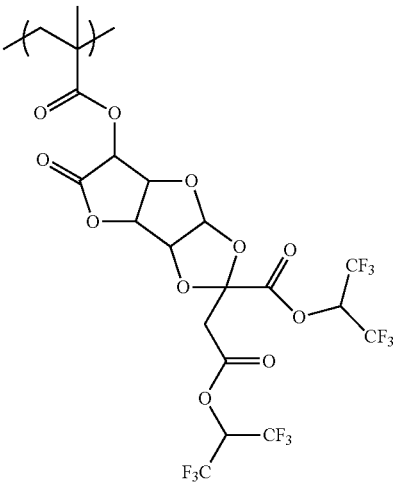

(C-203)
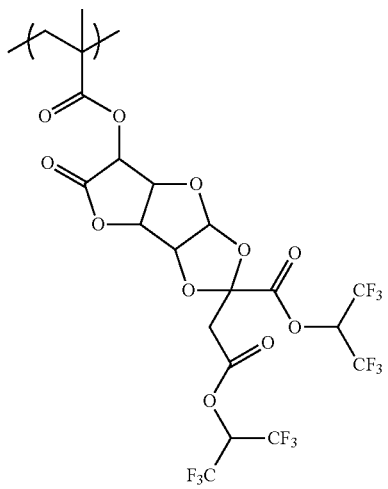
(C-204)
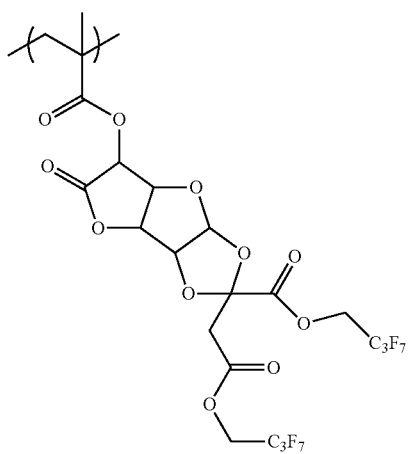
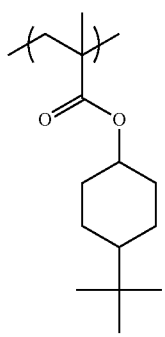
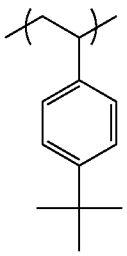
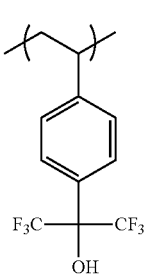
(C-205)
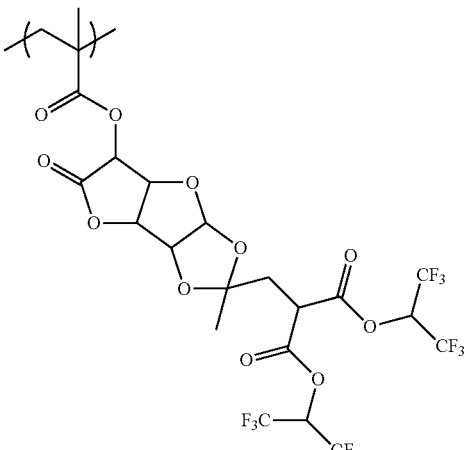
(C-206)
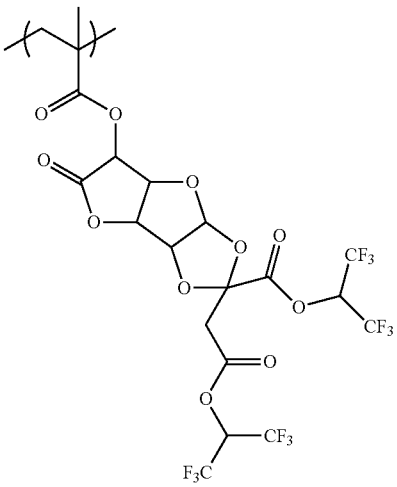
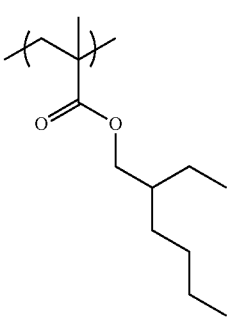

-continued
(C-207)
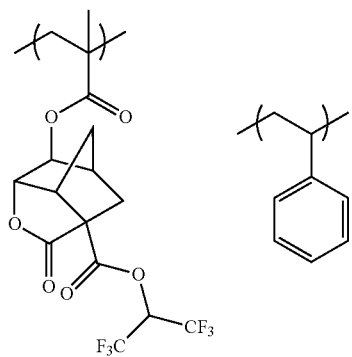
(C-209)
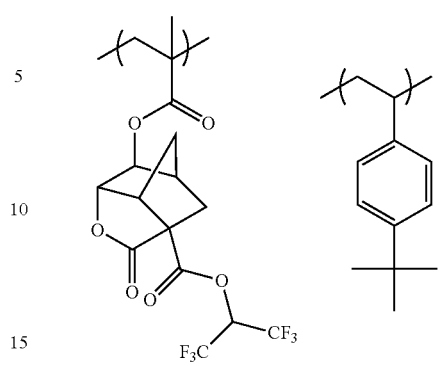
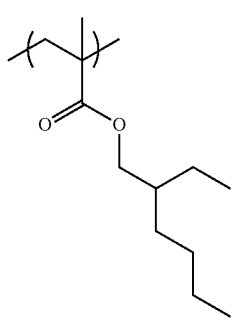
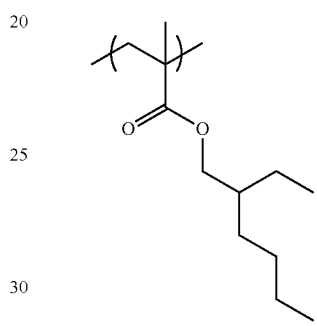
(C-208)
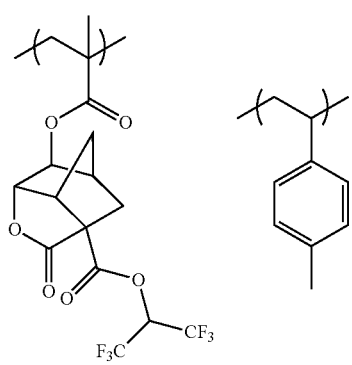
(C-210)
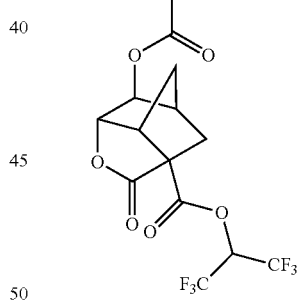
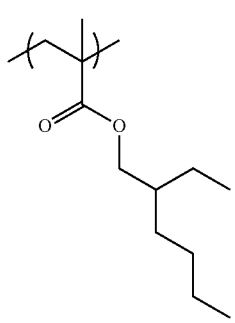
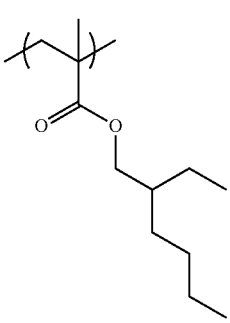

(C-211)
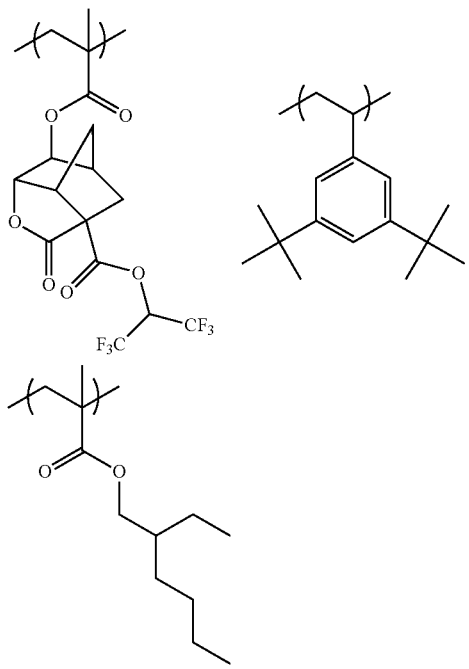 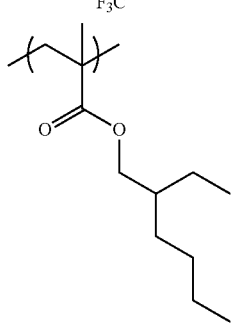
(C-212)
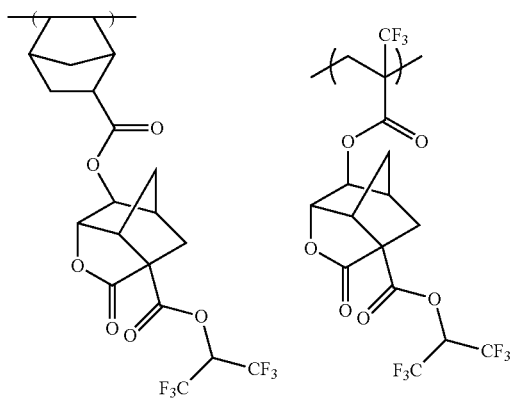 
(C-213)
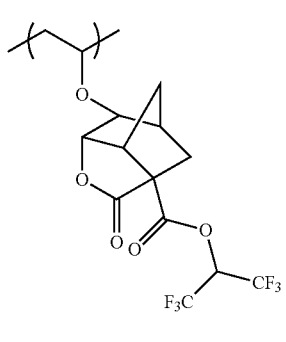 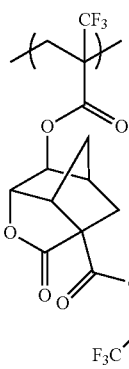
(C-214)
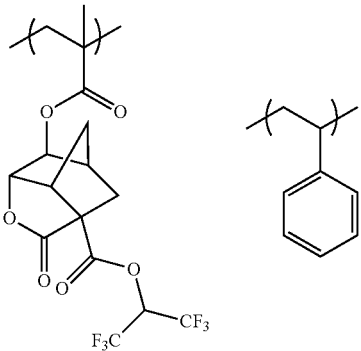 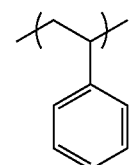
(C-215)
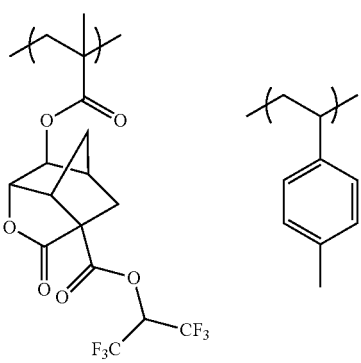
(C-216)
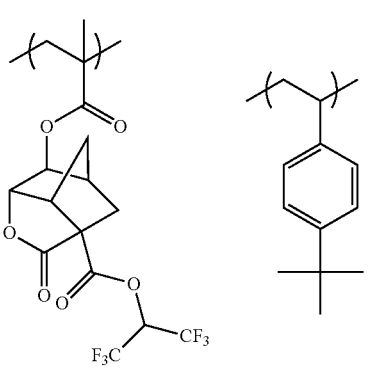
(C-217)
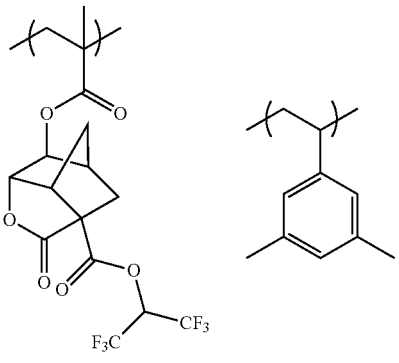

(C-218)
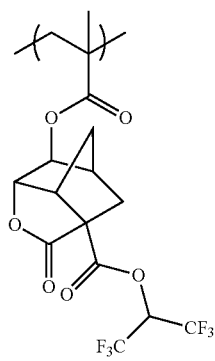 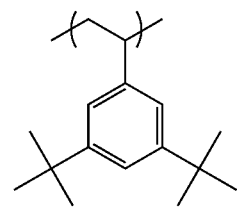
(C-219)
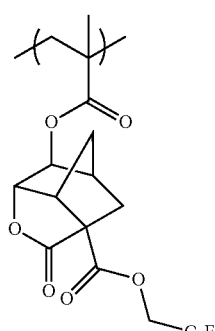 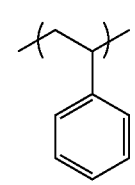
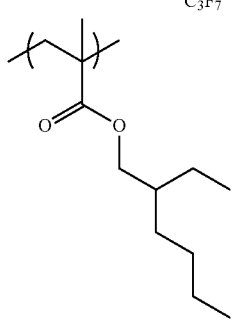
(C-220)
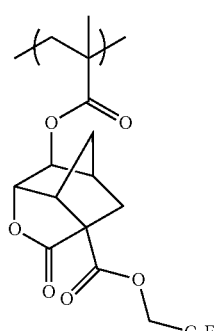 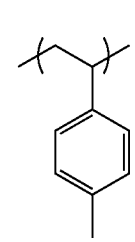
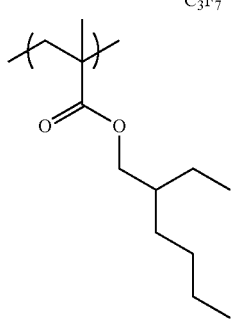
(C-221)
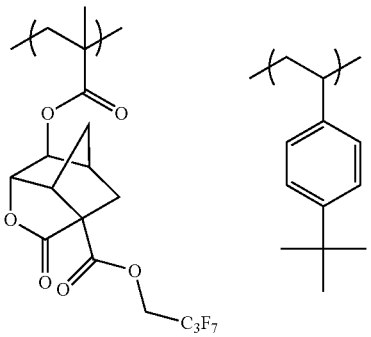 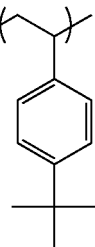
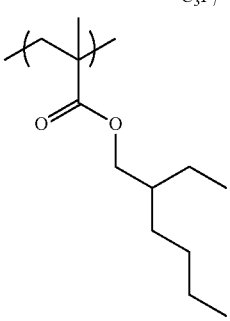
(C-222)
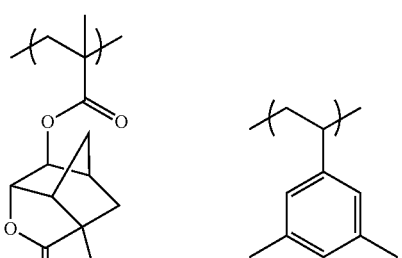
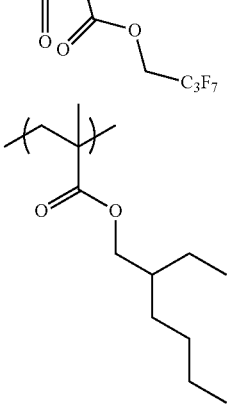
(C-223)
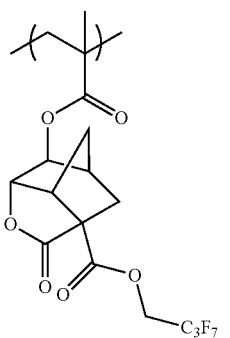 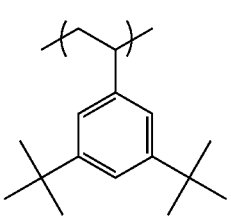

-continued
(C-224)
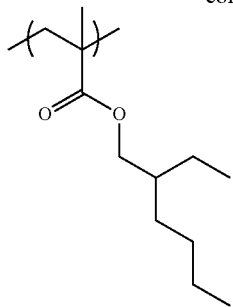
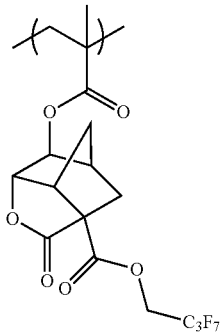 (C-227)
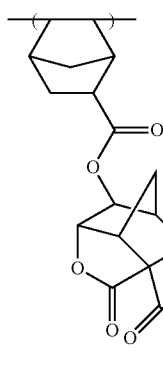 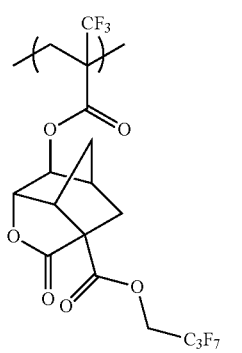
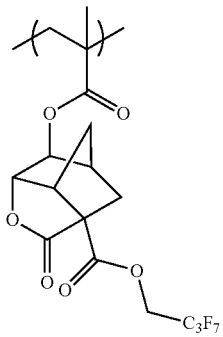 (C-228)
(C-225)
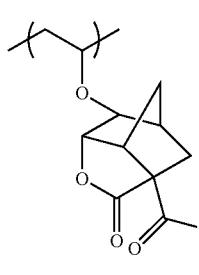 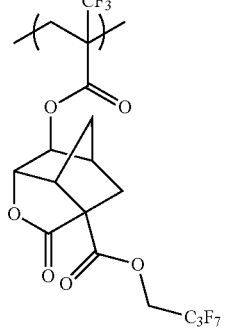
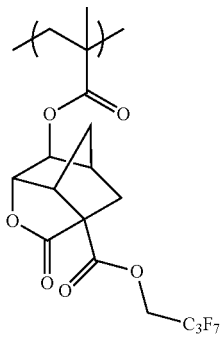 (C-229)
(C-226)
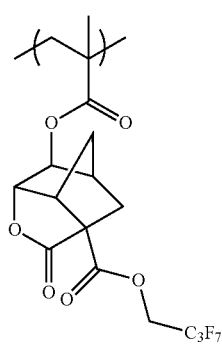 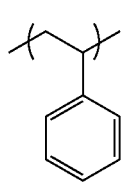
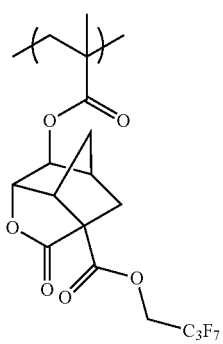 (C-230)
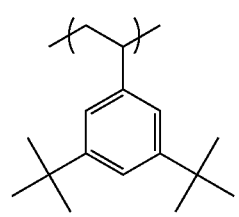

-continued
(C-231)
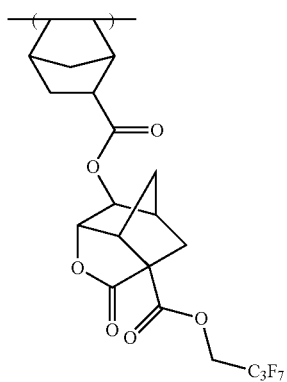 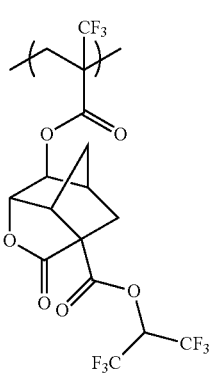
(C-232)
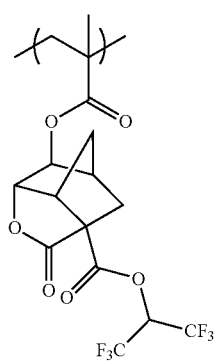 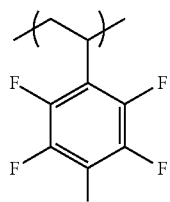
(C-233)
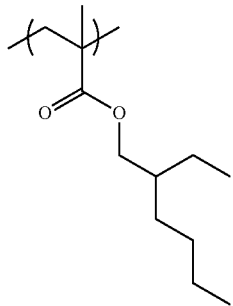
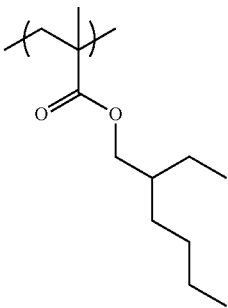
(C-234)
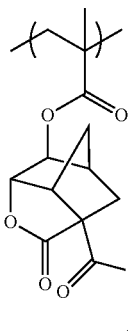 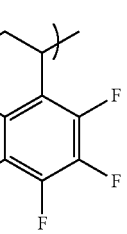
(C-235)
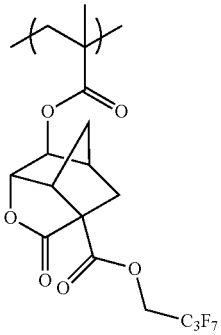 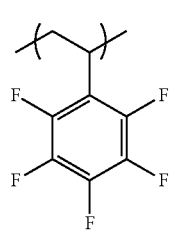
(C-236)
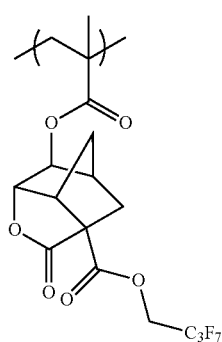 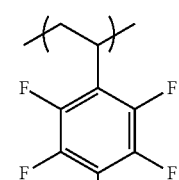
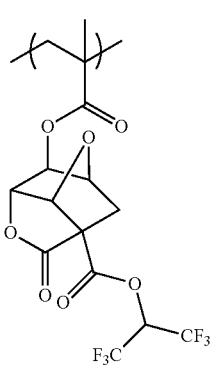

(C-237)
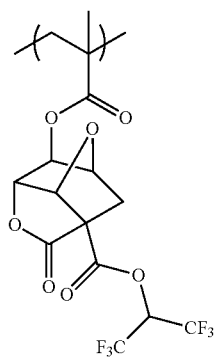
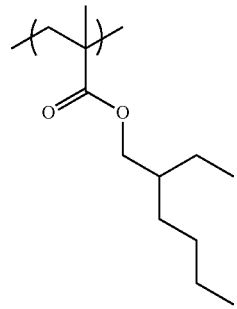
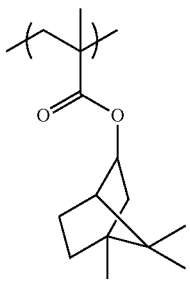
(C-238)
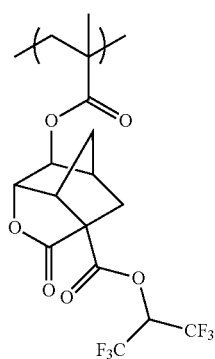
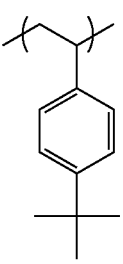
(C-242)
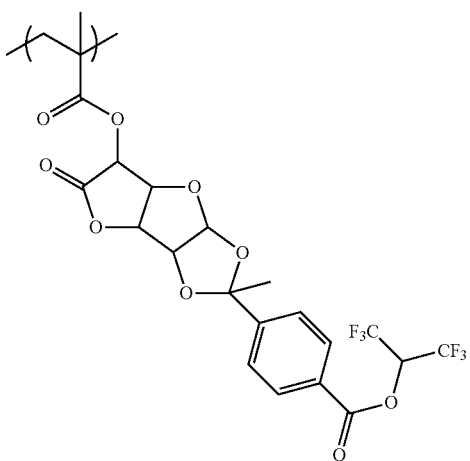
(C-239)
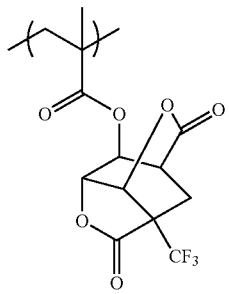
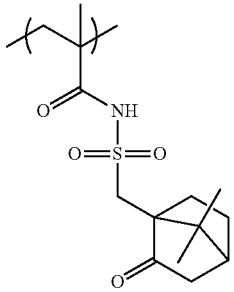
(C-240)
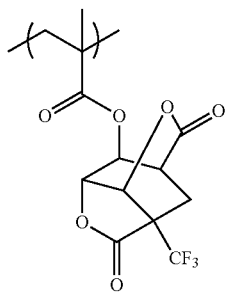
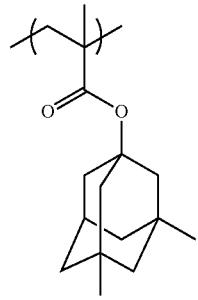
(C-243)
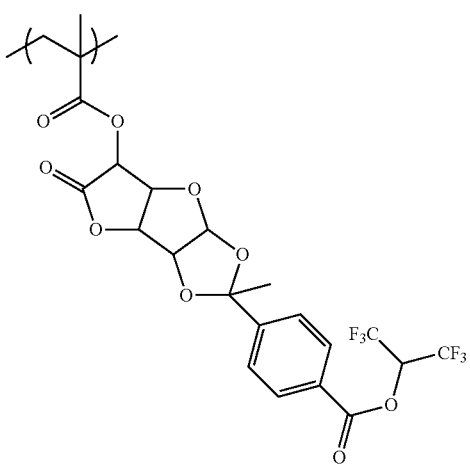
(C-241)
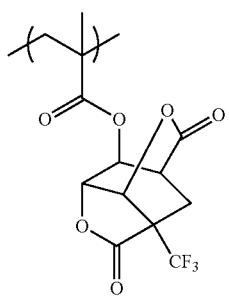
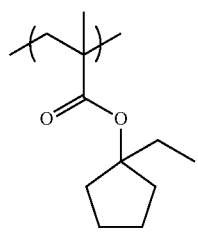

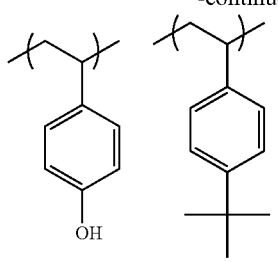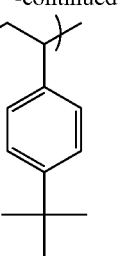
(C-244)
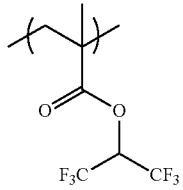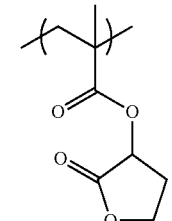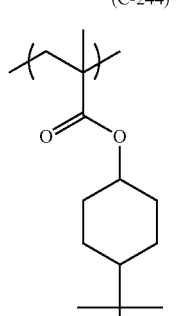
(C-245)
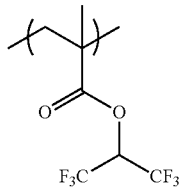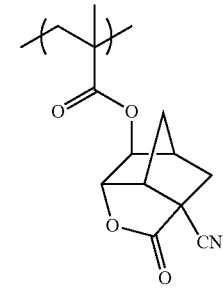
(C-246)
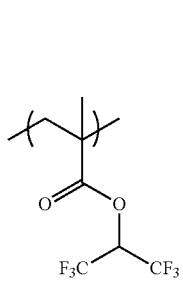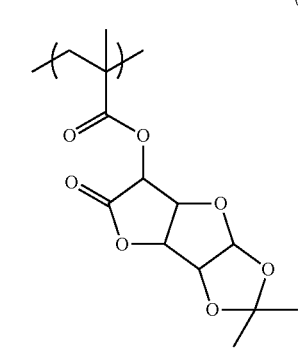
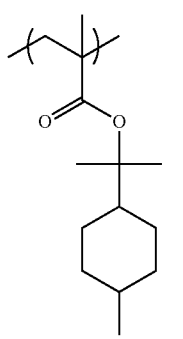
(C-247)
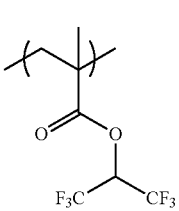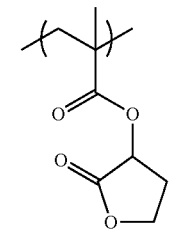
(C-248)
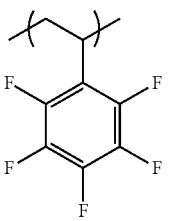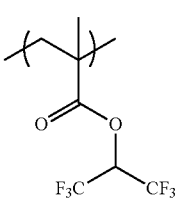
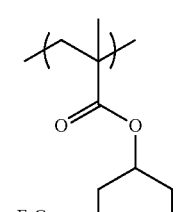
(C-249)
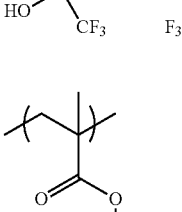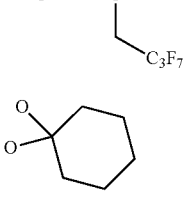
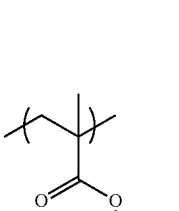
(C-250)
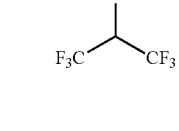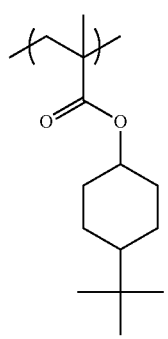

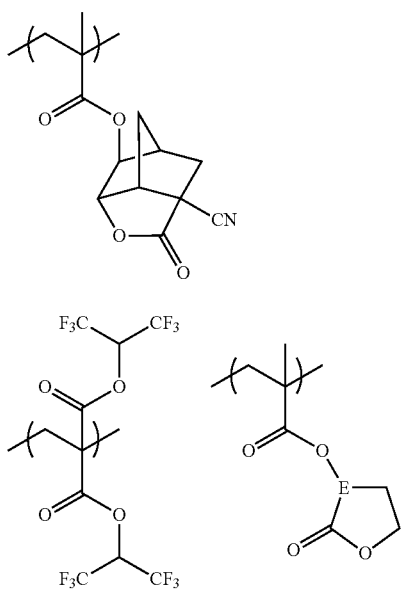
(C-251)
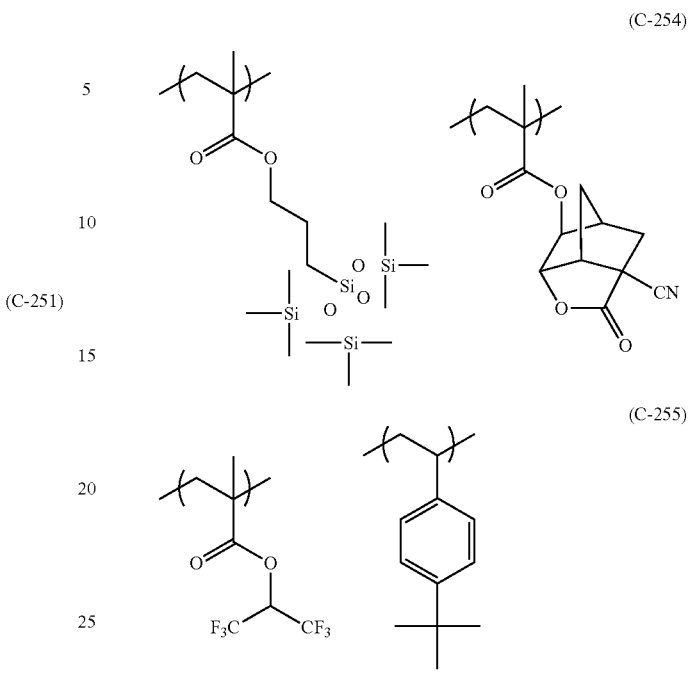
(C-254)
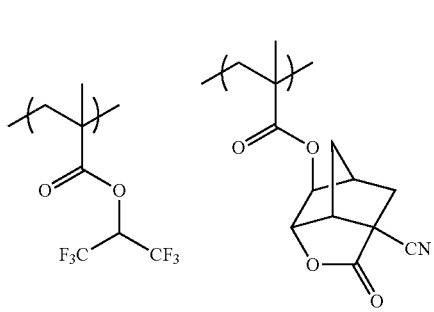
(C-252)
(C-255)
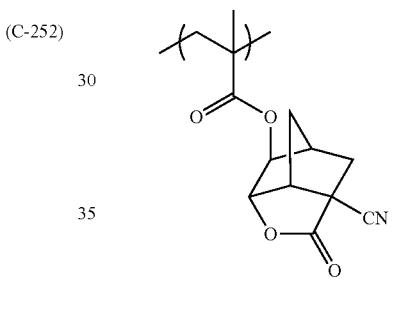
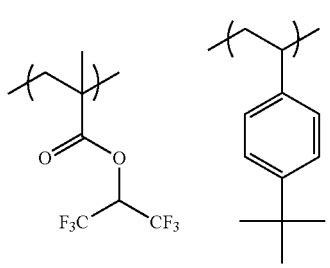
(C-253)
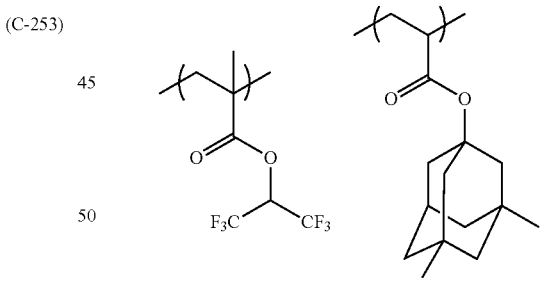
(C-256)
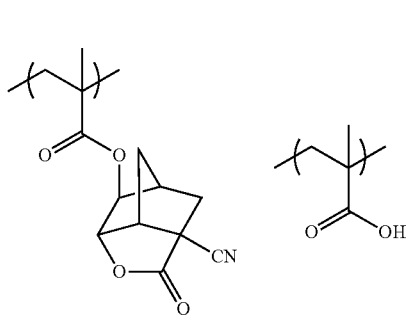
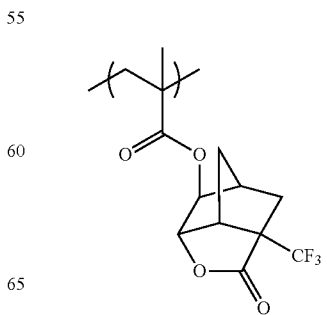

(C-257)
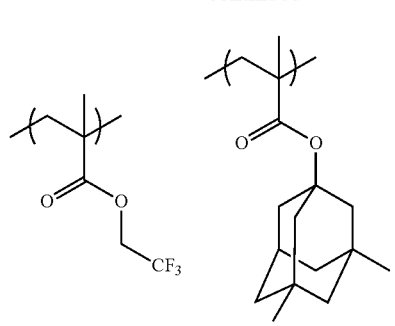
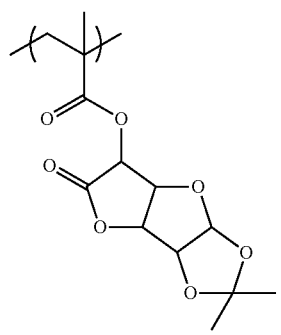
(C-258)
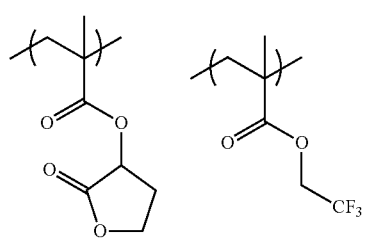
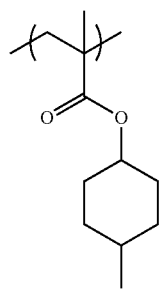
(C-259)
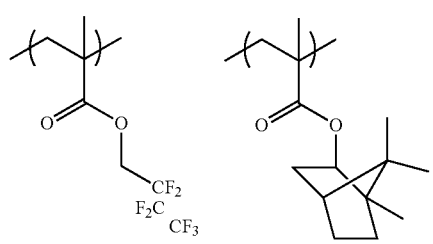
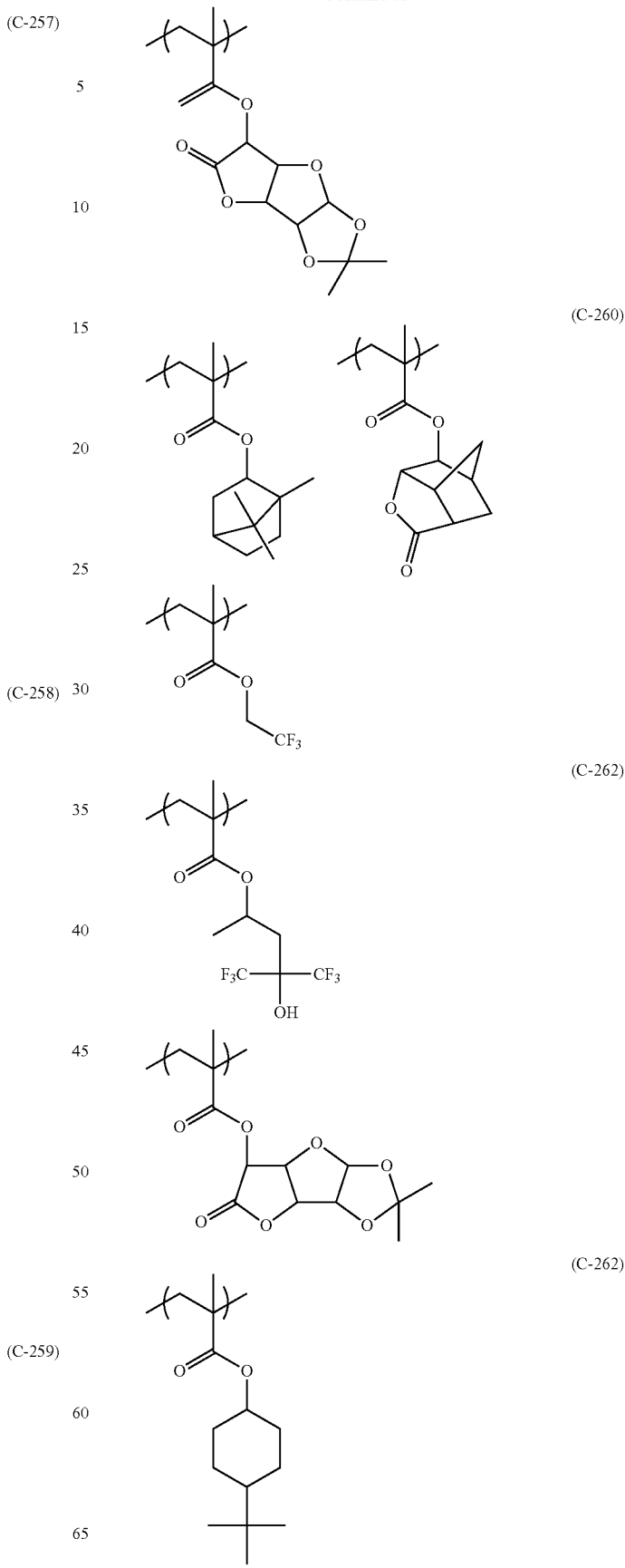

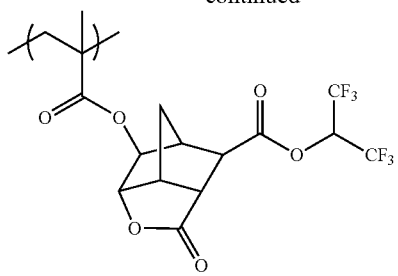
(C-263)
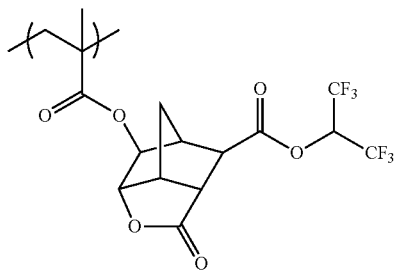
(C-264)
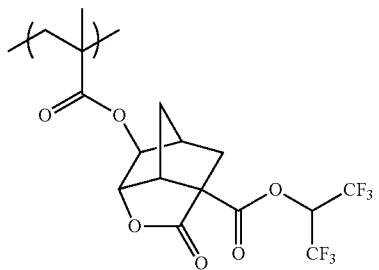
(C-265)
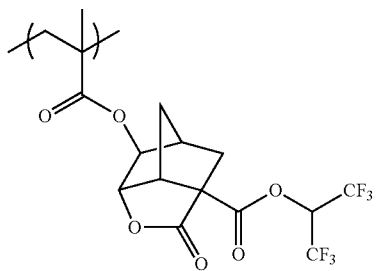
(C-266)
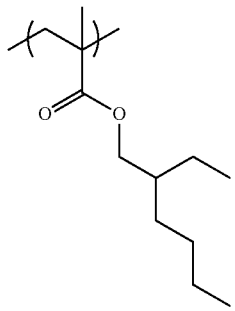
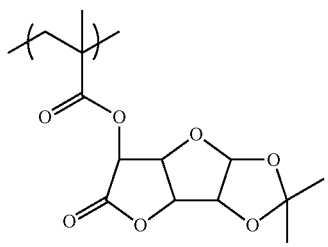
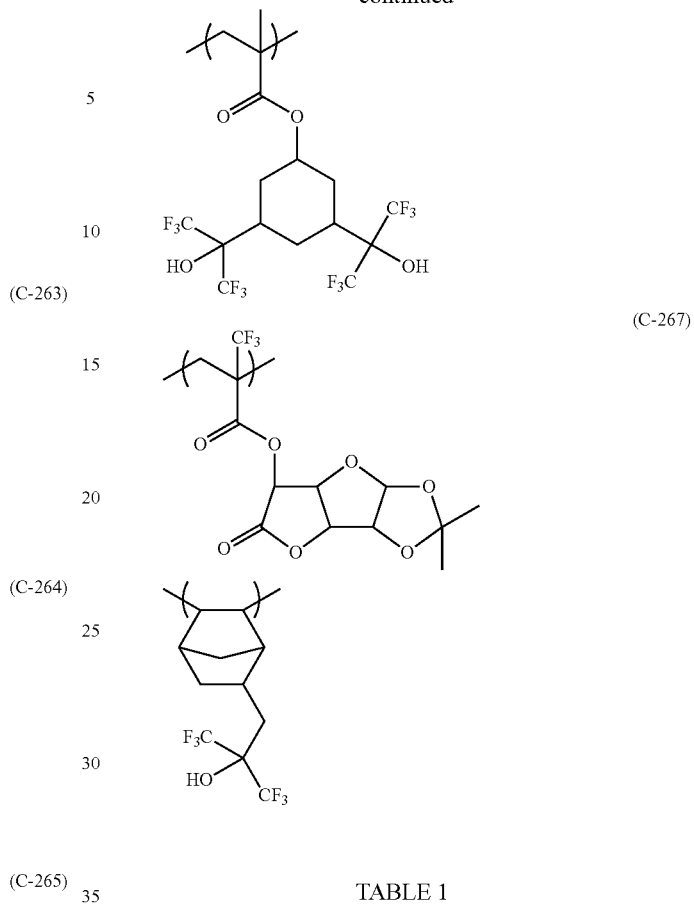
(C-267)
TABLE 1
| Resin | Composition | Mw | Mw/Mn |
|---|---|---|---|
| C-1 | 100 | 6000 | 1.5 |
| C-2 | 100 | 7500 | 1.4 |
| C-3 | 100 | 6000 | 1.4 |
| C-4 | 100 | 9000 | 1.5 |
| C-5 | 100 | 6000 | 1.4 |
| C-6 | 50/50 | 6500 | 1.4 |
| C-7 | 90/10 | 8000 | 1.4 |
| C-8 | 60/40 | 8000 | 1.3 |
| C-9 | 30/30/30/10 | 9500 | 1.4 |
| C-10 | 70/30 | 7000 | 1.4 |
| C-11 | 50/10/40 | 9000 | 1.6 |
| C-12 | 80/20 | 6000 | 1.4 |
| C-13 | 40/30/30 | 9500 | 1.4 |
| C-14 | 50/50 | 8000 | 1.4 |
| C-15 | 70/30 | 7000 | 1.4 |
| C-16 | 100 | 6000 | 1.4 |
| C-17 | 100 | 8000 | 1.4 |
| C-18 | 40/20/40 | 6000 | 1.4 |
| C-19 | 40/60 | 5000 | 1.5 |
| C-20 | 30/40/30 | 7000 | 1.4 |
| C-21 | 40/40/10/10 | 6000 | 1.4 |
| C-22 | 100 | 5500 | 1.4 |
| C-23 | 100 | 9500 | 1.5 |
| C-24 | 70/30 | 8500 | 1.4 |
| C-25 | 50/30/20 | 5000 | 1.4 |
| C-26 | 50/20/30 | 5500 | 1.4 |
| C-27 | 50/50 | 9000 | 1.5 |
| C-28 | 50/40/10 | 9000 | 1.4 |
| C-29 | 60/20/20 | 6500 | 1.4 |
| C-30 | 70/30 | 6500 | 1.4 |
| C-31 | 70/30 | 9000 | 1.5 |
| C-32 | 90/10 | 9000 | 1.5 |
| C-33 | 70/20/10 | 7000 | 1.4 |
| C-34 | 80/10/10 | 8500 | 1.5 |
| C-35 | 60/30/10 | 7500 | 1.4 |
| C-36 | 50/50 | 5000 | 1.5 |

TABLE 1-continued

| Resin | Composition | Mw | Mw/Mn |
|---|---|---|---|
| C-37 | 30/30/30/5/5 | 6000 | 1.5 |
| C-38 | 50/50 | 4500 | 1.4 |
| C-39 | 80/20 | 5000 | 1.4 |
| C-40 | 100 | 5000 | 1.4 |
| C-41 | 100 | 9000 | 1.5 |
| C-42 | 100 | 10000 | 1.5 |
| C-43 | 90/10 | 8500 | 1.4 |
| C-44 | 30/30/30/10 | 5500 | 1.4 |
| C-45 | 60/30/10 | 6500 | 1.4 |
| C-46 | 70/30 | 6500 | 1.4 |
| C-47 | 30/20/50 | 7000 | 1.4 |
| C-48 | 80/20 | 8000 | 1.5 |
| C-49 | 60/30/10 | 6000 | 1.4 |
| C-50 | 60/40 | 8000 | 1.5 |
| C-51 | 50/50 | 9500 | 1.4 |
| C-52 | 90/10 | 8000 | 1.5 |
| C-53 | 100 | 7000 | 1.5 |
| C-54 | 70/10/10/10 | 5500 | 1.4 |
| C-55 | 80/20 | 6500 | 1.4 |
| C-56 | 30/30/40 | 6000 | 1.4 |
| C-57 | 100 | 6000 | 1.4 |
| C-58 | 90/10 | 8000 | 1.4 |
| C-59 | 80/20 | 7000 | 1.5 |
| C-60 | 50/20/30 | 6000 | 1.4 |
| C-61 | 60/40 | 4500 | 1.5 |
| C-62 | 100 | 6500 | 1.4 |
| C-63 | 80/10/10 | 7000 | 1.5 |
| C-64 | 90/10 | 9000 | 1.5 |
| C-65 | 70/30 | 8000 | 1.4 |
| C-66 | 35/30/10/5/20 | 7000 | 1.4 |
| C-67 | 100 | 6500 | 1.4 |
| C-68 | 80/20 | 6500 | 1.4 |
| C-69 | 70/20/10 | 7000 | 1.4 |
| C-70 | 60/30/10 | 9000 | 1.5 |
| C-71 | 60/20/20 | 8000 | 1.4 |
| C-72 | 100 | 9500 | 1.5 |
| C-73 | 40/60 | 8000 | 1.4 |
| C-74 | 60/10/30 | 7000 | 1.5 |
| C-75 | 100 | 5500 | 1.5 |
| C-76 | 90/10 | 6500 | 1.4 |
| C-77 | 90/10 | 7500 | 1.3 |
| C-78 | 50/10/20/20 | 6000 | 1.5 |
| C-79 | 70/30 | 5000 | 1.3 |
| C-80 | 70/10/20 | 8500 | 1.5 |
| C-81 | 80/20 | 5500 | 1.3 |
| C-82 | 100 | 8000 | 1.3 |
| C-83 | 85/5/10 | 6500 | 1.4 |
| C-84 | 80/20 | 8000 | 1.5 |
| C-85 | 60/30/10 | 10000 | 1.5 |
| C-86 | 100 | 8000 | 1.5 |
| C-87 | 55/30/5/10 | 8000 | 1.3 |
| C-88 | 40/30/30 | 6000 | 1.3 |
| C-89 | 70/30 | 6500 | 1.3 |
| C-90 | 90/10 | 8000 | 1.5 |
| C-91 | 70/20/10 | 6500 | 1.5 |
| C-92 | 100 | 7000 | 1.4 |
| C-93 | 100 | 6000 | 1.5 |
| C-94 | 100 | 13000 | 1.4 |
| C-95 | 100 | 4000 | 1.4 |
| C-96 | 100 | 6000 | 1.5 |
| C-97 | 100 | 10000 | 1.4 |
| C-98 | 100 | 7500 | 1.5 |
| C-99 | 50/50 | 6500 | 1.4 |
| C-100 | 50/50 | 8500 | 1.4 |
| C-101 | 80/20 | 7000 | 1.3 |
| C-102 | 50/20/30 | 4500 | 1.3 |
| C-103 | 90/10 | 5500 | 1.3 |
| C-104 | 60/30/10 | 6000 | 1.5 |
| C-105 | 80/20 | 8000 | 1.3 |
| C-106 | 50/45/5 | 7500 | 1.4 |
| C-107 | 80/20 | 7000 | 1.5 |
| C-108 | 30/30/30/10 | 9000 | 1.6 |
| C-109 | 70/30 | 8000 | 1.3 |
| C-110 | 50/30/20 | 9000 | 1.4 |
| C-111 | 60/10/30 | 6000 | 1.5 |
| C-112 | 60/5/35 | 8000 | 1.5 |
| C-113 | 50/40/10 | 9500 | 1.5 |
| C-114 | 80/20 | 7000 | 1.5 |
| C-115 | 90/10 | 6000 | 1.2 |
| C-116 | 40/20/30/10 | 8000 | 1.3 |
| C-117 | 50/50 | 6000 | 1.5 |
| C-118 | 100 | 9500 | 1.4 |
| C-119 | 50/20/20/10 | 8000 | 1.5 |
| C-120 | 75/10/10/5 | 7000 | 1.3 |
| C-121 | 30/30/10/30 | 5500 | 1.3 |
| C-122 | 100 | 8000 | 1.3 |
| C-123 | 100 | 9500 | 1.5 |
| C-124 | 100 | 9000 | 1.6 |
| C-125 | 90/10 | 9500 | 1.3 |
| C-126 | 70/30 | 7500 | 1.5 |
| C-127 | 70/30 | 8000 | 1.3 |
| C-128 | 85/15 | 6000 | 1.5 |
| C-129 | 90/10 | 7000 | 1.6 |
| C-130 | 50/20/30 | 5000 | 1.3 |
| C-131 | 60/20/20 | 4000 | 1.4 |
| C-132 | 50/30/20 | 6500 | 1.4 |
| C-133 | 70/10/20 | 7000 | 1.4 |
| C-134 | 80/10/10 | 9000 | 1.4 |
| C-135 | 60/40 | 8000 | 1.5 |
| C-136 | 30/70 | 9000 | 1.4 |
| C-137 | 70/15/15 | 7500 | 1.5 |
| C-138 | 70/30 | 8000 | 1.4 |
| C-139 | 75/5/10/10 | 6000 | 1.5 |
| C-140 | 70/30 | 5500 | 1.5 |
| C-141 | 50/25/25 | 6500 | 1.4 |
| C-142 | 100 | 9000 | 1.6 |
| C-143 | 50/40/10 | 7000 | 1.4 |
| C-144 | 50/50 | 9000 | 1.4 |
| C-145 | 50/30/20 | 8000 | 1.4 |
| C-146 | 50/50 | 9000 | 1.5 |
| C-147 | 48/50/2 | 6000 | 1.4 |
| C-148 | 50/50 | 9000 | 1.5 |
| C-149 | 50/25/25 | 6000 | 1.4 |
| C-150 | 50/40/10 | 9500 | 1.5 |
| C-151 | 50/50 | 8000 | 1.5 |
| C-152 | 50/50 | 7000 | 1.4 |
| C-153 | 95/5 | 3000 | 1.4 |
| C-154 | 100 | 5000 | 1.4 |
| C-155 | 50/50 | 6000 | 1.5 |
| C-156 | 50/50 | 4000 | 1.5 |
| C-157 | 100 | 8000 | 1.4 |
| C-158 | 80/20 | 4500 | 1.4 |
| C-159 | 80/20 | 3500 | 1.4 |
| C-160 | 70/30 | 7000 | 1.4 |
| C-161 | 50/50 | 10000 | 1.3 |
| C-162 | 95/5 | 4500 | 1.4 |
| C-163 | 90/10 | 8500 | 1.4 |
| C-164 | 25/50/25 | 6000 | 1.5 |
| C-165 | 40/40/10/10 | 6500 | 1.4 |
| C-166 | 100 | 8000 | 1.4 |
| C-167 | 100 | 6500 | 1.4 |
| C-168 | 80/20 | 5000 | 1.3 |
| C-169 | 40/30/30 | 4500 | 1.5 |
| C-170 | 90/10 | 3000 | 1.4 |
| C-171 | 100 | 4500 | 1.4 |
| C-172 | 100 | 3500 | 1.4 |
| C-173 | 60/40 | 5000 | 1.4 |
| C-174 | 90/10 | 6000 | 1.4 |
| C-175 | 100 | 4000 | 1.5 |
| C-176 | 100 | 8000 | 1.4 |
| C-177 | 100 | 5000 | 1.4 |
| C-178 | 100 | 10000 | 1.5 |
| C-179 | 100 | 6000 | 1.4 |
| C-180 | 100 | 7000 | 1.3 |
| C-181 | 100 | 5500 | 1.4 |
| C-182 | 100 | 8000 | 1.3 |
| C-183 | 90/10 | 4500 | 1.4 |
| C-184 | 80/20 | 6000 | 1.4 |
| C-185 | 70/30 | 5500 | 1.6 |
| C-186 | 85/15 | 8500 | 1.4 |
| C-187 | 90/10 | 3000 | 1.3 |
| C-188 | 70/30 | 4500 | 1.4 |
| C-189 | 75/25 | 6500 | 1.4 |
| C-190 | 55/45 | 8500 | 1.3 |
| C-191 | 90/10 | 5500 | 1.4 |
| C-192 | 75/25 | 9000 | 1.4 |

TABLE 1-continued

| Resin | Composition | Mw | Mw/Mn |
|---|---|---|---|
| C-193 | 70/30 | 10000 | 1.5 |
| C-194 | 70/30 | 5000 | 1.4 |
| C-195 | 80/20 | 7000 | 1.4 |
| C-196 | 85/15 | 4500 | 1.4 |
| C-197 | 80/20 | 3500 | 1.5 |
| C-198 | 75/25 | 6000 | 1.4 |
| C-199 | 100 | 5000 | 1.4 |
| C-200 | 80/20 | 6000 | 1.4 |
| C-201 | 80/20 | 8000 | 1.5 |
| C-202 | 100 | 4500 | 1.5 |
| C-203 | 70/30 | 3500 | 1.4 |
| C-204 | 80/20 | 10000 | 1.4 |
| C-205 | 80/20 | 7000 | 1.4 |
| C-206 | 90/10 | 4000 | 1.4 |
| C-207 | 80/15/5 | 10000 | 1.4 |
| C-208 | 85/10/5 | 5000 | 1.5 |
| C-209 | 90/8/2 | 13000 | 1.5 |
| C-210 | 85/10/5 | 6000 | 1.5 |
| C-211 | 90/8/2 | 8000 | 1.4 |
| C-212 | 50/50 | 12000 | 1.5 |
| C-213 | 50/50 | 8000 | 1.3 |
| C-214 | 85/15 | 6500 | 1.5 |
| C-215 | 85/15 | 4000 | 1.5 |
| C-216 | 90/10 | 7500 | 1.6 |
| C-217 | 90/10 | 3500 | 1.5 |
| C-218 | 95/5 | 5500 | 1.4 |
| C-219 | 85/10/5 | 5000 | 1.5 |
| C-220 | 88/10/2 | 13000 | 1.4 |
| C-221 | 90/8/2 | 12000 | 1.5 |
| C-222 | 90/8/2 | 11000 | 1.4 |
| C-223 | 90/8/2 | 9000 | 1.5 |
| C-224 | 50/50 | 6000 | 1.5 |
| C-225 | 50/50 | 8000 | 1.5 |
| C-226 | 80/20 | 4500 | 1.3 |
| C-227 | 85/15 | 8500 | 1.6 |
| C-228 | 90/10 | 10000 | 1.4 |
| C-229 | 90/10 | 3500 | 1.5 |
| C-230 | 95/5 | 4500 | 1.5 |
| C-231 | 50/50 | 4000 | 1.5 |
| C-232 | 80/18/2 | 6000 | 1.5 |
| C-233 | 90/8/2 | 9500 | 1.5 |
| C-234 | 80/20 | 6500 | 1.4 |
| C-235 | 90/10 | 8000 | 1.5 |
| C-236 | 100 | 8000 | 1.5 |
| C-237 | 95/5 | 4500 | 1.5 |
| C-238 | 90/10 | 10000 | 1.5 |
| C-239 | 100 | 6500 | 1.4 |
| C-240 | 80/20 | 6500 | 1.4 |
| C-241 | 70/20/10 | 7000 | 1.4 |
| C-242 | 90/10 | 7000 | 1.6 |
| C-243 | 50/20/30 | 5000 | 1.3 |
| C-244 | 40/30/30 | 5000 | 1.4 |
| C-245 | 60/40 | 6000 | 1.4 |
| C-246 | 40/20/40 | 7000 | 1.4 |
| C-247 | 40/30/30 | 8000 | 1.5 |
| C-248 | 40/30/30 | 9500 | 1.5 |
| C-249 | 60/40 | 9500 | 1.5 |
| C-250 | 40/40/20 | 7500 | 1.4 |
| C-251 | 80/20 | 9000 | 1.5 |
| C-252 | 80/20 | 9000 | 1.5 |
| C-253 | 40/30/15/15 | 7000 | 1.4 |
| C-254 | 60/40 | 8500 | 1.4 |
| C-255 | 50/30/20 | 8000 | 1.4 |
| C-256 | 30/30/40 | 9500 | 1.5 |
| C-257 | 30/50/20 | 8000 | 1.3 |
| C-258 | 30/50/20 | 8000 | 1.3 |
| C-259 | 40/40/20 | 6500 | 1.4 |
| C-260 | 50/30/20 | 6000 | 1.4 |
| C-261 | 80/20 | 8500 | 1.5 |
| C-262 | 20/80 | 10000 | 1.5 |
| C-263 | 100 | 8500 | 1.5 |
| C-264 | 100 | 6000 | 1.4 |
| C-265 | 90/10 | 8000 | 1.4 |
| C-266 | 30/70 | 9000 | 1.6 |
| C-267 | 50/50 | 4000 | 1.3 |

As for the resin (C), one kind may be used alone, or two or more kinds may be used in combination.

Also, (CP) a resin having at least either a fluorine atom or a silicon atom, which is different from the resin (C), is preferably used in combination.

(CP) Resin Having at Least Either a Fluorine Atom or a Silicon Atom

The actinic ray-sensitive or radiation-sensitive resin composition of the present invention may further contain (CP) a resin having at least either a fluorine atom or a silicon atom, separately from the resin (C). By virtue of containing the resin (C) and the resin (CP), the resin (C) and the resin (CP) are unevenly distributed to the film surface layer and when the immersion medium is water, the film formed can be enhanced in the receding contact angle for water on the resist film surface as well as in the followability of the immersion liquid. The receding contact angle of the film is preferably from 60 to 90°, more preferably 70° or more. The resin (CP) may be used by appropriately adjusting its content to give a film having a receding contact angle in the range above, but the content of the resin is preferably from 0.01 to 10 mass %, more preferably from 0.01 to 5 mass %, still more preferably from 0.01 to 4 mass %, yet still more preferably from 0.01 to 3 mass %, based on the entire solid content of the actinic ray-sensitive or radiation-sensitive resin composition.

The resin (CP) is, as described above, unevenly distributed to the interface but unlike a surfactant, need not have necessarily a hydrophilic group in the molecule and may not contribute to uniform mixing of polar/nonpolar substances.

The fluorine atom or silicon atom in the (CP) resin having at least either a fluorine atom or a silicon atom may be present in the main chain of the resin or may be substituted on the side chain.

The resin (CP) is preferably a resin having, as the fluorine atom-containing partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably from 1 to 4) is a linear or branched alkyl group with at least one hydrogen atom being replaced by a fluorine atom and may further have other substituents.

The fluorine atom-containing cycloalkyl group is a monocyclic or polycyclic cycloalkyl group with at least one hydrogen atom being replaced by a fluorine atom and may further have other substituents.

The fluorine atom-containing aryl group is an aryl group (e.g., phenyl, naphthyl) with at least one hydrogen atom being replaced by a fluorine atom and may further have other substituents.

Preferred examples of the fluorine atom-containing alkyl group, fluorine atom-containing cycloalkyl group and fluorine atom-containing aryl group include the groups represented by formulae (F2) to (F4) described above with respect to the resin (C), but the present invention is not limited thereto.

In the present invention, the group represented by formulae (F2) to (F4) is preferably contained in a (meth)acrylate-based repeating unit.

Specific examples of the repeating unit having a fluorine atom are set forth below, but the present invention is not limited thereto.

In specific examples, $X_1$ represents a hydrogen atom, $-CH_3$, $-F$ or $-CF_3$.

$X_2$ represents $-F$ or $-CF_3$.

247
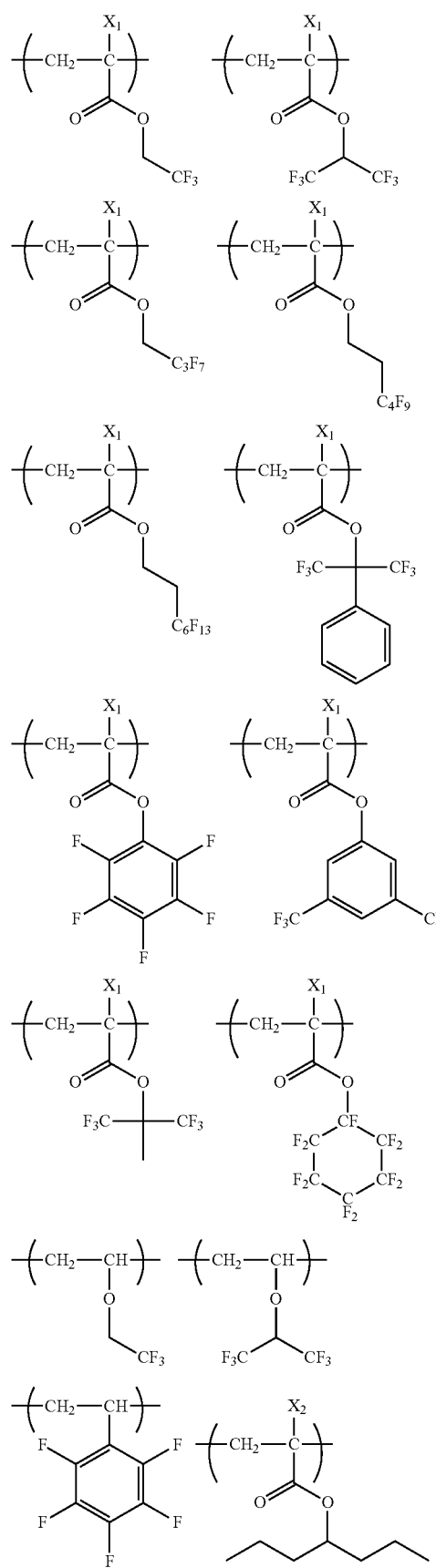
248
-continued
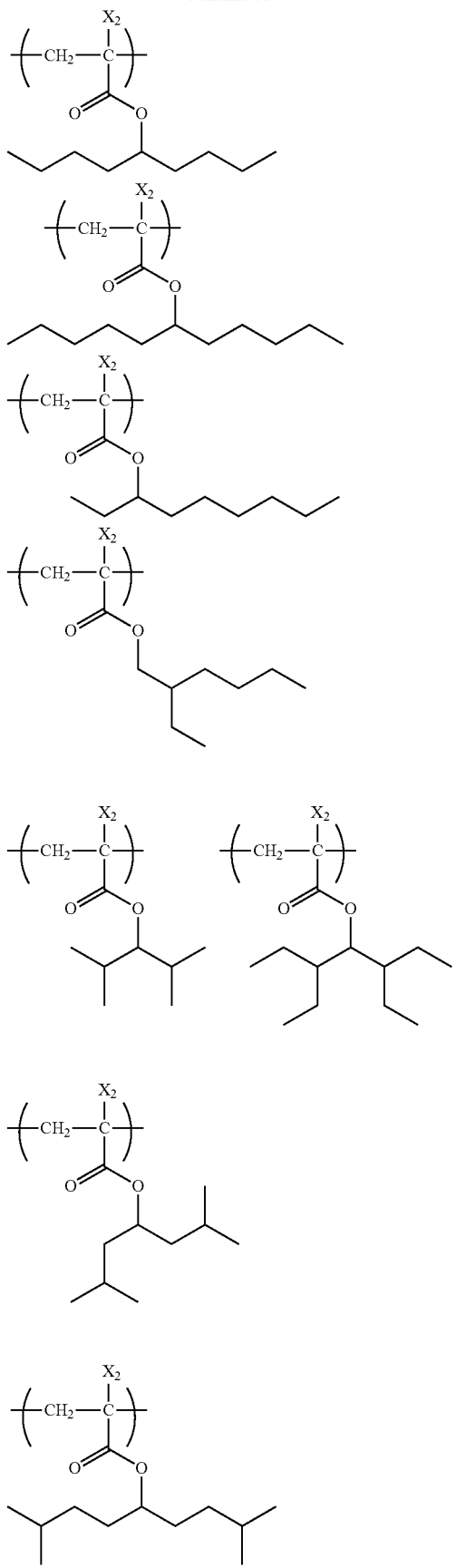

249
-continued

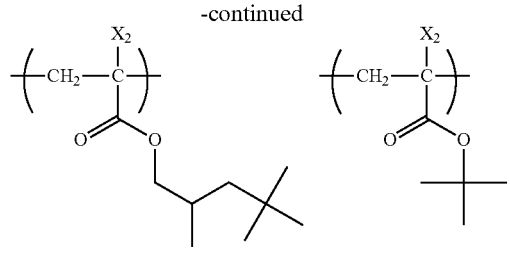
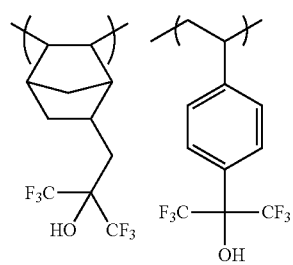
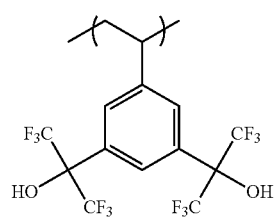
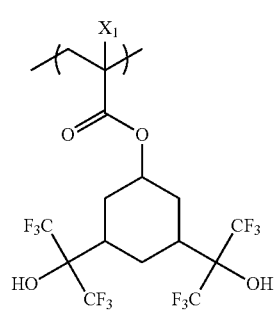
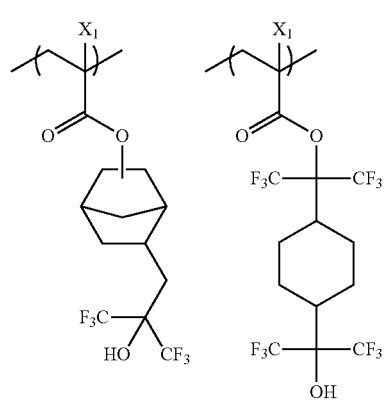

250
-continued

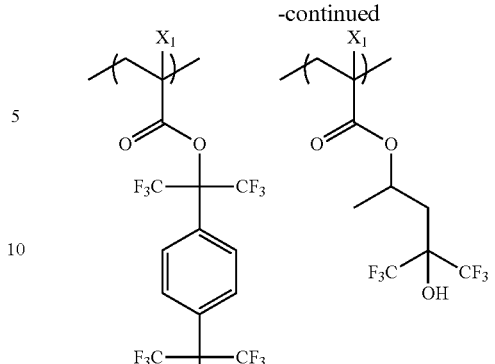
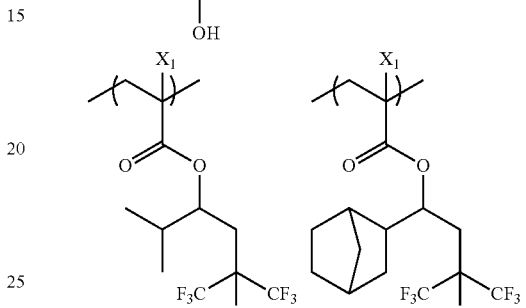
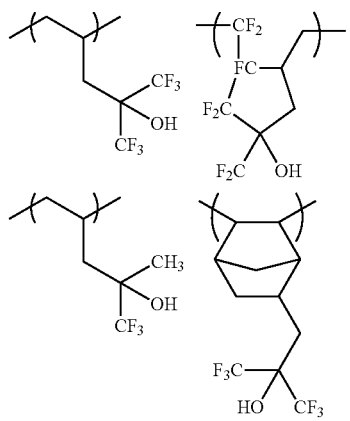
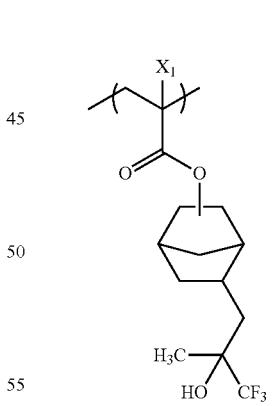

The resin (CP) is preferably a resin having, as the silicon atom-containing partial structure, an alkylsilyl structure (preferably a trialkylsilyl group) or a cyclic siloxane structure.

Specific examples of the alkylsilyl structure and cyclic siloxane structure include the groups represented by formulae (CS-1) to (CS-3) described above with respect to the resin (C).

The resin (CP) may further has at least one group selected from the group consisting of the following (x) and (z):

(x) an alkali-soluble group, and (z) a group capable of decomposing by the action of an acid.

Specific examples of these groups are the same as those described above with respect to the resin (C).

Examples of the repeating unit having (z) a group capable of decomposing by the action of an acid, contained in the resin (CP), are the same as those of the repeating unit having an acid-decomposable group described for the resin of the component (A). In the resin (CP), the content of the repeating unit having (z) a group capable of decomposing by the action of an acid is preferably from 1 to 80 mol %, more preferably from 10 to 80 mol %, still more preferably from 20 to 60 mol %, based on all repeating units in the resin (CP).

The resin (CP) may further contain a repeating unit represented by formula (CIII) described above with respect to the resin (C).

In the case where the resin (CP) contains a fluorine atom, the fluorine atom content is preferably from 5 to 80 mass %, more preferably from 10 to 80 mass %, based on the weight average molecular weight of the resin (CP). Also, the fluorine atom-containing repeating unit preferably occupies from 10 to 100 mol %, more preferably from 30 to 100 mol %, based on all repeating units in the resin (CP).

In the case where the resin (CP) contains a silicon atom, the silicon atom content is preferably from 2 to 50 mass %, more preferably from 2 to 30 mass %, based on the weight average molecular weight of the resin (CP). Also, the silicon atom-containing repeating unit preferably occupies from 10 to 100 mol %, more preferably from 20 to 100 mol %, based on all repeating units in the resin (CP).

The standard polystyrene-equivalent weight average molecular of the resin (CP) is preferably from 1,000 to 100,000, more preferably from 1,000 to 50,000, still more preferably from 2,000 to 15,000.

In the resin (CP), similarly to the resin of the component (A), it is of course preferred that the content of impurities such as metal is small, but also, the content of residual monomers or oligomer components is preferably from 0 to 10 mass %, more preferably from 0 to 5 mass %, still more preferably from 0 to 1 mass %. When these conditions are satisfied, an actinic ray-sensitive or radiation-sensitive resin composition free of extraneous substances in the liquid or change with aging of sensitivity or the like can be obtained. Furthermore, in view of resolution, resist profile, side wall of resist pattern, roughness and the like, the molecular weight distribution (Mw/Mn, sometimes referred to as "polydispersity") is preferably from 1 to 3, more preferably from 1 to 2, still more preferably from 1 to 1.8, and most preferably from 1 to 1.5.

As for the resin (CP), various commercially available products may be used or the resin may be synthesized by an ordinary method (for example, radical polymerization)). Specifically, the resin may be synthesized in the same manner as the resin (C).

Specific examples of the (CP) resin having at least either a fluorine atom or a silicon atom are set forth below. Also, the molar ratio of repeating units (corresponding to repeating units starting from the left), weight average molecular weight (Mw) and polydispersity (Mw/Mn) of each resin are shown in the Table later.

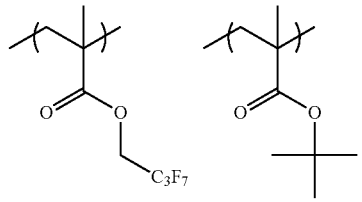
(CP-1)

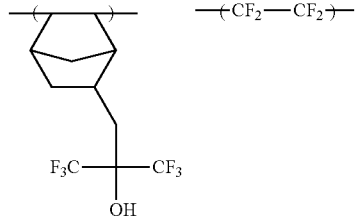
(CP-2)

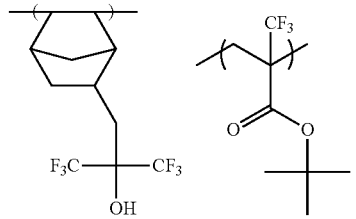
(CP-3)

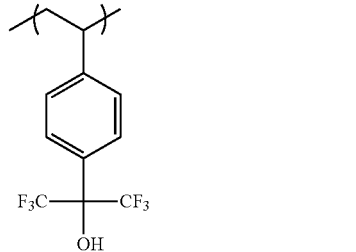
(CP-4)

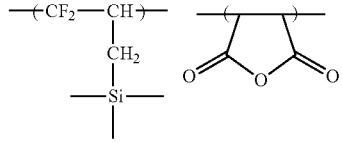
(CP-5)

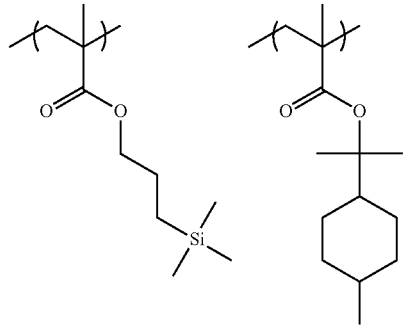
(CP-6)

(CP-7)
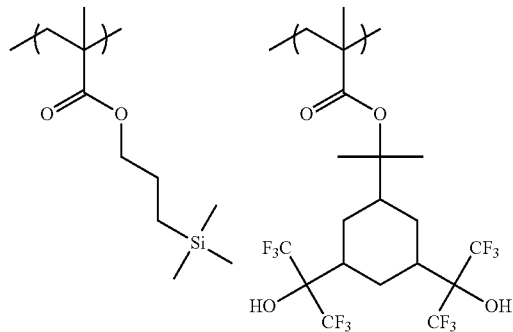
(CP-11)
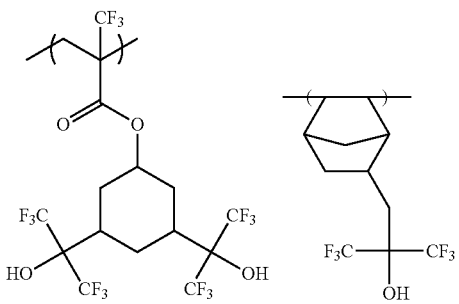
(CP-8)
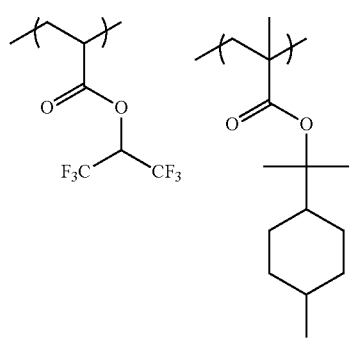
(CP-12)
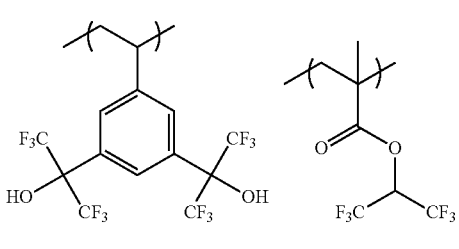
(CP-13)
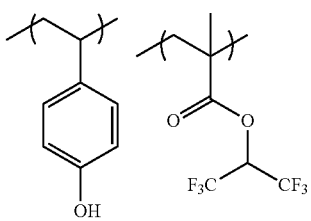
(CP-9)
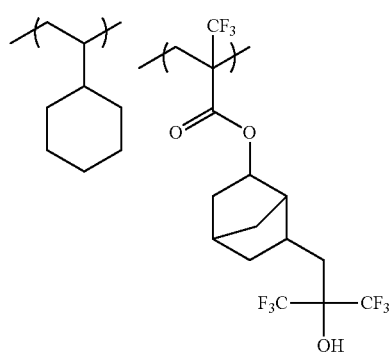
(CP-14)
(CP-10)
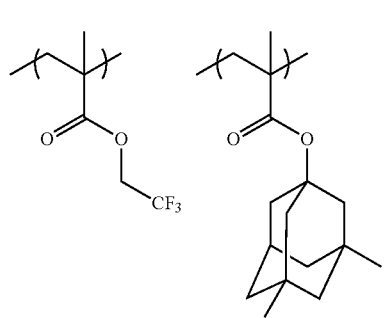
(CP-15)
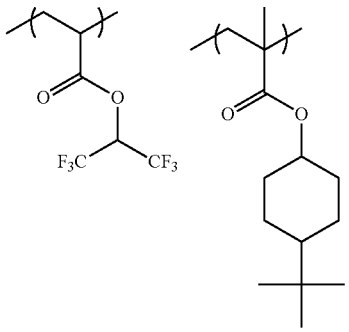

(CP-16)
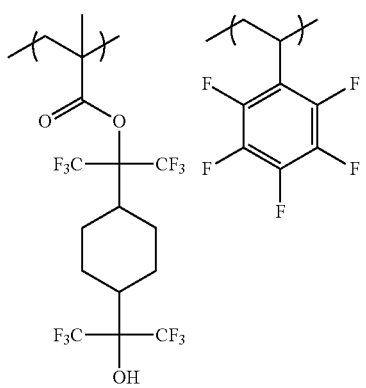
(CP-17)
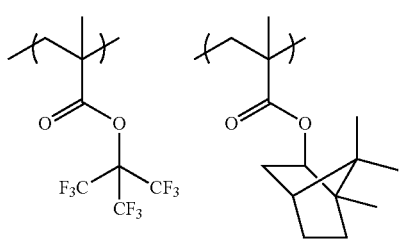
(CP-18)
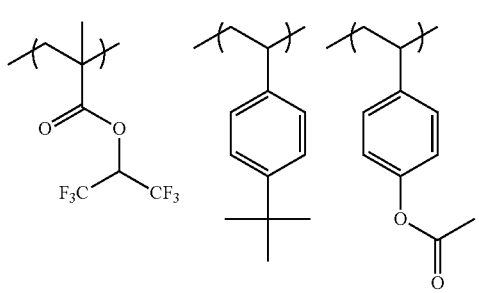
(CP-19)
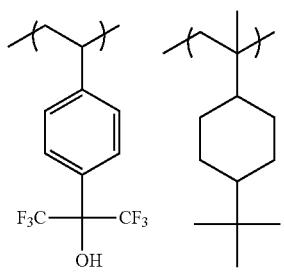
(CP-20)
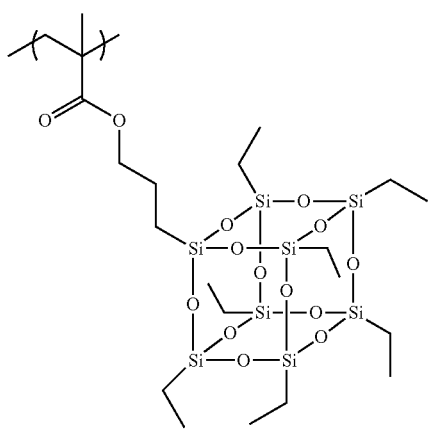
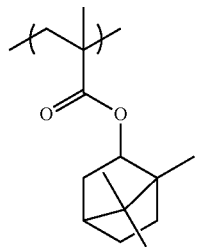
(CP-21)
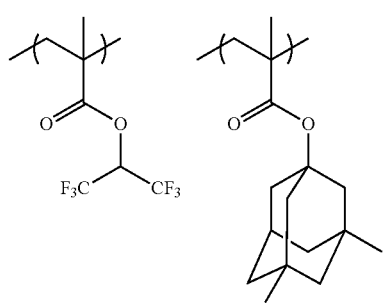
(CP-22)
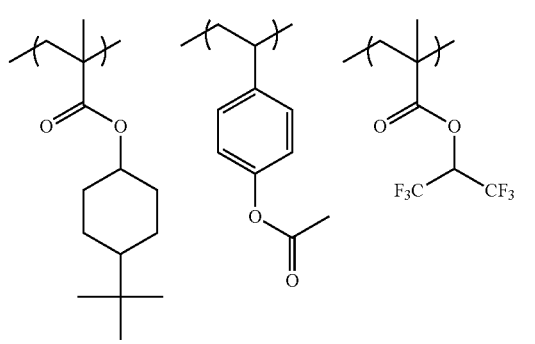
(CP-23)
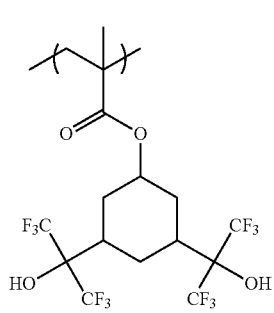
(CP-24)
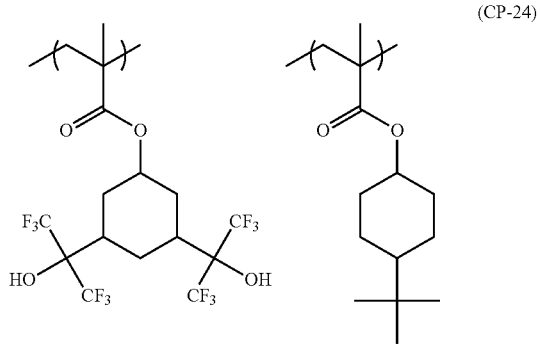

(CP-25)
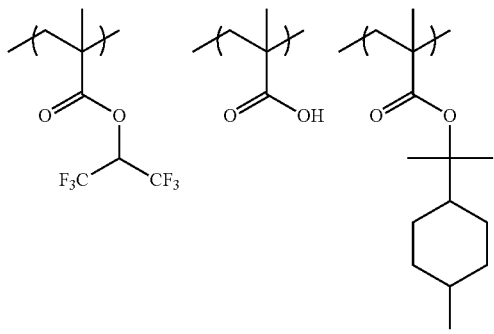
(CP-26)
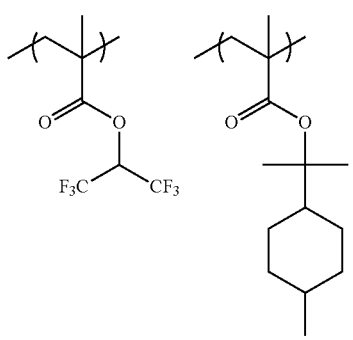
(CP-27)
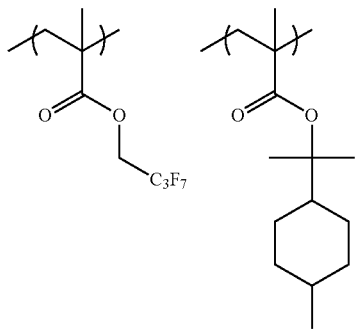
(CP-28)
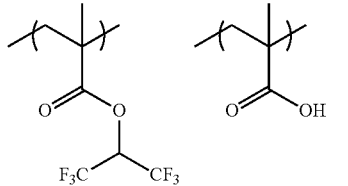
(CP-29)
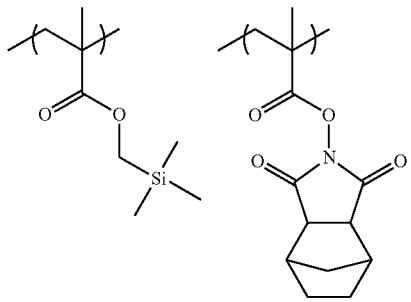
(CP-30)
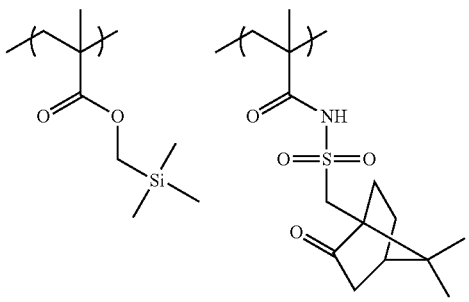
(CP-31)
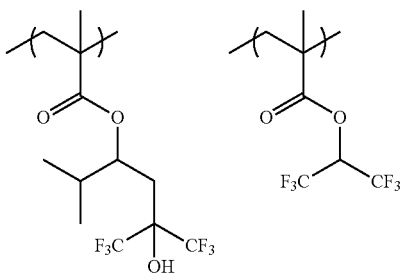
(CP-32)
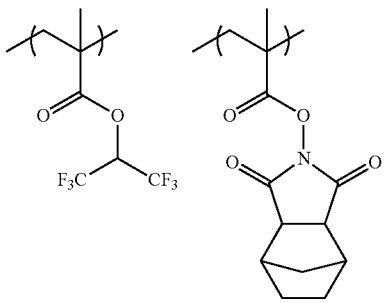
(CP-33)
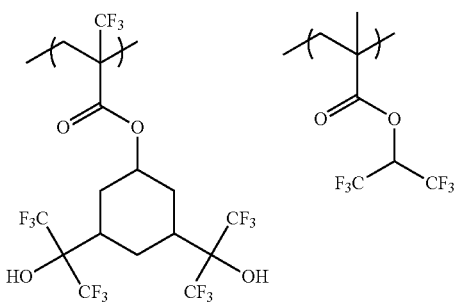
(CP-34)
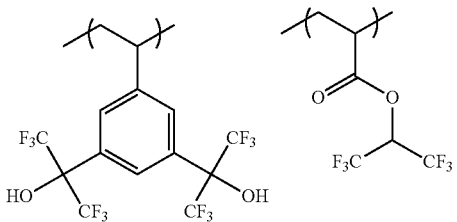

261
-continued
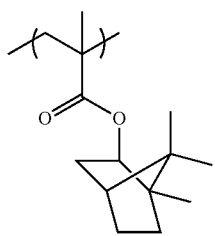
(CP-41)
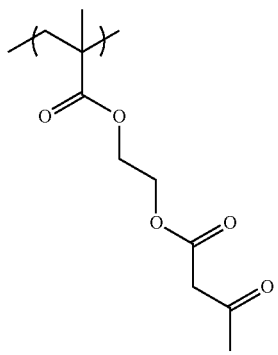
(CP-42)
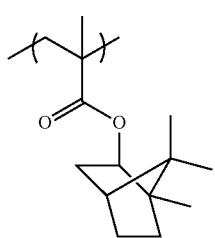
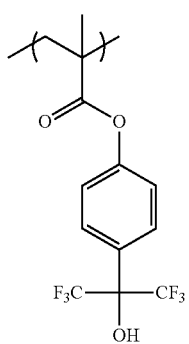
262
-continued
(CP-43)
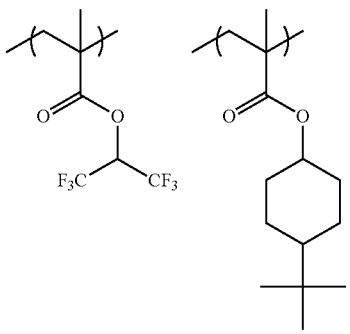
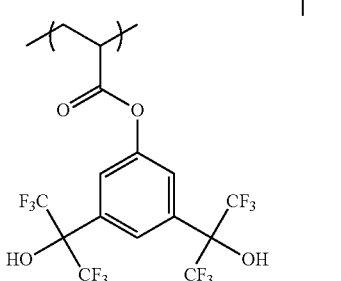
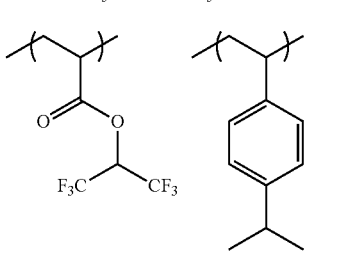
(CP-44)
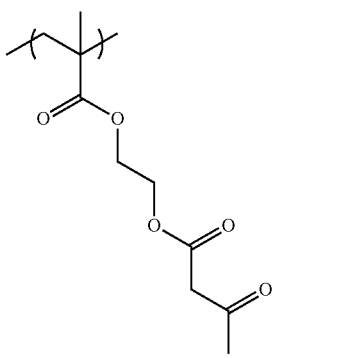
(CP-45)
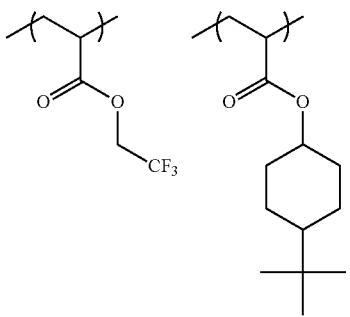

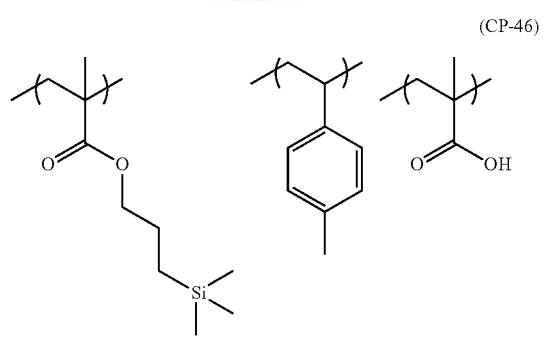
(CP-46)
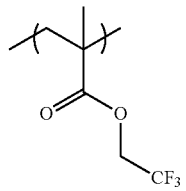
(CP-51)
(CP-47)
(CP-52)
(CP-53)
(CP-54)
(CP-48)
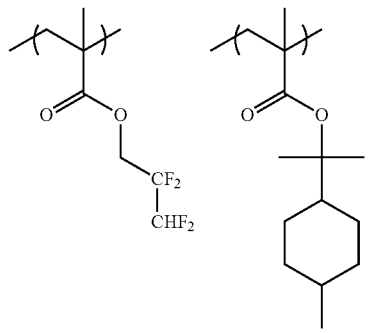
(CP-55)
(CP-49)
(CP-56)
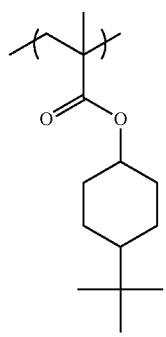
(CP-50)

(CP-57)
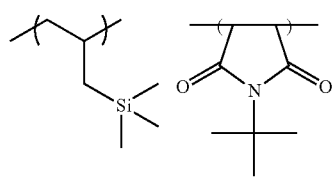
(CP-58)
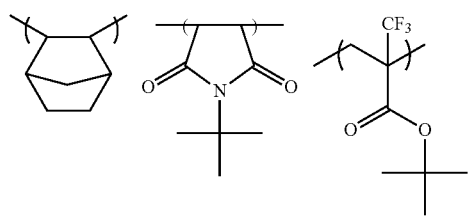
(CP-59)
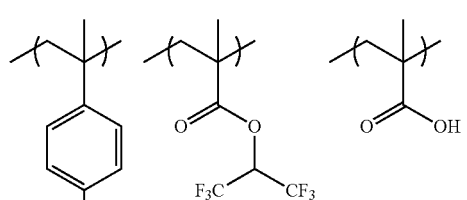
(CP-60)
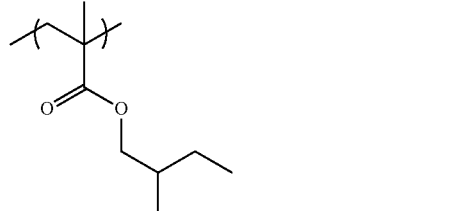
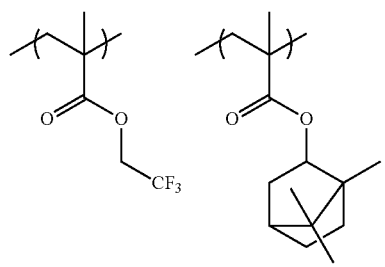
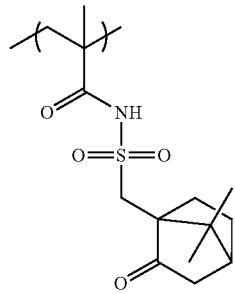
(CP-61)
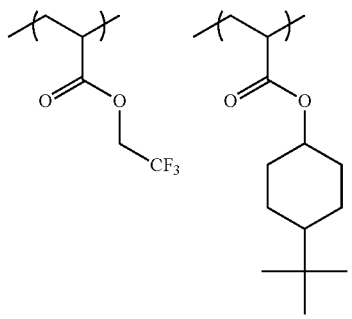
(CP-62)
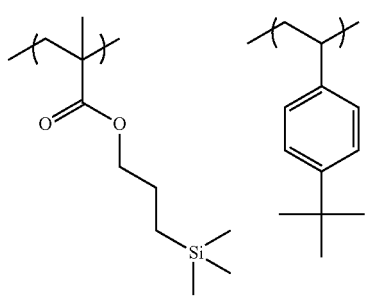
(CP-63)
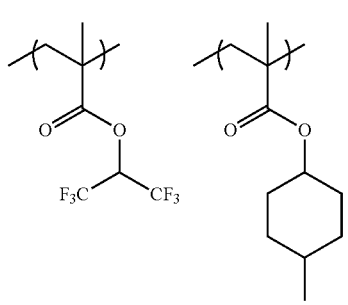
(CP-64)
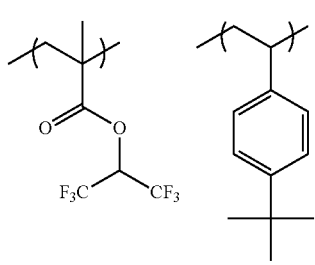
(CP-65)
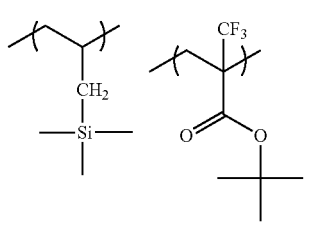

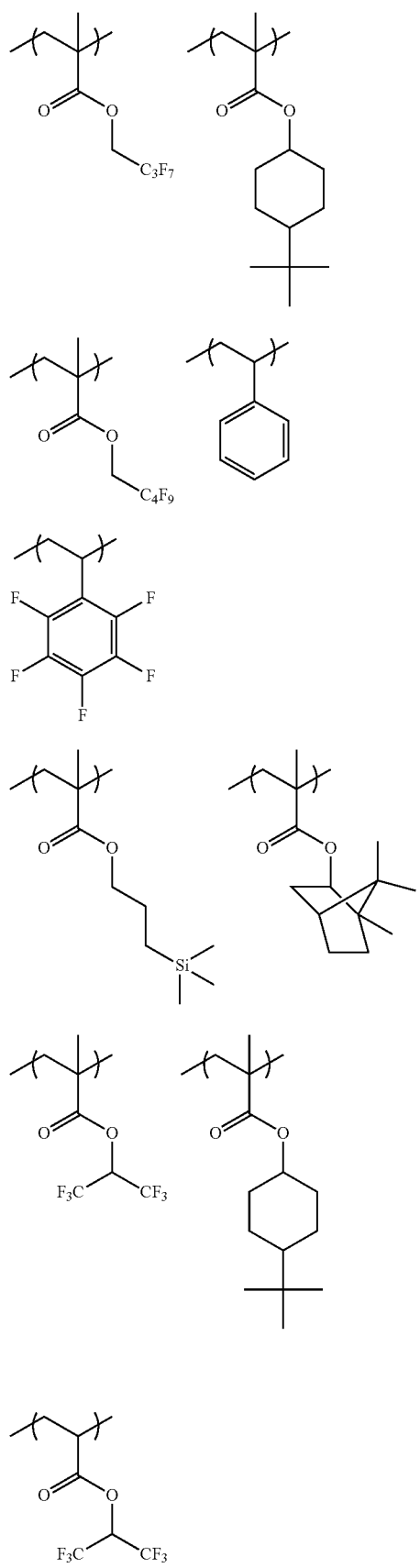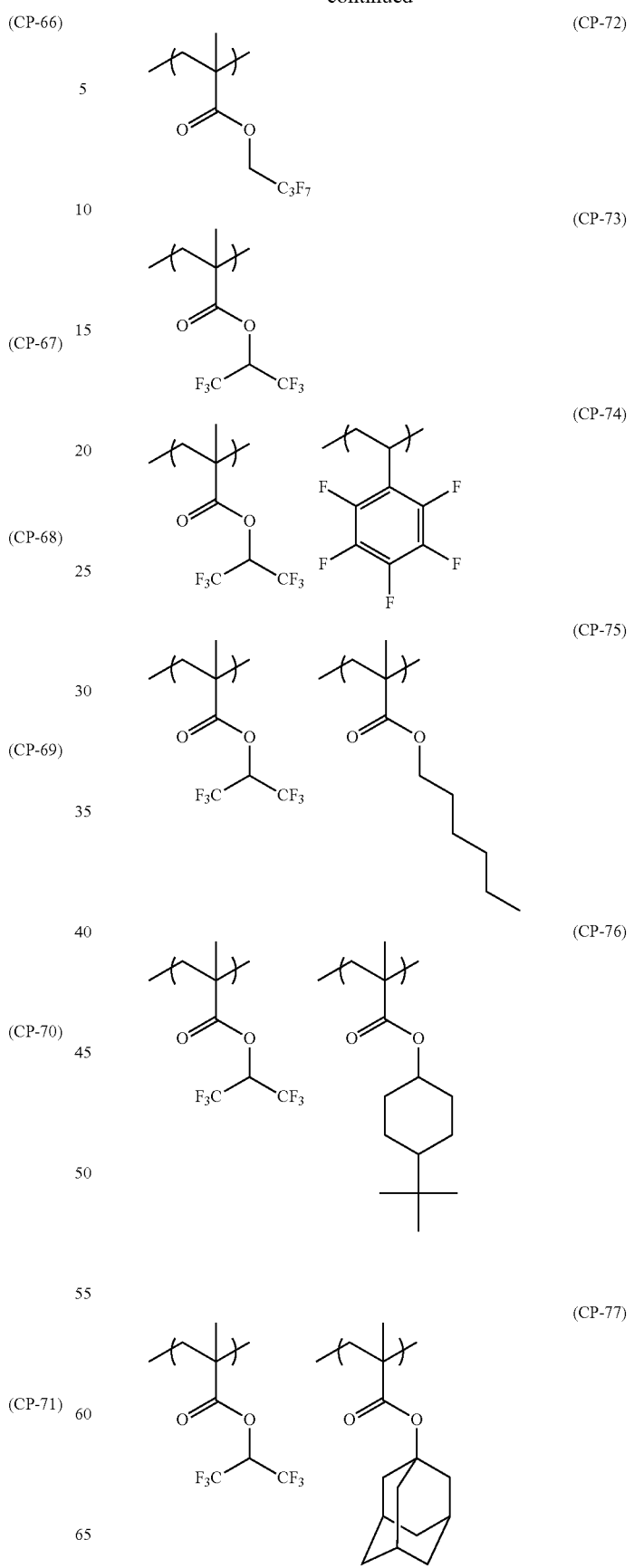

(CP-78)
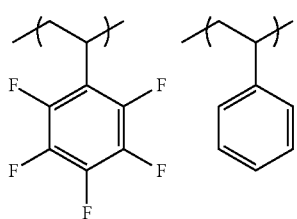
(CP-79)
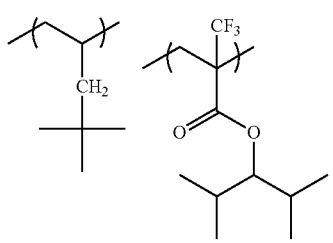
(CP-80)
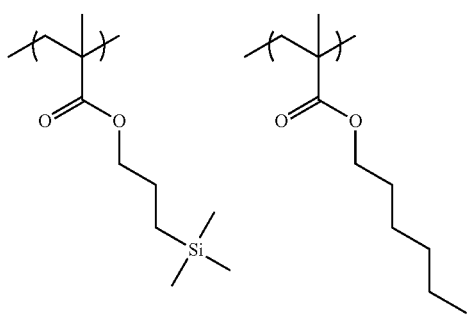
(CP-81)
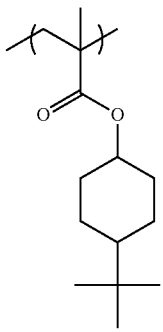
(CP-82)
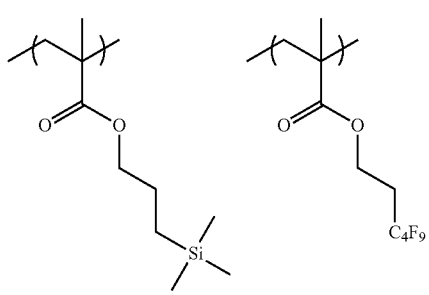
(CP-83)
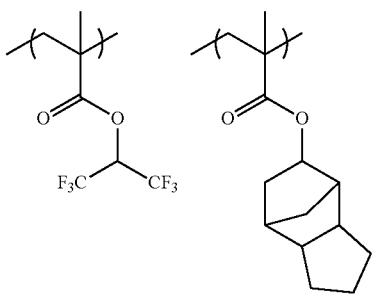
(CP-84)
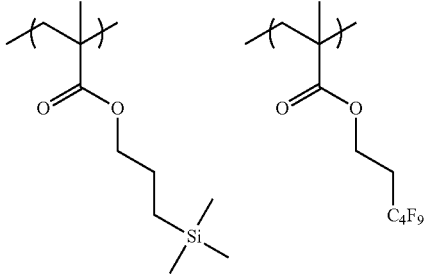
(CP-85)
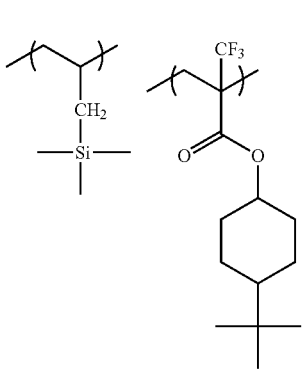
(CP-86)
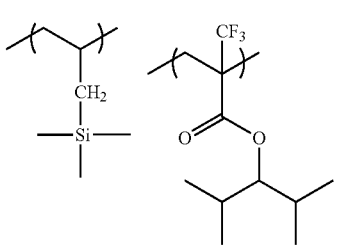

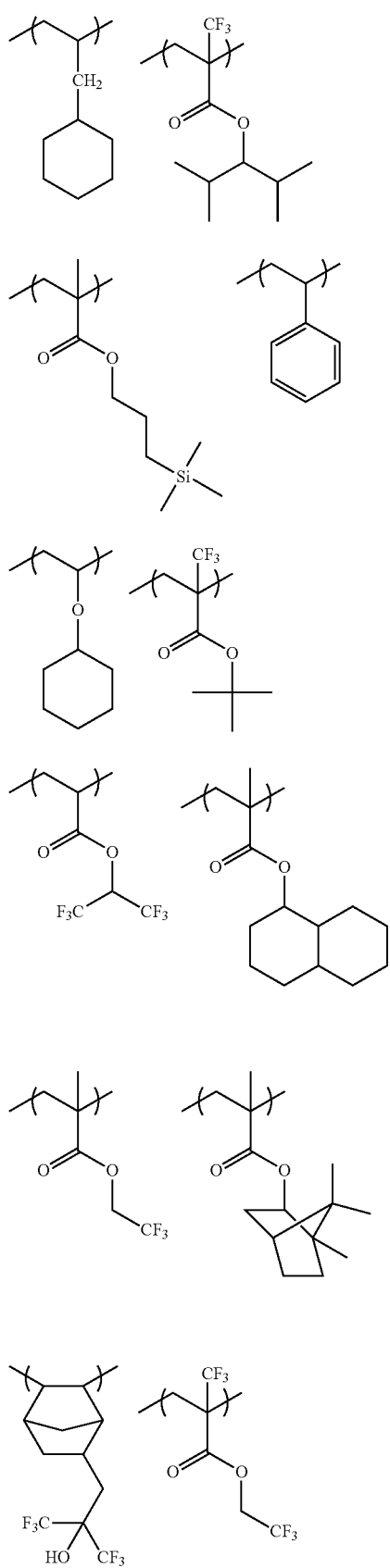
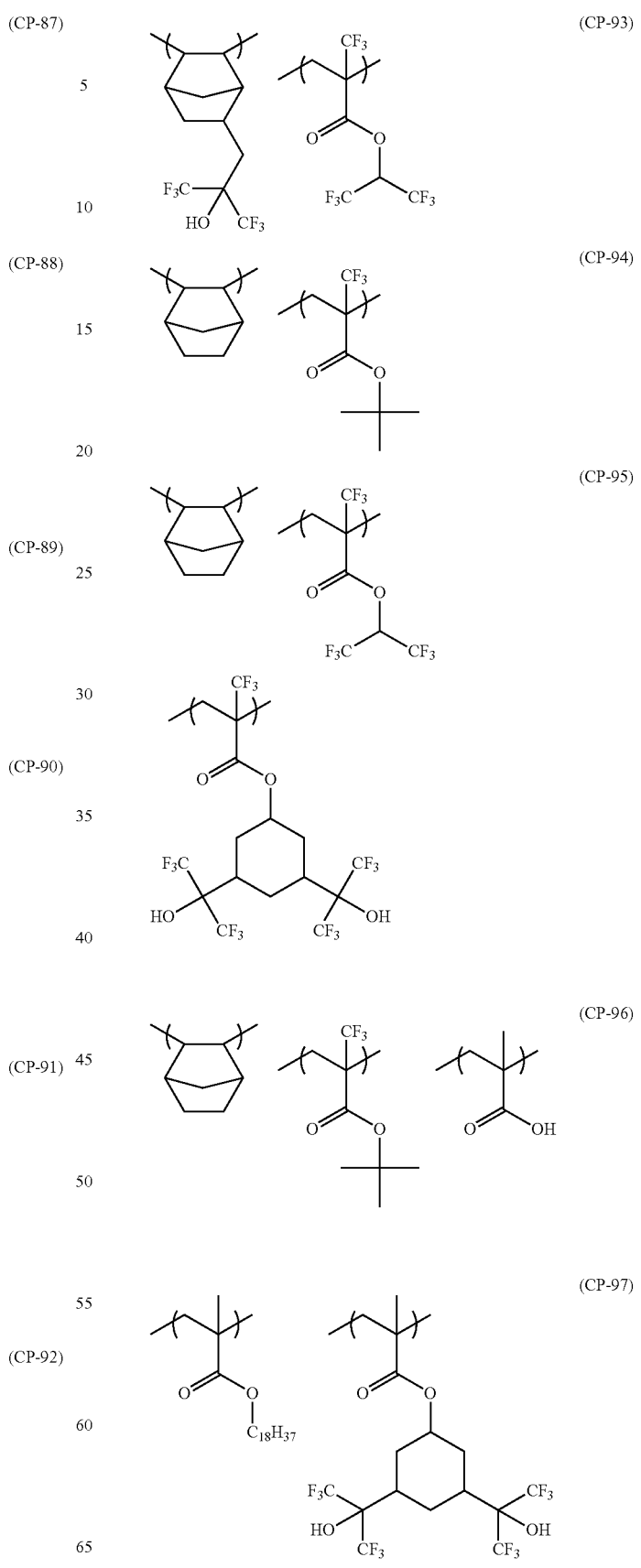

-continued
(CP-98)
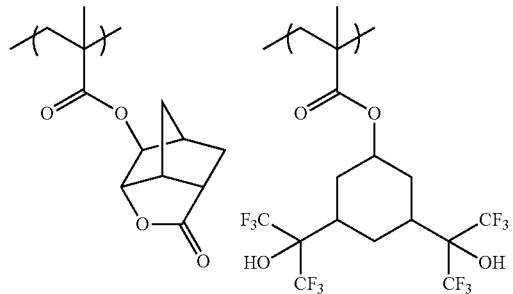
(CP-99)
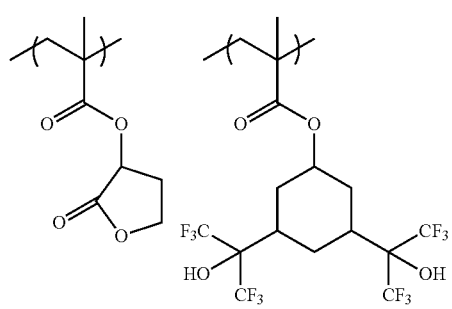
(CP-100)
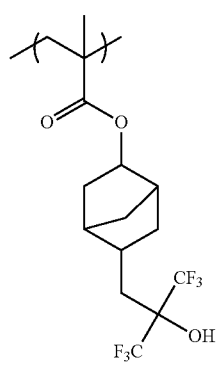
(CP-101)
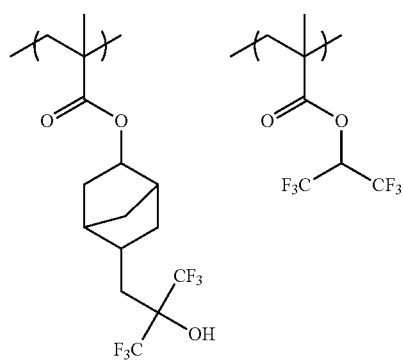
-continued
(CP-102)
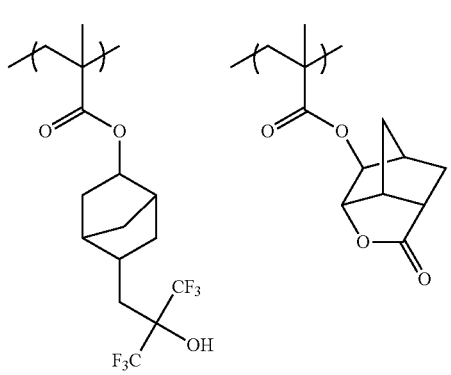
(CP-103)
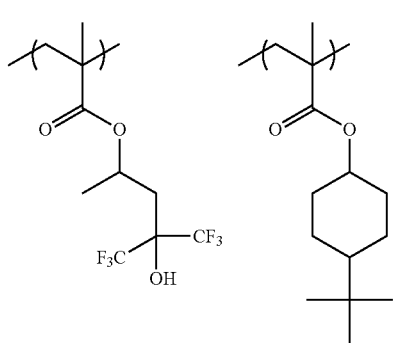
(CP-104)
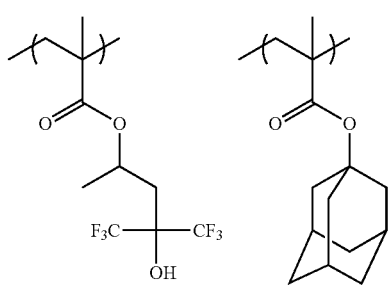
(CP-105)
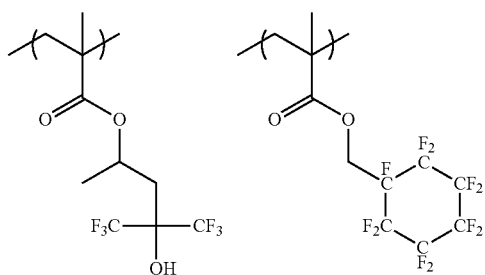
(CP-106)
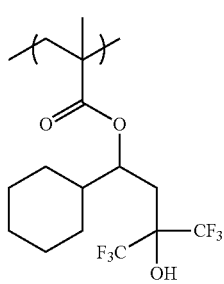

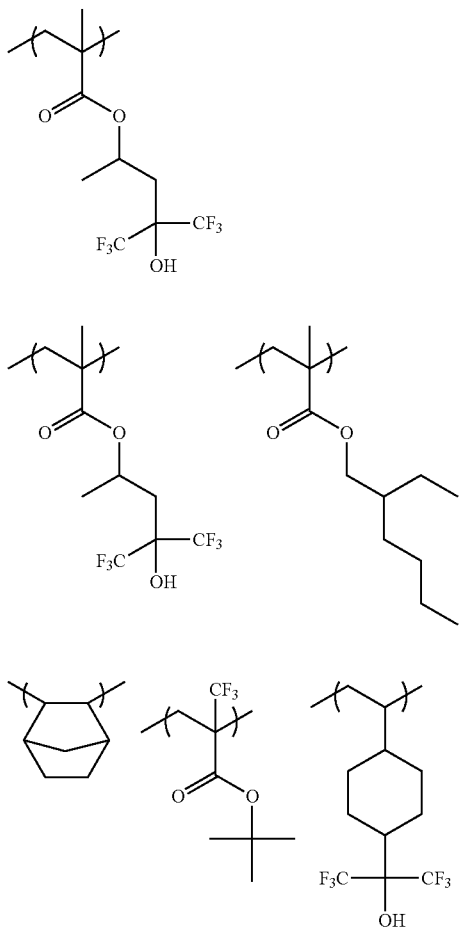

(CP-107)

(CP-108)

(CP-109)

TABLE 5

| Resin | Composition | Mw | Mw/Mn |
|---|---|---|---|
| CP-1 | 50/50 | 6000 | 1.5 |
| CP-2 | 50/50 | 7500 | 1.4 |
| CP-3 | 50/50 | 6000 | 1.4 |
| CP-4 | 100 | 9000 | 1.5 |
| CP-5 | 50/50 | 6000 | 1.4 |
| CP-6 | 40/60 | 8000 | 1.4 |
| CP-7 | 60/40 | 6000 | 1.4 |
| CP-8 | 50/50 | 6500 | 1.4 |
| CP-9 | 50/50 | 8000 | 1.4 |
| CP-10 | 50/50 | 6500 | 1.4 |
| CP-11 | 50/50 | 10000 | 1.6 |
| CP-12 | 40/60 | 7500 | 1.4 |
| CP-13 | 40/60 | 6500 | 1.4 |
| CP-14 | 100 | 8500 | 1.4 |
| CP-15 | 40/60 | 7000 | 1.4 |
| CP-16 | 60/40 | 7500 | 1.4 |
| CP-17 | 40/60 | 6000 | 1.4 |
| CP-18 | 50/30/20 | 5000 | 1.4 |
| CP-19 | 40/60 | 8500 | 1.5 |
| CP-20 | 40/60 | 5500 | 1.4 |
| CP-21 | 50/50 | 6000 | 1.4 |
| CP-22 | 40/20/40 | 5500 | 1.4 |
| CP-23 | 100 | 9500 | 1.5 |
| CP-24 | 40/60 | 8500 | 1.4 |
| CP-25 | 50/10/40 | 8000 | 1.5 |
| CP-26 | 50/50 | 6000 | 1.4 |
| CP-27 | 50/50 | 5000 | 1.4 |
| CP-28 | 70/30 | 9000 | 1.4 |
| CP-29 | 50/50 | 7500 | 1.4 |

TABLE 5-continued

| Resin | Composition | Mw | Mw/Mn |
|---|---|---|---|
| CP-30 | 60/40 | 9000 | 1.5 |
| CP-31 | 80/20 | 10000 | 1.5 |
| CP-32 | 40/60 | 8500 | 1.4 |
| CP-33 | 30/70 | 5500 | 1.4 |
| CP-34 | 20/40/40 | 6500 | 1.4 |
| CP-35 | 20/50/30 | 7000 | 1.4 |
| CP-36 | 35/35/30 | 9000 | 1.5 |
| CP-37 | 25/45/30 | 9000 | 1.5 |
| CP-38 | 30/50/20 | 6000 | 1.4 |
| CP-39 | 40/40/20 | 8000 | 1.5 |
| CP-40 | 10/50/40 | 7000 | 1.4 |
| CP-41 | 30/30/40 | 6500 | 1.3 |
| CP-42 | 40/30/30 | 8000 | 1.5 |
| CP-43 | 40/40/20 | 6000 | 1.3 |
| CP-44 | 50/20/30 | 9500 | 1.5 |
| CP-45 | 45/40/15 | 7000 | 1.3 |
| CP-46 | 50/30/20 | 8000 | 1.5 |
| CP-47 | 35/25/40 | 10000 | 1.5 |
| CP-48 | 50/50 | 8000 | 1.5 |
| CP-49 | 100 | 5000 | 1.3 |
| CP-50 | 100 | 6000 | 1.3 |
| CP-51 | 100 | 4500 | 1.3 |
| CP-52 | 100 | 5000 | 1.5 |
| CP-53 | 100 | 5000 | 1.5 |
| CP-54 | 100 | 5500 | 1.4 |
| CP-55 | 50/50 | 9000 | 1.5 |
| CP-56 | 80/20 | 9000 | 1.5 |
| CP-57 | 50/50 | 6500 | 1.4 |
| CP-58 | 50/25/25 | 6500 | 1.5 |
| CP-59 | 46/50/2/2 | 4500 | 1.4 |
| CP-60 | 40/40/20 | 5500 | 1.5 |
| CP-61 | 60/40 | 8000 | 1.4 |
| CP-62 | 50/50 | 7500 | 1.3 |
| CP-63 | 50/50 | 8000 | 1.3 |
| CP-64 | 50/50 | 7000 | 1.3 |
| CP-65 | 50/50 | 8000 | 1.5 |
| CP-66 | 60/40 | 6000 | 1.3 |
| CP-67 | 70/30 | 8000 | 1.4 |
| CP-68 | 100 | 8000 | 1.5 |
| CP-69 | 50/50 | 9500 | 1.6 |
| CP-70 | 50/50 | 7000 | 1.3 |
| CP-71 | 100 | 6000 | 1.4 |
| CP-72 | 100 | 8000 | 1.5 |
| CP-73 | 100 | 7000 | 1.5 |
| CP-74 | 50/50 | 6000 | 1.5 |
| CP-75 | 70/30 | 6000 | 1.5 |
| CP-76 | 50/50 | 4000 | 1.2 |
| CP-77 | 60/40 | 6000 | 1.3 |
| CP-78 | 80/20 | 8000 | 1.5 |
| CP-79 | 50/50 | 6000 | 1.4 |
| CP-80 | 80/20 | 7000 | 1.5 |
| CP-81 | 100 | 5000 | 1.3 |
| CP-82 | 50/50 | 4000 | 1.3 |
| CP-83 | 50/50 | 6000 | 1.3 |
| CP-84 | 30/30/40 | 6000 | 1.5 |
| CP-85 | 50/50 | 8000 | 1.6 |
| CP-86 | 50/50 | 7000 | 1.3 |
| CP-87 | 50/50 | 6000 | 1.5 |
| CP-88 | 60/40 | 4500 | 1.3 |
| CP-89 | 50/50 | 7500 | 1.5 |
| CP-90 | 60/40 | 8000 | 1.6 |
| CP-91 | 60/40 | 6000 | 1.3 |
| CP-92 | 50/50 | 4500 | 1.3 |
| CP-93 | 50/50 | 5000 | 1.4 |
| CP-94 | 50/50 | 3500 | 1.3 |
| CP-95 | 40/30/30 | 4500 | 1.4 |
| CP-96 | 50/45/5 | 5000 | 1.5 |
| CP-97 | 20/80 | 10000 | 1.5 |
| CP-98 | 30/70 | 9500 | 1.4 |
| CP-99 | 20/80 | 7500 | 1.3 |
| CP-100 | 100 | 5500 | 1.5 |
| CP-101 | 80/20 | 5000 | 1.3 |
| CP-102 | 70/30 | 8000 | 1.4 |
| CP-103 | 80/20 | 9500 | 1.4 |
| CP-104 | 80/20 | 7000 | 1.4 |
| CP-105 | 80/20 | 5000 | 1.5 |
| CP-106 | 100 | 10500 | 1.4 |
| CP-107 | 100 | 8000 | 1.5 |

TABLE 5-continued

| Resin | Composition | Mw | Mw/Mn |
|---|---|---|---|
| CP-108 | 90/10 | 9500 | 1.5 |
| CP-109 | 40/40/20 | 5000 | 1.4 |

With respect to the film formed from the actinic ray-sensitive or radiation-sensitive resin composition of the present invention, the exposure may also be performed by filling a liquid (immersion medium) having a refractive index higher than that of air between the resist film and a lens at the irradiation with an actinic ray or radiation (immersion exposure). By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid being transparent to light at the exposure wavelength and having as small a temperature coefficient of refractive index as possible so as to minimize the distortion of an optical image projected on the resist film. Particularly, when the exposure light source is an ArF excimer laser (wavelength: 193 nm), water is preferably used in view of easy availability and easy handleability in addition to the above-described aspects.

Furthermore, a medium having a refractive index of 1.5 or more can also be used from the standpoint that the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small. On the other hand, if a substance opaque to light at 193 nm or an impurity greatly differing in the refractive index from water is intermixed, this incurs distortion of the optical image projected on the resist film. Therefore, the water used is preferably distilled water. Pure water obtained by further filtering the distilled water through an ion exchange filter or the like may also be used.

The electrical resistance of water is preferably 18.3 MΩcm or more, and TOC (total organic carbon) is preferably 20 ppb or less. Also, the water is preferably subjected to a deaeration treatment.

The lithography performance can be enhanced by elevating the refractive index of the immersion liquid. From such a standpoint, an additive for elevating the refractive index may be added to water, or heavy water ($D_2O$) may be used in place of water.

In order to prevent the film from directly contacting with the immersion liquid, a film (hereinafter, sometimes referred to as a "topcoat") sparingly soluble in an immersion liquid may be provided between the film formed of the composition of the present invention and the immersion liquid. The functions required of the topcoat are suitability for coating as an overlayer of the resist, transparency to radiation particularly at 193 nm, and sparing solubility in the immersion liquid. The topcoat is preferably unmixable with the resist and capable of being uniformly coated as an overlayer of the resist.

In view of transparency to light at 193 nm, the topcoat is preferably a polymer not abundantly containing an aromatic, and specific examples thereof include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resins (C) and (CP) are also suitable as the topcoat. If impurities are dissolved out into the immersion liquid from the topcoat, the optical lens is contaminated. In this viewpoint, the amount of residual monomer components of the polymer contained in the topcoat is preferably smaller.

On peeling off the topcoat, a developer may be used or a releasing agent may be separately used. The releasing agent is preferably a solvent less permeating the film. From the standpoint that the peeling step can be performed simultaneously with the development step of the film, the topcoat is preferably peelable with an alkali developer and for enabling the peeling with an alkali developer, the topcoat is preferably acidic, but in view of non-intermixing with the film, the topcoat may be neutral or alkaline.

With no difference in the refractive index between the topcoat and the immersion liquid, the resolution is enhanced. In the case of using water as the immersion liquid at the exposure to ArF excimer laser (wavelength: 193 nm), the topcoat for ArF immersion exposure preferably has a refractive index close to the refractive index of the immersion liquid. From the standpoint of making the refractive index close to that of the immersion liquid, the topcoat preferably contains a fluorine atom. Also, in view of transparency and refractive index, the topcoat is preferably a thin film.

The topcoat is preferably unmixable with the film and further unmixable with the immersion liquid. From this standpoint, when the immersion liquid is water, the solvent used for the topcoat is preferably a medium that is sparingly soluble in the solvent used for the composition of the present invention and insoluble in water. In the case where the immersion liquid is an organic solvent, the topcoat may be either water-soluble or water-insoluble.

[3] (B) Compound Capable of Generating an Acid Upon Irradiation with an Actinic Ray or Radiation The composition of the present invention contains a compound capable of generating an acid upon irradiation with an actinic ray or radiation (hereinafter sometimes referred to as an "acid generator").

The acid generator is not particularly limited as long as it is a known acid generator, but compounds represented by the following formulae (ZI), (ZII) and (ZIII) are preferred.

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. The group formed by combining two members out of $R_{201}$ to $R_{203}$ includes an alkylene group (e.g., butylene, pentylene).

$Z^-$ represents a non-nucleophilic anion (an anion having an extremely low ability of causing a nucleophilic reaction).

Examples of $Z^-$ include a sulfonate anion (e.g., aliphatic sulfonate anion, aromatic sulfonate anion, camphorsulfonate anion), a carboxylate anion (aliphatic carboxylate anion, aromatic carboxylate anion, aralkylcarboxylate anion), a sulfonylimide anion, a bis(alkylsulfonyl)imide anion and a tris(alkylsulfonyl)methide anion.

The aliphatic moiety in the aliphatic sulfonate anion and aliphatic carboxylate may be an alkyl group or a cycloalkyl group but is preferably a linear or branched alkyl group having a carbon number of 1 to 30 or a cycloalkyl group having a carbon number of 3 to 30.

The aromatic group in the aromatic sulfonate anion and aromatic carboxylate anion is preferably an aryl group having a carbon number of 6 to 14, and examples thereof include a phenyl group, a tolyl group and a naphthyl group.

The alkyl group, cycloalkyl group and aryl group above may have a substituent. Specific examples thereof include a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 1 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group and ring structure in each group, examples of the substituent further include an alkyl group (preferably having a carbon number of 1 to 15).

The aralkyl group in the aralkylcarboxylate anion is preferably an aralkyl group having a carbon number of 7 to 12, and examples thereof include a benzyl group, a phenethyl group, a naphthylmethyl group, a naphthylethyl group and a naphthylbutyl group.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5. Examples of the substituent of such an alkyl group include a halogen atom, a halogen atom-substituted alkyl group, an alkoxy group, an alkylthio group, an alkyloxysulfonyl group, an aryloxysulfonyl group and a cycloalkylaryloxysulfonyl group, with a fluorine atom and a fluorine atom-substituted alkyl group being preferred.

Other examples of $Z^-$ include fluorinated phosphorus (e.g. $PF_6^-$), fluorinated boron (e.g. $BF_4^-$) and fluorinated antimony (e.g. $SbF_6^-$).

$Z^-$ is preferably an aliphatic sulfonate anion with at least the α-position of the sulfonic acid being substituted by a fluorine atom, an aromatic sulfonate anion substituted by a fluorine atom or a fluorine atom-containing group, a bis(alkylsulfonyl)imide anion with the alkyl group being substituted by a fluorine atom, or a tris(alkylsulfonyl)methide anion with the alkyl group being substituted by a fluorine atom. The non-nucleophilic anion is more preferably a perfluoroaliphatic sulfonate anion (more preferably having a carbon number of 4 to 8) or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

In view of acid strength, the pKa of the acid generated is preferably −1 or less so as to enhance the sensitivity.

Examples of the organic group of $R_{201}$, $R_{202}$ and $R_{203}$ include an aryl group (preferably having a carbon number of 6 to 15), a linear or branched alkyl group (preferably having a carbon number of 1 to 10), and a cycloalkyl group (preferably having a carbon number of 3 to 15). At least one of three members $R_{201}$, $R_{202}$ and $R_{203}$ is preferably an aryl group, and it is more preferred that these members all are an aryl group. The aryl group may be a heteroaryl group such as indole residue and pyrrole residue, other than a phenyl group or a naphthyl group. These aryl groups may further have a substituent, and examples of the substituent include, but are not limited to, a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12) and an alkoxycarbonyloxy group (preferably having a carbon number of 2 to 7).

Also, two members selected from $R_{201}$, $R_{202}$ and $R_{203}$ may combine through a single bond or a linking group. Examples of the linking group include, but are not limited to, an alkylene group (preferably having a carbon number of 1 to 3), —O—, —S—, —CO— and —SO$_2$—.

Preferred structures when at least one of $R_{201}$, $R_{202}$ and $R_{203}$ is not an aryl group include cation structures such as compounds described in JP-A-2004-233661, paragraphs 0046, 0047 and 0048, and JP-A-2003-35948, paragraphs 0040 to 0046, Compounds (I-1) to (I-70) set forth in U.S. Patent Application Publication 2003/0224288A1, and Compounds (IA-1) to (IA-54) and (IB-1) to (IB-24) set forth in U.S. Patent Application Publication 2003/0077540A1.

In formulae (ZII) and (ZIII), each of $R_{204}$ to $R_{207}$ independently represents an aryl group, an alkyl group or a cycloalkyl group.

The aryl group, alkyl group and cycloalkyl group of $R_{204}$ to $R_{207}$ are the same as the aryl group, alkyl group and cycloalkyl group of $R_{201}$ to $R_{203}$ in the compound (ZI).

The aryl group, alkyl group and cycloalkyl group of $R_{204}$ to $R_{207}$ may have a substituent. Examples of the substituent include those which the aryl group, alkyl group and cycloalkyl group of $R_{201}$ to $R_{203}$ in the compound (ZI) may have.

$Z^-$ represents a non-nucleophilic anion, and examples thereof are the same as those of the non-nucleophilic anion of $Z^-$ in formula (ZI).

Other examples of the acid generator include compounds represented by the following formulae (ZIV), (ZV) and (ZVI):

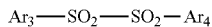
(ZIV)

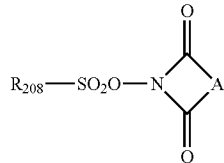
(ZV)

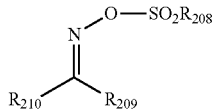
(ZVI)

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as those of the aryl group as $R_{201}$ to $R_{203}$ in formula (ZI).

Specific examples of the alkyl group and cycloalkyl group of $R_{208}$, $R_{209}$ and $R_{210}$ are the same as those of the alkyl group and cycloalkyl group as $R_{201}$ to $R_{203}$ in formula (ZI).

Specific examples of the alkylene group of A includes an alkylene group having a carbon number of 1 to 12 (e.g., a methylene group, an ethylene group, a propylene group, an isopropylene group, a butylenes group, an isobutylene group). Moreover, specific examples of the alkenylene group of A includes an alkenylene group having a carbon number of 2 to 12 (e.g., a vinylene group, a propenylene group, a butenylene group) and specific examples of the arylene group of A includes an arylene group having a carbon number of 6 to 10 (e.g., a phenylene group, a tolylene group, a naphthylene group).

Out of the acid generators, particularly preferred examples are set forth below.

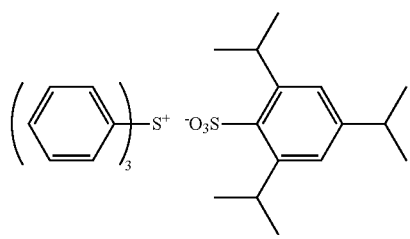
(z4)

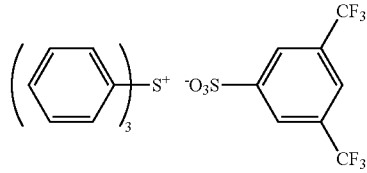
(z5)

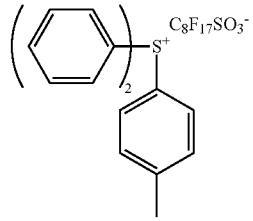
(z6)

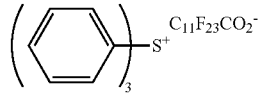
(z7)

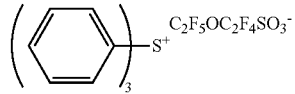
(z8)

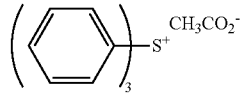
(z9)

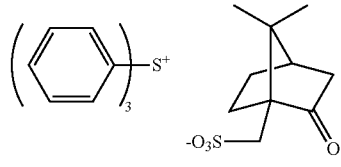
(z10)

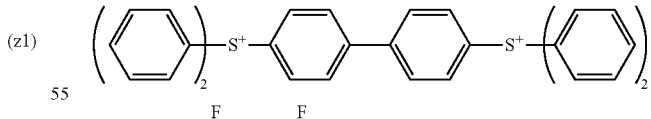
(z11)

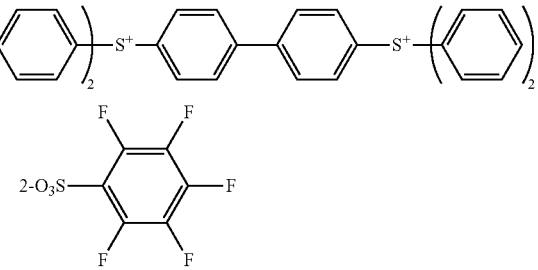

(z1)

(z2)

(z3)

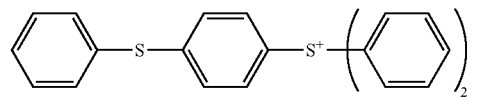
(z12)

-continued
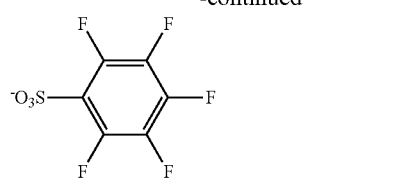
(z13)
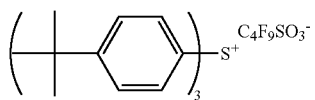
(z14)
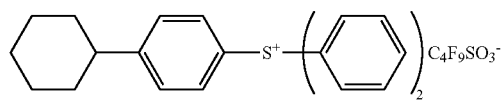
(z15)
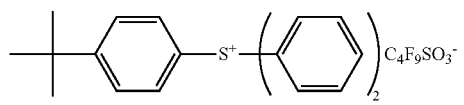
(z16)
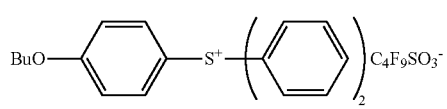
(z17)
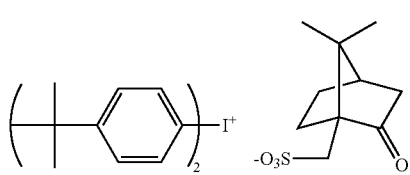
(z18)
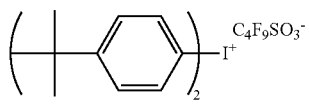
(z19)
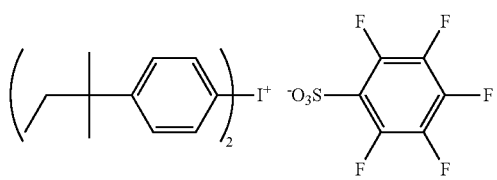
(z20)
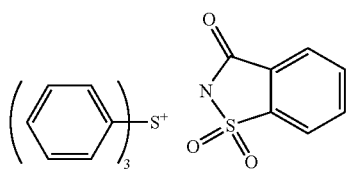
(z21)
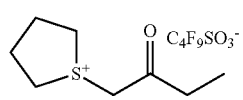
(z22)
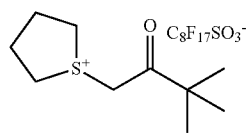
-continued
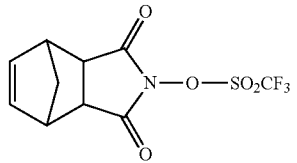
(z23)
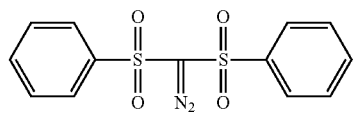
(z24)
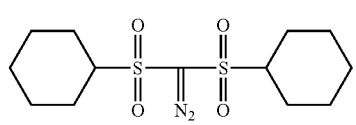
(z25)
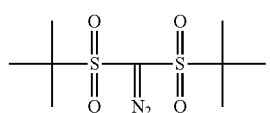
(z26)
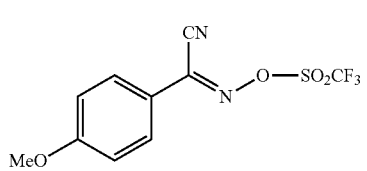
(z27)
(z28)
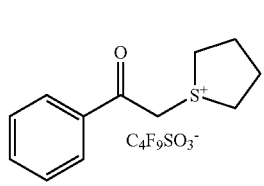
(z29)
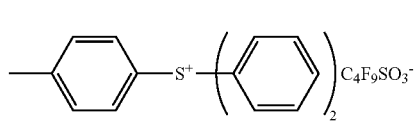
(z30)
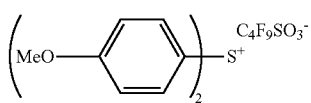
(z31)
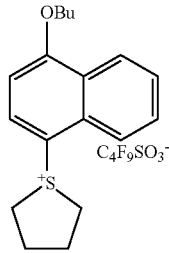
(z32)

285
-continued
(z33)
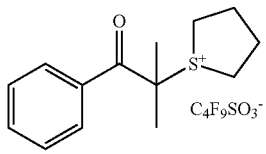
(z34)
(z35)
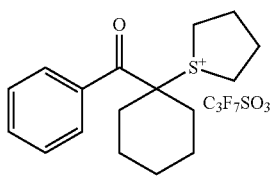
(z36)
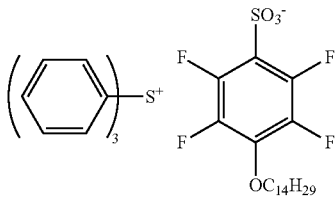
(z37)
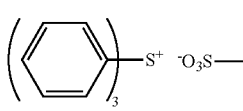
(z38)
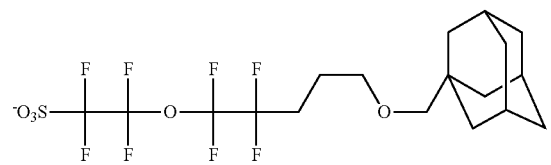
(z39)
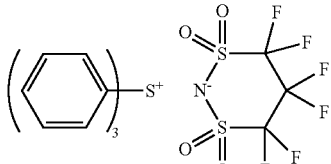
(z40)
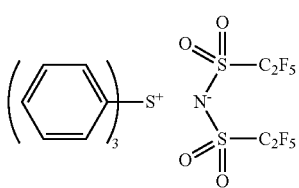
286
-continued
(z41)
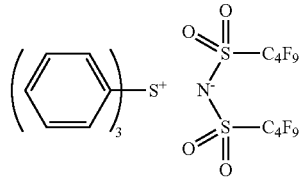
(z42)
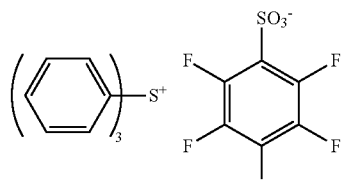
(z43)
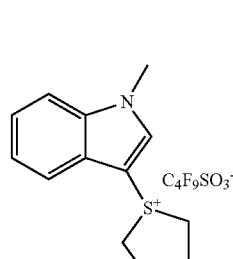
(z44)
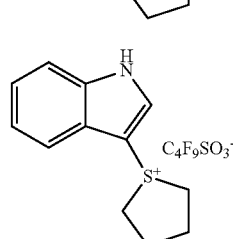
(z45)
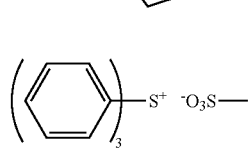
(z46)
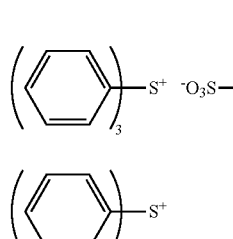
(z47)
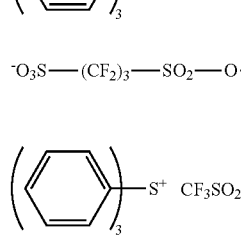
(z48)
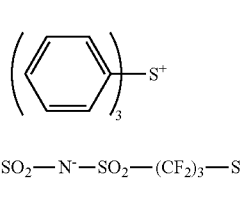
(z49)

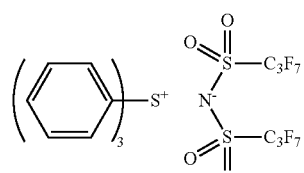
(z50)
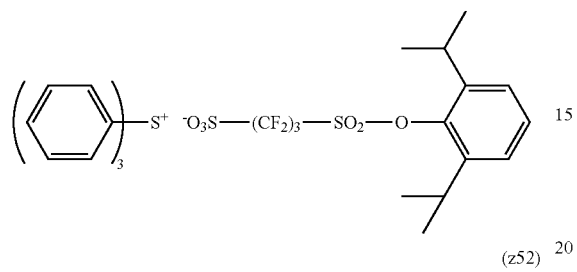
(z51)
(z52)
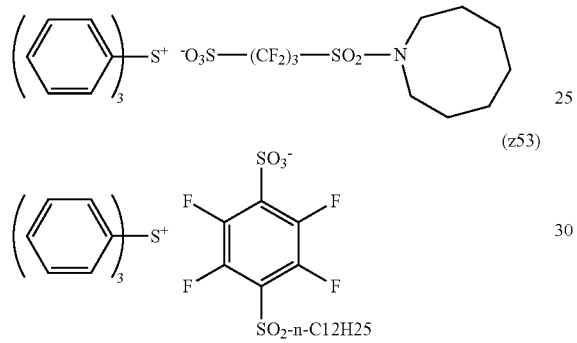
(z53)
(z54)
(z55)
(z56)
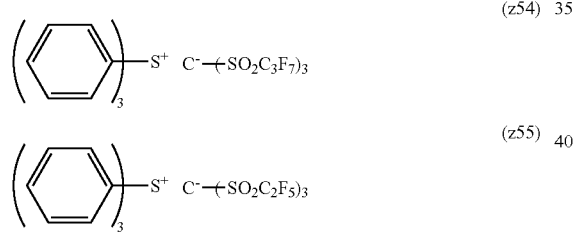
(z57)
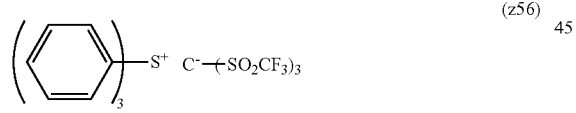
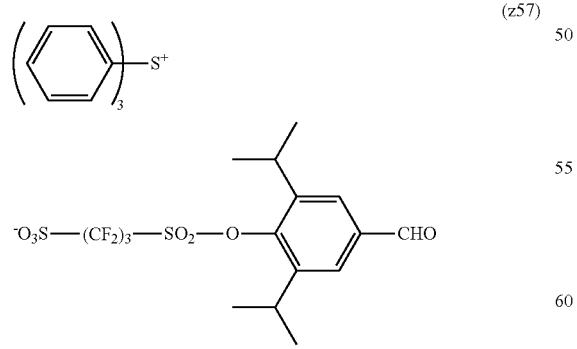
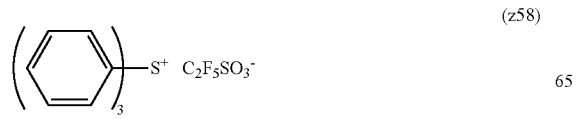
(z58)
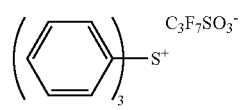
(z59)
(z60)
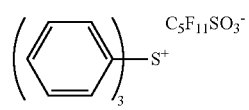
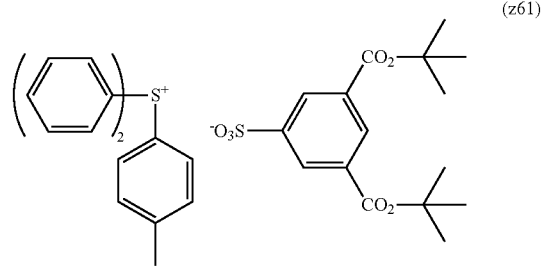
(z61)
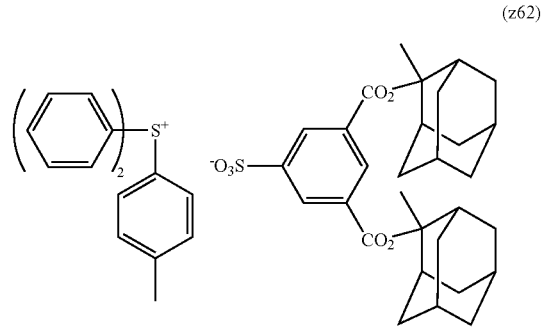
(z62)
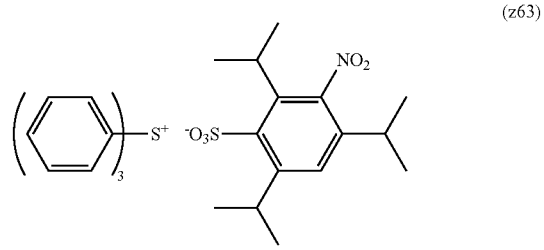
(z63)
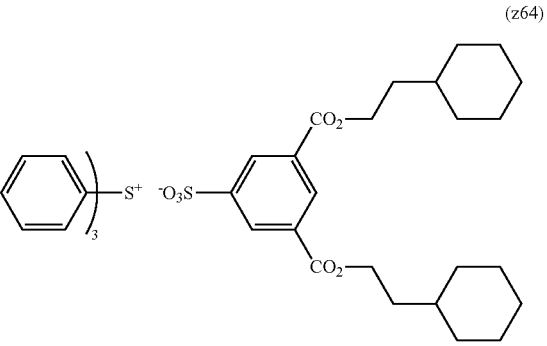
(z64)
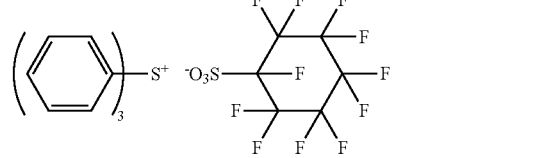
(z65)

-continued

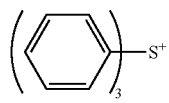  (z66)

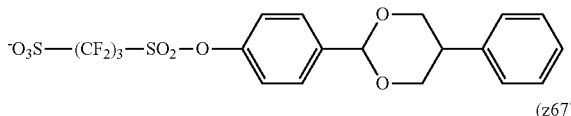

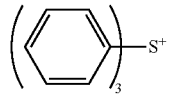  (z67)

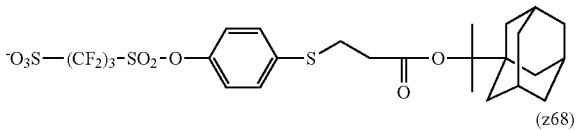

  (z68)

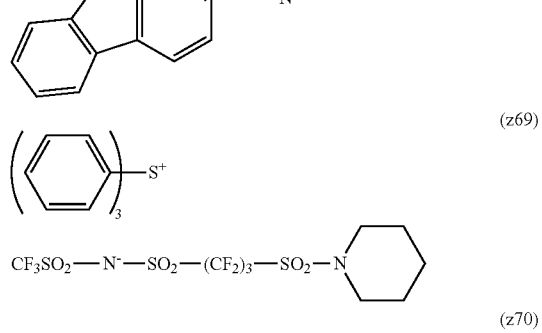  (z69)

(z70)

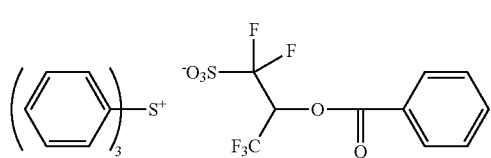

As for the acid generator, one kind may be used alone, or two or more kinds may be used in combination.

The content of the acid generator in the composition is preferably from 0.1 to 20 mass %, more preferably from 0.5 to 15 mass %, still more preferably from 4 to 13 mass %, based on the entire solid content of the composition.

[4] (D) Solvent

Examples of the solvent that can be used at the time of preparing the actinic ray-sensitive or radiation-sensitive resin composition by dissolving the above-described components include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Preferred examples of the alkylene glycol monoalkyl ether carboxylate include propylene glycol monomethyl ether acetate (PGMEA, another name: 1-methoxy-2-acetoxypropane), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether (PGME, another name: 1-methoxy-2-propanol), propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent that can be preferably used includes a solvent having a boiling point of 130° C. or more at ordinary temperature under atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more kinds thereof may be used in combination.

In the present invention, a mixed solvent prepared by mixing a solvent containing a hydroxyl group in the structure and a solvent containing no hydroxyl group may be used as the organic solvent.

The solvent containing a hydroxyl group and the solvent containing no hydroxyl group may be appropriately selected from the compounds illustrate above, but the solvent containing a hydroxyl group is preferably an alkylene glycol monoalkyl ether, an alkyl lactate or the like, more preferably propylene glycol monomethyl ether or ethyl lactate. Preferred examples of the solvent containing no hydroxyl group include an alkylene glycol monoalkyl ether acetate, an alkyl alkoxypropionate, a monoketone compound that may contain a ring, a cyclic lactone and an alkyl acetate. Among these, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate and 2-heptanone are most preferred.

The mixing ratio (by mass) of the solvent containing a hydroxyl group to the solvent containing no hydroxyl group is from 1/99 to 99/1, preferably from 10/90 to 90/10, more preferably from 20/80 to 60/40. A mixed solvent in which the solvent containing no hydroxyl group is contained in a ratio of 50 mass % or more is particularly preferred in view of coating uniformity.

The solvent is preferably a mixed solvent of two or more kinds of solvents containing propylene glycol monomethyl acetate.

[5] (E) Basic Compound

The actinic ray-sensitive or radiation-sensitive resin composition of the present invention preferably contains a basic compound for reducing the change of performance with aging from exposure to heating.

The basic compound is preferably a compound having a structure represented by the following formulae (A) to (E):

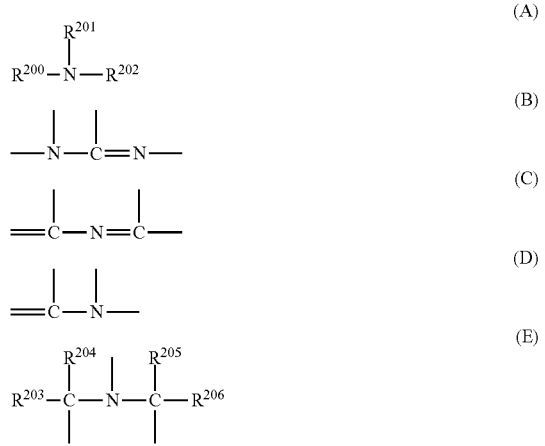

In formulae (A) and (E), each of $R^{200}$, $R^{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine together to foam a ring. Each of $R^{203}$, $R^{204}$, $R^{205}$ and $R^{206}$, which may be the same or different, represents an alkyl group having a carbon number of 1 to 20.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

The alkyl group in formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, benzimidazole and 2-phenylbenzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include tetrabutylammonium hydroxide, triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include those where the anion moiety of the compound having an onium hydroxide structure becomes a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine, N-phenyldiethanolamine and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound and a sulfonic acid ester group-containing ammonium salt compound.

In the phenoxy group-containing amine compound, phenoxy group-containing ammonium salt compound, sulfonic acid ester group-containing amine compound and sulfonic acid ester group-containing ammonium salt compound, at least one alkyl group is preferably bonded to the nitrogen atom. Also, the compound preferably has an oxygen atom in the alkyl chain to form an alkyleneoxy group. The number of alkyleneoxy groups within the molecule is 1 or more, preferably from 3 to 9, more preferably from 4 to 6. Among alkyleneoxy groups, those having a structure of —$CH_2CH_2O$—, —$CH(CH_3)CH_2O$— or —$CH_2CH_2CH_2O$— are preferred.

Specific examples of the phenoxy group-containing amine compound, phenoxy group-containing ammonium salt compound, sulfonic acid ester group-containing amine compound and sulfonic acid ester group-containing ammonium salt compound include, but are not limited to, Compounds (C1-1) to (C3-3) illustrated in [0066] of U.S. Patent Application Publication 2007/0224539A.

One of these basic compounds is used alone, or two or more kinds thereof are used in combination.

The actinic ray-sensitive or radiation-sensitive resin composition of the present invention may or may not contain a basic compound. In the case of containing a basic compound, the content of the basic compound is usually from 0.001 to 10 mass %, preferably from 0.01 to 5 mass %, based on the solid content of the actinic ray-sensitive or radiation-sensitive resin composition.

The ratio of acid generator and basic compound contained in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/basic compound (by mol) is more preferably from 5.0 to 200, still more preferably from 7.0 to 150.

[6] (F) Surfactant

The actinic ray-sensitive or radiation-sensitive resin composition of the present invention may further contain a surfactant. In the case of containing a surfactant, the composition preferably contains any one of fluorine-containing and/or silicon-containing surfactants (a fluorine-containing surfactant, a silicon-containing surfactant and a surfactant containing both a fluorine atom and a silicon atom), or two or more kinds thereof.

By incorporating the above-described surfactant into the actinic ray-sensitive or radiation-sensitive resin composition of the present invention, a resist pattern with good performance in terms of sensitivity, resolution and adherence and reduced development defect can be obtained.

Examples of the commercially available surfactant which can be used include a fluorine-containing surfactant and a silicon-containing surfactant, such as EFtop EF301 and EF303 (produced by Shin-Akita Kasei K. K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may also be used as the silicon-containing surfactant.

As for the surfactant, other than these known surfactants, a surfactant using a polymer having a fluoro-aliphatic group derived from a fluoro-aliphatic compound that is produced by a telomerization process (also called a telomer process) or an oligomerization process (also called an oligomer process), may be used. The fluoro-aliphatic compound can be synthesized by the method described in the vicinity of [0344] and [0345] of JP-A-2002-90991. The polymer having a fluoro-aliphatic group may also be a copolymer of a fluoro-aliphatic group-containing monomer with a (poly(oxyalkylene)) acrylate and/or a (poly(oxyalkylene)) methacrylate.

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactant, described in [0280] of U.S. Patent Application Publication 2008/0248425, may also be used.

One of these surfactants may be used alone, or some of them may be used in combination.

The actinic ray-sensitive or radiation-sensitive resin composition of the present invention may or may not contain a surfactant. In the case of containing a surfactant, the content of the surfactant is preferably from 0 to 2 mass %, more preferably from 0.0001 to 2 mass %, still more preferably from 0.001 to 1 mass %, based on the entire amount (excluding the solvent) of the actinic ray-sensitive or radiation-sensitive resin composition.

On the other hand, when the amount of the surfactant added is set to 10 ppm or less based on the entire amount of the resist composition (excluding the solvent), uneven distribution of the hydrophobic resin to the surface is more successfully achieved, so that the resist film surface can be made more hydrophobic and the followability of water at the immersion exposure can be enhanced.

[7] (G) Onium Carboxylate

The actinic ray-sensitive or radiation-sensitive resin composition of the present invention may contain an onium carboxylate. Examples of the onium carboxylate include those described in [0605] to [0606] of U.S. Patent Application Publication 2008/0187860. These onium carboxylates can be synthesized by reacting a sulfonium hydroxide, iodonium hydroxide or ammonium hydroxide and a carboxylic acid with silver oxide in an appropriate solvent.

The actinic ray-sensitive or radiation-sensitive resin composition of the present invention may or may not contain an onium carboxylate. In the case of containing an onium carboxylate, the content of the onium carboxylate in the composition is generally from 0.1 to 20 mass %, preferably from 0.5 to 10 mass %, more preferably from 1 to 7 mass %, based on the entire solid content of the composition.

[8] (H) Dissolution Inhibiting Compound Having a Molecular Weight of 3,000 or Less and being Capable of Decomposing by the Action of an Acid to Increase the Solubility in an Alkali Developer The dissolution inhibiting compound having a molecular weight of 3,000 or less and being capable of decomposing by the action of an acid to increase the solubility in an alkali developer (hereinafter, sometimes referred to as a "dissolution inhibiting compound") is preferably an alicyclic or aliphatic compound containing an acid-decomposable group, such as acid-decomposable group-containing cholic acid derivative described in *Proceeding of SPIE*, 2724, 355 (1996), so as not to reduce the transparency to light at 220 nm or less. Examples of the acid-decomposable group and alicyclic structure are the same as those described above with respect to the resin of the component (B).

In the case where the actinic ray-sensitive or radiation-sensitive resin composition of the present invention is exposed to KrF excimer laser or irradiated with electron beam, the dissolution inhibiting compound preferably has a structure where a phenolic hydroxyl group of a phenol compound is substituted by an acid-decomposable group. The phenol compound is preferably a compound containing from 1 to 9 phenol skeletons, more preferably from 2 to 6 phenol skeletons.

The actinic ray-sensitive or radiation-sensitive resin composition of the present invention may or may not contain a dissolution inhibiting compound. In the case of containing a dissolution inhibiting compound, the content of the dissolution inhibiting compound is preferably from 3 to 50 mass %, more preferably from 5 to 40 mass %, based on the solid content of the actinic ray-sensitive or radiation-sensitive resin composition.

Specific examples of the dissolution inhibiting compound are set forth below, but the present invention is not limited thereto.

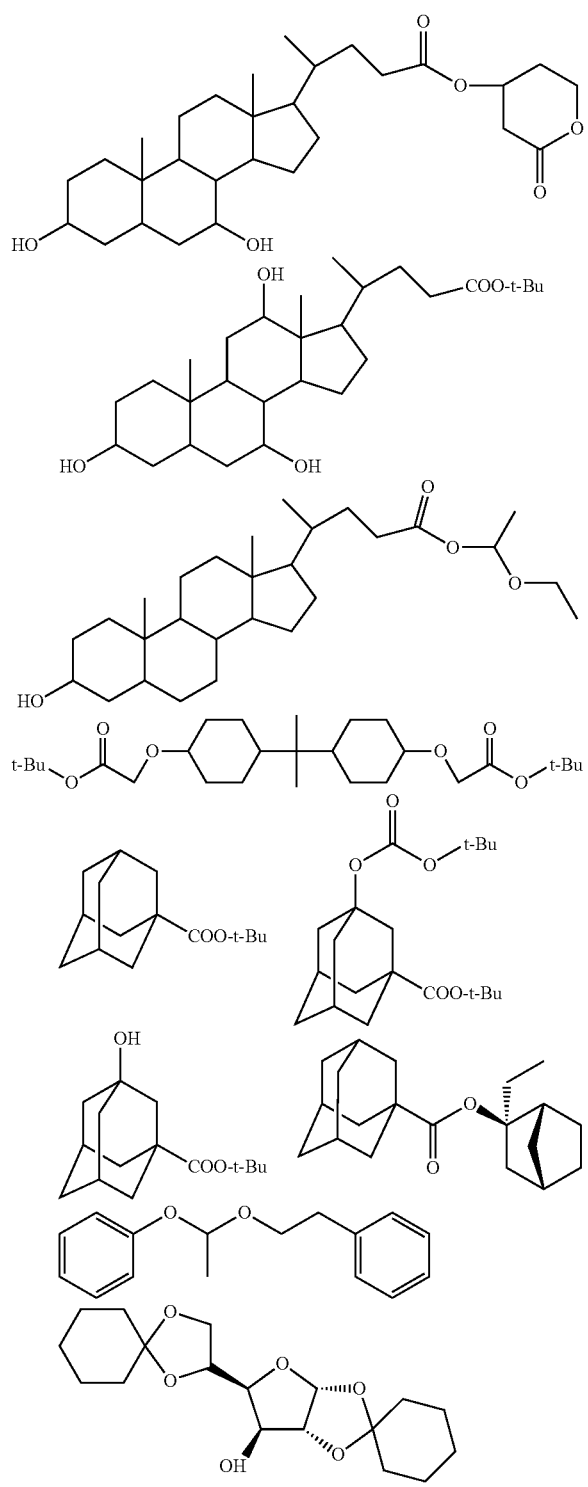

[9] Other Additives

The actinic ray-sensitive or radiation-sensitive resin composition of the present invention may further contain, for example, a dye, a plasticizer, a photosensitizes, a light absorber, and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art by referring to the methods described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

Pattern Forming Method

The present invention also relates to a resist film formed of the actinic ray-sensitive or radiation-sensitive resin composition of the present invention.

Furthermore, the pattern forming method of the present invention comprises steps of subjecting the resist film to immersion exposure and developing the immersion-exposed resist film.

The actinic ray-sensitive or radiation-sensitive resin composition of the present invention is preferably used in a film thickness of 30 to 250 nm, more preferably from 30 to 200 nm, from the standpoint of enhancing the resolution. Such a film thickness can be obtained by setting the solid content concentration in the actinic ray-sensitive or radiation-sensitive resin composition to an appropriate range, thereby imparting an appropriate viscosity and enhancing the coatability and film-forming property.

The entire solid content concentration in the actinic ray-sensitive or radiation-sensitive resin composition is generally from 1 to 10 mass %, preferably from 1 to 8.0 mass %, more preferably from 1.0 to 6.0 mass %, still more preferably from 2.0 to 4.0 mass %.

The actinic ray-sensitive or radiation-sensitive resin composition of the present invention is used by dissolving the components above in a predetermined organic solvent, preferably in the above-described mixed solvent, filtering the solution, and coating a predetermined support with it as follows. The filter used for filtration is preferably a polytetrafluoroethylene-, polyethylene- or nylon-made filter having a pore size of 0.1 µm or less, more preferably 0.05 µm or less, still more preferably 0.03 µm or less.

For example, the actinic ray-sensitive or radiation-sensitive resin composition is applied on such a substrate (e.g., silicon/silicon dioxide-coated substrate) as used in the production of a precision integrated circuit device, by an appropriate coating method such as spinner or coater and dried to form a resist film The resist film is irradiated with an actinic ray or radiation through a predetermined mask, then preferably baked (heated), and subjected to development and rinsing, whereby a good pattern can be obtained.

It is preferred to include a prebaking step (PB) before the exposure step after film formation.

Also, it is preferred to include a post-exposure baking step (PEB) after the exposure step but before the developing step.

As for the heating temperature, both PB and PEB are preferably performed at 70 to 120° C., more preferably at 80 to 110° C.

The heating time is preferably from 30 to 300 seconds, more preferably from 30 to 180 seconds, still more preferably from 30 to 90 seconds.

The heating may be performed by means of a device equipped with a normal exposure/developing machine and may also be performed using a hot plate or the like.

The reaction in the exposed area is promoted by the baking, and the sensitivity and pattern profile are improved.

Examples of the actinic ray or radiation include infrared light, visible light, ultraviolet light, far ultraviolet light, extreme-ultraviolet light, X-ray and electron beam, but the radiation is preferably far ultraviolet light at a wavelength of 250 nm or less, more preferably 220 nm or less, still more preferably from 1 to 200 nm. Specific examples thereof include KrF excimer laser (248 nm), ArF excimer laser (193 nm), $F_2$ excimer laser (157 nm), X-ray, EUV (13 nm) and electron beam. Of these, ArF excimer laser, $F_2$ excimer laser, EUV (13 nm) and electron beam are preferred.

The immersion liquid used at immersion exposure is as described above.

Before forming the resist film, an antireflection film may be previously provided by applying it on the substrate.

The antireflection film used may be either an inorganic film type such as titanium, titanium dioxide, titanium nitride, chromium oxide, carbon and amorphous silicon, or an organic film type composed of a light absorber and a polymer material. As for the organic antireflection film, there may also be used a commercially available organic antireflection film such as DUV30 Series and DUV-40 Series produced by Brewer Science, Inc. and AR-2, AR-3 and AR-5 produced by Shipley Co., Ltd.

As for the alkali developer used in the development step, a quaternary ammonium salt typified by tetramethylammonium hydroxide (TMAH) is usually used, but other than this compound, an aqueous alkali solution of, for example, inorganic alkali, primary amine, secondary amine, tertiary amine, alcohol amine or cyclic amine may also be used.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

Also, the above-described alkaline aqueous solution may be used after adding thereto alcohols and a surfactant each in an appropriate amount.

As for the rinsing solution, pure water is used, and an appropriate amount of a surfactant may be added to the pure water before use.

After the development or rinsing, a treatment of removing the developer or rinsing solution adhering on the pattern by a supercritical fluid may be performed.

EXAMPLES

The present invention is described below by referring to Examples, but the present invention is not limited thereto.

Structures of the acid-decomposable resins (A) used in Examples are shown below. The weight average molecular weight (Mw), polydispersity (Mw/Mn) and molar ratio of repeating units (corresponding to repeating units starting from the left) of each resin are shown in the Table later.

Incidentally, the monomers corresponding to the repeating unit (a) were synthesized by the method described in JP-A-2005-258438 or JP-A-2005-281307.

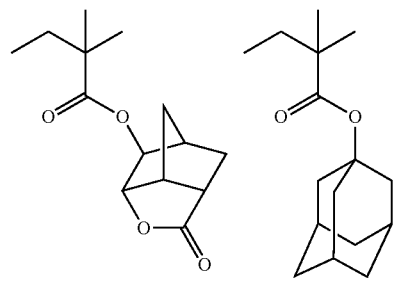

(A-1)

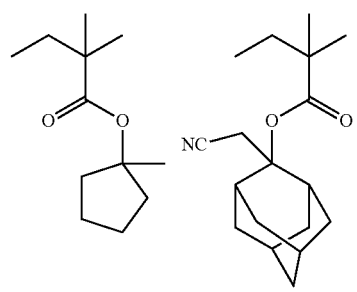

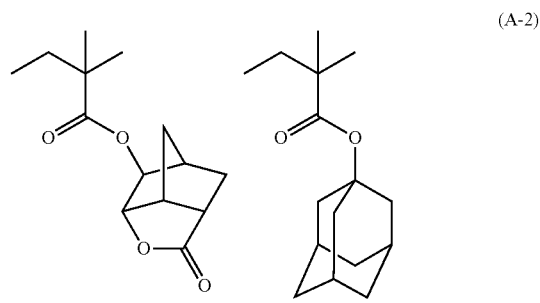

(A-2)

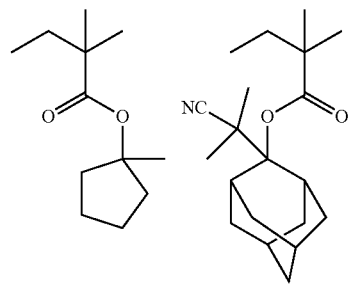

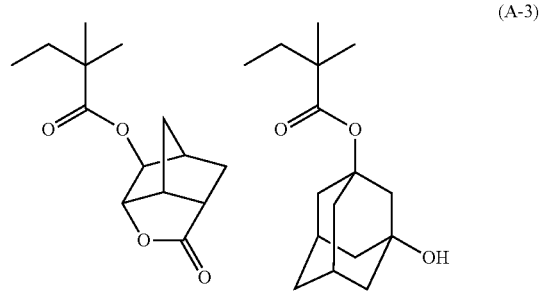

(A-3)

299
-continued
300
-continued
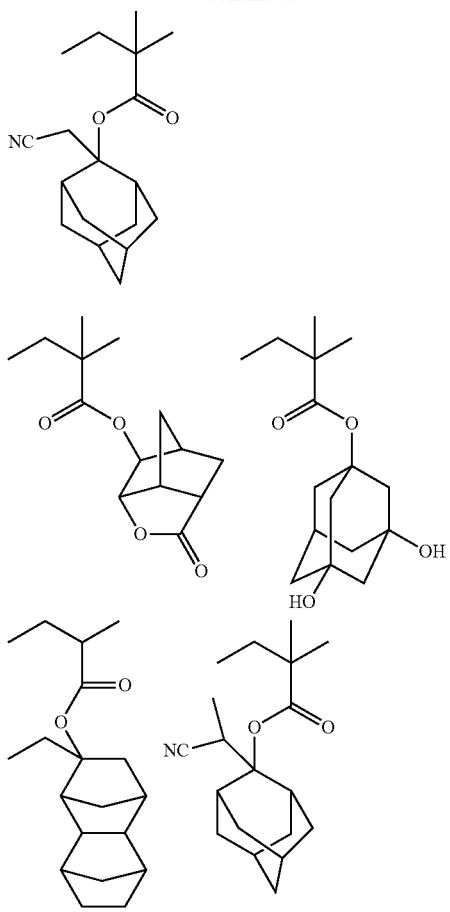
(A-4)
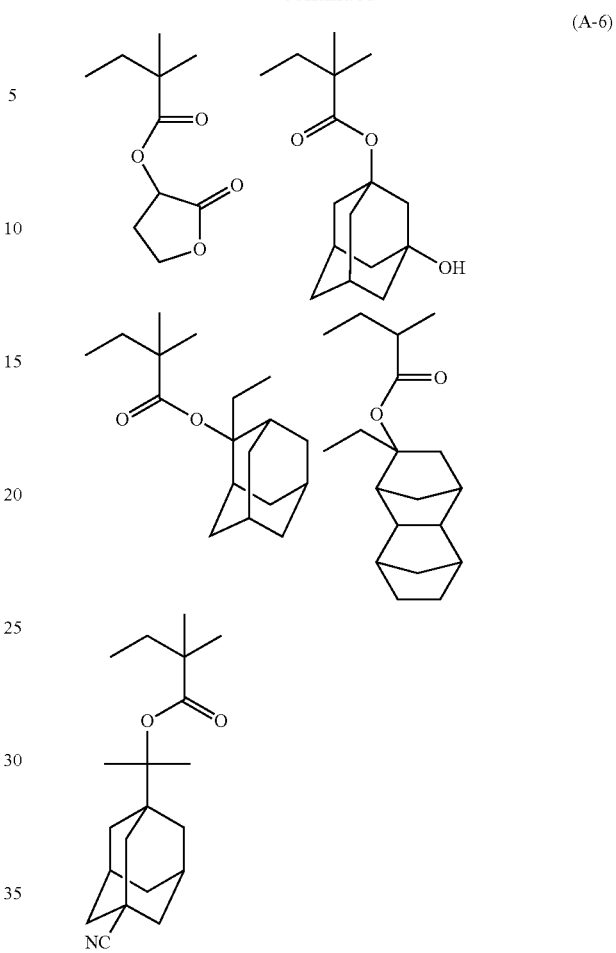
(A-6)
(A-5)
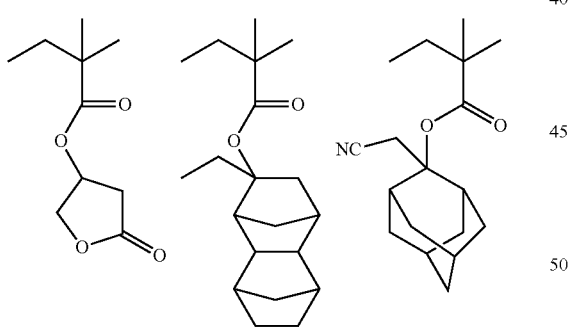
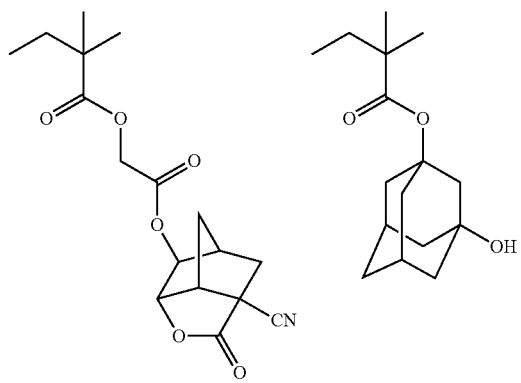
(A-7)
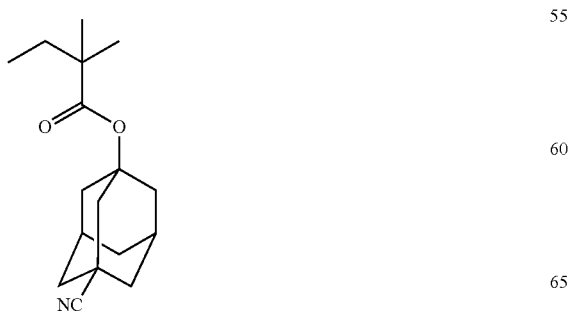
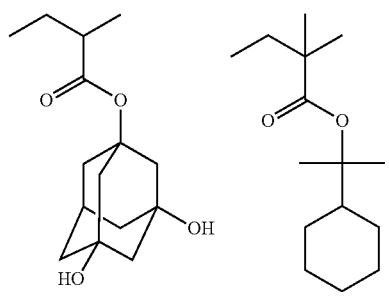

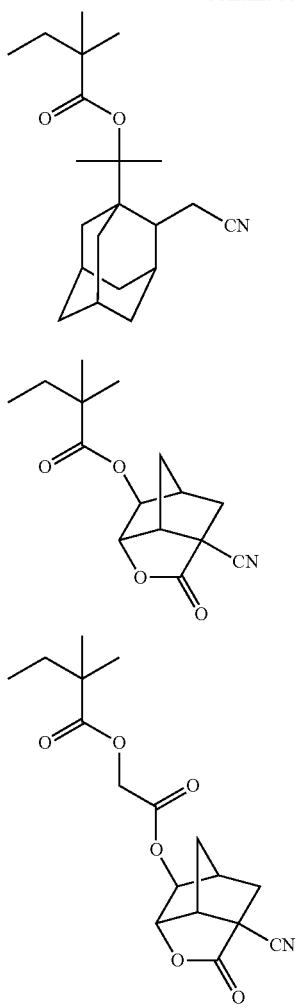
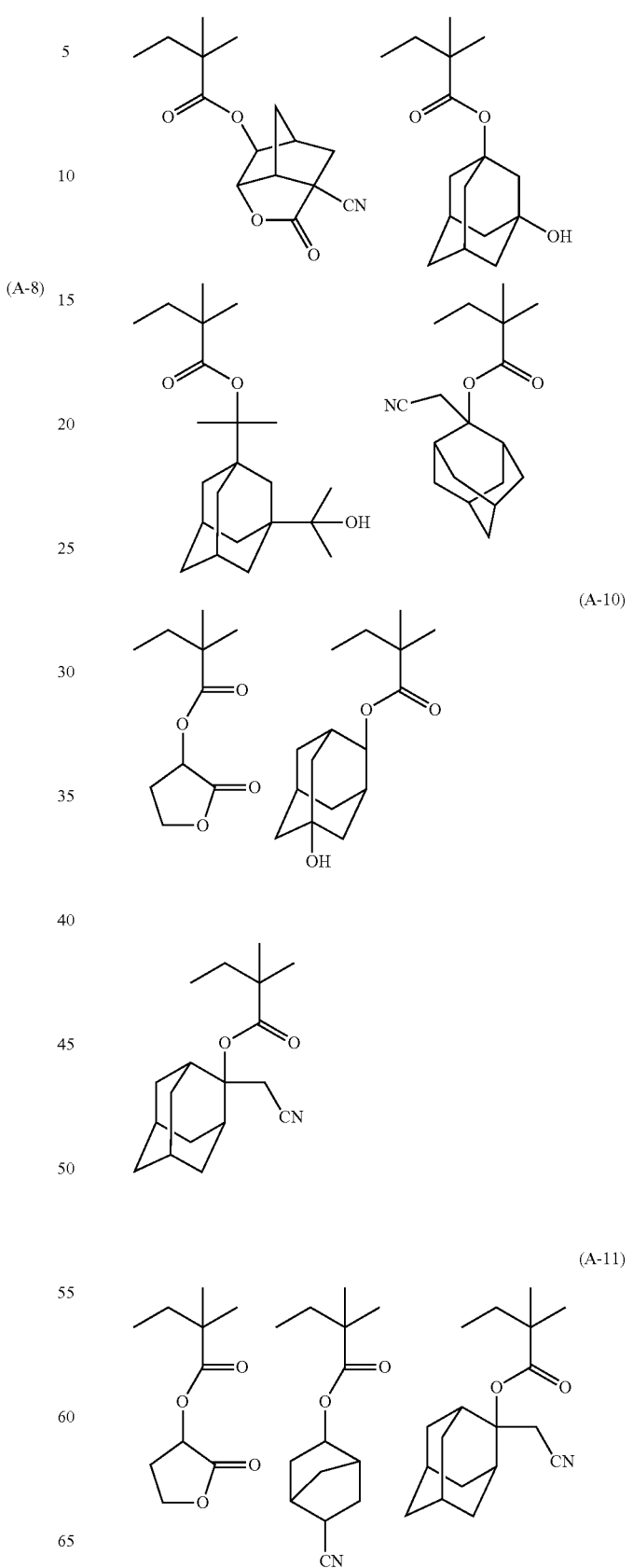

(A-12)
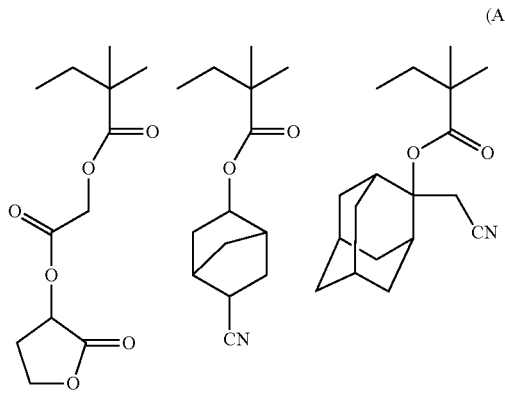
(A-13)
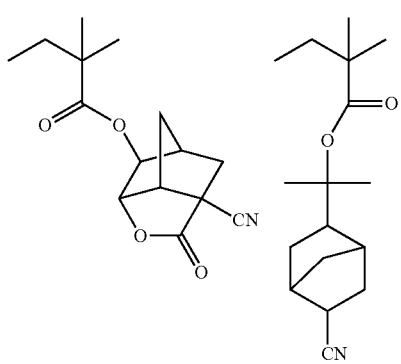
(A-14)
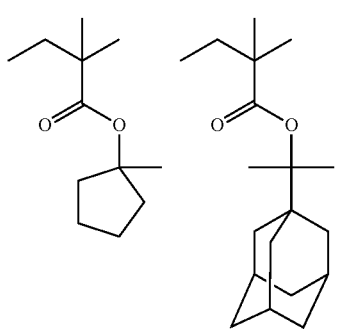
(A-15)
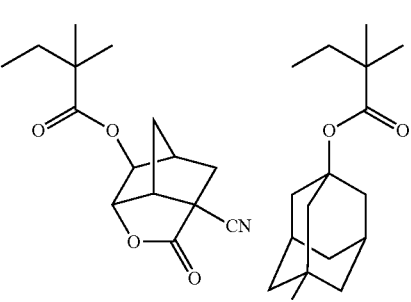
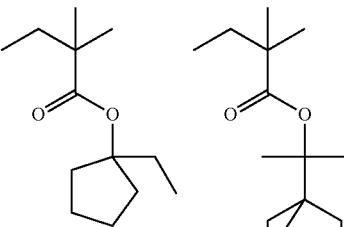
(A-16)
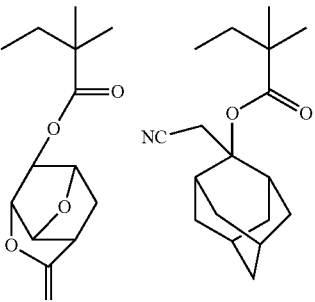
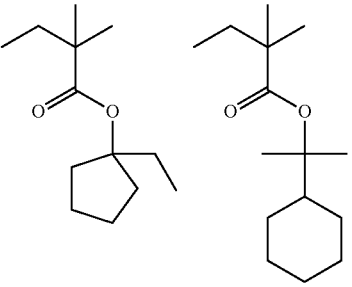
TABLE 6
| | Mw | Mw/Mn | Compositional Ratio (mol %) | | | |
|---|---|---|---|---|---|---|
| (A-1) | 8000 | 1.3 | 40 | 10 | 10 | 40 |
| (A-2) | 10000 | 1.6 | 40 | 10 | 40 | 10 |
| (A-3) | 15000 | 2.0 | 40 | 20 | 40 | |
| (A-4) | 23000 | 2.1 | 30 | 10 | 50 | 10 |
| (A-5) | 5000 | 1.2 | 30 | 10 | 40 | 20 |
| (A-6) | 9000 | 1.5 | 40 | 15 | 15 | 15 | 15 |
| (A-7) | 8000 | 1.8 | 40 | 5 | 5 | 20 | 30 |
| (A-8) | 8000 | 1.5 | 10 | 30 | 10 | 30 | 20 |
| (A-9) | 10000 | 1.7 | 40 | 10 | 10 | 40 |
| (A-10) | 10000 | 1.7 | 40 | 20 | 40 | |
| (A-11) | 8000 | 1.8 | 40 | 20 | 40 | |
| (A-12) | 12000 | 1.7 | 40 | 20 | 40 | |
| (A-13) | 9000 | 1.8 | 40 | 40 | 20 | |
| (A-14) | 10500 | 1.7 | 35 | 10 | 35 | 20 |

TABLE 6-continued

|  | Mw | Mw/Mn | Compositional Ratio (mol %) | | | |
|---|---|---|---|---|---|---|
| (A-15) | 8500 | 1.8 | 40 | 10 | 20 | 30 |
| (A-16) | 9000 | 1.7 | 40 | 10 | 20 | 30 |

<Preparation of Resist>

The components shown in the Tables below were dissolved in a solvent to prepare a solution having a solid content concentration of 3.5 mass %, and the obtained solution was filtered through a polyethylene filter having a pore size of 0.03 μm to prepare a positive resist composition. The positive resist compositions prepared were evaluated by the following methods, and the results are shown in the Tables.

<Resist Pattern Formation>

An organic antireflection film, ARC29A (produced by Nissan Chemical Industries, Ltd.), was applied on a silicon wafer and baked at 205° C. for 60 seconds to form a 78 nm-thick antireflection film, and the positive resist composition prepared above was applied thereon and baked at 100° C. for 60 seconds to form a 120 nm-thick resist film. The obtained wafer was exposed through a 6% halftone mask having a 1:1 line-and-space pattern having a line width of 65 nm or a line-and-space pattern of 90 nm with DUTY of from 1:1 to 1:10 (in steps of 1) (90 nm for the mask coverage area) by using an ArF excimer laser immersion scanner (XT1700i, manufactured by ASML, NA:1.20, Annular, outer sigma: 0.940, inner sigma: 0.740, XY deflection). As for the immersion liquid, ultrapure water was used. Thereafter, the wafer was heated at 100° C. for 60 seconds, then developed with an aqueous tetramethylammonium hydroxide solution (2.38 mass %) for 30 seconds, rinsed with pure water and spin-dried to obtain a resist pattern.

<Evaluation of Pitch Dependency>

With a fixed exposure dose of giving a pattern CD (critical dimension, limiting (minimum) dimension) of 90 nm when the pitch is 180 nm, and the pitch dependency was evaluated by the following method. For the measurement of line width, a Critical Dimension SEM (S-8840, manufactured by Hitachi Ltd.) was used.

Pitch dependency=(line CD at mask CD 90 nm·pitch 180 nm)−(line CD at mask CD 90 nm·pitch 252 nm)

<Evaluation of Coverage Dependency>

Exposure was performed through a reticle having a mask CD of 65 nm and a pitch of 130 nm at an exposure dose of giving a line width of 65 nm when the coverage is 50%. The line width of the line-and-space was measured by changing the mask coverage of the reticle within the exposure chip in a range of from 50 to 90%. For the measurement of line width, a Critical Dimension SEM (S-8840, manufactured by Hitachi Ltd.) was used.

The coverage dependency was quantified as follows.

Coverage dependency=Δ(line width at coverage of 90%−line width at coverage of 50%)

TABLE 7

| | | Resist Composition | | | | | Evaluation Results | |
|---|---|---|---|---|---|---|---|---|
| | Resin (2 g) | Photo-Acid Generator (mg) | Solvent (ratio by mass) | Basic Compound (mg) | Resin (C) (mg) | Surfactant (mg) | Pitch Dependency (nm) | Coverage Dependency (nm) |
| Example 1 | A-1 | z1 (100) | SL-2/SL-4 60/40 | N-5/N-1 (7/7) | C-1/C-7 (40/40) | W-4 (2) | 32.3 | 2.6 |
| Example 2 | A-2 | z2 (100) | SL-2/SL-4 60/40 | N-8/N-1 (7/7) | C-2 (80) | W-4 (2) | 31.6 | 2.4 |
| Example 3 | A-3 | z5 (100) | SL-2/SL-4 60/40 | N-8/N-1 (7/7) | C-7 (100) | W-4 (2) | 33.3 | 2.3 |
| Example 4 | A-4 | z10 (100) | SL-2/SL-4 60/40 | N-1 (10) | C-12 (80) | W-4 (2) | 32.5 | 2.8 |
| Example 5 | A-5 | z11 (90) | SL-2/SL-4 40/60 | N-5 (7) | C-8 (80) | W-1 (3) | 34.1 | 2.4 |
| Example 6 | A-6 | z17 (110) | SL-2/SL-4 40/60 | N-5 (10) | C-66 (80) | W-1 (3) | 32.5 | 2.2 |
| Example 7 | A-7 | z18 (100) | SL-2/SL-4 40/60 | N-3 (7) | C-18 (80) | W-1/W-3 (2/1) | 32.2 | 2.5 |
| Example 8 | A-8 | z20 (100) | SL-2/SL-4/SL-6 40/59/1 | N-6 (10) | C-119 (40) | W-3 (3) | 31.9 | 2.4 |
| Example 9 | A-9 | z21 (100) | SL-2/SL-4/SL-6 40/59/1 | N-1 (7) | C-30 (40) | W-3 (3) | 32.7 | 2.6 |
| Example 10 | A-10 | z25 (100) | SL-2/SL-4/SL-6 40/59/1 | N-2 (10) | C-79 (50) | W-3 (5) | 30.0 | 1.9 |
| Example 11 | A-11 | z28 (100) | SL-2/SL-4 70/30 | N-3 (7) | C-9 (80) | W-6 (4) | 29.9 | 2.0 |
| Example 12 | A-12 | z29/z31 (40/60) | SL-2/SL-4 70/30 | N-3 (7) | C-50 (80) | W-6 (3) | 28.7 | 2.0 |
| Example 13 | A-13 | z39 (100) | SL-1/SL-2 60/40 | N-4 (7) | C-190 (80) | W-6 (2) | 32.2 | 2.2 |
| Example 14 | A-14 | z18 (100) | SL-2/SL-4 40/60 | N-8/N-1 (7/7) | C-2 (80) | W-4 (2) | 32.1 | 2.3 |
| Example 15 | A-15 | z20 (100) | SL-2/SL-4/SL-6 40/59/1 | N-8/N-1 (7/7) | C-7 (100) | W-4 (2) | 31.9 | 2.2 |
| Example 16 | A-16 | z21 (100) | SL-2/SL-4/SL-6 40/59/1 | N-1 (10) | C-12 (80) | W-4 (2) | 31.8 | 2.2 |
| Example 17 | A-1 | z33 (100) | SL-2/SL-4 60/40 | N-7 (10) | C-56 (80) | W-1 (3) | 32.4 | 2.8 |
| Example 18 | A-2 | z37 (100) | SL-3/SL-4 30/70 | N-6 (7) | C-74 (80) | W-5 (2) | 32.1 | 2.4 |
| Example 19 | A-3 | z38 (100) | SL-2/SL-4/SL-5 40/58/2 | N-1 (10) | C-12 (40) | W-1 (2) | 34.5 | 2.2 |

TABLE 7-continued

| | Resist Composition | | | | | | Evaluation Results | |
|---|---|---|---|---|---|---|---|---|
| | Resin (2 g) | Photo-Acid Generator (mg) | Solvent (ratio by mass) | Basic Compound (mg) | Resin (C) (mg) | Surfactant (mg) | Pitch Dependency (nm) | Coverage Dependency (nm) |
| Example 20 | A-4 | z39 (100) | SL-1/SL-2 60/40 | N-4 (7) | C-190 (80) | W-6 (2) | 33.1 | 2.5 |
| Example 21 | A-5 | z40 (110) | SL-2/SL-4/SL-6 40/59/1 | N-3 (10) | C-87 (80) | W-2 (2) | 31.9 | 2.1 |
| Example 22 | A-6 | z41 (100) | SL-2/SL-4/SL-6 40/58/2 | N-2 (10) | C-121 (50) | W-3 (2) | 32.3 | 22 |
| Example 23 | A-7 | z43/z45 (60/40) | SL-2/SL-4 60/40 | N-5/N-1 (7/7) | C-125 (80) | W-4 (3) | 33.6 | 2.6 |
| Example 24 | A-8 | z50 (100) | SL-2/SL-4 60/40 | N-8/N-1 (7/7) | C-151 (40) | W-4 (3) | 33.4 | 2.4 |
| Example 25 | A-9 | z52 (100) | SL-2/SL-4 60/40 | N-5 (10) | C-145 (80) | W-1 (3) | 29.8 | 2.5 |

TABLE 8

| | Resist Composition | | | | | | Evaluation Results | |
|---|---|---|---|---|---|---|---|---|
| | Resin (2 g) | Photo-Acid Generator (mg) | Solvent (ratio by mass) | Basic Compound (mg) | Resin (C) (mg) | Surfactant (mg) | Pitch Dependency (nm) | Coverage Dependency (nm) |
| Example 26 | A-10 | z55 (100) | SL-2/SL-4 60/40 | N-3 (10) | C-137 (80) | W-1 (3) | 28.9 | 1.8 |
| Example 27 | A-11 | z59 (100) | SL-2/SL-4 60/40 | N-1 (10) | C-205 (40) | W-3 (2) | 27.9 | 1.9 |
| Example 28 | A-12 | z39 (260) | SL-2/SL-4 60/40 | N-3 (7) | C-4 (80) | W-6 (2) | 27.8 | 1.9 |
| Example 29 | A-13 | z52 (100) | SL-2/SL-4 60/40 | N-5 (10) | C-145 (80) | W-1 (3) | 32.3 | 2.1 |
| Example 30 | A-14 | z2 (100) | SL-2/SL-4 40/60 | N-3 (10) | C119 (80) | W-2/W-4 (1/1) | 32.0 | 1.8 |
| Example 31 | A-15 | z1 (100) | SL-2/SL-4/SL-6 40/59/1 | N-6 (7) | C-94 (80) | W-4 (2) | 32.0 | 1.9 |
| Example 32 | A-16 | z5 (100) | SL-2/SL-4/SL-6 40/59/1 | N-5/N-1 (7/7) | C-7 (160) | W-4 (2) | 31.9 | 2.0 |
| Example 33 | A-1 | z65 (100) | SL-2/SL-4 60/40 | N-7 (7) | C-155 (80) | W-1 (2) | 32.6 | 2.6 |
| Example 34 | A-2 | z68 (100) | SL-2/SL-4 60/40 | N-1 (7) | C-154 (60) | W-1 (2) | 31.8 | 2.5 |
| Example 35 | A-3 | z2 (100) | SL-2/SL-4 60/40 | N-1 (7) | C-262 (80) | W-4 (2) | 31.7 | 2.3 |
| Example 36 | A-4 | z1 (100) | SL-2/SL-4 60/40 | N-3 (10) | C-119 (80) | W-2/W-4 (1/1) | 32.6 | 2.4 |
| Example 37 | A-5 | z5 (100) | SL-2/SL-4 60/40 | N-6 (7) | C-94 (80) | W-4 (2) | 33.1 | 2.6 |
| Example 38 | A-6 | z10 (100) | SL-2/SL-4 60/40 | N-5/N-1 (7/7) | C-7 (160) | W-4 (2) | 32.9 | 2.3 |
| Example 39 | A-7 | z11 (90) | SL-2/SL-4 60/40 | N-5/N-1 (7/7) | C-7/CP-1 (80/5) | W-4 (2) | 33.5 | 2.4 |
| Example 40 | A-1/A-8 (1 g/1 g) | z17 (110) | SL-2/SL-4 60/40 | N-5/N-1 (7/7) | C-7/CP-4 (40/10) | W-4 (2) | 33.4 | 2.5 |
| Example 41 | A-2/A-7 (1.2 g/0.8 g) | z18 (100) | SL-2/SL-4 60/40 | N-5/N-1 (7/7) | C-167 (240) | W-4 (2) | 33.9 | 2.4 |
| Example 42 | A-10 | z20 (100) | SL-2/SL-4 60/40 | N-5/N-1 (7/7) | C-155 (80) | W-4 (2) | 27.6 | 2.3 |
| Example 43 | A-11 | z21 (100) | SL-2/SL-4 60/40 | N-5/N-1 (7/7) | C-237 (80) | W-4 (2) | 27.9 | 1.9 |
| Example 44 | A-12 | z25 (100) | SL-2/SL-4 60/40 | N-5/N-1 (7/7) | C-167 (80) | W-4 (2) | 27.9 | 1.9 |
| Example 45 | A-10 | z28 (100) | SL-2/SL-4 60/40 | N-5/N-1 (7/7) | C-188 (80) | W-4 (2) | 27.9 | 1.8 |
| Example 46 | A-10 | z29/z31 (40/60) | SL-2/SL-4 60/40 | N-5/N-1 (7/7) | C-172 (80) | W-4 (2) | 27.1 | 1.8 |
| Example 47 | A-10 | z29/z31 (40/60) | SL-2/SL-4 60/40 | N-5/N-1 (7/7) | C-172 (80) | — | 27.1 | 1.8 |
| Comparative Example 1 | Ex-1 | z2 (100) | SL-2/SL-4 60/40 | N-5/N-1 (7/7) | H-3 (80) | W-4 (2) | 36.8 | 3.3 |
| Comparative Example 2 | A-10 | z2 (100) | SL-2/SL-4 60/40 | N-5/N-1 (7/7) | H-3 (80) | W-4 (2) | 35.6 | 3.0 |
| Comparative Example 3 | Ex-1 | z2 (100) | SL-2/SL-4 60/40 | N-5/N-1 (7/7) | C-7 (80) | W-4 (2) | 36.7 | 3.1 |

Denotations in the Tables are as follows.

The acid generators and resins (C) are corresponding to those illustrated above as examples.

(Ex-1)

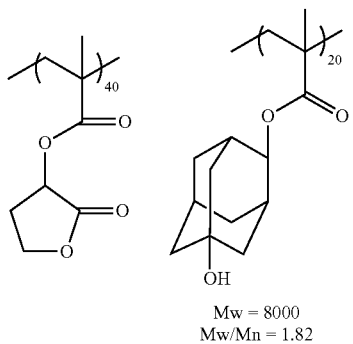

Mw = 8000
Mw/Mn = 1.82

(H-3)

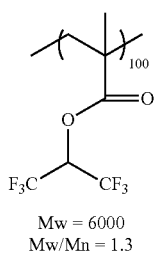

Mw = 6000
Mw/Mn = 1.3

[Basic Compound]
N-1: N,N-Dibutylaniline
N-2: N,N-Dihexylaniline
N-3: 2,6-Diisopropylaniline
N-4: Tri-n-octylamine
N-5: N,N-Dihydroxyethylaniline
N-6: 2,4,5-Triphenylimidazole
N-7: Tris(methoxyethoxyethyl)amine
N-8: 2-[2-{2-(2,2-Dimethoxy-phenoxyethoxy)ethyl}-bis-(2-methoxyethyl)]-amine
[Surfactant]
W-1: Megaface F176 (produced by Dainippon Ink & Chemicals, Inc., fluorine-containing)
W-2: Megaface R08 (produced by Dainippon Ink & Chemicals, Inc., fluorine- and silicon-containing)
W-3: Polysiloxane Polymer KP-341 (produced by Shin-Etsu Chemical Co., Ltd., silicon-containing)
W-4: Troysol S-366 (produced by Troy Chemical)
W-5: PF656 (produced by OMNOVA, fluorine-containing)
W-6: PF6320 (produced by OMNOVA, fluorine-containing)
[Solvent]
SL-1: Cyclohexanone
SL-2: Propylene glycol monomethyl ether acetate (PGMEA)
SL-3: Ethyl lactate
SL-4: Propylene glycol monomethyl ether (PGME)
SL-5: γ-Butyrolactone
SL-6: Propylene carbonate It is seen from the results above that the resist pattern formed using the positive resist composition of the present invention exhibits excellent performance in both the pitch dependency and the coverage dependency.

As apparent from the results in Tables 7 and 8, in all of Comparative Example 1 containing neither of the resins (A) and (C) for use in the present invention and Comparative Examples 2 and 3 containing either one of the resins (A) and (C), both the pitch dependency and the coverage dependency are poor.

On the other hand, the resist patterns of Examples 1 to 47 formed using the actinic ray-sensitive or radiation-sensitive resin composition of the present invention containing both of the resins (A) and (C) exhibit excellent performance in the pitch dependency as well as in the coverage dependency.

INDUSTRIAL APPLICABILITY

According to the present invention, an actinic ray-sensitive or radiation-sensitive resin composition having good performance in terms of pitch dependency and coverage dependency of CD, a resist film and a pattern forming method using the composition are provided.

The entire disclosure of Japanese Patent Application Nos. 2009-088568 and 2009-256265, and 2010-076454, filed on Mar. 31, 2009, Nov. 9, 2009 and Mar. 29, 2010 respectively, from which the benefit of foreign priority has been claimed in the present application, is incorporated herein by reference, as if fully set forth.

The invention claimed is:

1. An actinic ray-sensitive or radiation-sensitive resin composition comprising:

(A) a resin capable of increasing the solubility in an alkali developer by the action of an acid, the resin containing (a) a repeating unit represented by the following formula (AN-01), (B) a compound capable of generating an acid upon irradiation with an actinic ray or radiation, and (C) a resin that contains (c') a repeating unit having at least either a fluorine atom or a silicon atom and having a group capable of decomposing by the action of an alkali developer to increase the solubility in an alkali developer on one side chain:

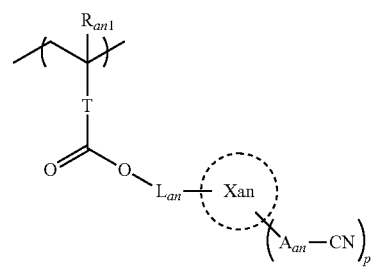

(AN-01)

wherein

T represents a single bond or a divalent linking group;

$R_{an1}$ represents a hydrogen atom, a methyl group or a group represented by —$CH_2$—$R_9$, wherein $R_9$ represents a hydroxyl group or a monovalent organic group;

$L_{an}$ represents a single bond or a divalent linking group;

$X_{an}$ represents (1+p)-valent alicyclic structure;

p is an integer of 1 to 3; and $A_{an}$ represents a single bond, an alkylene group, a cycloalkylene group, an oxy group, a carbonyl group, an amide group, or a group formed by combining two or more of these groups.

2. The actinic ray-sensitive or radiation-sensitive resin composition as claimed in claim 1, wherein the repeating unit (a) is a repeating unit represented by formula (ANa) or (ANb):

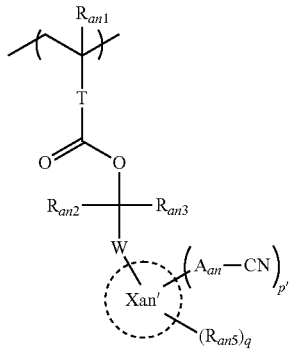

(ANa)

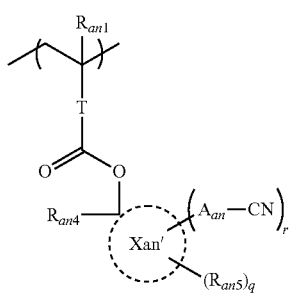

(ANb)

wherein $A_{an}$ has the same meanings as that in formula (AN-01);

$X_{an'}$ represents an alicyclic structure;

W represents a single bond, an alkylene group or a cycloalkylene group;

T represents a single bond or a divalent linking group;

$R_{an1}$ represents a hydrogen atom, a methyl group or a group represented by —$CH_2$—$R_9$, wherein $R_9$ represents a hydroxyl group or a monovalent organic group;

each of $R_{an2}$ and $R_{an3}$ independently represents an alkyl group or a cycloalkyl group;

$R_{an4}$ represents an alkyl group, a cycloalkyl group or a structure represented by -$A_{an}$-CN;

$R_{an5}$ represents a halogen atom, a hydroxyl group or a monovalent organic group;

p' is an integer of 1 to 3 q is an integer of 0 to 3; and r is an integer of 0 to 3, provided that when r is 0, $R_{an4}$ is a structure represented by -$A_{an}$-CN.

3. The actinic ray-sensitive or radiation-sensitive resin composition as claimed in claim 1, wherein the alicyclic structure represented by $X_{an}$ and $X_{an'}$ is an adamantane residue.

4. The actinic ray-sensitive or radiation-sensitive resin composition as claimed in claim 1, wherein the repeating unit (a) is a repeating unit represented by the following formula (Nb-01):

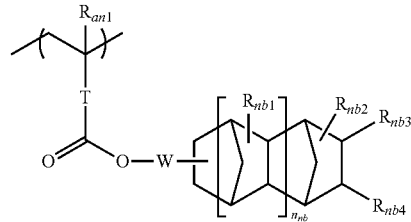

(Nb-01)

wherein $R_{an1}$ represents a hydrogen atom, a methyl group or a group represented by —$CH_2$—$R_9$, wherein $R_9$ represents a hydroxyl group or a monovalent organic group;

W represents a single bond, an alkylene group or a cycloalkylene group;

T represents a single bond or a divalent linking group;

each of $R_{nb1}$ and $R_{nb2}$ independently represents a hydrogen atom, a hydroxyl group, an alkyl group or a cycloalkyl group;

each of $R_{nb3}$ and $R_{nb4}$ independently represents a hydrogen atom, an alkyl group, a cycloalkyl group or a structure represented by -$A_{an}$-CN, wherein $A_{an}$ has the same meaning as that in formula (AN-01), provided that at least one of $R_{nb3}$ and $R_{nb4}$ is a structure represented by -$A_{an}$-CN; and $n_{nb}$ is an integer of 0 to 2, provided that when $n_{nb}$ is 2, two of $R_{nb1}$ may be same or different, respectively.

5. The actinic ray-sensitive or radiation-sensitive resin composition as claimed in claim 1, wherein the resin (C) contains a repeating unit having two or more groups capable of decomposing by the action of an alkali developer to increase the solubility in an alkali developer.

6. The actinic ray-sensitive or radiation-sensitive resin composition as claimed in claim 1, wherein the resin (A) further contains a lactone structure-containing repeating unit.

7. A resist film formed of the actinic ray-sensitive or radiation-sensitive resin composition claimed in claim 1.

8. A pattern forming method comprising steps of subjecting the resist film claimed in claim 7 to immersion exposure and developing the immersion-exposed resist film.

9. The actinic ray-sensitive or radiation-sensitive resin composition as claimed in claim 1, wherein the content of the resin (C) is from 0.01 to 10 mass % based on the entire solid content of the actinic ray-sensitive or radiation-sensitive resin composition.

10. The actinic ray-sensitive or radiation-sensitive resin composition as claimed in claim 1, wherein the resin (A) further contains an acid-decomposable group-containing repeating unit represented by formula (AI):

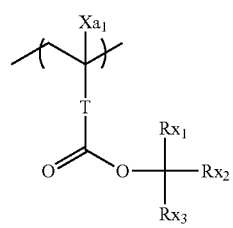

(AI)

wherein $Xa_1$ represents a hydrogen atom, a methyl group which may have a substituent, or a group represented by —$CH_2$—$R_9$;

$R_9$ represents a hydroxyl group or a monovalent organic group;

T represents a single bond or a divalent linking group;

each of $Rx_1$ to $Rx_3$ independently represents a linear or branched alkyl group or a monocyclic or polycyclic cycloalkyl group; and two members out of $Rx_1$ to $Rx_3$ may combine to form a monocyclic or polycyclic cycloalkyl group.

11. The actinic ray-sensitive or radiation-sensitive resin composition as claimed in claim 1, wherein the resin (A) contains at least two kinds of acid-decomposable group-containing repeating units.

12. The actinic ray-sensitive or radiation-sensitive resin composition as claimed in claim 6, wherein the resin (A) contains a lactone structure-containing repeating unit represented by formula (3):

(3)

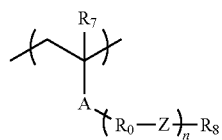

wherein A represents —COO— or —CONH—;

$R_0$ represents, and when a plurality of $R_0$'s are present, each independently represents, an alkylene group;

Z represents, and when a plurality of Z's are present, each independently represents, an ether bond, an ester bond, an amide bond, a group represented by

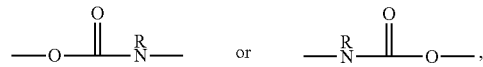

or a group represented by

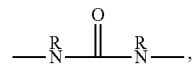

wherein R represents a hydrogen atom, an alkyl group, a cycloalkyl group or an aryl group;

$R_8$ represents a monovalent organic group having a lactone structure;

n is a repetition number of the structure represented by —$R_0$—Z— and represents an integer of 1 to 5; and $R_7$ represents a hydrogen atom, a halogen atom or an alkyl group.

13. The actinic ray-sensitive or radiation-sensitive resin composition as claimed in claim 1, wherein the group capable of decomposing by the action of an alkali developer to increase the solubility in an alkali developer is a carboxylic acid ester group of the formula —COO—.

14. The actinic ray-sensitive or radiation-sensitive resin composition as claimed in claim 1, wherein the content of the repeating unit (c') is from 40 to 100 mol %, based on all repeating units in the resin (C).

* * * * *